(12) United States Patent
Bertin et al.

(10) Patent No.: US 9,390,790 B2
(45) Date of Patent: Jul. 12, 2016

(54) CARBON BASED NONVOLATILE CROSS POINT MEMORY INCORPORATING CARBON BASED DIODE SELECT DEVICES AND MOSFET SELECT DEVICES FOR MEMORY AND LOGIC APPLICATIONS

(71) Applicant: Nantero Inc., Woburn, MA (US)

(72) Inventors: Claude L. Bertin, Venice, FL (US); C. Rinn Cleavelin, Lubbock, TX (US); Thomas Rueckes, Carmel Valley, CA (US); X. M. Henry Huang, Cupertino, CA (US); H. Montgomery Manning, Eagle, ID (US)

(73) Assignee: Nantero Inc., Woburn, MA (US)

( * ) Notice: Subject to any disclaimer, the term of this patent is extended or adjusted under 35 U.S.C. 154(b) by 0 days.

(21) Appl. No.: 13/716,453

(22) Filed: Dec. 17, 2012

(65) Prior Publication Data
US 2014/0166959 A1    Jun. 19, 2014

(51) Int. Cl.
*H01L 29/02* (2006.01)
*G11C 13/00* (2006.01)
(Continued)

(52) U.S. Cl.
CPC ............. *G11C 13/0002* (2013.01); *B82Y 10/00* (2013.01); *G11C 13/003* (2013.01); *G11C 13/025* (2013.01); *G11C 23/00* (2013.01); *H01L 27/2409* (2013.01); *H01L 27/249* (2013.01); *H01L 27/2481* (2013.01); *H01L 27/285* (2013.01); *H01L 29/0669* (2013.01); *H01L 29/1606* (2013.01); *H01L 29/861* (2013.01); *H01L 29/872* (2013.01); *H01L 45/04* (2013.01);
(Continued)

(58) Field of Classification Search
CPC ......... H01L 45/04; H01L 29/00; H01L 27/24; G11C 13/0004
USPC .................. 257/2–5, E29.002; 438/102–104; 977/700, 755
See application file for complete search history.

(56) References Cited

U.S. PATENT DOCUMENTS 5,172,278 A * 12/1992 Tutt .............................. 359/885
6,369,003 B1 * 4/2002 Rademacher et al. ........ 504/319
(Continued)

OTHER PUBLICATIONS

Amblard, G., "Development and characterization of carbon nanotube processes for NRAM technology," Proc. of SPIE, 2011, vol. 7970, pp. 797017-1-797017-7.

(Continued)

*Primary Examiner* — Jami M Valentine
(74) *Attorney, Agent, or Firm* — Nantero Inc.

(57) ABSTRACT

The present disclosure is directed toward carbon based diodes, carbon based resistive change memory elements, resistive change memory having resistive change memory elements and carbon based diodes, methods of making carbon based diodes, methods of making resistive change memory elements having carbon based diodes, and methods of making resistive change memory having resistive change memory elements having carbons based diodes. The carbon based diodes can be any suitable type of diode that can be formed using carbon allotropes, such as semiconducting single wall carbon nanotubes (s-SWCNT), semiconducting Buckminsterfullerenes (such as C60 Buckyballs), or semiconducting graphitic layers (layered graphene). The carbon based diodes can be pn junction diodes, Schottky diodes, other any other type of diode formed using a carbon allotrope. The carbon based diodes can be placed at any level of integration in a three dimensional (3D) electronic device such as integrated with components or wiring layers.

22 Claims, 115 Drawing Sheets

(51) Int. Cl.
| | |
|---|---|
| G11C 13/02 | (2006.01) |
| G11C 23/00 | (2006.01) |
| H01L 45/00 | (2006.01) |
| H01L 29/861 | (2006.01) |
| H01L 29/872 | (2006.01) |
| H01L 27/24 | (2006.01) |
| H01L 29/16 | (2006.01) |
| H01L 29/06 | (2006.01) |
| H01L 51/00 | (2006.01) |
| H01L 27/28 | (2006.01) |
| B82Y 10/00 | (2011.01) |

(52) U.S. Cl.
CPC ........ *H01L 45/1226* (2013.01); *H01L 45/1233* (2013.01); *H01L 45/149* (2013.01); *H01L 45/1608* (2013.01); *H01L 45/1675* (2013.01); *H01L 51/0048* (2013.01); *G11C 2213/35* (2013.01); *G11C 2213/71* (2013.01); *G11C 2213/72* (2013.01); *G11C 2213/77* (2013.01); *G11C 2213/79* (2013.01)

(56) References Cited

U.S. PATENT DOCUMENTS

| | | | |
|---|---|---|---|
| 6,422,450 | B1 | 7/2002 | Zhou et al. |
| 6,423,583 | B1 | 7/2002 | Avouris et al. |
| 6,528,020 | B1 | 3/2003 | Dai et al. |
| 6,574,130 | B2 | 6/2003 | Segal et al. |
| 6,643,165 | B2 | 11/2003 | Segal et al. |
| 6,706,402 | B2 | 3/2004 | Rueckes et al. |
| 6,784,028 | B2 | 8/2004 | Rueckes et al. |
| 6,808,746 | B1 | 10/2004 | Dai et al. |
| 6,835,591 | B2 | 12/2004 | Rueckes et al. |
| 6,888,773 | B2 | 5/2005 | Morimoto et al. |
| 6,890,780 | B2 | 5/2005 | Lee et al. |
| 6,894,359 | B2 | 5/2005 | Bradley et al. |
| 6,899,945 | B2 | 5/2005 | Smalley et al. |
| 6,905,892 | B2 | 6/2005 | Esmark et al. |
| 6,911,682 | B2 | 6/2005 | Rueckes et al. |
| 6,918,284 | B2 | 7/2005 | Snow et al. |
| 6,919,592 | B2 | 7/2005 | Rueckes et al. |
| 6,919,740 | B2 | 7/2005 | Snider et al. |
| 6,921,575 | B2 | 7/2005 | Horiuchi et al. |
| 6,924,538 | B2 | 8/2005 | Jaiprakash et al. |
| 7,015,500 | B2 | 3/2006 | Choi et al. |
| 7,161,403 | B2 | 1/2007 | Bertin et al. |
| 7,259,410 | B2 | 8/2007 | Jaiprakash et al. |
| 7,335,395 | B2 | 2/2008 | Ward et al. |
| 7,365,632 | B2 | 4/2008 | Bertin et al. |
| 7,375,369 | B2 | 5/2008 | Sen et al. |
| 7,560,136 | B2 | 7/2009 | Ward et al. |
| 7,566,478 | B2 | 7/2009 | Ward et al. |
| 7,666,382 | B2 | 2/2010 | Ghenciu et al. |
| 7,667,999 | B2 | 2/2010 | Herner et al. |
| 7,745,810 | B2 | 6/2010 | Rueckes et al. |
| 7,781,862 | B2 | 8/2010 | Bertin et al. |
| 7,835,170 | B2 | 11/2010 | Bertin et al. |
| 7,839,615 | B2 | 11/2010 | Bertin et al. |
| 7,852,114 | B2 | 12/2010 | Bertin et al. |
| 7,928,523 | B2 | 4/2011 | Bertin et al. |
| 7,982,209 | B2 | 7/2011 | Herner et al. |
| 8,008,745 | B2 | 8/2011 | Bertin et al. |
| 8,102,018 | B2 | 1/2012 | Bertin et al. |
| 2001/0006869 | A1* | 7/2001 | Okamoto et al. ................ 445/51 |
| 2002/0018745 | A1* | 2/2002 | Herman .................... 423/447.1 |
| 2002/0160111 | A1* | 10/2002 | Sun et al. .................... 427/248.1 |
| 2002/0175390 | A1 | 11/2002 | Goldstein et al. |
| 2003/0124837 | A1* | 7/2003 | Rueckes et al. ............... 438/629 |
| 2004/0031975 | A1 | 2/2004 | Kern et al. |
| 2004/0132070 | A1 | 7/2004 | Star et al. |
| 2004/0266106 | A1 | 12/2004 | Lee et al. |
| 2005/0212014 | A1 | 9/2005 | Horibe et al. |
| 2006/0135110 | A1* | 6/2006 | Przybysz et al. ............. 455/331 |
| 2006/0250843 | A1 | 11/2006 | Bertin et al. |
| 2006/0250856 | A1 | 11/2006 | Bertin et al. |
| 2006/0258122 | A1 | 11/2006 | Whitefield et al. |
| 2006/0264053 | A1 | 11/2006 | Yates et al. |
| 2006/0281256 | A1 | 12/2006 | Carter et al. |
| 2006/0281287 | A1 | 12/2006 | Yates et al. |
| 2006/0292716 | A1 | 12/2006 | Gu et al. |
| 2008/0157126 | A1 | 7/2008 | Bertin et al. |
| 2008/0160734 | A1 | 7/2008 | Bertin et al. |
| 2008/0251723 | A1* | 10/2008 | Ward et al. ................ 250/338.4 |
| 2008/0273280 | A1* | 11/2008 | Chen et al. .................... 361/56 |
| 2009/0087630 | A1 | 4/2009 | Ward et al. |
| 2009/0166609 | A1 | 7/2009 | Schricker et al. |
| 2009/0166610 | A1 | 7/2009 | Schricker et al. |
| 2009/0168491 | A1 | 7/2009 | Schricker et al. |
| 2010/0001267 | A1 | 1/2010 | Manning et al. |
| 2010/0044074 | A1* | 2/2010 | Kim et al. .................. 174/126.2 |
| 2010/0078723 | A1* | 4/2010 | Bertin et al. ................. 257/350 |
| 2010/0327247 | A1 | 12/2010 | Ward et al. |
| 2011/0038195 | A1 | 2/2011 | Hamilton et al. |
| 2011/0163290 | A1* | 7/2011 | Rueckes et al. ................... 257/9 |
| 2011/0164349 | A1* | 7/2011 | Snyder et al. ................. 361/525 |
| 2012/0182178 | A1* | 7/2012 | Pesetski et al. ............... 342/179 |

OTHER PUBLICATIONS

Avouris, P., "Carbon nanotube electronics," Chemical Physics, 2002, vol. 281, pp. 429-445.

Awano, Y., "Graphene for VLSI: FET and Interconnect Applications," IEDM 2009 Technical Digest, pp. 10.1.1-10.1.4.

Bakoglu, H.B., "Circuits, Interconnections and Packaging for VLSI," Addison Wesley Publishing Company, 1990, pp. 46-51, 137-139, 239-241.

Brock, et al., "Carbon Nanotube Memories and Fabrics in a Radiation Hard Semiconductor Foundry," 2005 IEEE Conference, Mar. 2005, 9 pages.

Brown, K.M., "System in package "The Rebirth of SIP"," 2004 IEEE Custom Integrated Circuits Conference, 6 pgs.

Chen, et al., Japanese Journal of Applied Physics, 2006, vol. 45, No. 4B, pp. 3680-3685.

Collins, et al., "Engineering Carbon Nanotubes and Nanotube Circuits Using Electrical Breakdown," Science, 2001, vol. 292, pp. 706-709.

Crowley, et al., "512 Mb PROM with 8 layeyrs of antifuse/Diode cells," IEEE International Solid-State Circuits Conference, Feb. 2003, vol. XLVI, pp. 284-285.

Cui, et al., Carbon nanotube memory devices of high charge storage stability, Appl. Phys. Ltrs., vol. 81, No. 17 Oct. 2002, pp. 3260-3262.

Davidson, F. S., "Design for a Diode-resistor Logic Circuit Family," George Washington University Thesis, 1967, 63 pages.

Derycke, et al., "Carbon Nanotube Inter- and Intramolecular Logic Gates," Nano Letters, Sep. 2001, vol. 1, No. 9, pp. 453-456.

Fuhrer, et al., "High-Mobility Nanotube Transistor Memory," Nano Letters, 2002, vol. 2, No. 7, pp. 755-759.

Hone, J., Phonons and Thermal Properties of Carbon Nanotubes, Topics Appl. Phys., 2001, vol. 80, pp. 273-286.

Huai, Y., "Spin-Transfet Torque MRAM (STT-MTAM): Challenges and Prospects," AAPS Bulletin, Dec. 2008, vol. 18, No. 6, pp. 33-40.

Jiang, et al., "Performance Breakthrough in 8nm Gate-All-Around Length Gate-All-Around Nanowire Transistors using Metallic Nanowire Contacts," 2008 Symposium on VLSI Technology Digest of Technical Papers, pp. 34-35.

Johnson, R.C., "IBM fellow unrolls blueprint for nano," EE Times, 3 pgs., Mar. 6, 2006, http://www.eetimes.com/showArticle.jhtml?.ArticleID=181500304.

Kianian, et al., "A 3D Stackable Carbon Nanotube-based Nonvolatile Memory (NRAM)," ESSDERC, Jun. 2010, Nantero Inc., 4 pages.

Kong, et al., "Quantum Interference and Ballistic Transmission in Nanotube Electron Wavegrinders,"The American Physical Society, 2001, vol. 87, No. 10, pp. 106801-1-106801-4.

Langer, et al., "Electrical resistance of a carbon nanotube bundle," J. Mater. Res., 1994, vol. 9, No. 4, pp. 927-932.

Liang, et al., "Cross-Point Memory Array Without Cell Selectors—Device Characteristics and Data Storage Pattern Dependencies," IEEE Transaction on Electron Devices, Oct. 2010, vol. 57, No. 10, pp. 2531-2538.

(56) References Cited

OTHER PUBLICATIONS

Na, et al., "Fullerenes, Nanotubes, and Carbon Nanostructures," 2006, vol. 14, pp. 141-149.

Novak, et al., "Nerve agent detection using networks of single-walled carbon nanotubes," Appl. Phys. Ltrs., vol. 83, No. 19, Nov. 2003, pp. 4026-4028.

Onoa, et al., "Bulk production of singly dispersed carbon nanotubes with prescribed lengths," Nanotechnology, 2005, vol. 16, pp. 2799-2803.

Rosendale, et al., "A 4 Megabit Carbon Nanotube-based Nonvolatile Memory (NRAM)," ESSCIRC 2010 Proceedings, Sep. 2010, pp. 478-481.

Rueckes, et al., "Carbon Nanotube-Based Nonvolatile Random Access Memory for Molecular Computing," Science, 2000, vol. 289, pp. 94-97.

Servalli, G., "A 45nm Generation Phase Change Memory Technology," IEDM 2009 Technical Digest, pp. 5.7.1-5.7.4.

Snow, et al., "Random networks of carbon nanotubes as an electronic material," Appl. Phys. Ltrs., vol. 82, No. 13, Mar. 2003, pp. 2145-2147.

Star, et al., "Nanoelectronic Carbon Dioxide Sensors," Adv. Mater. 2004, vol. 16, No. 22, Nov. 2004, pp. 2049-2052.

Star, et al., "Nanotube Optoelectronic Memory Devices," Nano Letters, 2004, vol. 4, No. 9, pp. 1587-1591.

Ward, et al., "A Non-Volatile Nanoelectromechanical Memory Element Utilizing a Fabric of Carbon Nanotubes," IEEE 2004, pp. 34-38.

Zhou, et al., "p-Channel, n-Channel Thin Film Transistors and p-n Diodes Based on Single Wall Carbon Nanotube Networks," Nano Letters, 2004, vol. 4, No. 10, pp. 2031-2035.

\* cited by examiner

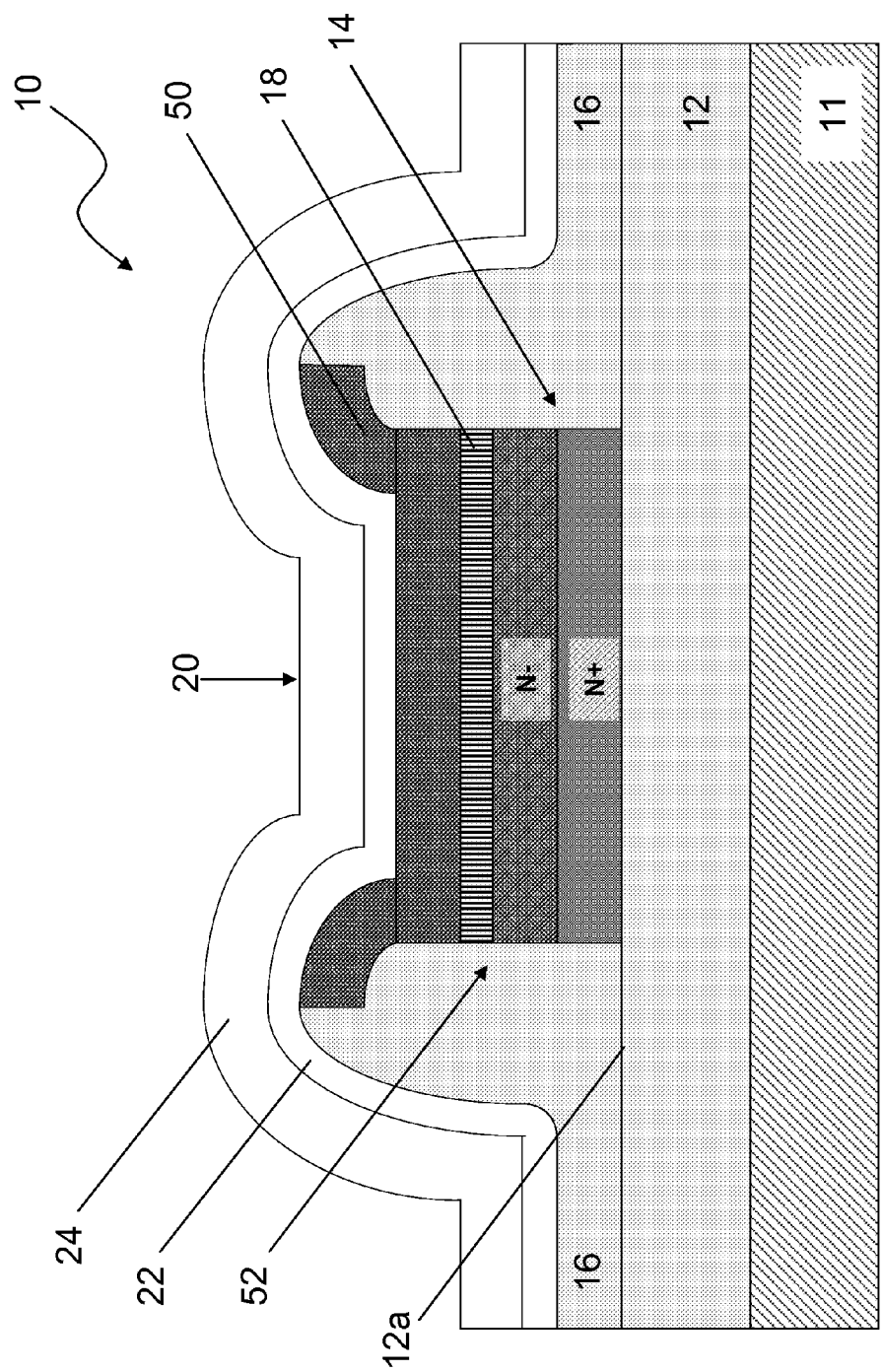
Figure 1: PRIOR ART

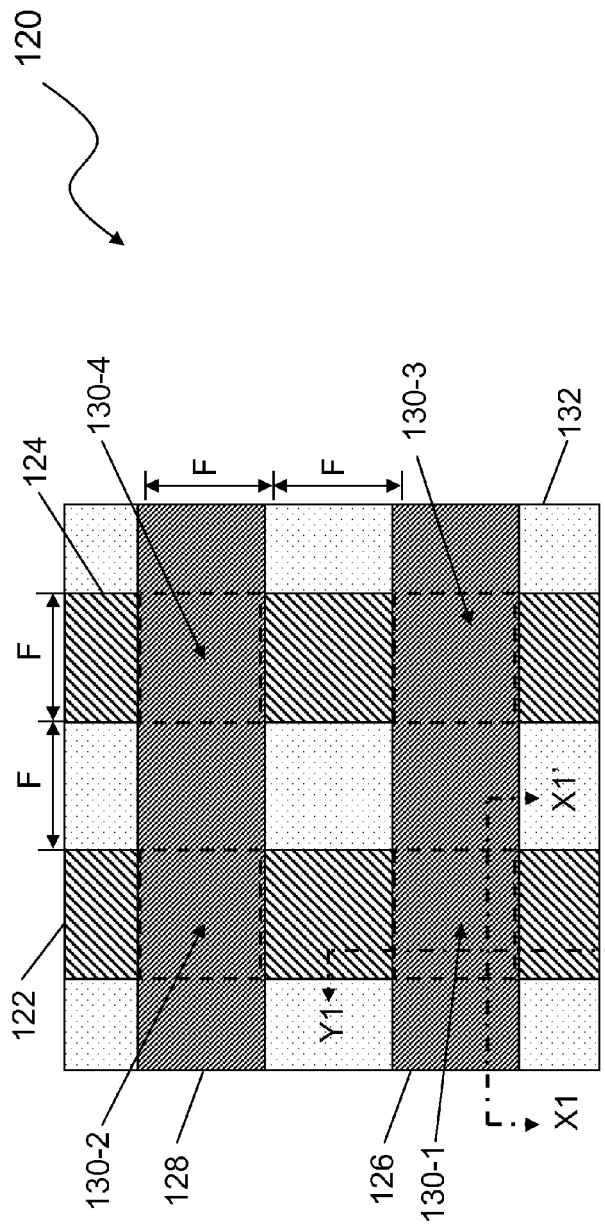
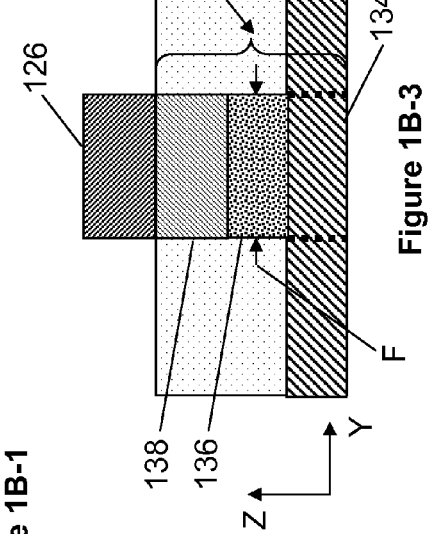
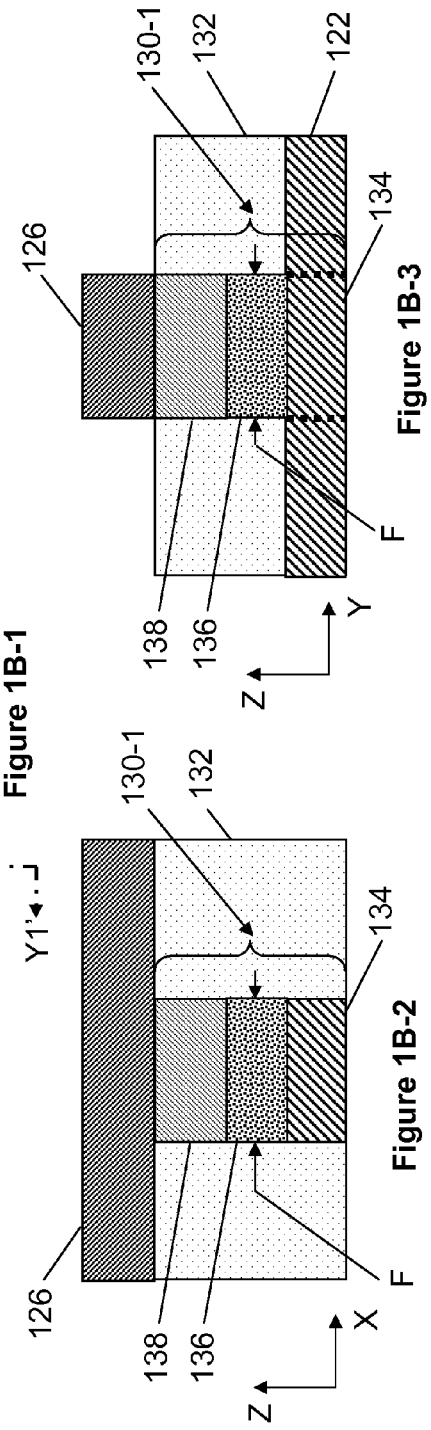

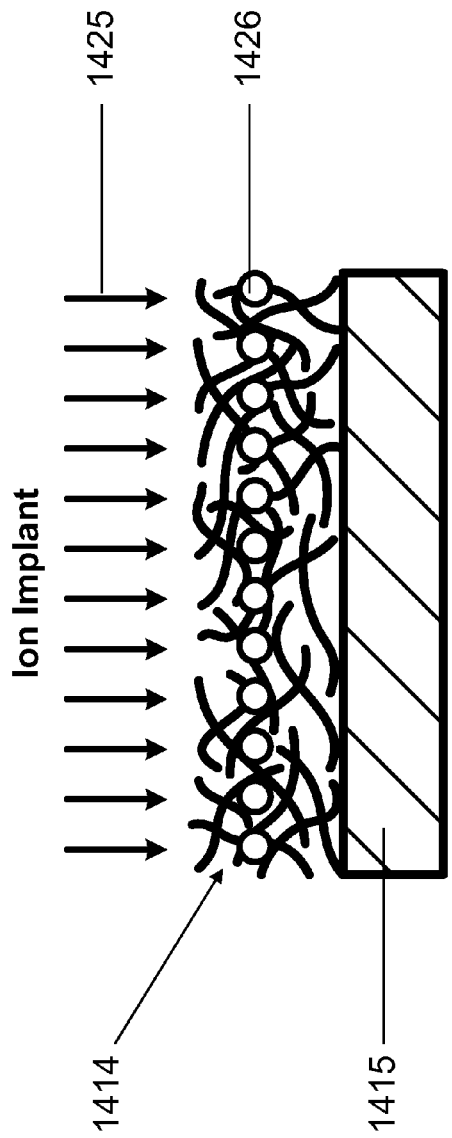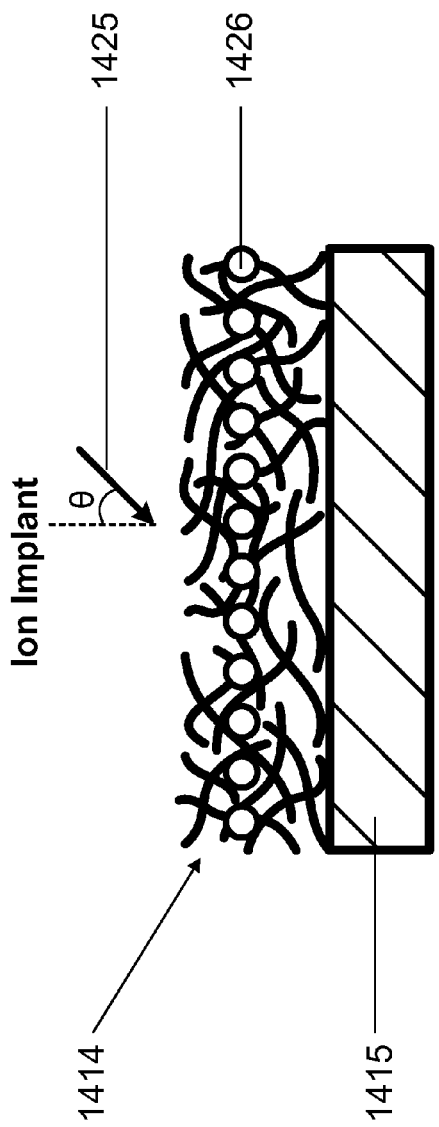

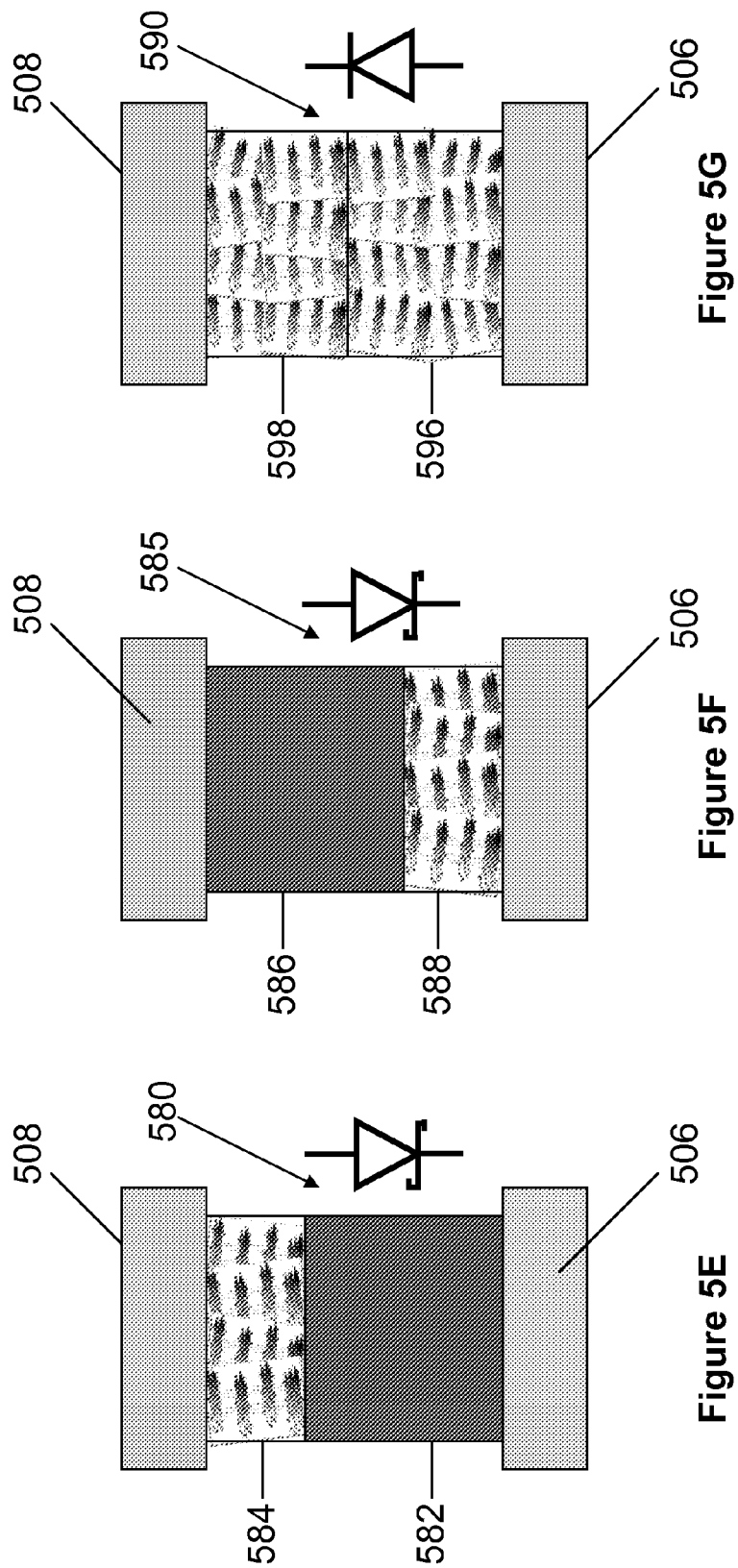

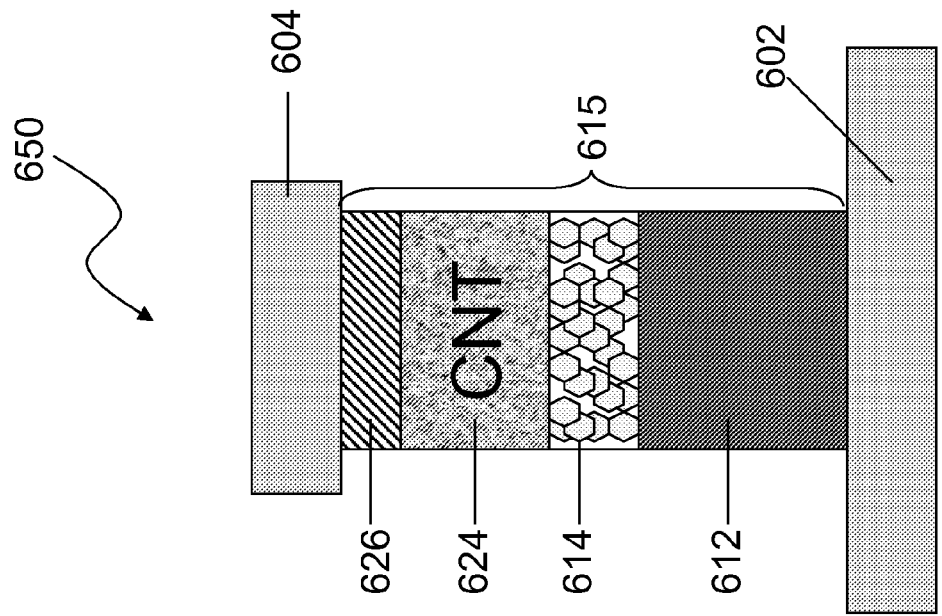
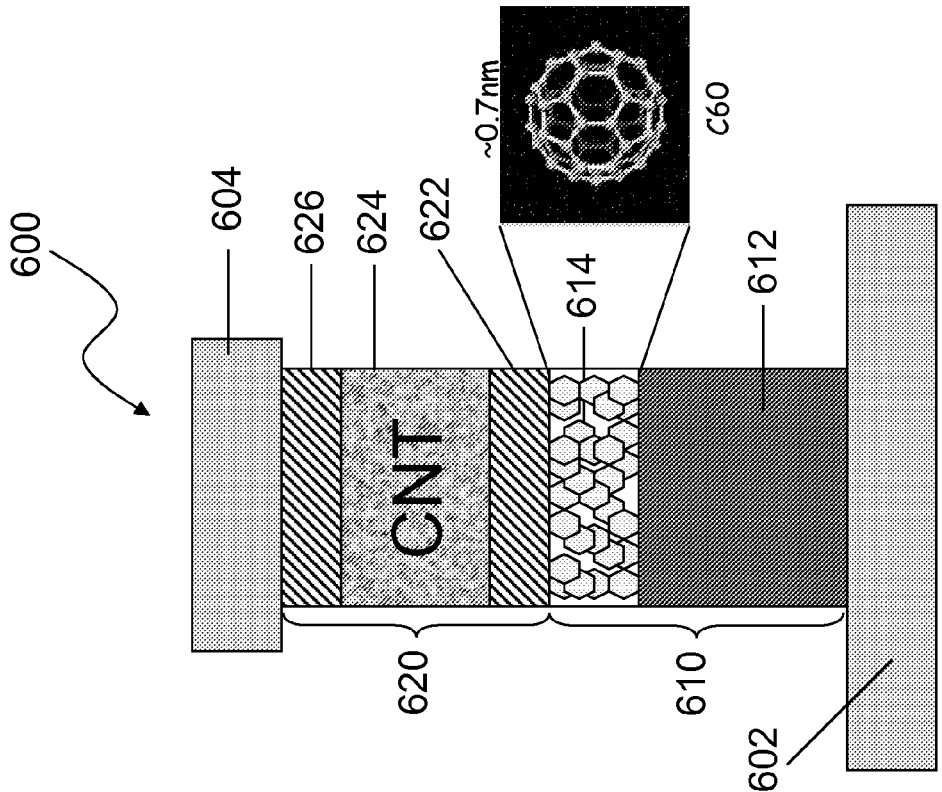

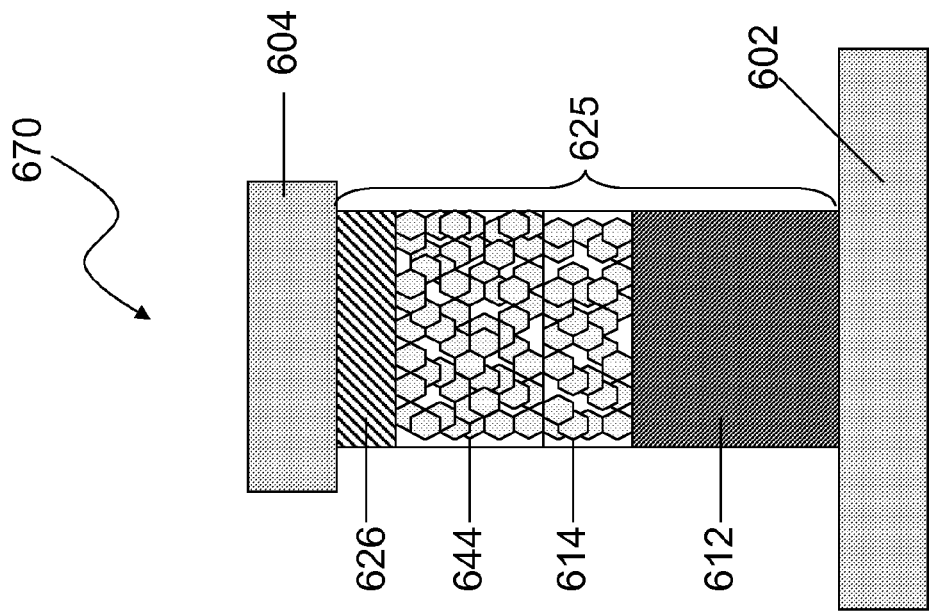
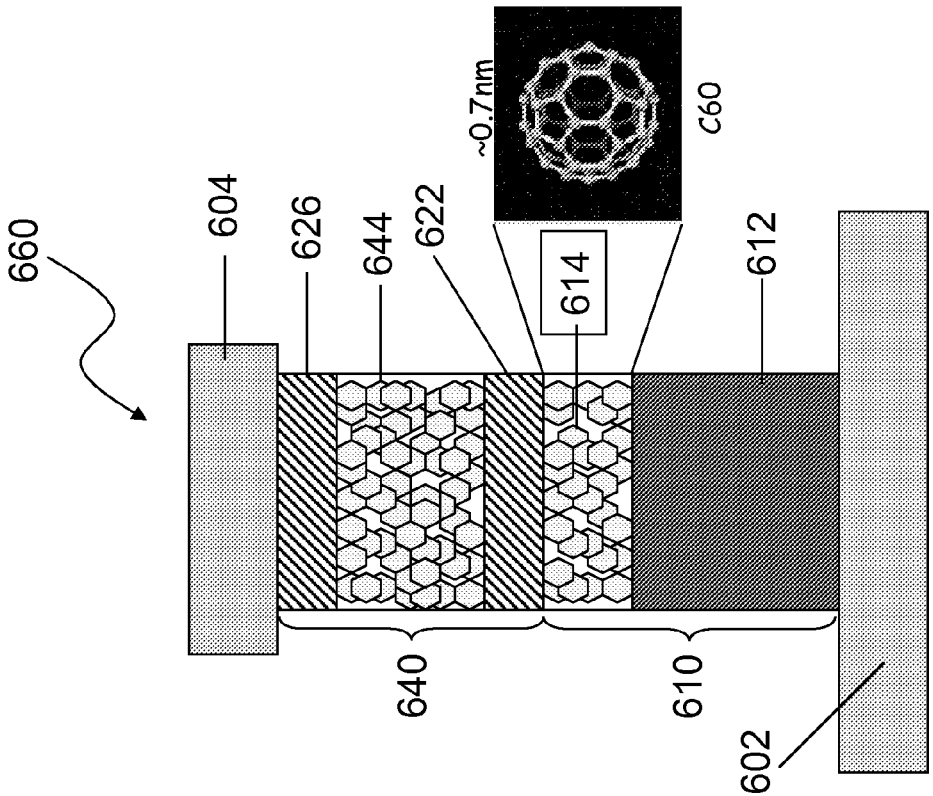

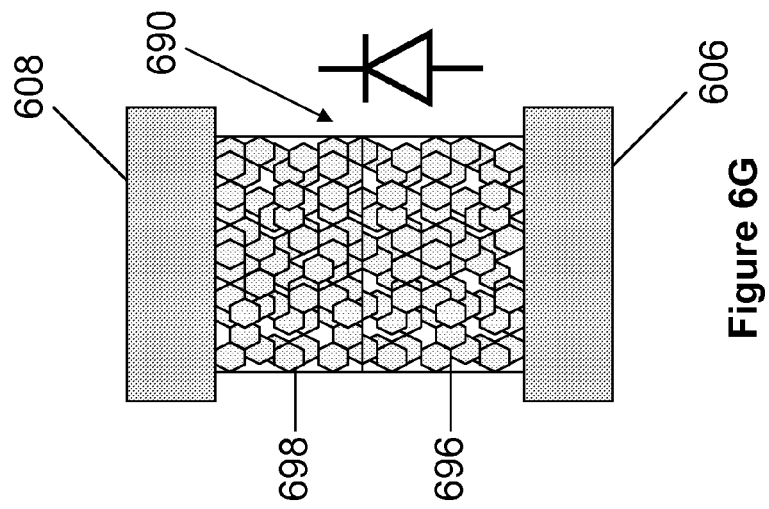
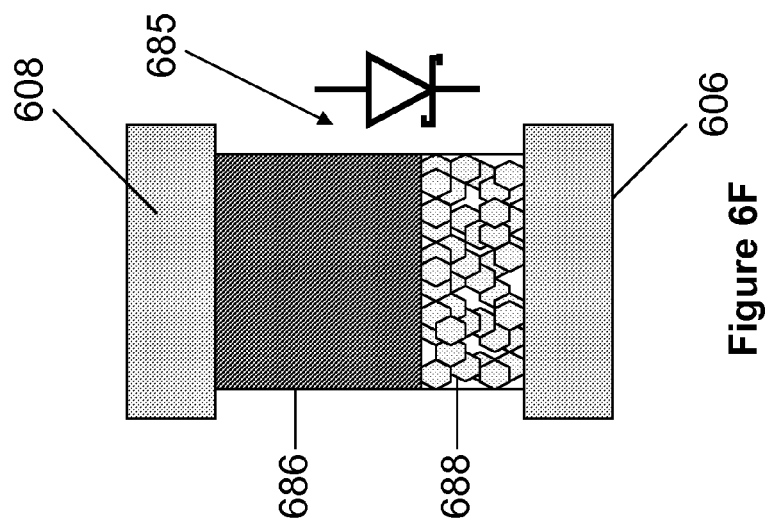
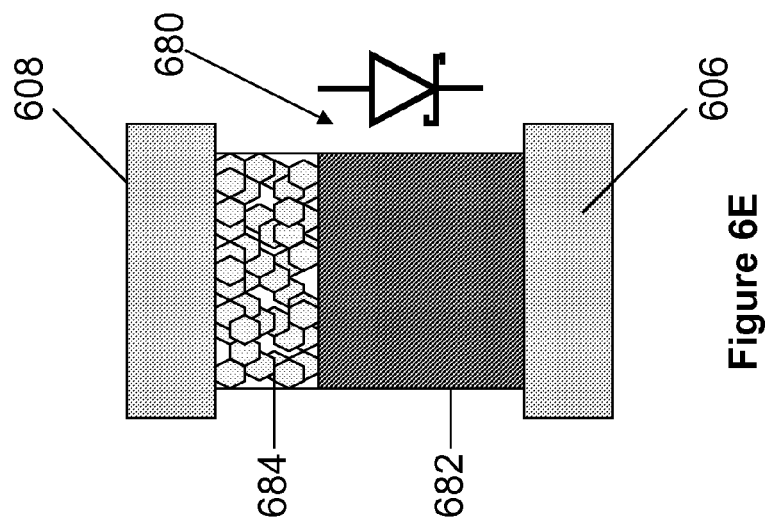

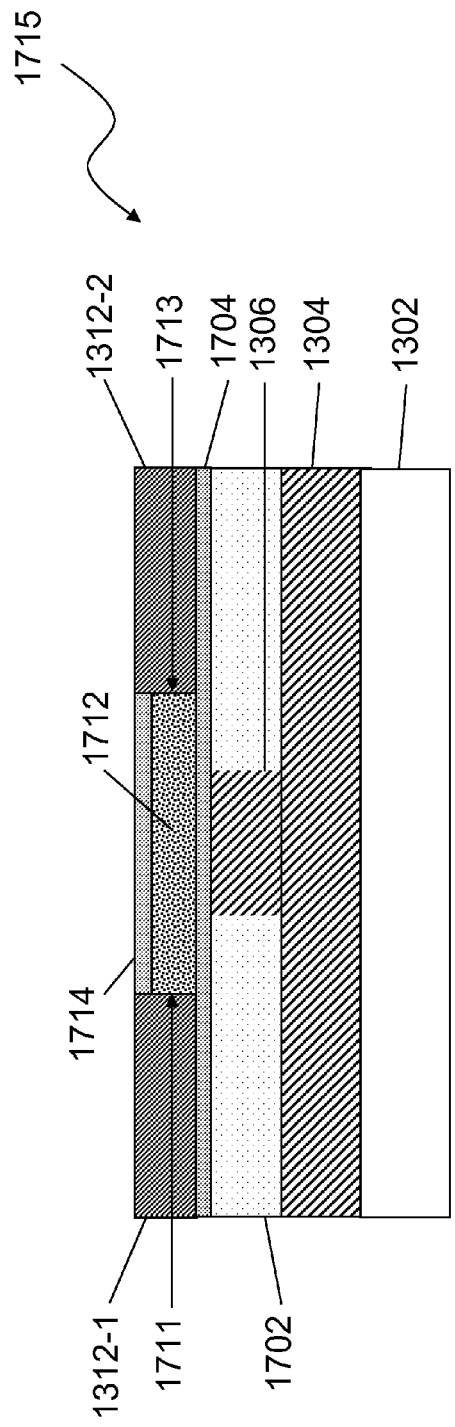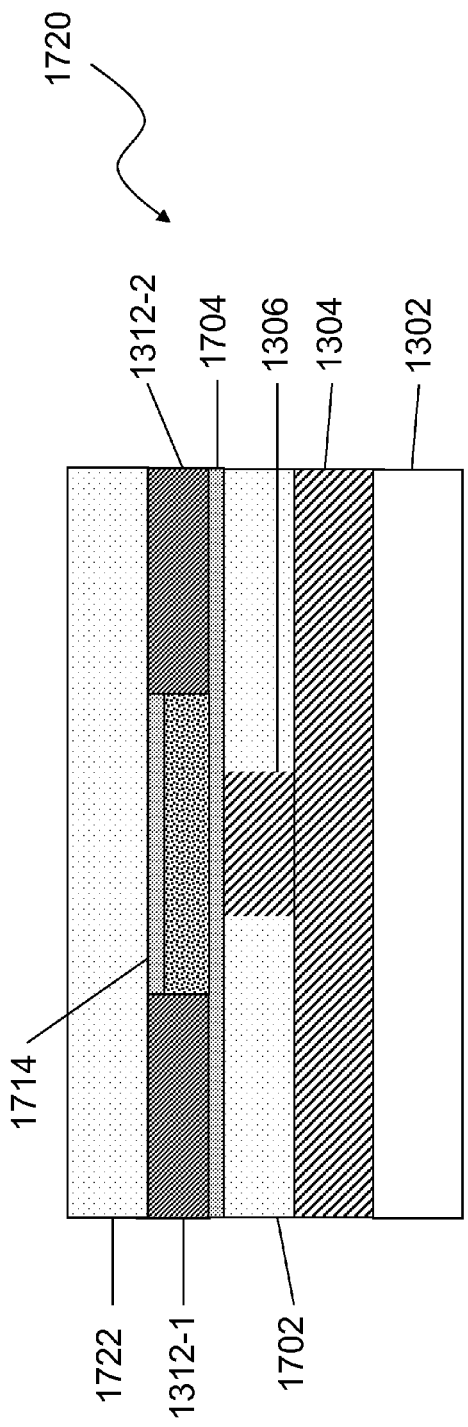

| 4Mb NRAM® | Operating Conditions |
|---|---|
| Write Voltage (across CNT) | 2.5V SET; 3.5V RESET |
| Read Voltage | 1.0 V |
| Window (Ioff/Ion) | Ratio: 100x (0.1 uA / 10 uA Current) to<br>Ratio: 1000x (0.01uA / 10uA Current) |
| Write time | 20ns SET / 20ns RESET |
| Read time | 20ns |
| Operation reliability | -65C to +165C |
| Data retention | >1,000y @ 85C (5eV)<br>>10y @ 300C (5eV) |
| Read disturb | >$10^{16}$ reads (1V) |
| Endurance | >$10^{12}$ cycles |

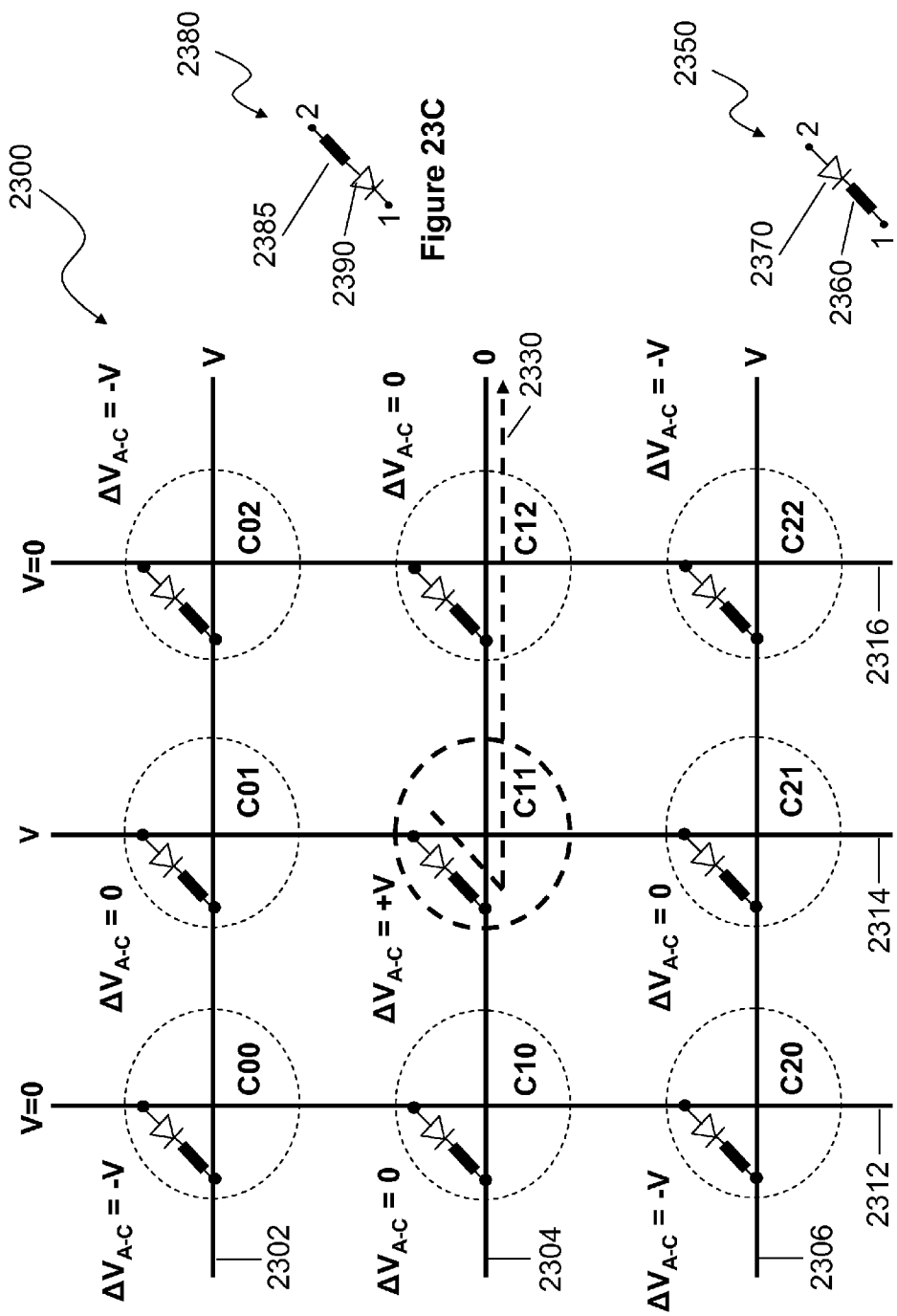

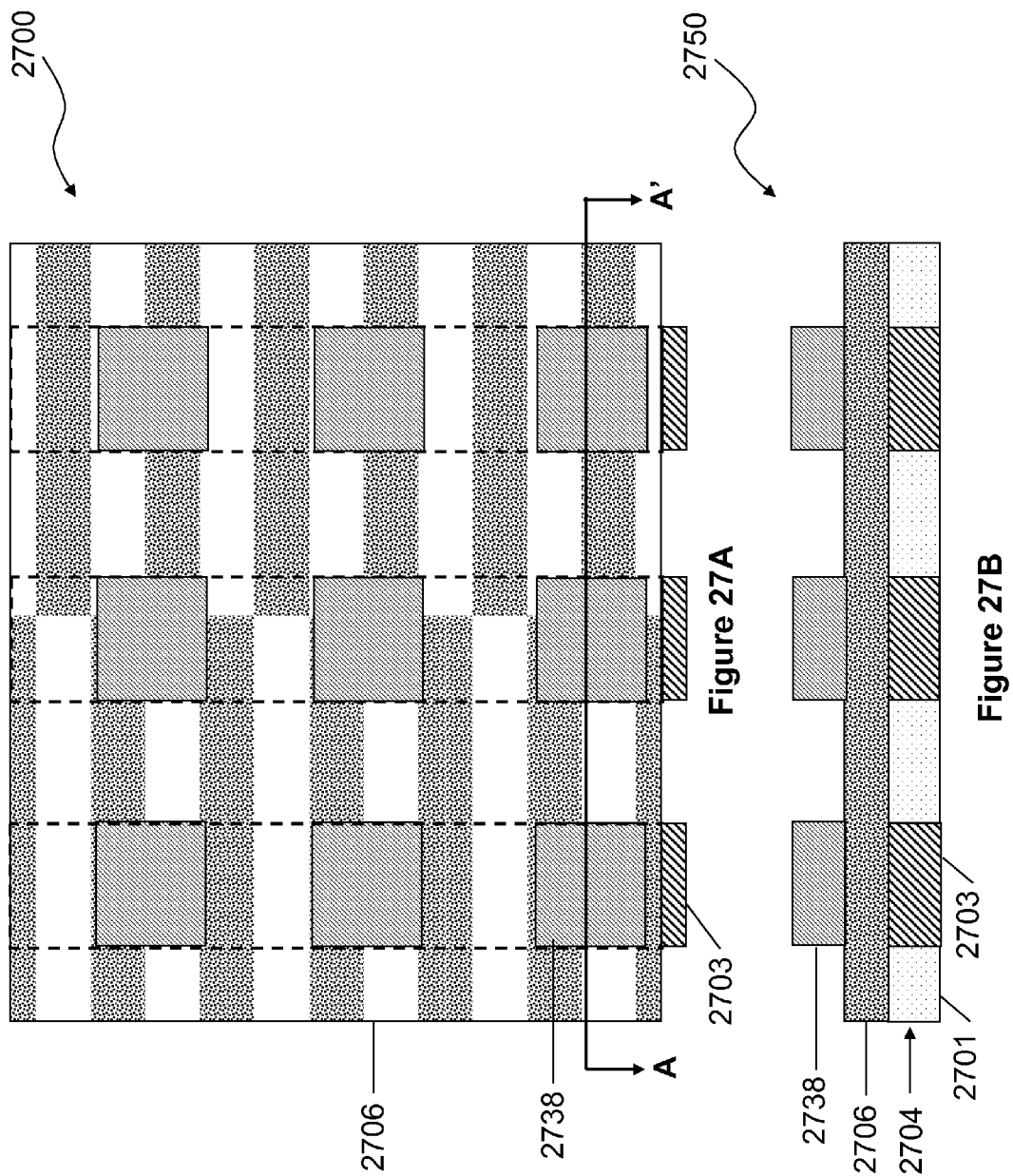

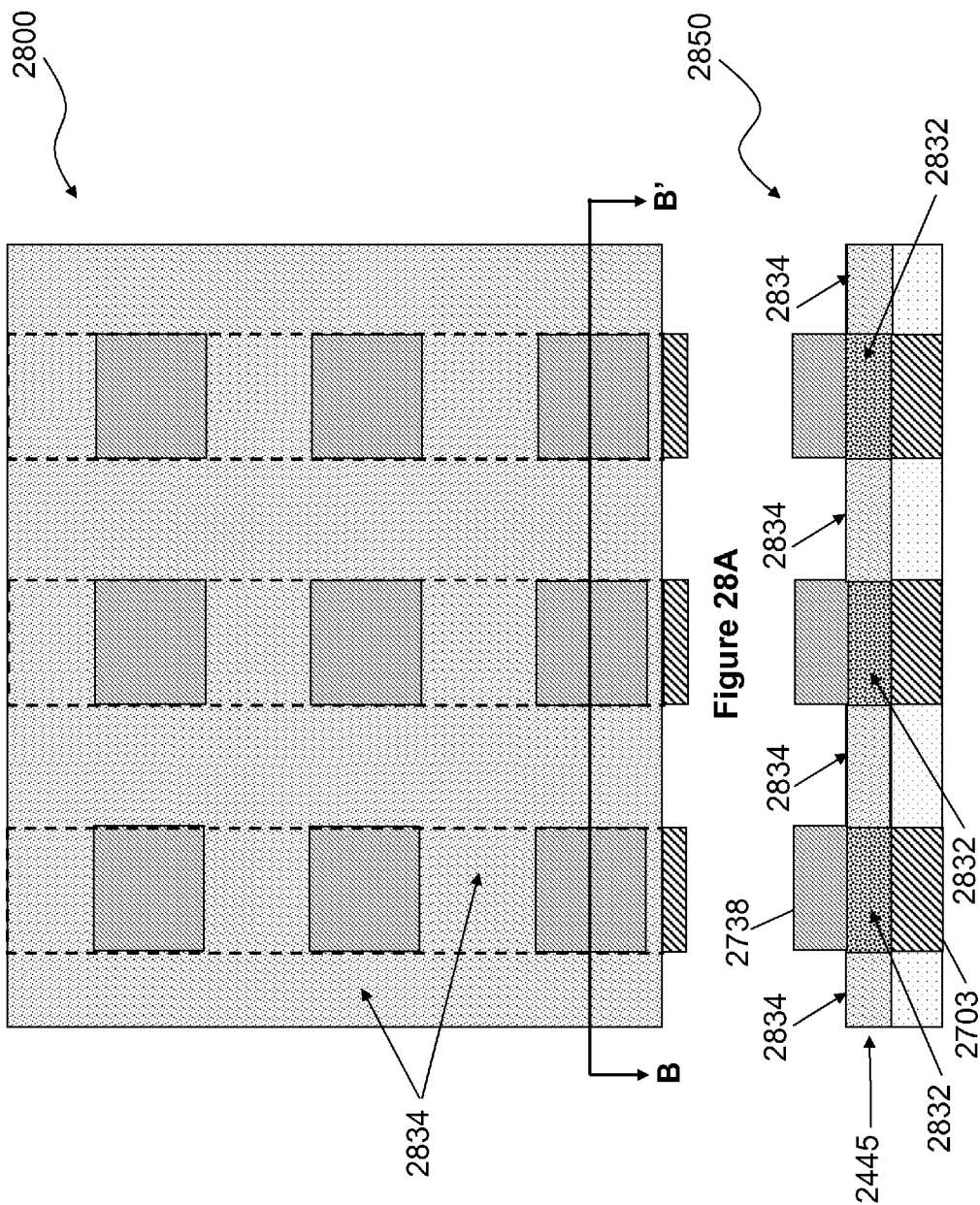

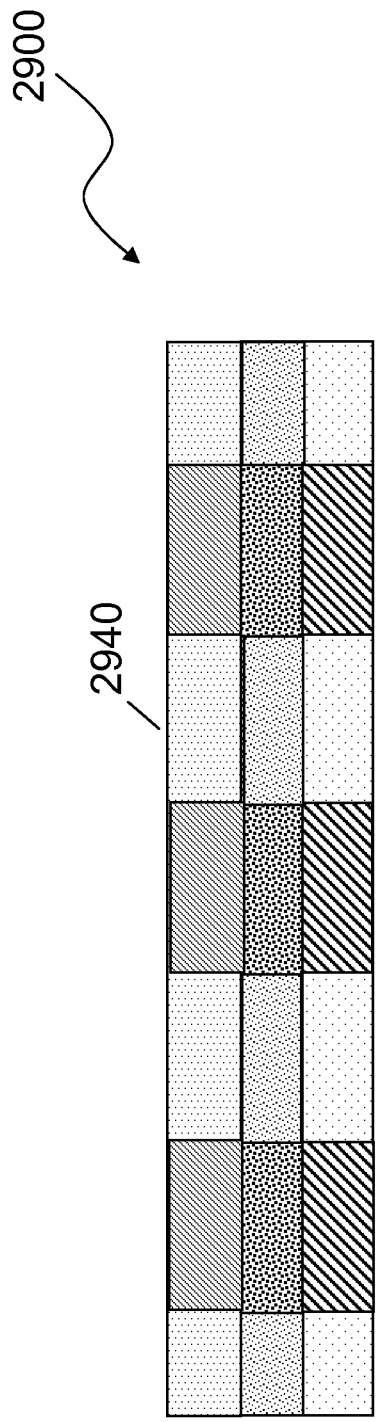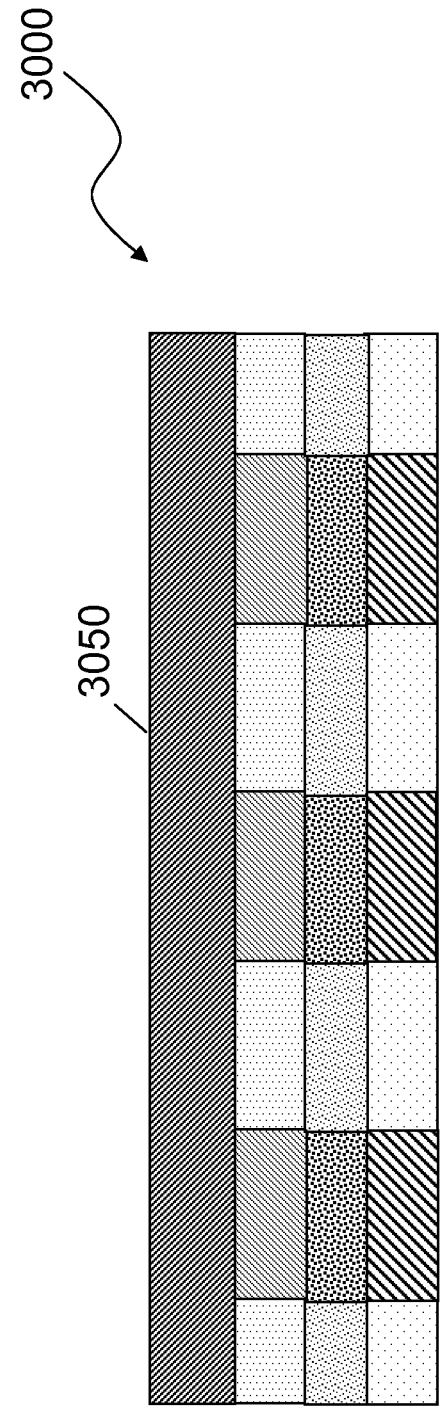

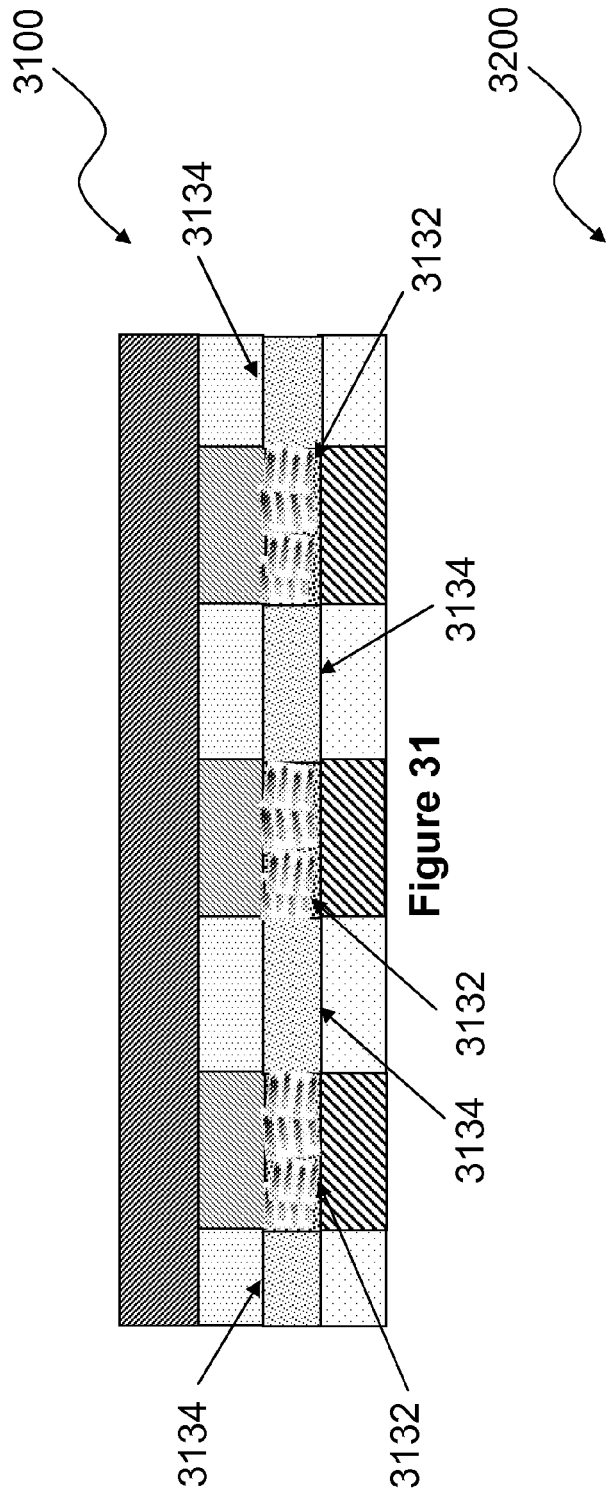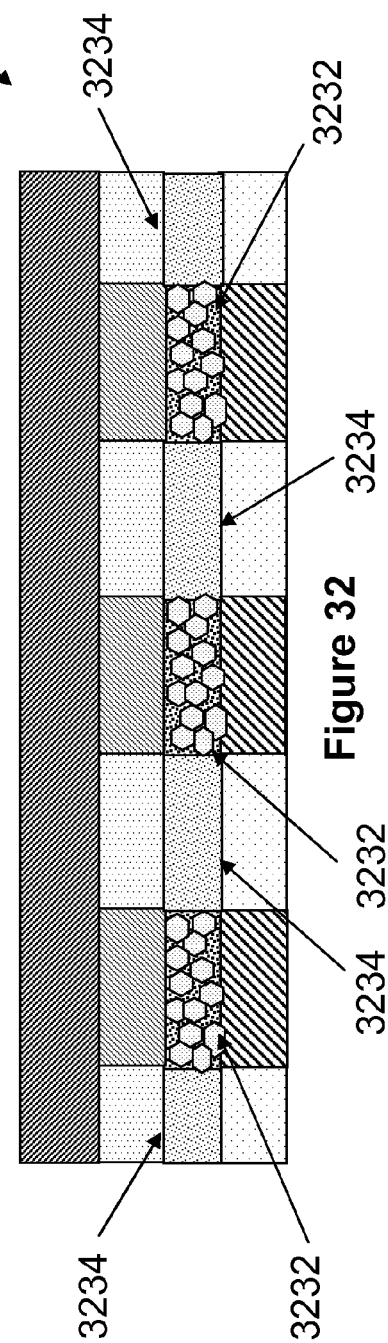

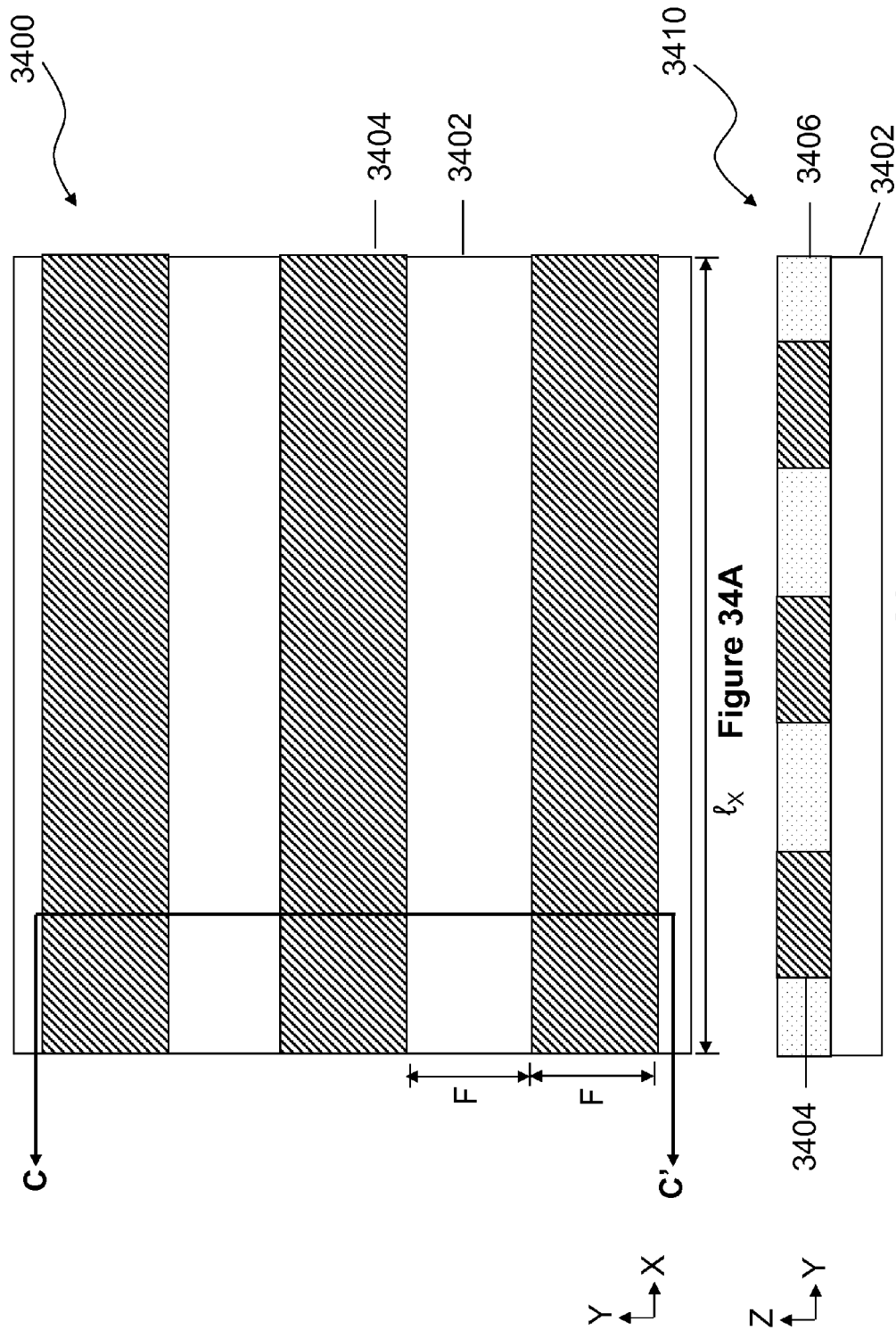

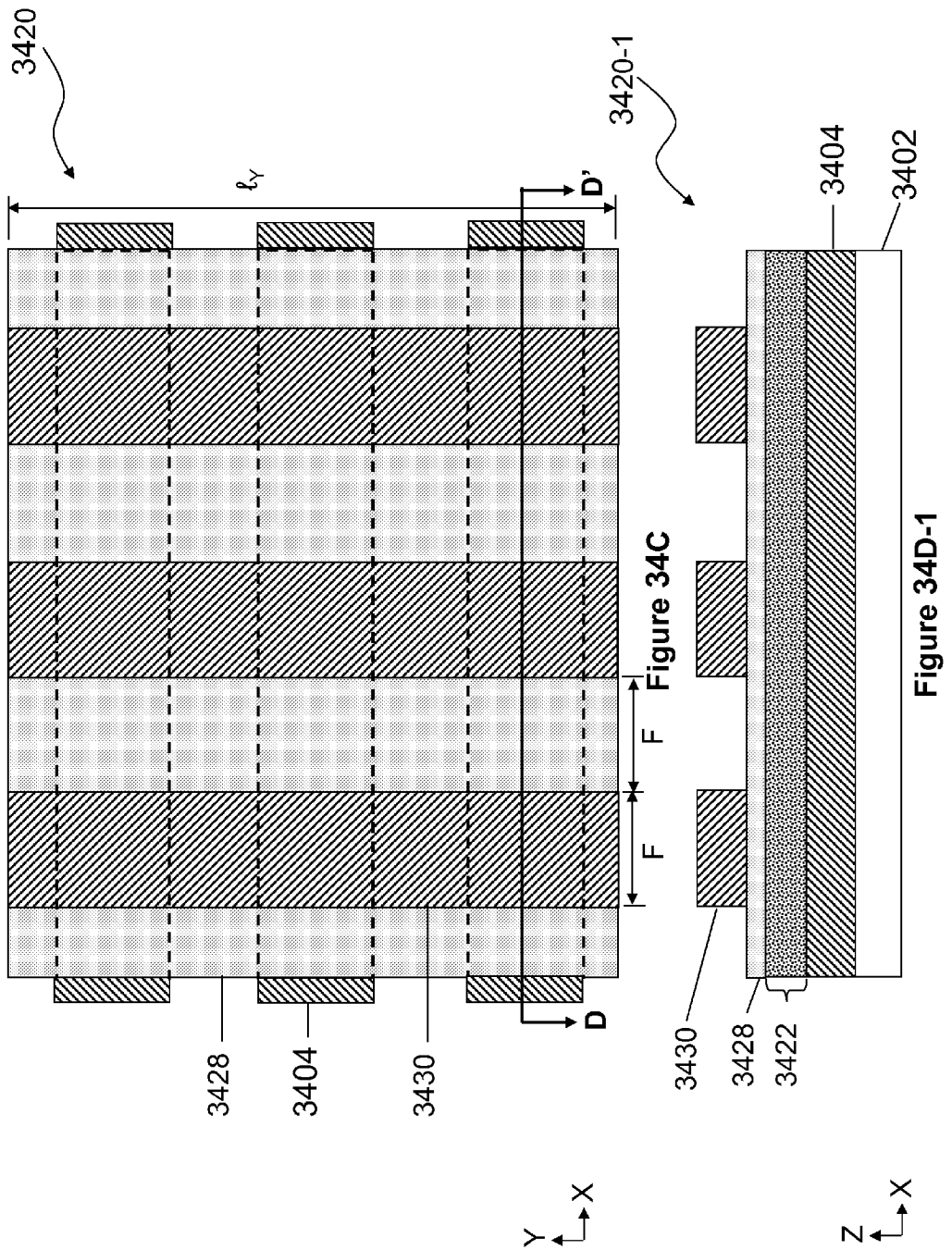

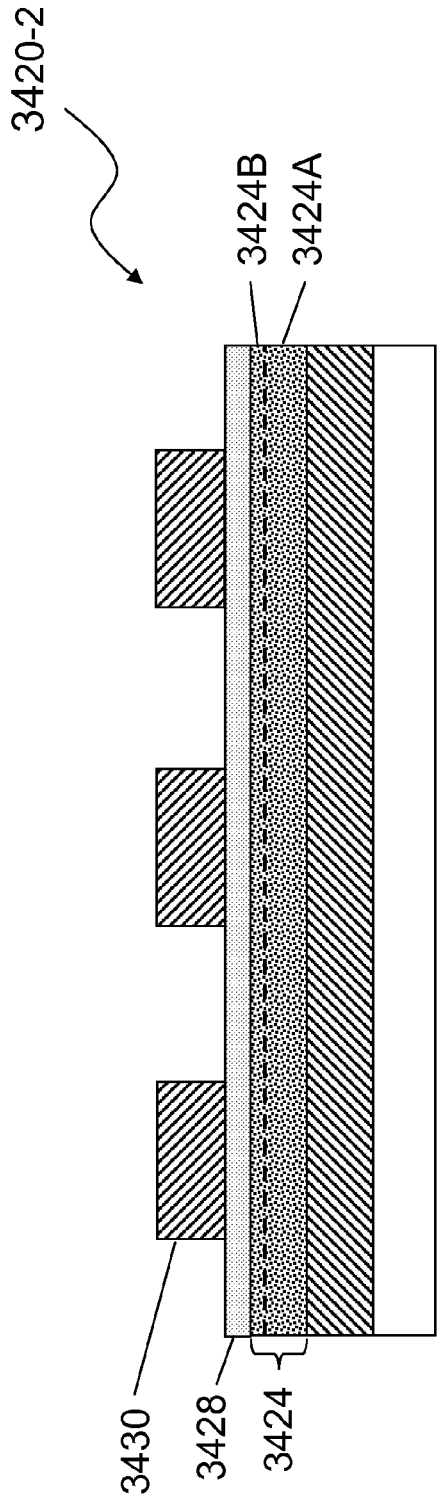
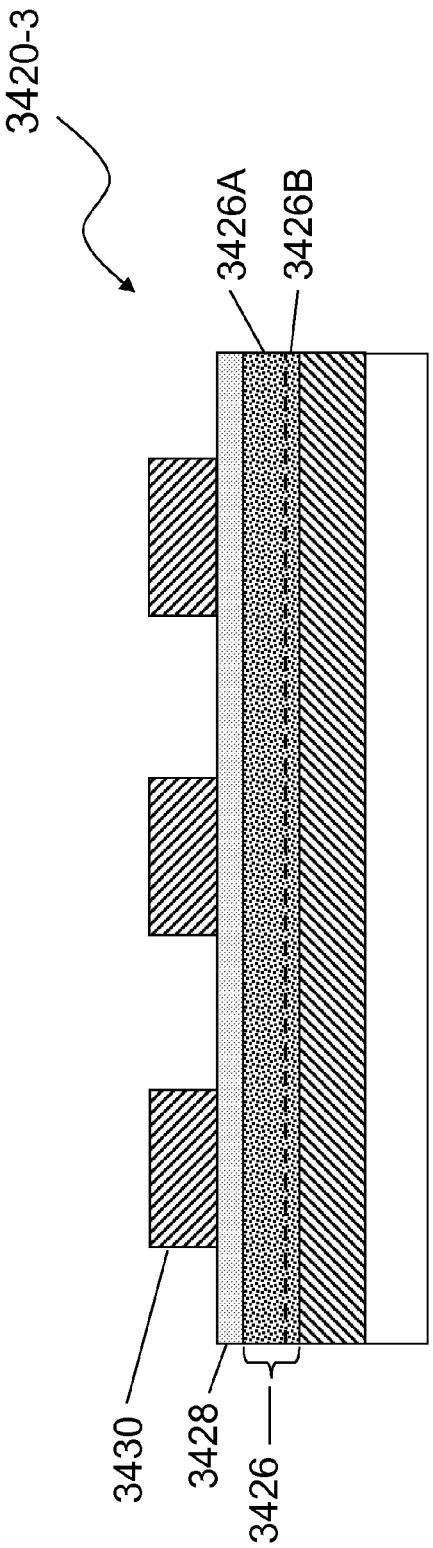
Figure 34D-2
Figure 34D-3

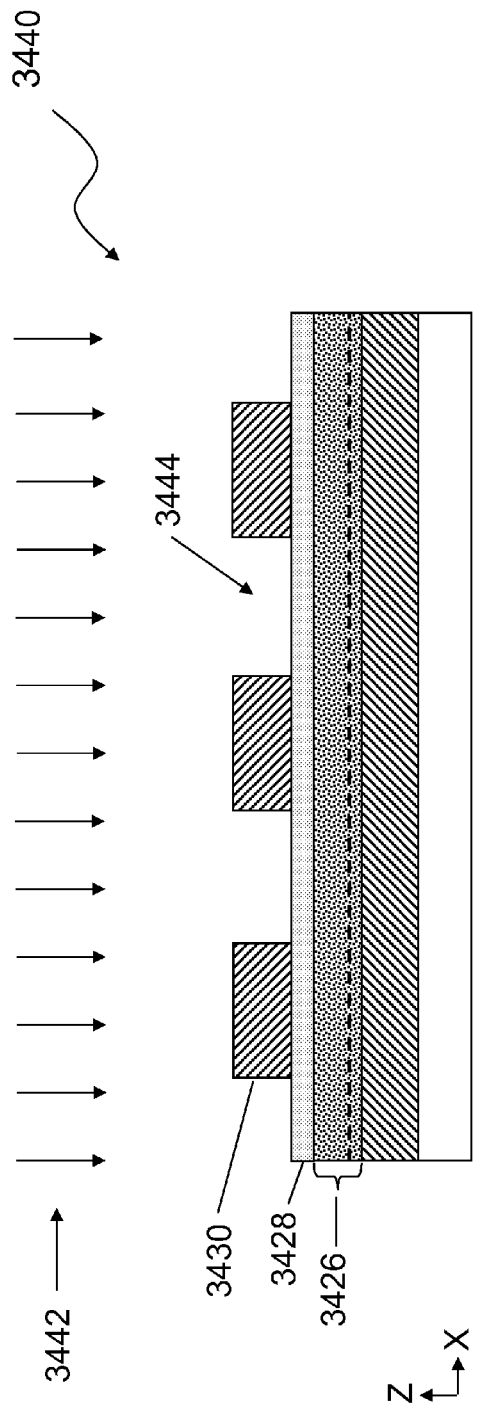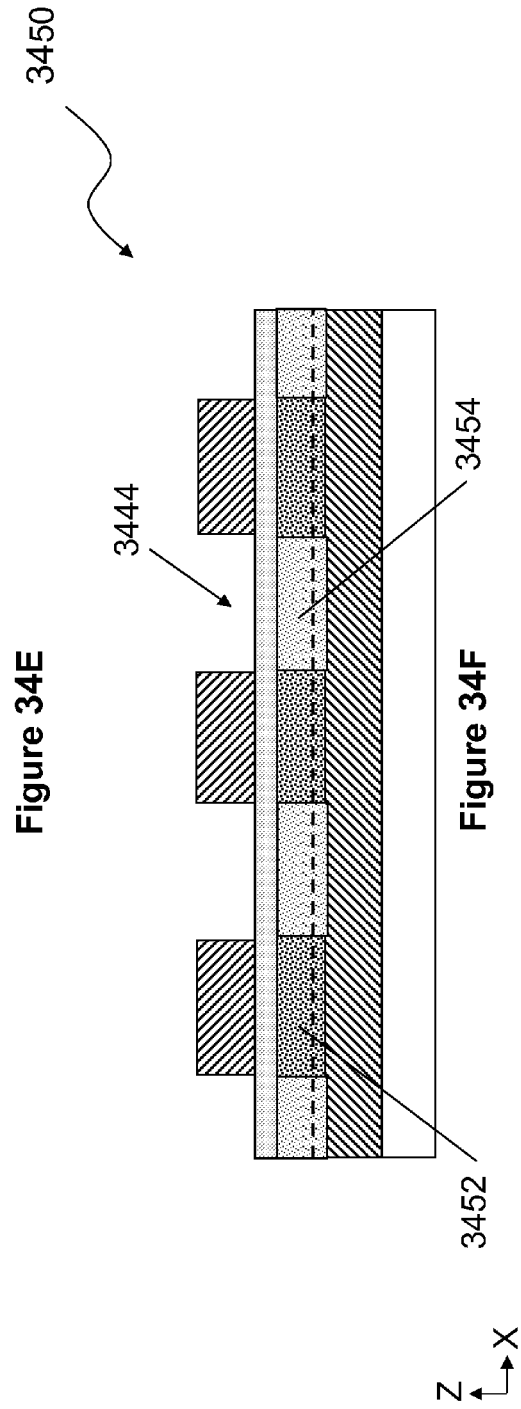

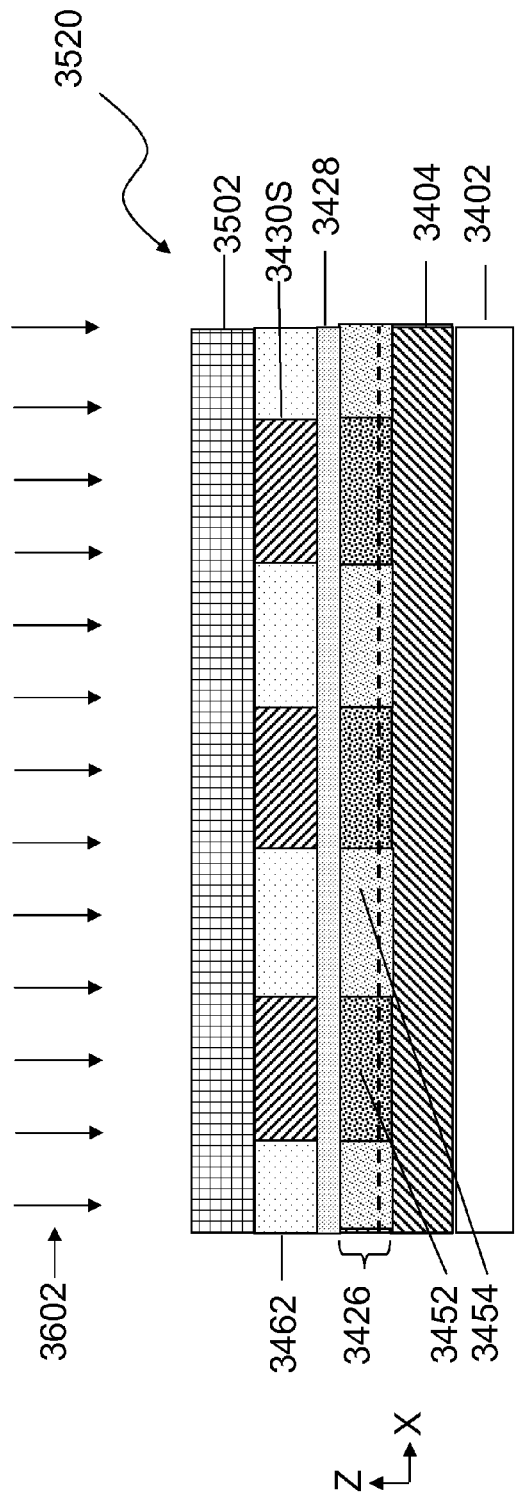
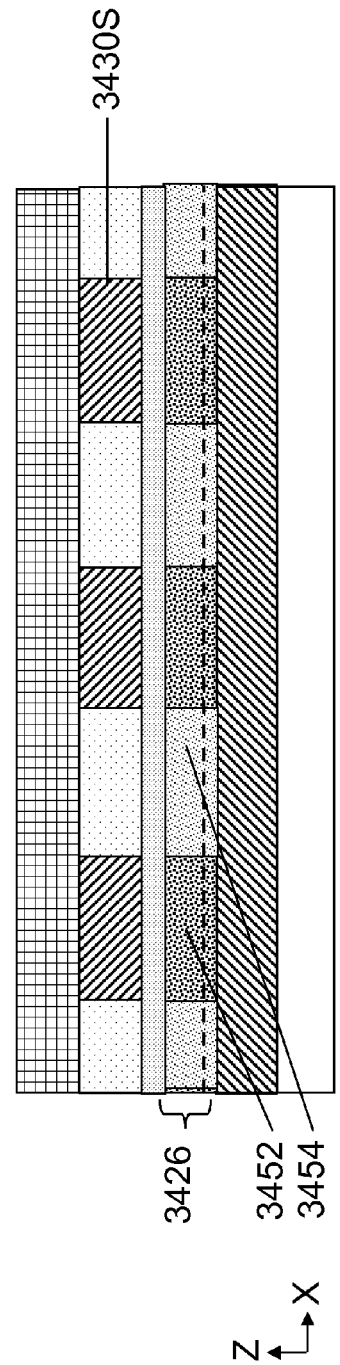

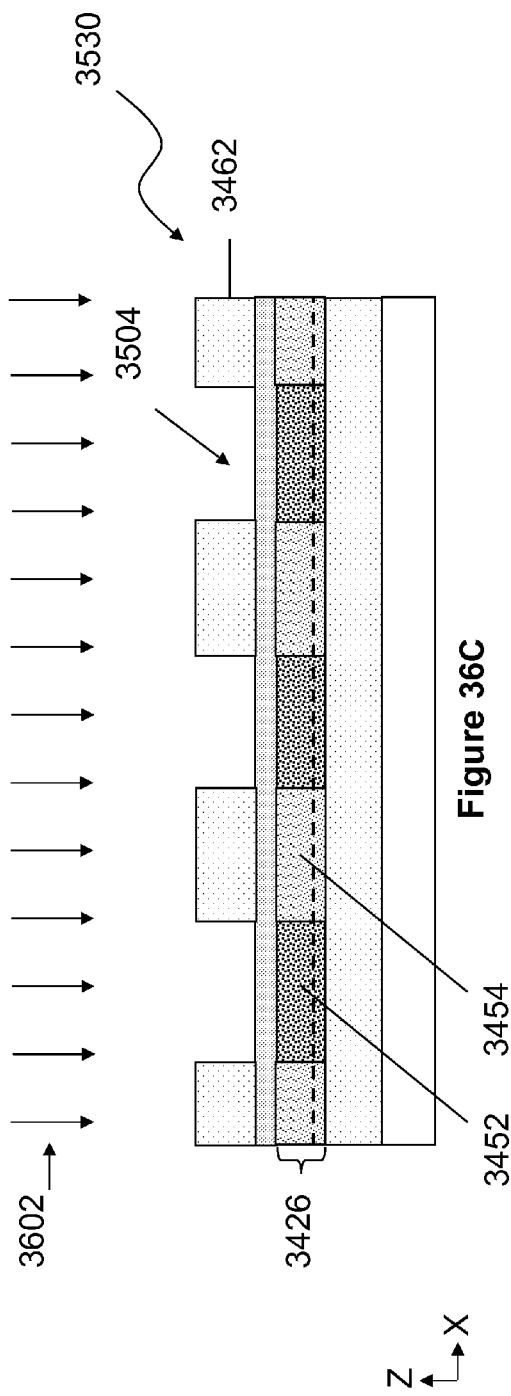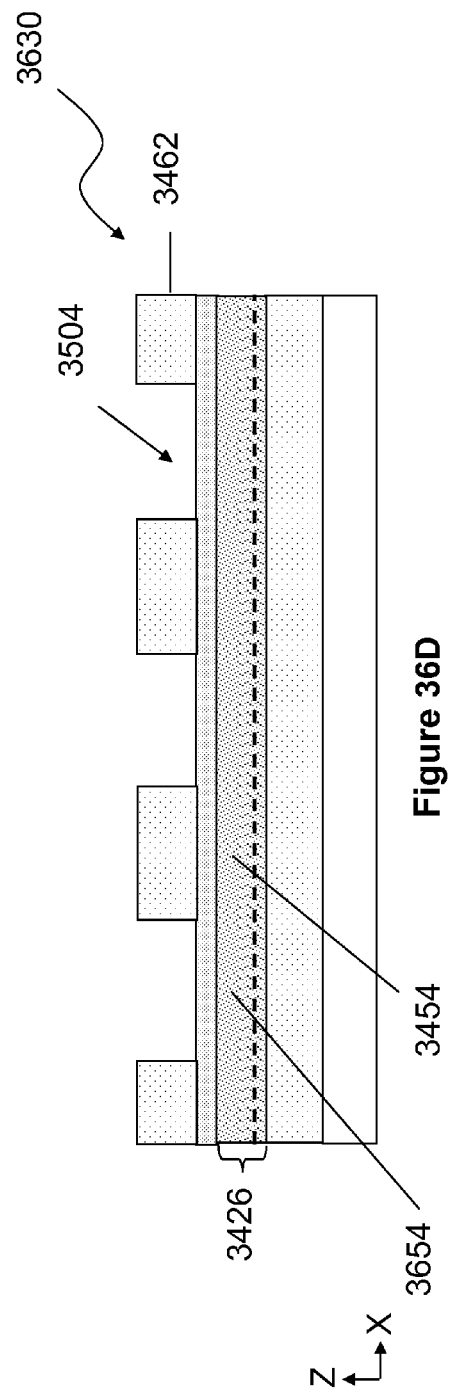

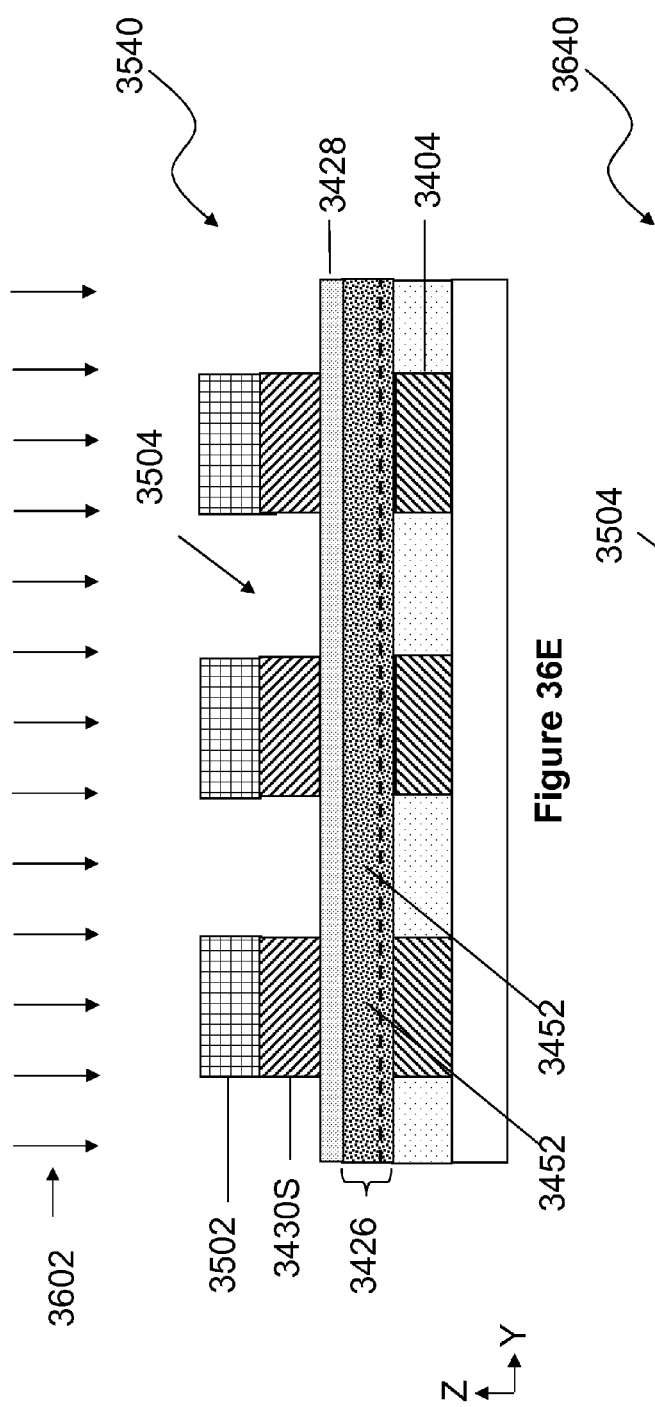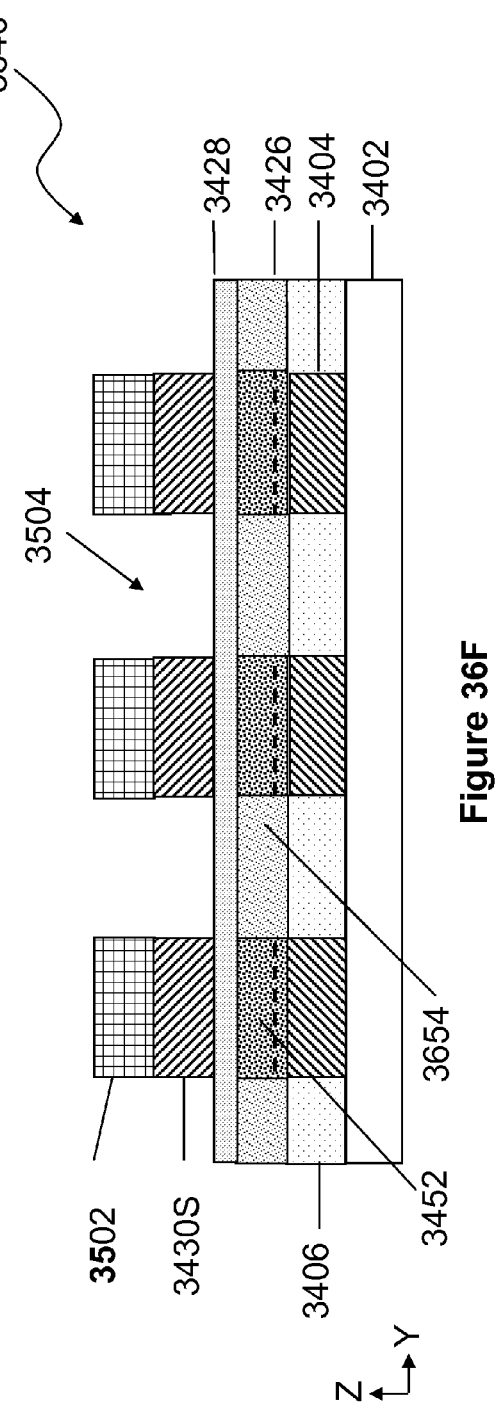
Figure 36E
Figure 36F

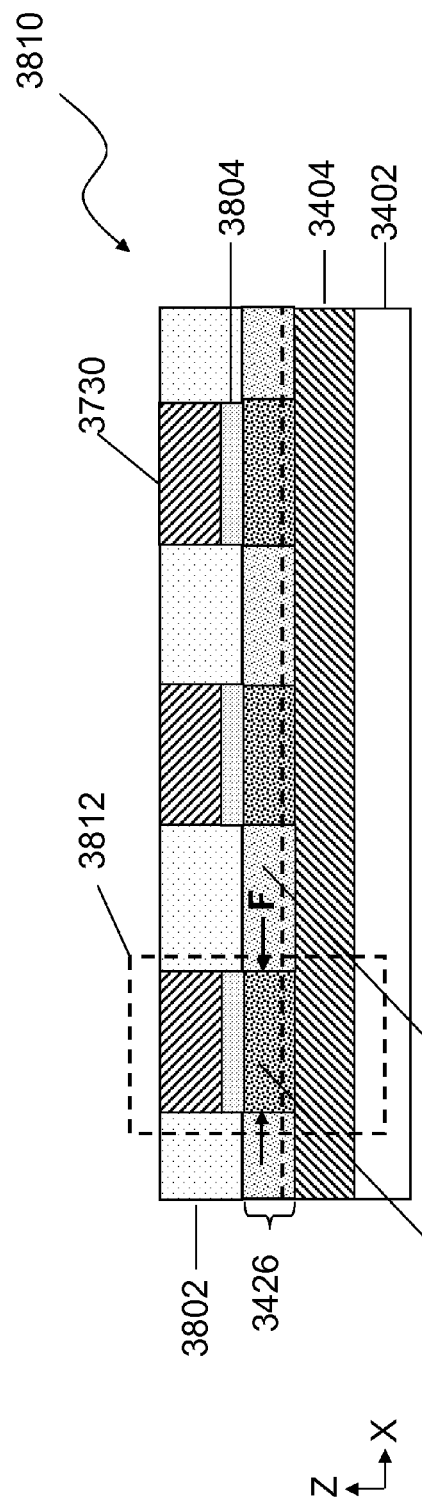
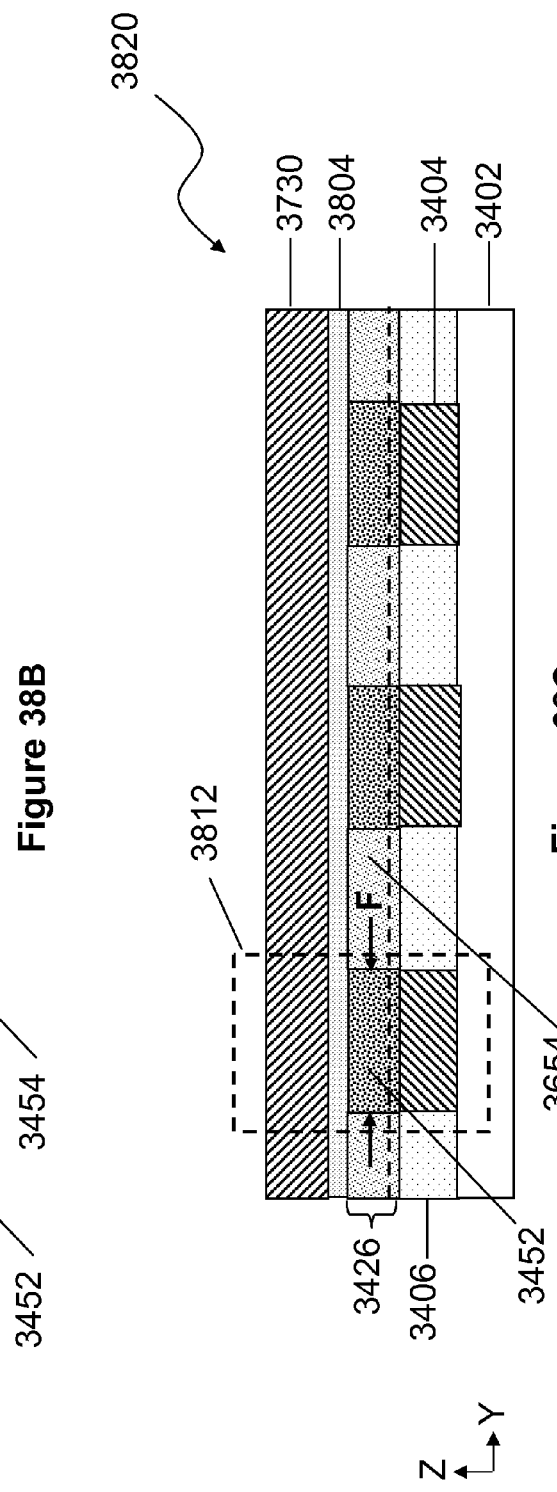

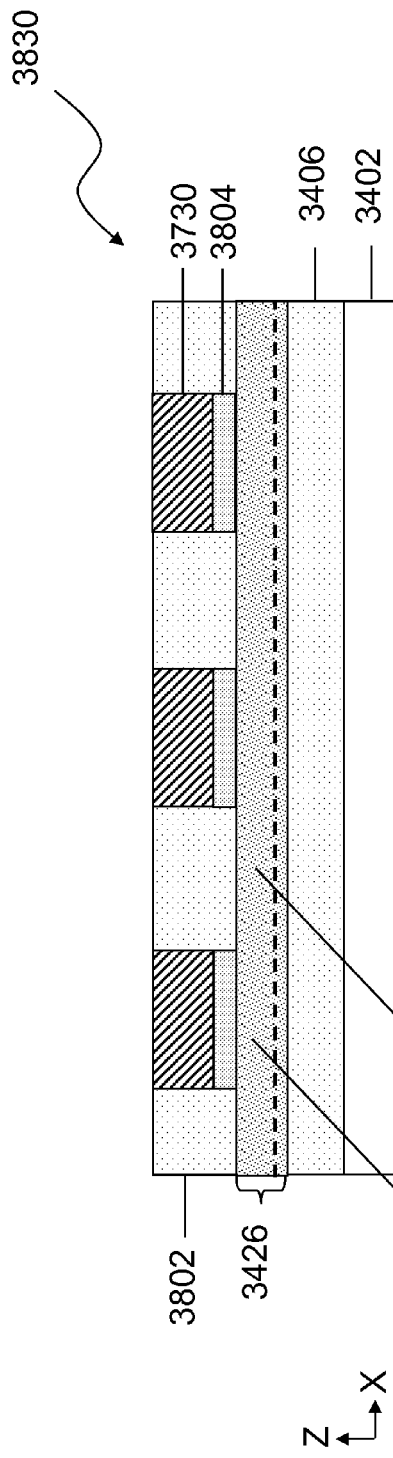
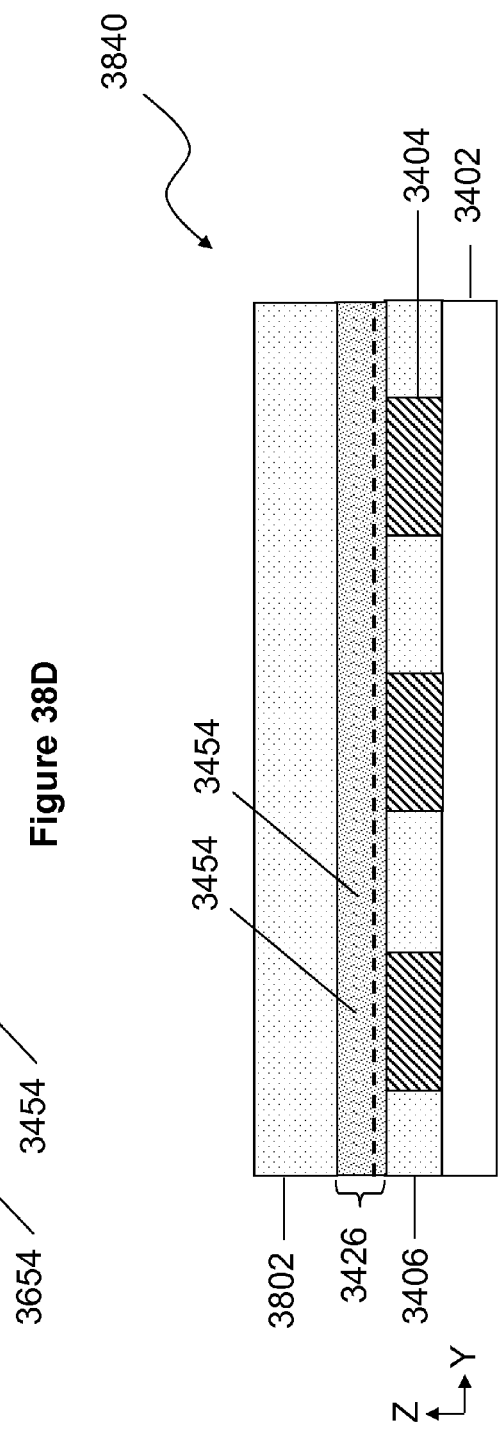
Figure 38D
Figure 38E

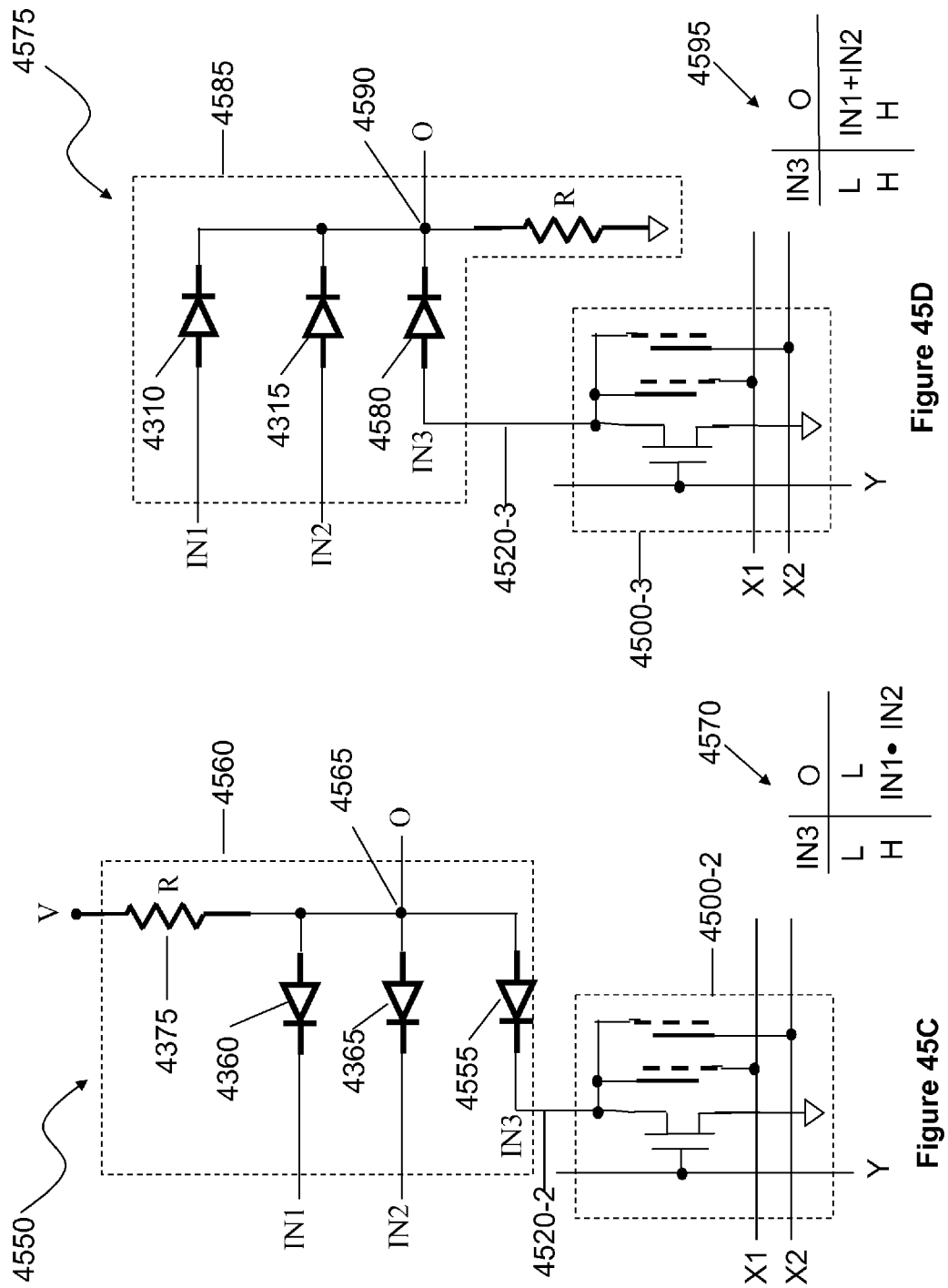

| Mode 1<br>WL >=0<br>BL 0 → $V_{SET}$<br>SL 0 → $V_{RST}$ | First Architecture<br>SL Parallel to BL<br>(Max. Write Voltages) | | | Second Architecture<br>SL Parallel to WL<br>(Max. Write Voltages) | | |
|---|---|---|---|---|---|---|
| | $\|V_{GS}\|$ | $\|V_{SD}\|$ | $\|V_{D\text{-}SUB}\|$ | $\|V_{GS}\|$ | $\|V_{SD}\|$ | $\|V_{D\text{-}SUB}\|$ |
| RANDOM RESET | $V_{RST}$ | $V_{RST}$ | $V_{RST}$ | $V_{RST}$ | $V_{RST}/2$ | $V_{RST}$ |
| RANDOM SET | $V_{SET}+\Delta V$ | $V_{SET}$ | $V_{SET}$ | $V_{SET}+\Delta V$ | $V_{SET}/2$ | $V_{SET}$ |
| SUB-BLOCK RESET | $V_{DD}$ | ≈ 0 | ≈ 0 | $V_{DD}$ | ≈ 0 | ≈ 0 |
| SUB-BLOCK SET | $\Delta V$ | ≈ 0 | $V_{SET}$ | $\Delta V$ | ≈ 0 | $V_{SET}$ |

Figure 53

| Mode 1A (Random Write Select) For: $V_{RST} = 3V$. $V_{SET} = 2V$. $\Delta V = 0.2V$. | First Architecture SL Parallel to BL (Max. Write Voltages) | | | Second Architecture SL Parallel to WL (Max. Write Voltages) | | |
|---|---|---|---|---|---|---|
| | $|V_{GS}|$ | $|V_{SD}|$ | $|V_{D-SUB}|$ | $|V_{GS}|$ | $|V_{SD}|$ | $|V_{D-SUB}|$ |
| RANDOM RESET | 3V. | 3V. | 3V. | 3V. | 1.5V. | 3V. |
| RANDOM SET | 2.2V. | 2V. | 2V. | 2.2 | 1V. | 2V. |
| SUB-BLOCK RESET | $V_{DD}$ | ≈ 0 | ≈ 0 | $V_{DD}$ | ≈ 0 | ≈ 0 |
| SUB-BLOCK SET | 0.2V. | ≈ 0 | 2V. | 0.2V. | ≈ 0 | 2V. |

(1) Random SET & RESET write modes require 3V. Select MOSFETs
(2) Random SET & RESET write modes require 3V. Select MOSFETs

Figure 54A

| Mode 1B (Mixed Random & Sub-Block Write Select) For: $V_{RST} = 3V.$ $V_{SET} = 2V.$ $\Delta V = 0.2V.$ | First Architecture SL Parallel to BL (Max. Write Voltages) | | | | Second Architecture SL Parallel to WL (Max. Write Voltages) | | | |
|---|---|---|---|---|---|---|---|---|
| | $|V_{GS}|$ | $|V_{SD}|$ | $|V_{D-SUB}|$ | | $|V_{GS}|$ | $|V_{SD}|$ | $|V_{D-SUB}|$ | |
| RANDOM RESET | 3V. | 3V. | 3V. | | 3V. | 1.5V. | 3V. | |
| RANDOM SET | 2.2V. | 2V. | 2V. | | 2.2 | 1V. | 2V. | (4) |
| SUB-BLOCK RESET (3) | $V_{DD}$ | ≈ 0 | ≈ 0 | | $V_{DD}$ | ≈ 0 | ≈ 0 | |
| SUB-BLOCK SET | 0.2V. | ≈ 0 | 2V. | | 0.2V. | ≈ 0 | 2V. | |

5450

(3) Random SET & Sub-Block RESET write modes require 2V. Select MOSFETs
(4) Operating in any combination of Write Modes requires a 2V. Select MOSFET; Random SET & Sub-Block RESET write modes may use 1.5V. Select MOSFETs for applications with lower reliability requirements

Figure 54B

| Mode 2<br>WL >=0<br>BL -$V_{SET}$/2 to +$V_{SET}$/2<br>SL -$V_{RST}$/2 to $V_{RST}$/2 | First Architecture<br>SL Parallel to BL<br>(Max. Write Voltages) | | | Second Architecture<br>SL Parallel to WL<br>(Max. Write Voltages) | | |
|---|---|---|---|---|---|---|
| | $|V_{GS}|$ | $|V_{SD}|$ | $|V_{D-SUB}|$ | $|V_{GS}|$ | $|V_{SD}|$ | $|V_{D-SUB}|$ |
| RANDOM RESET | $V_{RST}$/2 | $V_{RST}$ | $V_{RST}$/2 | $V_{RST}$/2 | $V_{RST}$/2 | $V_{RST}$/2 |
| RANDOM SET | $(V_{SET}+\Delta V)$/2 | $V_{SET}$ | $V_{SET}$/2 | $(V_{SET}+\Delta V)$/2 | $V_{SET}$/2 | $V_{SET}$/2 |
| SUB-BLOCK RESET | $V_{DD}$ | ≈ 0 | ≈ 0 | $V_{DD}$ | ≈ 0 | ≈ 0 |
| SUB-BLOCK SET | $\Delta V$/2 | ≈ 0 | $V_{SET}$/2 | $\Delta V$/2 | ≈ 0 | $V_{SET}$/2 |

Figure 55

| Mode 2A (Random Write Select) For: +-V_RST = 1.5V. +-V_SET = 1V. ΔV = 0.1V. | First Architecture SL Parallel to BL (Max. Write Voltages) | | | Second Architecture SL Parallel to WL (Max. Write Voltages) | | |
|---|---|---|---|---|---|---|
| | \|V_GS\| | \|V_SD\| | \|V_D-SUB\| | \|V_GS\| | \|V_SD\| | \|V_D-SUB\| |
| RANDOM RESET | 1.5V. | 3V. | 1.5V. | 1.5V. | 1.5V. | 1.5V. |
| RANDOM SET | 1.1V. | 2V. | 1V. | 1.1 | 1V. | 1.1V. |
| SUB-BLOCK RESET | V_DD | ≈ 0 | ≈ 0 | V_DD | ≈ 0 | ≈ 0 |
| SUB-BLOCK SET | 0.1V. | ≈ 0 | 1V. | 0.1V. | ≈ 0 | 1V. |

(5) Random SET & RESET write modes require 3V. Select MOSFETs
(6) Random SET & RESET write modes require 1.5V. Select MOSFETs

Figure 56A

| Mode 2B (Mixed Random & Sub-Block Write Select) For: +-V$_{RST}$ = 1.5V. +-V$_{SET}$ = 1V. ΔV = 0.1V. | First Architecture SL Parallel to BL (Max. Write Voltages) | | | Second Architecture SL Parallel to WL (Max. Write Voltages) | | |
|---|---|---|---|---|---|---|
| | \|V$_{GS}$\| | \|V$_{SD}$\| | \|V$_{D-SUB}$\| | \|V$_{GS}$\| | \|V$_{SD}$\| | \|V$_{D-SUB}$\| |
| RANDOM RESET | 1.5V. | 3V. | 1.5V. | 1.5V. | 1.5V. | 1.5V. |
| RANDOM SET (7) | 1.1V. | 2V. | 1V. | 1.1 | 1V. | 1.1V. |
| SUB-BLOCK RESET | V$_{DD}$ | ≈ 0 | ≈ 0 | V$_{DD}$ | ≈ 0 | ≈ 0 |
| SUB-BLOCK SET | 0.1V. | ≈ 0 | 1V. | 0.1V. | ≈ 0 | 1V. |

(7) Random SET & Sub-Block RESET write modes require 2V. Select MOSFETs
(8) Random SET & Sub-Block RESET write modes require 1V. Select MOSFETs

Figure 56B

| Cell Select MOSFET Voltage Requirement | First Architecture SL Parallel to BL (Max. Write Voltages) | Second Architecture SL Parallel to WL (Max. Write Voltages) |
|---|---|---|
| Mode 1A (Random Write Select) | 3V. MOSFET | 3V. MOSFET |
| Mode 1B (Mixed Random & Sub-Block Write Select) | 2V. MOSFET | 2V. MOSFET (May use 1.5V. MOSFET in some applications) |
| Mode 2A (Random Write Select) | 3V. MOSFET | 1.5V. MOSFET |
| Mode 2B (Mixed Random & Sub-Block Write Select) | 2V. MOSFET | 1V. MOSFET |

Figure 57

CARBON BASED NONVOLATILE CROSS POINT MEMORY INCORPORATING CARBON BASED DIODE SELECT DEVICES AND MOSFET SELECT DEVICES FOR MEMORY AND LOGIC APPLICATIONS

TECHNICAL FIELD

The present disclosure generally relates to carbon based nonvolatile cross point memory cells using carbon nanotubes, and other carbon allotropes, in corresponding memory arrays. It also relates to carbon based diode select devices formed using carbon nanotubes and other carbon allotropes, carbon based diodes formed as part of cross point memory cells, and carbon based diodes for use with any type of electronic device. It also relates to voltage scaled MOSFET select devices.

CROSS-REFERENCE TO RELATED APPLICATIONS

This application is related to the following U.S. patents, which are assigned to the assignee of the present application, and are hereby incorporated by reference in their entirety:
  U.S. Pat. No. 6,574,130, filed Jul. 25, 2001, entitled "Hybrid Circuit Having Nanotube Electromechanical Memory;"
  U.S. Pat. No. 6,643,165, filed Jul. 25, 2001, entitled "Electromechanical Memory Having Cell Selection Circuitry Constructed with Nanotube Technology;"
  U.S. Pat. No. 6,706,402, filed Apr. 23, 2002, entitled "Nanotube Films and Articles;"
  U.S. Pat. No. 6,784,028, filed Dec. 28, 2001, entitled "Methods of Making Electromechanical Three-Trace Junction Devices;"
  U.S. Pat. No. 6,835,591, filed Dec. 28, 2001, entitled "Methods of Making Electromechanical Three-Trace Junction Devices;"
  U.S. Pat. No. 6,911,682, filed Dec. 28, 2001, entitled "Electromechanical Three-Trace Junction Devices;"
  U.S. Pat. No. 6,919,592, filed Jul. 25, 2001, entitled "Electromechanical Memory Array Using Nanotube Ribbons and Method for Making Same;"
  U.S. Pat. No. 6,924,538, filed Feb. 11, 2004, entitled "Devices Having Vertically-Disposed Nanofabric Articles and Methods of Making the Same;"
  U.S. Pat. No. 7,259,410, filed Feb. 11, 2004, entitled "Devices Having Horizontally-Disposed Nanofabric Articles and Methods of Making the Same;"
  U.S. Pat. No. 7,335,395, filed Jan. 13, 2003, entitled "Methods of Using Pre-Formed Nanotubes to Make Carbon Nanotube Films, Layers, Fabrics, Ribbons, Elements and Articles;"
  U.S. Pat. No. 7,375,369, filed Jun. 3, 2004, entitled "Spin-Coatable Liquid for Formation of High Purity Nanotube Films;"
  U.S. Pat. No. 7,560,136, filed Jan. 13, 2003, entitled "Methods of Using Thin Metal Layers to Make Carbon Nanotube Films, Layers, Fabrics, Ribbons, Elements And Articles;"
  U.S. Pat. No. 7,566,478, filed Jan. 13, 2003, entitled "Methods of Making Carbon Nanotube Films, Layers, Fabrics, Ribbons, Elements And Articles;"
  U.S. Pat. No. 7,666,382, filed Dec. 15, 2005, entitled "Aqueous Carbon Nanotube Applicator Liquids and Methods for Producing Applicator Liquids Thereof;"
  U.S. Pat. No. 7,745,810, filed Feb. 9, 2004, entitled "Nanotube Films and Articles;"
  U.S. Pat. No. 7,835,170, filed Aug. 8, 2007, entitled "Memory Elements and Cross Point Switches and Arrays of Same Using Nonvolatile Nanotube Blocks;"
  U.S. Pat. No. 7,839,615, filed Jul. 27, 2009, entitled "Nanotube ESD Protective Devices and Corresponding Nonvolatile and Volatile Nanotube Switches;"
  U.S. Pat. No. 7,852,114, filed Aug. 6, 2009, entitled "Nonvolatile Nanotube Programmable Logic Devices and a Nonvolatile Nanotube Field Programmable Gate Array Using Same;"
  U.S. Pat. No. 7,928,523, filed Jul. 30, 2009, entitled "Nonvolatile Electromechanical Field Effect Devices and Circuits Using Same and Methods of Forming Same;"
  U.S. Pat. No. 8,102,018, filed Aug. 8, 2007, entitled "Nonvolatile Resistive Memories Having Scalable Two-Terminal Nanotube Switches;"
  U.S. Pat. No. 7,365,632, filed Sep. 20, 2005, entitled "Resistive Elements using Carbon Nanotubes";

This application is related to the following U.S. patent applications, which are assigned to the assignee of the present application, and are hereby incorporated by reference in their entirety:
  U.S. patent application Ser. No. 11/835,852, filed Aug. 8, 2008, entitled "Nonvolatile Nanotube Diodes and Arrays," now U.S. Patent Pub. No. 2008/0160734;
  U.S. Patent App. No. 61/304,045, filed Feb. 12, 2012, entitled "Methods for Controlling Density, Porosity, and/or Gap Size within Nanotube Fabric Layers and Films;"
  U.S. patent application Ser. No. 11/398,126, filed Apr. 5, 2005, entitled "Nanotube Articles with Adjustable Electrical Conductivity and Methods of Making the Same," now U.S. Patent Pub. No. 2006/0276065;
  U.S. patent application Ser. No. 12/136,624, filed Jun. 10, 2008, entitled "Carbon Nanotube Films, Layers, Fabrics, Ribbons, Elements and Articles," now U.S. Patent Pub. No. 2009/0087630;
  U.S. patent application Ser. No. 12/618,448, filed Nov. 13, 2009, entitled "A Method for Resetting a Resistive Change Memory Element," now U.S. Patent Pub. No. 2011/0038195;
  U.S. patent application Ser. No. 13/076,152, filed Mar. 30, 2011, entitled "Methods for Arranging Nanotube Elements within Nanotube Fabric and Films;"
  U.S. patent application Ser. No. 12/874,501, filed Sep. 2, 2010, entitled "Methods for Adjusting the Conductivity Range of a Nanotube Fabric Layer;"
  U.S. patent application Ser. No. 12/356,447, filed Jan. 20, 2009, entitled "Enhanced Memory Arrays and Programmable Logic Circuit Operation and Manufacturability Using NV NT Switches with Carbon Contacts and CNTs;"
  U.S. patent application Ser. No. 12/066,053, filed Mar. 6, 2008, entitled "Method and System of Using Nanotube Fabrics as Joule Heating Elements for Memories and Other Applications," now U.S. Patent Pub. No. 2010/0327247;
  U.S. Patent App. No. 61/074,241, filed on Jun. 20, 2008, entitled "NRAM Arrays with Nanotube Blocks, Nanotube Traces, and Nanotube Planes and Methods of Making Same", now U.S. Patent Pub. No. 2010/0001267;
  U.S. Patent App. No. 61/319,034, filed on Mar. 30, 2010, entitled "Methods of Reducing Gaps and Voids within Nanotube Fabric Layers and Films."

BACKGROUND OF THE INVENTION

A memory device is used by electronic devices to store data. Data stored in a memory device are represented by binary digit (bit) patterns formed from single bits, where each single bit has typically two possible values: a logic 0 and a logic 1. The memory device stores the bit patterns in memory elements that have different states corresponding to different possible values. For example, a two-state memory element having a first state corresponding to a logic 0 and a second state corresponding to a logic 1 can store a single bit. Some memory devices are capable of storing more than two states, e.g., a four-state memory element having a first state corresponding to a logic 00, a second state corresponding to a logic 01, a third state corresponding to a logic 10, and a fourth state corresponding to a logic 11 can store two bits. In general, an n-state memory element can store $\log_2 n$ bits, where $\log_2 n$ refers to the binary logarithm of n.

The marketplace demand for low cost memory devices at lower costs with data storage capacities has spurred the creation of memory devices with increased memory densities. The traditional way of measuring memory density is the number of bits stored per square millimeter of layout area consumed (bits/mm$^2$). Therefore, the memory density of a memory device can be increased by: reducing the feature sizes of memory elements to consume less layout area, and increasing the number of bits memory elements can store. Vertically stacking memory layers to form a three-dimensional memory structure does not substantially increase the size of the memory device or layout area because the vertical dimension remains relatively small. Thus, bits/mm$^2$ remains a valid way of measuring memory density. Two memory layers doubles the memory density resulting in doubling the memory functionality in the approximately same layout area.

Resistive change memory is a technology well suited to meet the marketplace demand for low cost memory devices with higher data storage capacities. A resistive change memory device has resistive change memory elements that are scalable to very high densities, incur very low fabrication costs, store nonvolatile memory states, and consume very little power. Typically, the resistive change memory device stores data by adjusting the state of resistive change memory elements through adjusting the state of a state-adjustable material between a number of nonvolatile resistive states in response to applied stimuli. For example, a two-state resistive change memory element can be configured to switch between a first resistive state (e.g., a high resistive state) that corresponds to a logic 0 and a second resistive state (e.g., a low resistive state) that corresponds to a logic 1. Using these two resistive states, the two-state resistive change memory element can store a single bit. Similarly, a four-state resistive change memory element can be configured to switch between a first resistive state (e.g., a very high resistive state) that corresponds to a logic 00, a second resistive state (e.g., a moderately high resistive state) that corresponds to a logic 01, a third resistive state (e.g., a moderately low resistive state) that corresponds to a logic 10, and a fourth resistive state (e.g., a very low resistive state) that corresponds to a logic 11. Using these four resistive states, the four-state resistive change memory element can store two bits.

The electrically programmable read-only memory (EPROM) device disclosed by Roesner in U.S. Pat. No. 4,442,507 is a type of resistive change memory having two-state resistive change memory elements with the two-state resistive change memory elements having resistive materials in a series connection with Schottky diodes. The EPROM device stores data in the two-state resistive change memory elements by adjusting a resistance state of the resistive materials. Prior art FIG. 1 generally corresponds to FIG. 11 of U.S. Pat. No. 4,442,507 and prior art FIG. 1 illustrates a two-state resistive change memory element 10 formed by a resistive material 50 in a series connection with a Schottky diode 52. The resistive material 50 consists essentially of a single element semiconductor selected from the group of Si, Ge, C, and α-Sn, and is deposited as a layer of 2,000 Å thickness. The resistive material 50 has a high resistance state on the order of $10^7$ ohms before an electrical stimulus is applied and a low resistance state on the order of $10^2$ ohms after the electrical stimulus is applied.

During a write operation the EPROM device adjusts the resistance state of the two-state resistive change memory element 10 by supplying an electrical stimulus in the form of a programming voltage above a desired threshold voltage to the two-state resistive change memory element 10. The application of the programming voltage causes the resistive material 50 to irreversibly switch from the high resistance state to the low resistance state. During a read operation the EPROM device senses the resistance state of the two-state resistive change memory element 10 by supplying a preselected voltage and current to the two-state resistive change memory element 10. The preselected voltage is limited to a preselected value below the desired threshold voltage for switching the resistance state of the resistive material 50 and the resulting current are limited to below a preselected value. The high resistance state and the low resistance state of the resistive material 50 produce different voltages across and different currents flowing through the two-state resistive change memory element 10 in response to the EPROM device supplying the preselected voltage and current. Roesner provides the exemplary voltage across and current flowing through the two-state resistive change memory element 10 with the resistive material 50 in the high resistance state of 5 V and 0.2 μA respectively, and the exemplary voltage across and the current flowing through the two-state resistive change memory element 10 with the resistive material 50 in the low resistance state of 0.25 V and 50 μA respectively. The different voltages and currents sensed by the EPROM device are interpreted as data stored in the two-state resistive change memory element 10. Additionally, the resistive change memory element 10 is non-volatile because power is not required to maintain the different resistance states of the resistive material 50, and thus, the data is retained in the two-state resistive change memory element 10 when power is removed.

In operation, the EPROM device disclosed by Roesner is formed with a Schottky diode and a nonvolatile programmable resistor in a relatively high resistance initial state as fabricated. Decode circuits and Schottky diodes in each cell may be used to selectively cause nonvolatile programmable resistor values to transition to a relatively low resistance permanent state. That is, the EPROM-EROM is a one-time-programmable (OTP) memory. After the programming operation is completed, the EPROM device operates as a read-only memory.

The two-state resistive change memory element 10 illustrated in prior art FIG. 1 is fabricated on an insulating layer 12 of SiO$_2$ that is deposited over a semiconductor substrate 11 containing circuitry for the EPROM device. The insulating layer 12 is 7,000 Å-10,000 Å thick to smooth out surface 12a and also to minimize any capacitances between the two-state resistive change memory element 10 and the underlying circuitry for the EPROM device. The two-state resistive change memory element 10 is constructed from a semiconductor lead 14, an insulator 16, the Schottky diode 52, the resistive material 50, and a metal lead 20.

The semiconductor lead 14 has a polycrystalline layer of N+ semiconductor material deposited on the surface 12a of the insulating layer 12 and a polycrystalline layer of N− semiconductor material deposited on the polycrystalline layer of N+ semiconductor material. The polycrystalline layer of N+ semiconductor material and the polycrystalline layer of N− semiconductor material are fabricated by depositing either silicon or germanium and then doping the silicon or the germanium in-situ. The polycrystalline layer of N+ semiconductor material has a dopant atom concentration of at least $10^{20}$ atoms/cm$^3$ and the polycrystalline layer of N− semiconductor material has a dopant atom concentration of $10^{14}$-$10^{17}$ atoms/cm$^3$ with arsenic, phosphorous, and antimony being suitable dopant impurity atoms for both polycrystalline layers. The insulator 16 is then formed by depositing a layer of $SiO_2$ over the surface 12a and the semiconductor lead 14 with subsequent masking and etching of the insulator 16 to form a contact hole over the semiconductor lead 14. Thereafter, the semiconductor lead 14 and the insulator 16 are annealed at 900° C. to increase the crystalline grain size of both polycrystalline layers in semiconductor lead 14 and to move the dopant atoms from interstitial to substitutional positions in the lattice network of both polycrystalline layers in the semiconductor lead 14.

The Schottky diode 52 has a cathode formed by the polycrystalline layer of N-semiconductor material of the semiconductor lead 14 and an anode formed by a platinum compound (e.g. platinum silicide) 18. The Schottky diode 52 is fabricated by depositing a layer of platinum on the exposed portion of the polycrystalline layer of N− semiconductor material and heating the layer of platinum to 450° C. to form the platinum compound (e.g. platinum silicide) 18 with the polycrystalline layer of N− semiconductor material. The resistive material 50 is then deposited on the platinum compound with special care taken throughout the fabrication process to prevent the resistive material 50 from being exposed to temperatures greater than 600° C. This temperature constraint is imposed on the fabrication process to ensure that the crystalline grain size of the resistive material 50 is substantially smaller than the crystalline grain size of the polycrystalline layer of N-semiconductor material of the semiconductor lead 14 and also to ensure that any dopant atoms in the resistive material 50 are interstitial in the lattice instead of substitutional. Additionally, the amount of current required for resistive material 50 to switch resistance states is dependent on the maximum temperature that the resistive material 50 is exposed to with the amount of current required for the resistive material 50 to switch resistance states increasing in a highly nonlinear manner as the maximum temperature increases. Roesner provides the example of when the resistive material 50 is processed at a maximum temperature of 600° C. the resistive material 50 might require only 10 μA to switch resistive states and when the resistive material 50 is processed at a maximum temperature of 750° C. the resistive material 50 might require several milliamps to switch resistance states.

The metal lead 20 has a bottom layer 22 formed by a barrier metal and a top layer 24 formed by a conductive metal. The barrier metal prevents the conductive metal from migrating into the resistive material 50. The metal lead 20 is fabricated by depositing the bottom layer 22 of titanium tungsten on the resistive material 50 and the top layer 24 of aluminum on the bottom layer of titanium tungsten.

SUMMARY OF THE DISCLOSURE

The present disclosure relates to carbon based nonvolatile cross point memory incorporating carbon based diode select devices and MOSFET select devices for memory and logic applications.

In particular, the present disclosure discloses a diode. In particular, the diode comprises a first carbon layer and a second carbon layer in electrical communication with the first carbon layer, wherein the first carbon layer and the second carbon layer are configured to create a conductive path when sufficient voltage is applied. Under one aspect of the present disclosure, at least one of the first carbon layer and the second carbon layer is a nanotube fabric layer. Under another aspect of the present disclosure, at least one of the first carbon layer and the second carbon layer is a graphitic layer. Under yet another aspect of the present disclosure, at least one of the first carbon layer and the second carbon layer is a buckyball layer.

The present disclosure also discloses a resistive change element. In particular, the resistive change element comprises a nonvolatile resistive block switch, wherein the nonvolatile resistive block switch comprises a first metal layer and a switch carbon layer in electrical communication with the first metal layer. The resistive change element further comprises a diode in a series connection with the nonvolatile resistive block switch, wherein the diode comprises a first diode carbon layer and a second diode carbon layer in electrical communication with the first diode carbon layer, wherein the first diode carbon layer and the second diode carbon layer are configured to create a conductive path when sufficient voltage is applied. Under one aspect of the present disclosure, the switch carbon layer is at least one of a switch nanotube fabric layer, a switch graphitic layer, and a switch buckyball layer. Under another aspect of the present disclosure, the diode carbon layer is at least one of a diode nanotube fabric layer, a diode graphitic fabric layer, and a diode buckyball layer. Under yet another aspect of the present disclosure, the resistive change element is a resistive change memory element. Under still yet another aspect of the present disclosure, the resistive change element is a resistive change logic element.

The present disclosure also discloses a vertical resistive change array. In particular, the vertical resistive change array comprises vertical column element and at least one storage bit plane, wherein at least one storage bit plane comprises at least one resistive change element, in electrical communication the vertical column element. Under one aspect of the present disclosure, the resistive change element comprises at least a carbon layer and said carbon layer is at least one of a nanotube fabric layer, a graphitic layer, and a buckyball layer. Under another aspect of the present disclosure, the resistive change element is a resistive change memory element. Under yet another aspect of the present disclosure, the resistive change element is a resistive change logic element.

Other features and advantages of the present disclosure will become apparent from the description and drawings provided below.

BRIEF DESCRIPTION OF THE DRAWINGS

In the drawings,

FIG. 1, prior art, illustrates a two-state resistive change memory element formed by a resistive material in a series connection with a Schottky diode.

FIGS. 1B-1, 1B-2, and 1B-3 illustrate a two-terminal cross point array;

FIG. 4D illustrates ion implantation of a nanotube fabric layer with an angle of incidence of ion beams being a direct angle;

FIG. 4E illustrates ion implantation of a nanotube fabric layer with an angle of incidence of ion beams being greater than zero degrees;

FIG. 5E illustrates a carbon based diode configured as a Schottky diode having a conductive layer electrically contacting a p-type diode graphitic layer;

FIG. 5F illustrates a carbon based diode configured as a Schottky diode having a conductive layer electrically contacting an n-type diode graphitic layer;

FIG. 5G illustrates a carbon based diode configured as a pn junction diode having a p-type diode graphitic layer electrically contacting an n-type diode graphitic layer;

FIG. 6A illustrates a resistive change memory element formed by a nonvolatile CNT resistive block switch, an interposed conductive layer, and a carbon based diode configured as a Schottky diode having a conductive layer electrically contacting a diode buckyball layer;

FIG. 6B illustrates an alternative embodiment of a resistive change memory element formed by a nonvolatile CNT resistive block switch and a carbon based diode configured as a Schottky diode having a conductive layer electrically contacting a diode buckyball layer;

FIG. 6C illustrates a resistive change memory element formed by a nonvolatile buckyball resistive block switch, an interposed conductive layer, and a carbon based diode configured as a Schottky diode having a conductive layer electrically contacting a diode buckyball layer;

FIG. 6D illustrates an alternative embodiment of a resistive change memory element formed by a nonvolatile buckyball resistive block switch and a carbon based diode configured as a Schottky diode having a conductive layer electrically contacting a diode buckyball layer;

FIG. 6E illustrates a carbon based diode configured as a Schottky diode having a conductive layer electrically contacting a p-type diode buckyball layer;

FIG. 6F illustrates a carbon based diode configured as a Schottky diode having a conductive layer electrically contacting an n-type diode buckyball layer;

FIG. 6G illustrates a carbon based diode configured as a pn junction diode having a p-type diode buckyball layer electrically contacting an n-type diode buckyball layer;

FIGS. 17A-17I illustrates cross sections corresponding to the methods of fabrication of FIGS. 16A and 16B

FIGS. 23A, 23B, and 23C illustrate a cross point array formed with a cell having enhanced select characteristics, referred to as enhanced selectivity resistive 1-RS cells;

FIGS. 27A, 27B, 28A, 28B, 29 and 30 illustrate the application of the structures and corresponding methods of fabrication described with respect to FIGS. 24-26 using top contacts as masks for exposing non-protected CNT fabric regions to plasma or ion implantation to form cross point arrays with nonconductive or high resistance CNT fabrics to isolate cells in cross point arrays;

FIG. 31 illustrates the use of conductive and nonconductive graphitic layers using top contacts as masks to form cross point arrays with nonconductive or high-resistance graphitic layers to isolate cells in cross point arrays; and FIG. 32 illustrates the use of conductive and nonconductive buckyball layers using top contacts as masks to form cross point arrays with nonconductive or high-resistance buckyball layers to isolate cells in cross point arrays.

FIGS. 34A, 34B illustrate a plan view and cross section, respectively, of bottom array wires embedded in dielectric on a substrate;

FIG. 34C illustrates a plan view of top array wires on a contact layer. The contact layer is deposited on a CNT fabric layer;

FIG. 34D-1 illustrates a cross section, corresponding to FIG. 34C, including a CNT fabric layer on the surface of FIG. 34B with a top array wires formed on a contact layer between the top array wires and the CNT fabric layer;

FIG. 34D-2 illustrates a cross section similar to FIG. 34D-1, except that the CNT fabric layer includes a switch nanotube fabric layer integrated with a diode nanotube fabric layer;

FIG. 34D-3 illustrates a cross section showing a variation of the CNT fabric layer shown in FIG. 34D-2;

FIG. 34E illustrates a cross section that shows a first ion implant between top array wires that penetrates through the exposed contact layer into the CNT fabric layer. Prior to ion implantation, the entire CNT fabric layer is a CNT switching region. The first ion implant changes the CNT fabric region between top array wires into high-resistance isolation regions self-aligned to top array wires;

FIG. 34F illustrates a cross section corresponding to FIG. 34E that shows the CNT fabric region after the first ion implant step. CNT fabric regions under the top array wires remain CNT switching regions, while CNT fabric regions between top array wires are converted to high-resistance isolation regions;

FIG. 36A illustrates a cross section of a second ion implant applied to the cross section shown in FIG. 35C;

FIG. 36B illustrates the cross section of FIG. 35C after the second ion implant step, and shows that the ion implant was blocked from CNT fabric layer, leaving CNT switching regions unchanged;

FIG. 36C illustrates a cross section of a second ion implant applied to the cross section shown in FIG. 35D;

FIG. 36D illustrates the cross section of FIG. 35D after the second ion implant step has converted exposed CNT fabric regions to high-resistance isolation regions;

FIG. 36E illustrates a cross section of a second ion implant applied to the cross section shown in FIG. 35E;

FIG. 36F illustrates the cross section of FIG. 35E after the second ion implant step has converted exposed CNT fabric regions to high-resistance isolation regions;

FIG. 38B illustrates a cross section of FIG. 38A through the entire structure and through a bottom array wire. The cross section shows integrated nonvolatile CNT resistive blocks switches with CNT switching regions of minimum dimension F, defined by the intersection of array wires, along the length of the underlying bottom array wire and high-resistance isolation regions between the switches;

FIG. 38C illustrates a cross section of FIG. 38A through the entire structure and through a top array wire. The cross section shows integrated nonvolatile CNT resistive blocks switches with CNT switching regions of minimum dimension F, defined by the intersection of array wires, along the length of the overlying top array wire with high-resistance isolation regions between the switches;

FIG. 38D illustrates a cross section of FIG. 38A orthogonal to top array wires between CNT switching regions showing high-resistance isolation regions in the CNT fabric layer between the top array wires;

FIG. 38E illustrates a cross section of FIG. 38A orthogonal to bottom array wires between CNT switching regions showing high-resistance isolation regions in the CNT fabric layer between the bottom array wires;

FIGS. 45A, 45B, 45C, and 45D illustrate various configurable routing and logic circuits;

FIGS. 53, 54A, and 54B tables summarize first and second architecture operating conditions for mode 1;

FIGS. 55, 56A, and 56B tables summarize first and second architecture operating conditions for mode 2;

FIG. 57 table summarizes MOSFET scaled voltage requirements as a function of first and second architectures and operating modes 1 and 2.

DETAILED DESCRIPTION

NRAM and Cross Point Memory Cells

The present disclosure is generally directed toward nonvolatile resistive change memory cells (or elements) forming 1-R memory cells in a cross point cell configuration, approximately $4F^2$ in area, with cell select and nonvolatile storage functions combined in a single element. Nonvolatile resistive change memory elements using carbon layers as storage elements can form cross point nonvolatile resistive memory elements. In the present disclosure, the term carbon layer is defined as any allotrope of carbon, excluding amorphous carbon.

To elaborate further, a carbon layer as referred to herein for the present disclosure includes a layer of multiple, interconnected carbon structures (such as, but not limited to, carbon nanotubes, graphite, buckyballs, and nanocapsules) formed in a layer such as to provide at least one electrically conductive path through the layer. The carbon layer can be, for example, a nanotube fabric (as described in detail below). Further, in another example, this carbon layer can be one or more sheets of graphene (or graphitic layer). In yet another example, the carbon layer can be a deposition of carbon fullerenes (such as, but not limited to, carbon buckyballs or elongated nanocapsules).

In the present disclosure, carbon layers can be used to form diode carbon layers, such as, for example, diode nanotube fabric layers, diode graphitic layers, or diode buckyball layers. In the present disclosure, the term diode nanotube fabric layer refers to one or more nanotube fabric layers acting as, or as part of, a diode (as described in detail below). For example, a nanotube fabric layer in contact with a metal layer to form a Schottky diode. Or, for example, a p-type nanotube fabric layer in contact with an n-type nanotube fabric layer to form a pn diode. The term diode graphitic layer refers to one or more graphitic layers acting as, or as part of, a diode (as described in detail below). The term diode buckyball layer refers to one or more buckyball layers acting as, or as part of, a diode (as described in detail below).

In certain applications this carbon layer is patterned (via, for example, photolithography and etch) such that the layer of multiple, interconnected carbon structures conforms to a preselected geometry. Further, the carbon layer can be deposited or formed (via, for example, a spin coating operation of the individual structures) to have a preselected thickness, density, and/or porosity. The carbon layer can be ordered (wherein the individual carbon structures are substantially oriented in a uniform direction) or unordered (wherein the individual carbon structures are oriented independently of adjacent structures).

Figure 13A:
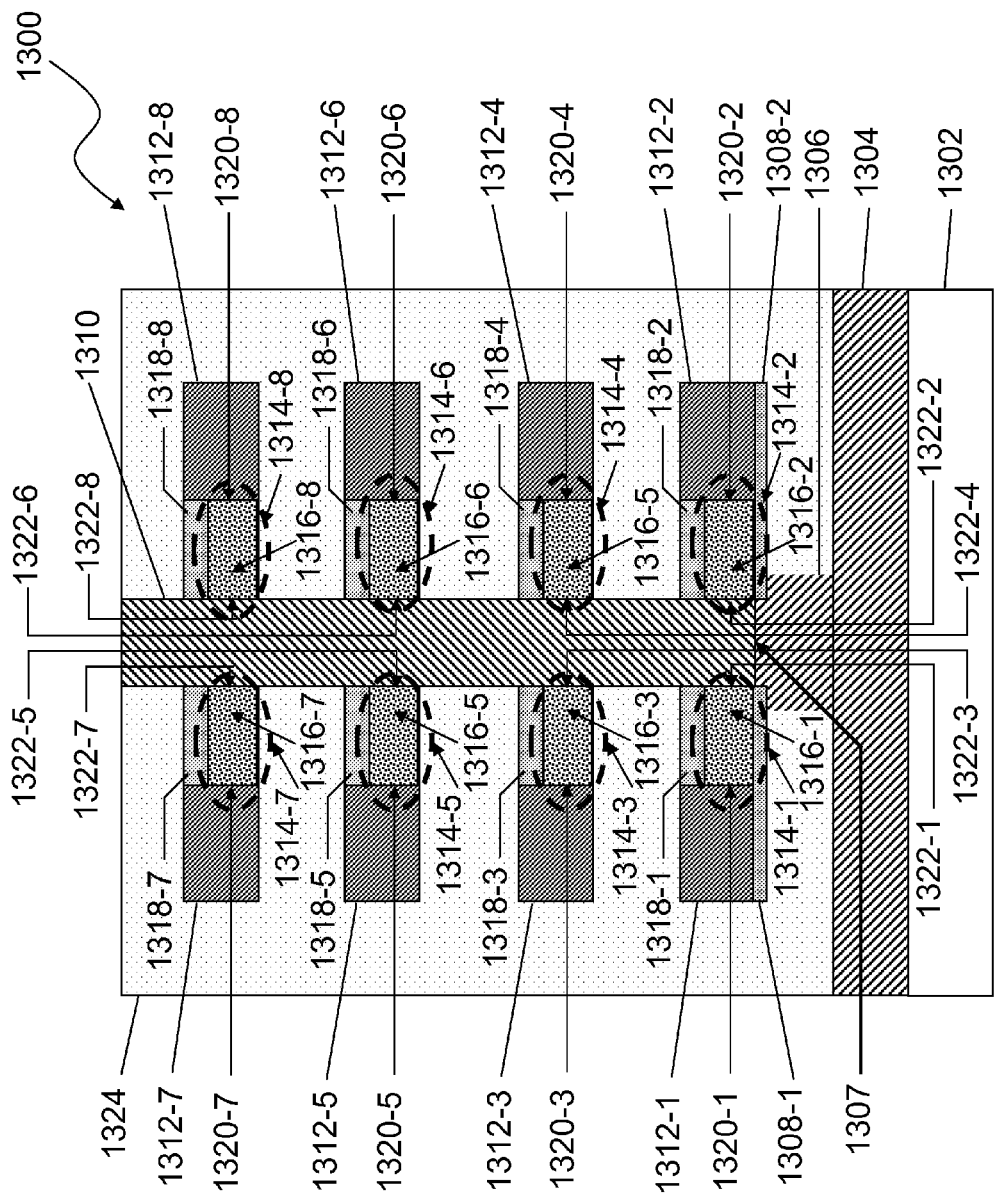
FIGS. 13A, 13B, 13C, 13D, and 13E illustrate a cross point memory array with vertical columns of array line segments.

Carbon layers can be patterned into structures referred to as blocks in the present disclosure. For example, FIG. 1C shows a NV CNT resistive change memory cell formed with a switch nanotube block and top and bottom conductive terminals. In another example, FIG. 13A shows a NV CNT resistive change memory cell formed with a switch nanotube block and end contacts to conductive terminals (in this example, array lines). In at least one embodiment, this block is a nanotube fabric block.

Relatively high ON-state ($R_{ON}$) minimum resistance values, in the mega-Ohm range for example, and OFF-state resistance ($R_{OFF}$) to ON-state resistance ratios $R_{OFF}/R_{ON}$ in excess of 2, are needed to achieve arrays of sufficient size as described in J. Liang et al., "Cross-Point Memory Array Without Cell Selectors—Device Characteristics and Data Storage Pattern Dependencies", IEEE Transactions on Electron Devices, Vol. 57, No. 10, October 2010. In summary, 1-R memory cells in a cross point cell configuration require high $R_{ON}$ values and a high degree of nonlinearity when comparing $R_{ON}$ and $R_{OFF}$ values to exhibit sufficient select and non-volatile storage element behavior.

A fabric of nanotubes as referred to herein for the present disclosure includes a layer of multiple, interconnected carbon nanotubes. A fabric of nanotubes (or nanofabric), in the present disclosure, e.g., a non-woven carbon nanotube (CNT) fabric, may, for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Such larger scale positional regularity is of particular interest to the present disclosure.

The fabrics of nanotubes retain desirable physical properties of the nanotubes from which they are formed. For example, in some electrical applications the fabric preferably has a sufficient amount of nanotubes in contact so that at least one ohmic (metallic) or semi-conductive pathway exists from a given point within the fabric to another point within the fabric. Single wall nanotubes may typically have a diameter of about 1-3 nm, and multi-wall nanotubes may typically have a diameter of about 3-30 nm. Nanotubes may have lengths ranging from about 0.2 microns to about 200 microns, for example. The nanotubes may curve and occasionally cross one another. Gaps in the fabric, i.e., between nanotubes either laterally or vertically, may exist. Such fabrics may include single wall nanotubes, multi-wall nanotubes, or both. The fabric may have small areas of discontinuity with no tubes present. The fabric may be prepared as a layer or as multiple fabric layers, one formed over another. The thickness of the fabric can be chosen as thin as substantially a monolayer of nanotubes or can be chosen much thicker, e.g., tens of nanometers to tens of microns in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example. Other methods for generating such fabrics may involve using spin-coating techniques and spray-coating techniques with preformed nanotubes suspended in a suitable solvent, silk screen printing, gravure printing, and electrostatic spray coating. Nanoparticles of other materials can be mixed with suspensions of nanotubes in such solvents and deposited by spin coating and spray coating to form fabrics with nanoparticles dispersed among the nanotubes. Such exemplary methods are described in more detail in the related art cited in the Background section of this disclosure.

As described within U.S. Pat. No. 7,375,369 and U.S. Pat. No. 7,666,382, both incorporated herein by reference in their entirety, nanotube fabrics and films can be formed by applying a nanotube application solution (for example, but not limited to, a plurality of nanotube elements suspended within an aqueous solution) over a substrate element. A spin coating process, for example, can be used to evenly distribute the nanotube elements over the substrate element, creating a substantially uniform layer of nanotube elements. In other cases, other processes (such as, but not limited to, spray coating processes, dip coating processes, silk screen printing processes, and gravure printing processes) can be used to apply and distribute the nanotube elements over the substrate element. In other cases, CVD growth of nanotubes on a material surface may be used to realize an unordered nanotube fabric layer. Further, U.S. Patent App. No. 61/304,045, incorporated herein by reference in its entirety, teaches methods of adjusting certain parameters (for example, the nanotube density or the concentrations of certain ionic species) within nanotube application solutions to either promote or discourage rafting—that is, the tendency for nanotube elements to group together along their sidewalls and form dense, raft-like structures—within a nanotube fabric layer formed with such a solution. By increasing the incidence of rafting within nanotube fabric layers, the density of such fabric layers can be increased, reducing both the number and size of voids and gaps within such fabric layers.

It should be noted that nanotube elements used and referenced within the embodiments of the present disclosure may be single wall nanotubes, multi-wall nanotubes, or mixtures thereof and may be of varying lengths. Further, the nanotubes may be conductive, semiconductive, or combinations thereof. Further, the nanotubes may be functionalized (for example, by oxidation with nitric acid resulting in alcohol, aldehydic, ketonic, or carboxylic moieties attached to the nanotubes), or they may be non-functionalized.

Nanotube elements may be functionalized for a plurality of reasons. For example, certain moieties may be formed on the sidewalls of nanotube elements to add in the dispersion of those elements within an application solution. In another example, certain moieties formed on the sidewalls of nanotube elements can aid in the efficient formation of a nanotube fabric. In a further example, nanotube elements can be functionalized with certain moieties such as to electrically insulate the sidewalls of the nanotube elements. Nanotube elements can be functionalized by attaching organic, silica, or metallic moieties (or some combination thereof) to the sidewalls of the nanotube elements. Such moieties can interact with nanotube elements covalently or remain affixed through π-π bonding.

While this discussion has been focused on memory, these methods can also be used for logic and photovoltaics. Uses for logic are discussed further in the present disclosure.

Figure 1A:
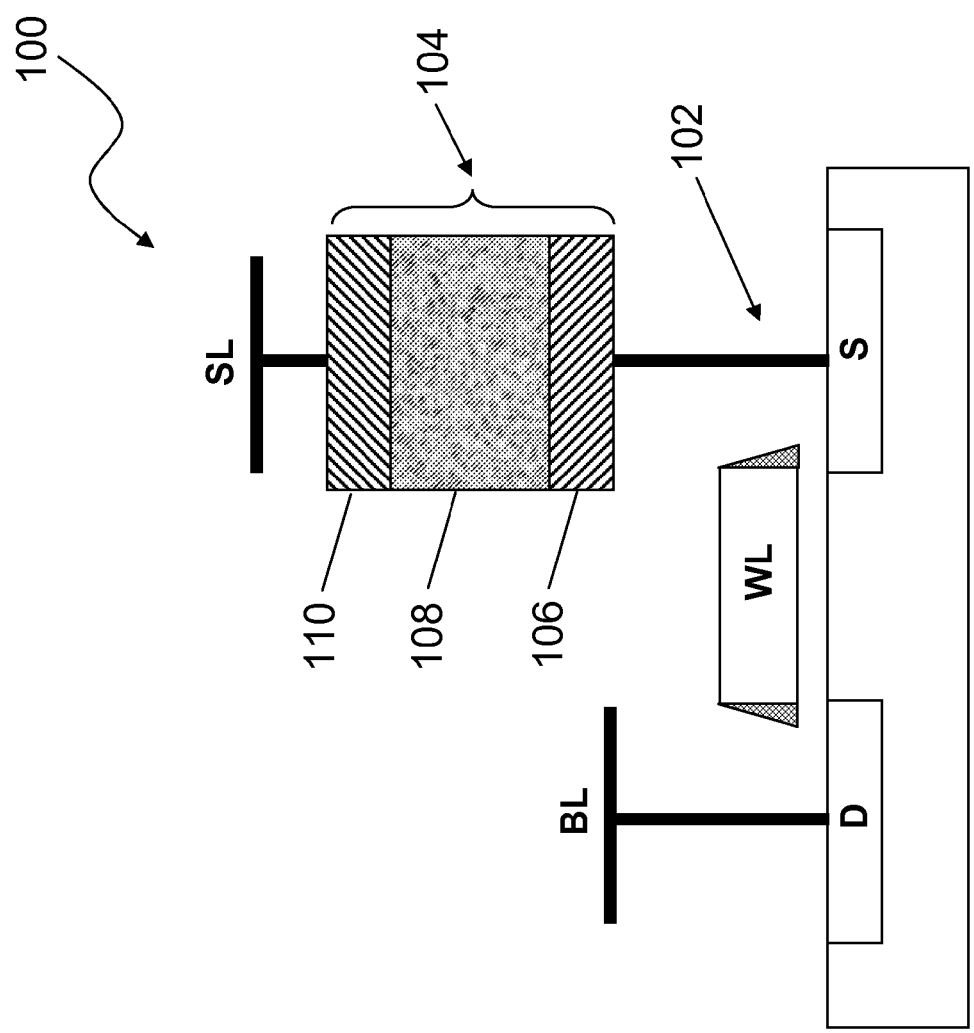
FIG. 1A illustrates an NRAM memory cell formed with a select device and a resistive nonvolatile memory element.
Figure 1C:
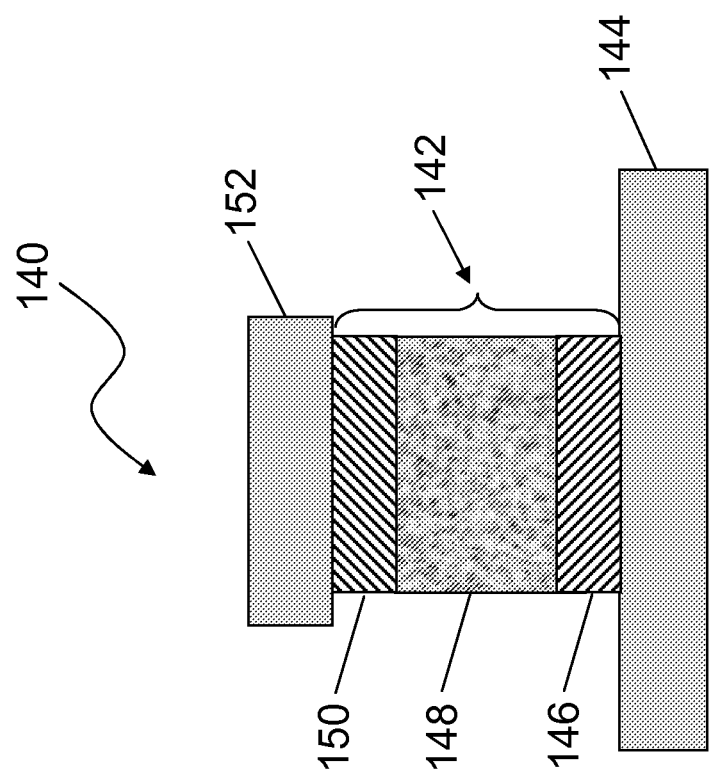
FIG. 1C illustrates a NV CNT resistive change memory cell formed with a switch nanotube block and top and bottom conductive terminals.

Referring now to FIG. 1A, FIG. 1A illustrates a nonvolatile resistive memory cell 100 in which one or more resistive states store corresponding logic states in a nonvolatile carbon nanotube (NV CNT) resistive block switch 104 that includes a first conductive terminal 106 on an underlying substrate (or insulator), switch nanotube block 108 in electrical contact with first conductive terminal 106, and a second conductive terminal 110 in electrical contact with switch nanotube block 108. Switch nanotube block 104 is taught by U.S. Patent Pub. No. 2008/0160734 and herein incorporated by reference in its entirety. Second conductive terminal 110 is connected to array select line SL and first conductive terminal 106 is connected to source S of MOSFET select device 102. Drain D is connected to array bit line BL. Array word line WL, orthogonal to array bit line BL, forms the gate of MOSFET select device 102. Bit line BL and select line SL are shown as parallel, but SL may be parallel to WL instead. Nonvolatile resistive memory cell 100 includes resistive nonvolatile memory element 104, MOSFET select device 102, interconnections, and connections to array lines from cell 100, which is taught by U.S. Pat. No. 7,835,170 and herein incorporated by reference in its entirety.

Nonvolatile resistive memory cell 100 includes one select device (or select transistor) (1-T) and one nonvolatile resistive memory element (1-R) and may be referred to as a 1-T, 1-R cell type, where the cell select and nonvolatile storage functions are separate. Also, since switch nanotube block 104 is formed using nanotube fabric layers, a random access nonvolatile memory formed of multiple nonvolatile resistive memory cells 100 may be referred to as a nanotube random access memory (NRAM®, a registered trademark of Nantero, Inc.). The area of nonvolatile resistive memory cell 100 may be in the $6F^2$ to $8F^2$ range, where F is the minimum lithographic dimension. Memories formed with cell 100 may be fabricated in the low gigabit ($10^9$ bit) range but cells cannot be scaled to accommodate order-of-magnitude increases in the total number of bits. To achieve such order-of-magnitude increases, nonvolatile memories in the 100 gigabit ($10^{11}$ bit) and terabit ($10^{12}$ bit) range and larger are needed. These require much smaller cell sizes of approximately $4F^2$ and scaling to F values of sub-15 nm. A cell size of $4F^2$ requires a single nonvolatile element that combines cell select and nonvolatile storage functions. Methods and structures that may be used to form such $4F^2$ cells are described further below, including cells with integrated diode select and nonvolatile resistance functions.

FIG. 1B-1 illustrates a plan view of a two-by-two cross point array 120 formed using four interconnected vertically-oriented (3-D) two-terminal nonvolatile carbon nanotube (NV CNT) resistive block switches (130-1, 130-2, 130-3, and 130-4). Representative cross section X1-X1' through a portion of NV CNT block switch 130-1 as illustrated in FIG. 1B-1 further illustrates elements of NV CNT block switches in vertically-oriented (3-D) structures as shown in FIG. 1B-2. Representative cross section Y1-Y1' through a portion of NV CNT block switch 130-1 as illustrated in FIG. 1B-1 further illustrates elements of NV CNT block switches in vertically-oriented (3-D) structures as shown in FIG. 1B-3. Details of the two-terminal NV CNT resistive block switches and their methods of fabrication, corresponding to NV CNT resistive block switches 130-1, 130-2, 130-3, 130-4, and their interconnections, are described further above in U.S. Pat. No. 7,835,170, U.S. Patent Pub. 2008/0160734 and in other incorporated patent references.

Bottom wire (or wiring layer) 122 in FIG. 1B-1 interconnects two-terminal NV CNT resistive block switches 130-1 and 130-2 by contacting bottom (lower level) contacts, with each of these two-terminal NV CNT block switches having dimensions F×F and separated by a distance F. Bottom wire 124 interconnects two-terminal NV CNT resistive block switches 130-3 and 130-4, forming bottom (lower level) contacts, with each of these two-terminal NV CNT block switches having dimensions F×F and separated by a distance F. While F represents the minimum feature size to achieve maximum switch array density, dimensions larger than F may be used as needed. Non-square cross sections may be also used, e.g. rectangular or circular, to achieve resistance values or other desired features. F may be scaled over a large range of dimensions: 250 nm and larger, less than 100 nm (e.g. 45 nm or 22 nm), or less than 10 nm. NV CNT resistive block switches with switch nanotube block channel lengths $L_{SW-CH}$ in the vertical (Z) direction, defined by the spacing between the first conductor contact and the second conductor contact, have been fabricated down to less than 30 nm. In certain applications, $L_{SW-CH}$ may be scaled over a large range: on the order of 250 nm to on the order of 10 nm. Two-by-two cross point array 120 is shown for illustrative purposes; however, cross point arrays of 100-by-100, 1,000-by-1,000, 10,000-by-10,000 or larger, may be formed as described further below with respect to FIGS. 2 and 3.

Top wire (or wiring layer) 126 in FIG. 1B-1 interconnects two-terminal NV CNT resistive block switches 130-1 and 130-3 by contacting top (upper level) contacts, with each of the two-terminal NV CNT resistive block switches having dimensions F×F and separated by a distance F. Top wire 128 interconnects two-terminal NV CNT resistive block switches 130-2 and 130-4 by contacting top (upper level) contacts, with each of the two-terminal NV CNT resistive block switches having dimensions F×F and separated by a distance F. Top wires 126 and 128 are patterned on the surface of insulator 132 that fills the regions between the two-terminal NV CNT resistive block switches. While F represents minimum feature size to achieve maximum switch array density, dimensions larger than F may be used.

FIG. 1B-2 illustrates cross section X1-X1' through and along top wire 126 in the X direction. The Z direction represents the vertical orientation of two-terminal NV CNT resistive block switch 130-1 and also indicates the direction of current flow (vertically) in the ON state. Two-terminal NV CNT resistive block switch 130-1 includes first (lower level)

electrical contact 134, which is a section of bottom wire 122; second (upper level) electrical contact 138, which is in contact with top wire 126; and switch nanotube block 136, which is in electrical contact with both first electrical contact 134 and second electrical contact 138. NV CNT resistive block 130-1 may be switched between ON and OFF states multiple times as described in the incorporated patent references, e.g., U.S. Pat. No. 7,835,170 and U.S. Patent Pub. No. 2008/0160734.

FIG. 1B-3 illustrates cross section Y1-Y1' through and along bottom wire 122 in the Y direction. The Z direction represents the vertical orientation of two-terminal NV CNT resistive block switch 130-1 and also indicates the direction (vertically) of current flow in the ON state. Two-terminal NV CNT resistive block switch 130-1 includes first conductive contact 134, which is a section of bottom wire 122; second conductive contact 138, which is in contact with top wire 126; and switch nanotube block 136 in contact with both first conductive contact 134 and second conductive contact 138. NV CNT resistive block 130-1 may be switched between ON and OFF states multiple times as described further above and in the incorporated patent references. The term "conductive" may include metals, metal alloys, semiconductors, silicides, various allotropes of carbon (including amorphous carbon), conductive oxides, and other materials.

FIG. 1C illustrates a nonvolatile resistive change memory cell (or element) 140 in which one or more resistive states store corresponding logic states in a nonvolatile carbon nanotube (NV CNT) resistive block switch 142 that includes a first conductive terminal 146 in electrical contact with array wire 144, switch nanotube block 148 in electrical contact with first conductive terminal 146, and a second conductive terminal 150 in electrical contact with both switch nanotube block 148 and array wire 152. The structure, fabrication, and electrical operation of NV CNT resistive block switch 142, including integration in a CMOS process to form memory arrays, is taught by U.S. Patent Pub. No. 2008/0160734 and herein incorporated by reference in its entirety.

NV CNT resistive block switch 142 illustrated in FIG. 1C corresponds to NV CNT resistive block switch 104 in FIG. 1A. NV CNT resistive block switch 142 also corresponds to NV CNT resistive block switches 130-1, 130-2, 130-3, and 130-4 illustrated in FIGS. 1B-1, 1B-2, and 1B-3 in cross point array 120. An illustration of NV CNT resistive block switch operating requirements as a function of array size, such as resistance values for $R_{ON}$ and $R_{OFF}$ as a function of cross point array (memory array) size, is described further below with respect to FIGS. 2 and 3.

Resistive change memory cell 140 may also be formed with array wire 144 in direct contact with the bottom surface of switch nanotube block 148, eliminating the need for first conductive terminal 146. Alternatively, resistive change memory cell 140 may also be formed with array wire 152 in direct contact with the top surface of switch nanotube block 148, eliminating the need for second conductive terminal 150. In still another implementation, array wire 144 may be in electrical contact with the bottom surface of switch nanotube block 148 and array wire 152 may be in electrical contact with the top surface of switch nanotube block 148, eliminating the need for first conductive terminal 146 and second conductive terminal 150, respectively.

The switch nanotube block 148 illustrated in FIG. 1C can be formed by patterning a nanotube fabric layer or multiple nanotube fabric layers. A nanotube fabric, a nanotube fabric layer, a fabric of nanotubes, a nanotube fabric of multiple nanotube fabric layers, a nanofabric, or a nanotube block may be used interchangeably in the present disclosure, e.g., a non-woven CNT fabric, may, for example, have a structure of multiple entangled nanotubes that are irregularly arranged relative to one another. Alternatively, the fabric of nanotubes for the present disclosure may possess some degree of positional regularity of the nanotubes, e.g., some degree of parallelism along their long axes. Such positional regularity may be found, for example, on a relatively small scale wherein flat arrays of nanotubes are arranged together along their long axes in rafts on the order of one nanotube long and ten to twenty nanotubes wide. In other examples, such positional regularity maybe found on a larger scale, with regions of ordered nanotubes, in some cases, extended over substantially the entire fabric layer. Additional descriptions of nanotube fabrics may be found in, for example, U.S. Pat. No. 7,745,810 and U.S. Pat. No. 7,928,523," both of which are incorporated by reference in their entirety.

Figure 12A:
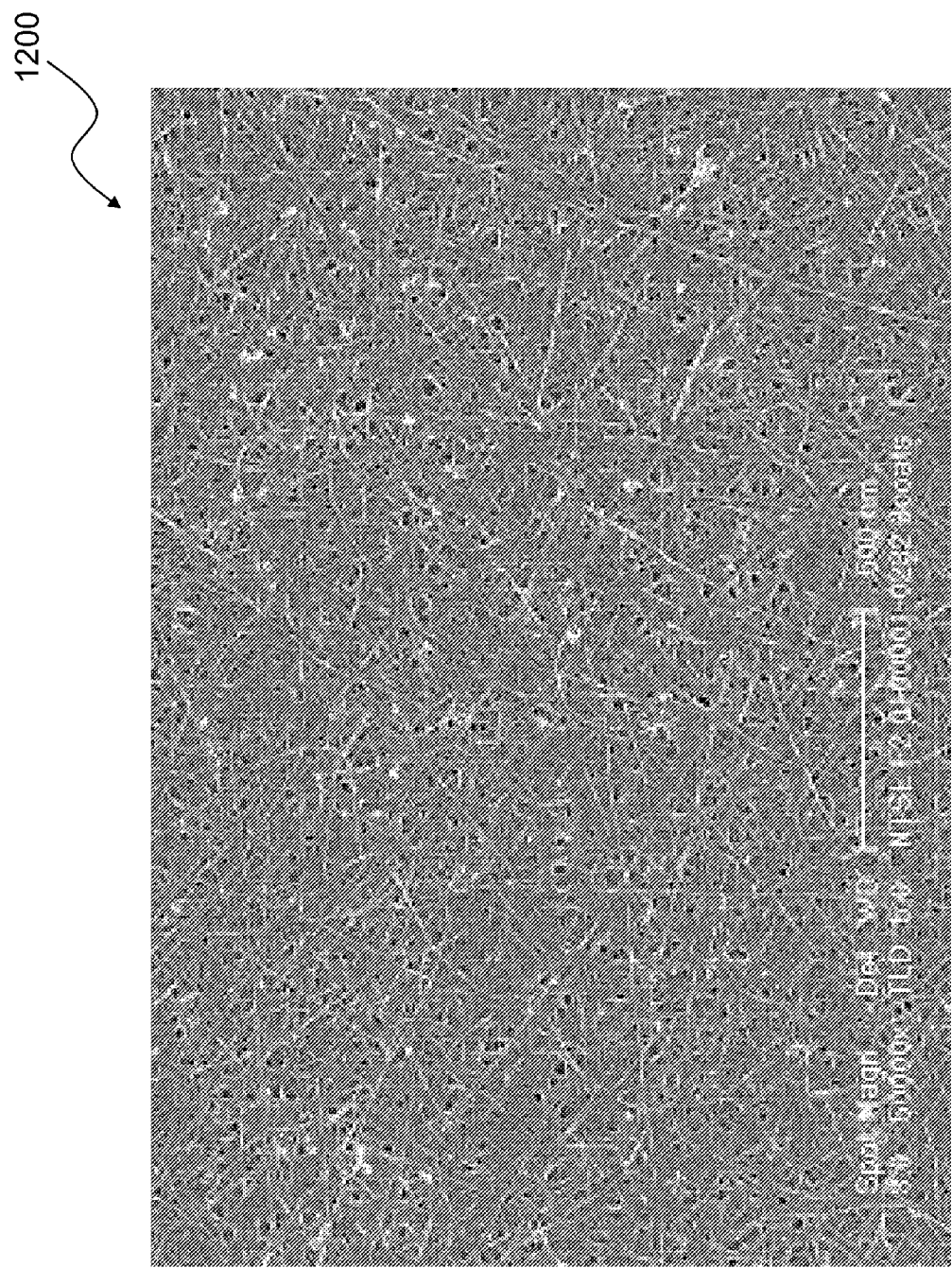
FIG. 12A illustrates a scanning electron microscope (SEM) image of an unordered nanotube fabric.

Referring now to FIG. 12A, an unordered nanotube fabric layer deposited on a substrate element is shown by scanning electron microscope (SEM) image 1200 illustrated in FIG. 12A. The unordered nanotube fabric layer has a plurality of nanotubes oriented in a plurality of directions with respect to each other. The unordered nanotube fabric layer contains gaps and voids between the nanotubes throughout the unordered nanotube fabric layer.

Figure 12B:
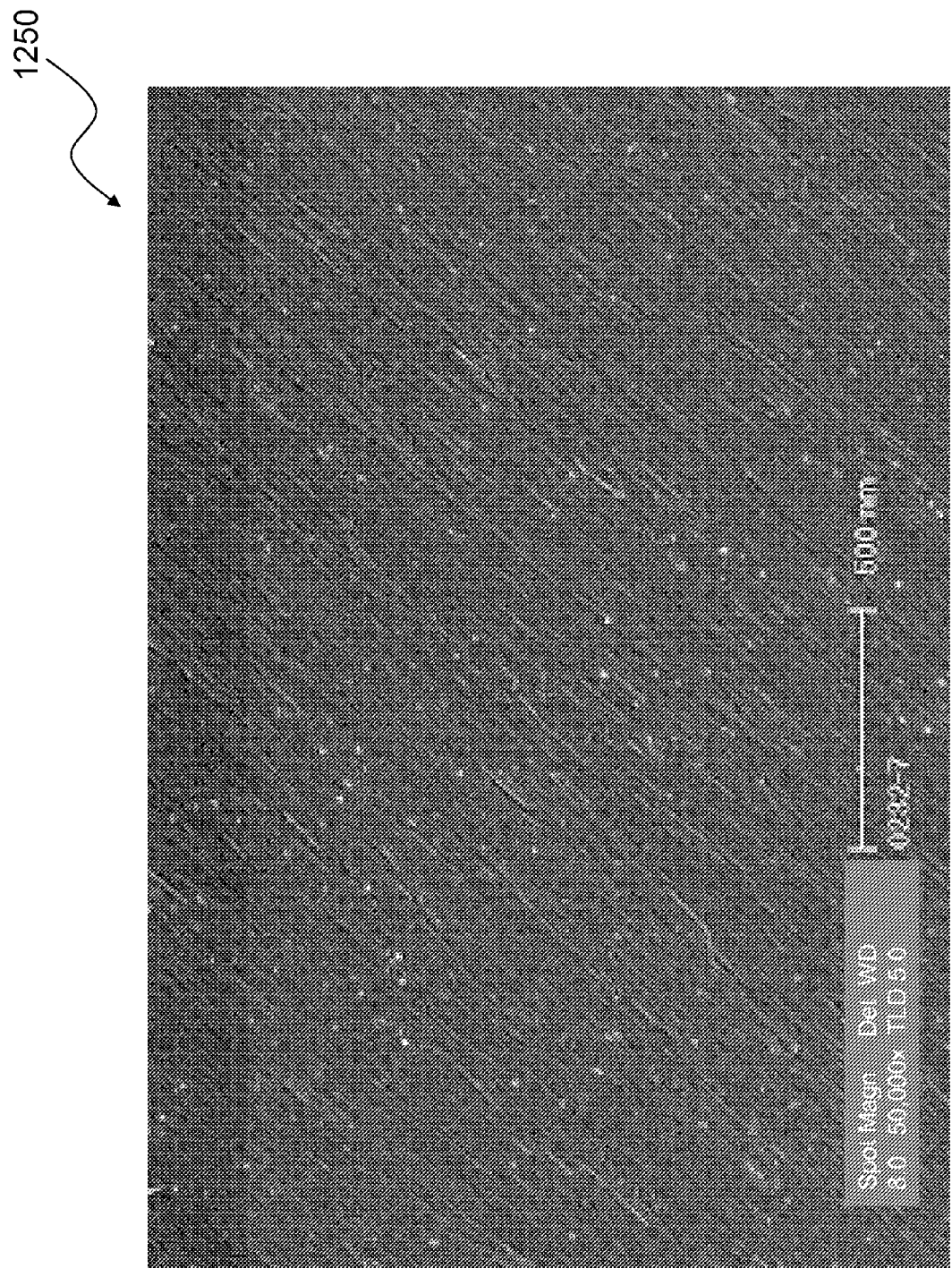
FIG. 12B illustrates a scanning electron microscope (SEM) image of an ordered nanotube fabric.

An ordered nanotube fabric layer formed on a substrate element is shown by SEM image 1250 illustrated in FIG. 12B. The ordered nanotube fabric layer has a plurality of nanotubes oriented in a substantially parallel direction with respect to each other and a substantially uniform arrangement along the direction of an applied force. The ordered nanotube fabric layer contains adjacent nanotubes grouped together along their sidewalls, reducing or substantially eliminating gaps and voids between nanotubes throughout the ordered nanotube fabric layer. In the nanotube fabric examples illustrated by SEM images 1200 and 1250 in FIGS. 12A and 12B, respectively, both metallic CNTs and semiconducting CNTs are present.

Through the use of an applied force, an unordered nanotube fabric layer deposited on a substrate element can be rendered into an ordered nanotube fabric layer. The applied force includes, but is not limited to, a directional mechanical force such as a rolling, rubbing, or polishing force applied to the deposited unordered nanotube fabric layer linearly, in an arc, or rotationally. In some applications, unordered nanotube fabric layers deposited individually on a substrate element will compress into each other under the applied force and thereby reduce the thickness of an ordered nanotube fabric layer. The rendering of an unordered nanotube fabric layer into an ordered nanotube fabric layer through the use of an applied force reduces or substantially eliminates gaps and voids between nanotubes throughout the ordered nanotube fabric layer and also orients the nanotubes in a substantially parallel direction with respect to each other. The changes made to a nanotube fabric layer when rendering the nanotube fabric layer from an unordered layer into an ordered layer can change the boundary conditions for current flow across the interface or junction between the nanotube fabric layer and conductors or materials electrically contacting the nanotube fabric layer. Additionally, the changes made to a nanotube fabric layer when rendering the nanotube fabric layer from an unordered layer into an ordered layer can also change how the current flows though the nanotube fabric layer on a microscopic level by changing frictional forces that oppose the acceleration of carriers in an electric field. The rendering of an unordered nanotube fabric layer deposited on a substrate element into an ordered nanotube fabric layer through the use of an applied force is described in more detail in U.S. Patent App. No. 61/319,034, incorporated herein by reference in its entirety.

Nanotube fabrics retain the desirable physical properties of the nanotubes from which they are formed. For example, in some electrical applications, the fabric preferably has a sufficient amount of nanotubes in contact so that at least one electrically conductive or semi-conductive pathway exists from a given point within the fabric to another point within the fabric. Nanotubes typically may have a diameter of about 1 to <6 nm depending if they are single-wall or multi-wall and may have varying lengths. The nanotubes may curve and occasionally cross one another. Gaps in the fabric, i.e., between nanotubes either laterally or vertically, may exist. Such fabrics may comprise single wall nanotubes, multi-wall nanotubes, or mixtures thereof and may be of varying lengths. The nanotubes may be conductive, semiconductive, or combinations thereof. The fabric may have small areas of discontinuity with no nanotubes present. The fabric may be prepared as a layer or as multiple fabric layers, one formed upon another. Fabrics formed as multiple fabric layers may include a mixture of unordered nanotube fabrics and ordered nanotube fabrics in any combination. The thickness of the fabric can be chosen as thin as substantially a monolayer of nanotubes or can be chosen much thicker, e.g., tens of nanometers to hundreds of nanometers in thickness. The porosity of the fabrics can vary from low density fabrics with high porosity to high density fabrics with low porosity. Such fabrics can be prepared by growing nanotubes using chemical vapor deposition (CVD) processes in conjunction with various catalysts, for example. Other methods for generating such fabrics may involve using spin-coating techniques and spray-coating techniques with preformed nanotubes suspended in a suitable solvent, roll-to-roll coating, dip coating, electrostatic spray coating, and printing processes. Nanoparticles of other materials can be mixed with suspensions of nanotubes in such solvents and deposited by spin coating and spray coating to form fabric with nanoparticles dispersed among the nanotubes. The formation of such nanotube layers is taught in several of the incorporated references.

For example, U.S. Pat. No. 7,335,395, incorporated herein by reference in its entirety, teaches a plurality of methods for forming nanotube layers and films on a substrate element using preformed nanotubes. The methods include, but are not limited to, spin coating (wherein a solution of nanotubes is deposited on a substrate which is then spun to evenly distribute the solution across the surface of the substrate), spray coating (wherein a plurality of nanotubes are suspended within an aerosol solution which is then dispersed over a substrate), roll-to-roll coating (or roll coating, for brevity) such as Gravure coating (wherein an engraved roller with a surface spinning in a coating bath picks up the coating solution in the engraved dots or lines of the roller, and where the coating is then deposited onto a substrate as it passes between the engraved roller and a pressure roller), and dip coating (wherein a plurality of nanotubes are suspended in a solution and a substrate element is lowered into the solution and then removed). Further, U.S. Pat. No. 7,375,369 to Sen et al. and U.S. Pat. No. 7,666,382, both incorporated herein by reference in their entirety, teach solvents that are well suited for suspending nanotubes and for forming nanotube layers and films over a substrate element. For example, such solvents include but are not limited to ethyl lactate, dimethyl sulfoxide (DMSO), monomethyl ether, 4-methyl-2 pentanone, N-methylpyrrolidone (NMP), t-butyl alcohol, methoxy propanol, propylene glycol, ethylene glycol, gamma butyrolactone, benzyl benzoate, salicyladehyde, tetramethyl ammonium hydroxide and esters of alpha-hydroxy carboxylic acids. Such solvents can disperse the nanotubes to form a stable composition without the addition of surfactants or other surface-active agents.

Referring now to FIG. 1C, first conductive terminal 146 and second conductive terminal 150 form electrical contacts with the bottom and top-surface of switch nanotube block 148. The combination of materials used for these terminals and the switch nanotube block form and determine the electrical properties of NV CNT resistive block switch 142, such as the minimum values of $R_{ON}$ and the nonlinearity of the resistive change, which determines the $R_{ON}$-to-$R_{OFF}$ resistance ratio, as described further below with respect to FIG. 3A.

Work function differences between the CNTs in the nanotube fabric and electrical contacts may be used, for example, to enhance nonlinearity by forming diodes such as Schottky diodes at one contact and near-Ohmic contact at the other contact as described further below. In addition to selecting various combinations of single wall, multi-wall, semiconducting, and metallic nanotubes when forming the nanotube fabric used in switch nanotube block 148, the nanotubes may also be functionalized as described further below.

First conductive terminal 146 and second conductive terminal 150 may be formed using a variety of materials. The term "conductive" may include metals, metal alloys, semiconductors, silicides, conductive oxides, various allotropes of carbon, and other materials. The following are examples of conductors, conductive alloys, and conductive oxides: Al, Al(Cu), Ag, Au, Bi, Ca, Co, $CoSi_x$, Cr, Cu, Fe, In, Ir, Mg, Mo, $MoSi_2$, Na, Ni, $NiSi_x$, Os, Pb, PbSn, PbIn, Pd, $Pd_2Si$, Pt, $PtSi_x$, Rh, RhSi, Ru, RuO, Sb, Sn, Ta, TaN, Ti, TiN, TiAu, TiCu, TiPd, $TiSi_x$, TiW, W, $WSi_2$, Zn, $ZrSi_2$, and others for example. Some or all of these materials may also be used to form arrays wires 144 and 152.

The following are examples of semiconductors that may be used as conductive terminals: Si (doped and undoped), Ge, SiC, GaP, GaAs, GaSb, InP, InAs, InSb, ZnS, ZnSe, CdS, CdSe, CdTe and other examples.

Various allotropes of carbon may also be used as first conductive terminal 146 and second conductive terminal 150: amorphous carbon (aC); carbon nanotubes such as nanotube fabric terminal, buckyballs, and other examples.

Two-terminal NV CNT resistive block switch 142 illustrated in FIG. 1C corresponds to two-terminal NV CNT resistive block switches 130-1, 130-2, 130-3, and 130-4 illustrated in FIGS. 1B-1, 1B-2, and 1B-3. Array wire 152 in FIG. 1C, corresponding to top wire 126 in FIGS. 1B-1, 1B-2, and 1B-3, is formed on the surface of insulator 132, and NV CNT resistive block switch 142 is imbedded in dielectric 132 to form two-by-two cross point array 120.

1-R memory requirements for relatively high $R_{ON}$ values and relatively high $R_{OFF}/R_{ON}$ ratio values are described further above with respect to FIG. 1C and further below with respect to FIG. 2B and FIG. 3A. Further above, the importance of work function differences between contact materials and carbon nanotubes to achieve desirable $R_{ON}$ and $R_{OFF}$ electrical characteristics is described with respect to FIG. 1C. And also, examples of carbon nanotube material options and various conductive terminal materials are described.

However, in addition to material selection, the geometry and placement of conductive terminals, such as first and second conductive terminals 146 and 150, respectively, with respect to switch nanotube blocks, such as switch nanotube block 148 illustrated in FIG. 1C, may also be used to enhance NV CNT resistive block switch performance. U.S. Patent Pub. No. 2008/0160734 gives examples of geometry variations such as the entire top and bottom surfaces of switch nanotube blocks in contact with conductive terminals as illustrated in FIG. 1C; and, alternatively, conductive terminals only in contact with a portion of top and bottom surfaces of switch nanotube blocks.

An example of NV CNT resistive block geometry that may be used to increase $R_{ON}$ and achieve greater resistance non-linearity is to contact only a portion of the switch nanotube block on one surface and completely contact another surface. For relatively large geometries, 50-100 nm or larger for example, a smaller contact area on one surface relative to another may be achieved relatively easily as illustrated in U.S. Patent Pub. No. 2008/0160734.

Figure 1D:
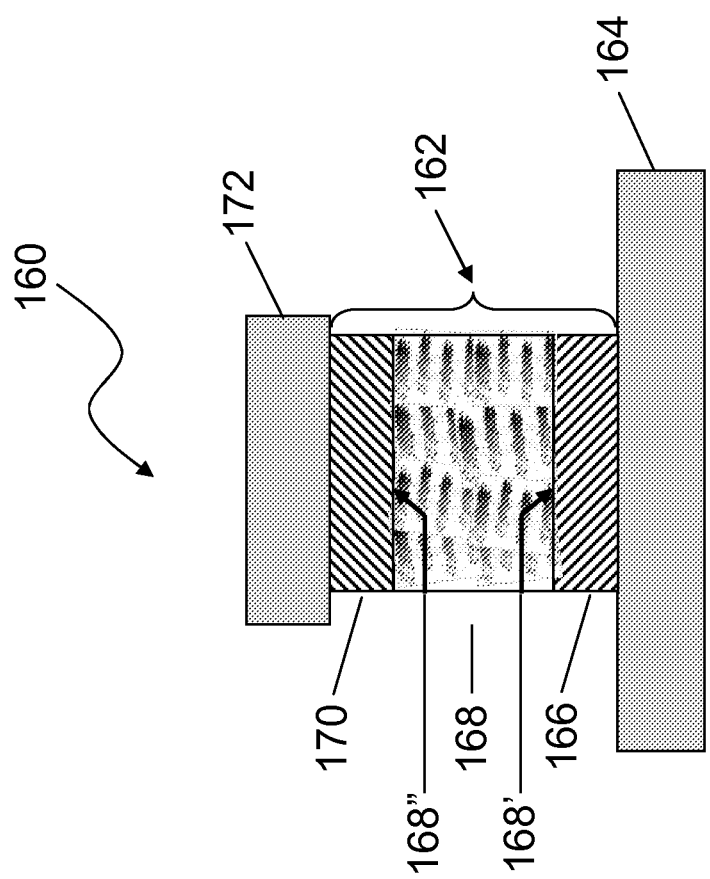
FIG. 1D illustrates a NV graphitic resistive change memory cell formed with a switch graphic block and top and bottom conductive terminals.

FIG. 1D illustrates a nonvolatile resistive change memory cell 160 in which one or more resistive states store corresponding logic states in a nonvolatile graphitic resistive block switch 162 that includes a first conductive terminal 166 in electrical contact with array wire 164, switch graphitic block 168 in electrical contact with first conductive terminal 166 at contact region 168', and a second conductive terminal 170 in electrical contact with the graphitic block switch 168 at contact region 168", and also in electrical contact with array wire 172.

FIG. 1D is similar to FIG. 1C, except that switch nanotube block 148 is replaced by switch graphitic block 168. The switch graphitic block 168 illustrated in FIG. 1D may be formed of a patterned layer or multiple layers of graphene as described further below with respect to FIG. 5. First conductive terminal 166 corresponds to first conductive terminal 146; array wire 164 corresponds to array wire 144; second conductive terminal 170 corresponds to second conductive terminal 150; and array wire 172 corresponds to array wire 152. The various conductive terminals and array wires shown in FIG. 1D may use the same materials as those listed with respect to FIG. 1C further above.

NV graphitic resistive block switch 162 illustrated in FIG. 1D corresponds to NV CNT resistive block switches 130-1, 130-2, 130-3, and 130-4 illustrated in FIGS. 1B-1, 1B-2, and 1B-3 in cross point array 120.

Resistive change memory cell 160 may also be formed with array wire 164 in direct contact with the bottom surface of switch graphitic block 168, eliminating the need for first conductive terminal 166. Alternatively, resistive change memory cell 160 may also be formed with array wire 172 in direct contact with the top surface of the switch graphitic block 168, eliminating the need for second conductive terminal 170. In still another implementation, array wire 164 may be in electrical contact with the bottom surface of switch graphitic block 168 and array wire 172 may be in electrical contact with the top surface of switch graphitic block 168, eliminating the need for first conductive terminal 166 and second conductive terminal 170, respectively.

Figure 1E:
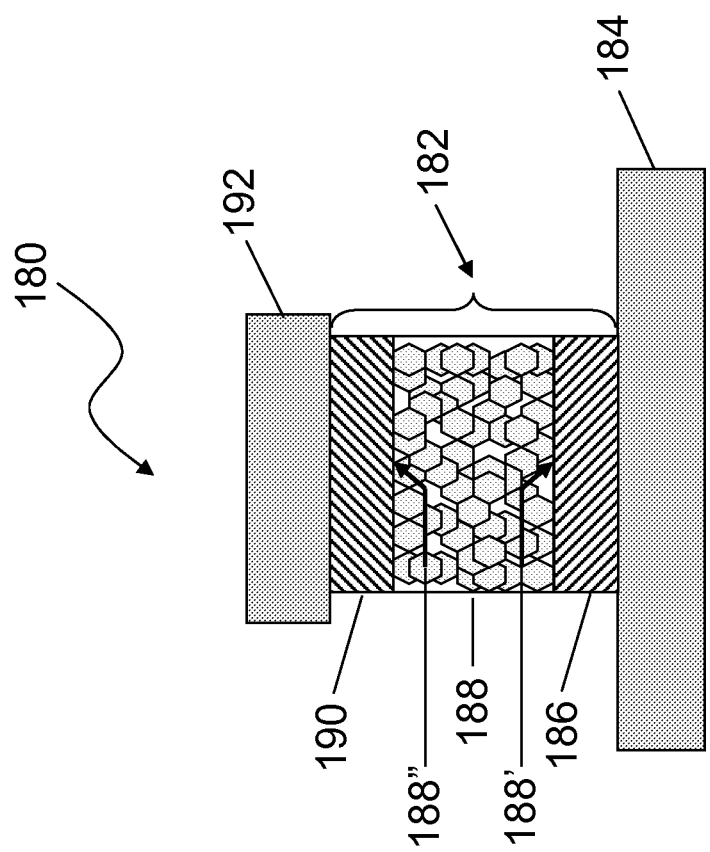
FIG. 1E illustrates a NV buckyball resistive change memory cell formed with a switch buckyball block and top and bottom conductive terminals.

FIG. 1E illustrates a nonvolatile resistive change memory cell 180 in which one or more resistive states store corresponding logic states in a nonvolatile buckyball resistive block switch 182 that includes a first conductive terminal 186 in electrical contact with array wire 184, switch buckyball block 188 in electrical contact with first conductive terminal 186 at contact region 188', and a second conductive terminal 190 in electrical contact with switch buckyball block 188 at contact region 188", and also in electrical contact with array wire 192.

FIG. 1E is similar to FIG. 1C, except that switch nanotube block 148 is replaced by switch buckyball block 188. Switch buckyball block switch 188 illustrated in FIG. 1E may be formed of a patterned layer or multiple layers of buckyballs as described further below with respect to FIG. 6. First conductive terminal 186 corresponds to first conductive terminal 146; array wire 184 corresponds to array wire 144; second conductive terminal 190 corresponds to second conductive terminal 150; and array wire 192 corresponds to array wire 152. The various conductive terminals and array wires shown in FIG. 1E may use the same materials as those listed with respect to FIG. 1C further above.

NV buckyball resistive block switch 182 illustrated in FIG. 1E corresponds to NV CNT resistive block switches 130-1, 130-2, 130-3, and 130-4 illustrated in FIGS. 1B-1, 1B-2, and 1B-3 in cross point array 120. An illustration of NV buckyball resistive block switch operating requirements as a function of array size, such as resistance values for $R_{ON}$ and $R_{OFF}$ as a function of cross point array (memory array) size, is described further below with respect to FIGS. 2 and 3.

Resistive change memory cell 180 may also be formed with array wire 184 in direct contact with the bottom surface of switch buckyball block 188, eliminating the need for first conductive terminal 186. Alternatively, resistive change memory cell 180 may also be formed with array wire 192 in direct contact with the top surface of the switch buckyball block 188, eliminating the need for second conductive terminal 190. In still another implementation, array wire 184 may be in electrical contact with the bottom surface of the switch buckyball block 188 and array wire 192 may be in electrical contact with the top surface of the switch buckyball block 188, eliminating the need for first conductive terminal 186 and second conductive terminal 190, respectively.

Figure 2A:
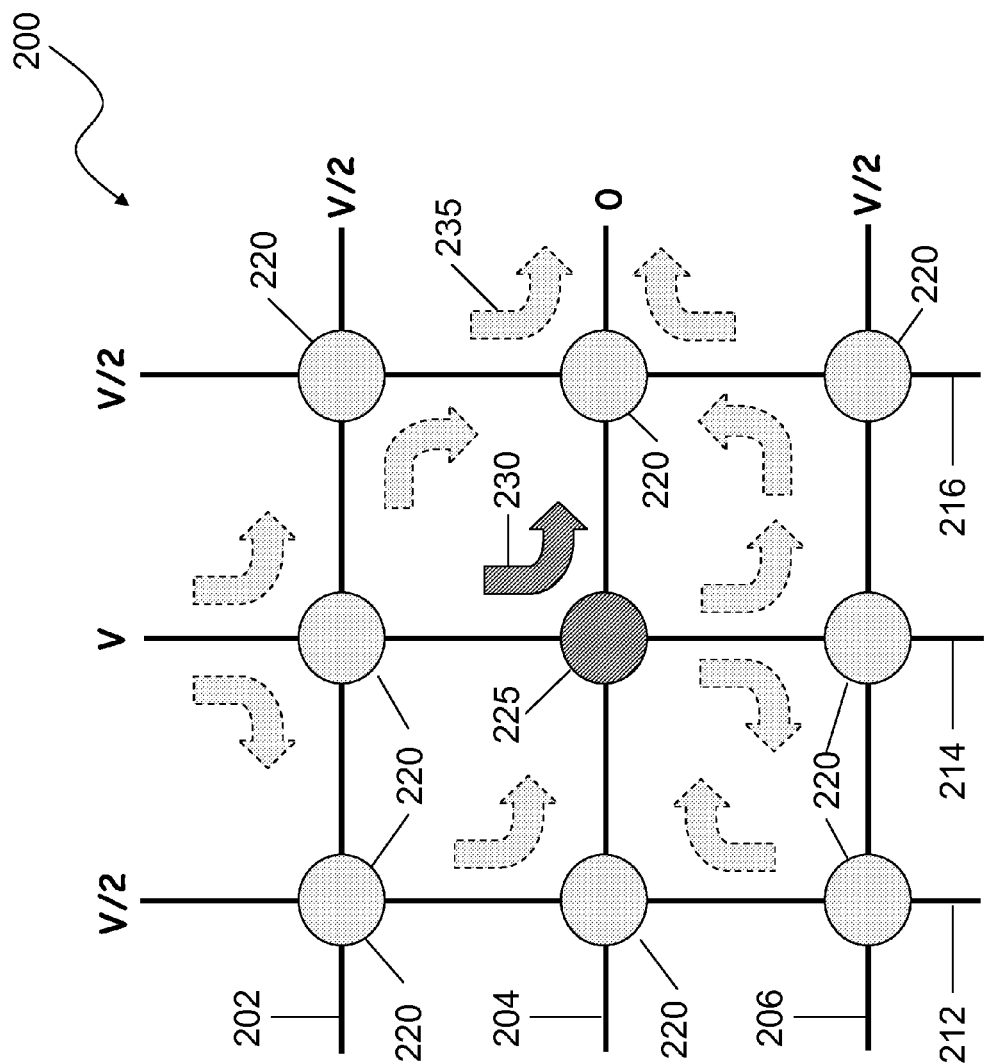
FIG. 2A illustrates a representation of a cross point array in a READ mode that shows selected current and parasitic current flows in cross point cells, referred to as resistive 1-R cells.

Cross point array 200, illustrated schematically in FIG. 2A, represents a 1-R cell-based memory array formed with any kind of cross point nonvolatile cell, such as a metal oxide cell for example. In the present disclosure, cross point array 200 each contains a nonvolatile nanotube block switch that corresponds to cross point array 120 illustrated in FIGS. 1B-1, 1B-2, and 1B-3; with nonvolatile 1-R cells 220 and 225 corresponding to NV CNT resistive block switches 130-1, 130-2, 130-3, and 130-4; array wires 202, 204, and 206 corresponding to top wires 126 and 128; and array wires 212, 214, and 216 corresponding to bottom wires 122 and 124. Because 1-R cells 220 and 225 do not include select devices, such as MOSFET select device 102 illustrated in FIG. 1A or a select (steering) diode (not shown) as illustrated in U.S. Patent Pub. No. 2008/0160734. individual two-terminal nonvolatile cross point array 1-R cells 220 and 225 need to provide both sufficient selectivity based on nonlinear resistance values to minimize adjacent cell write or read disturb, as described further below, and nonvolatile resistance storage of information.

During read and write operations, 1-R cells have parasitic current flows. A read operation example of the resistive state of 1-R cell 225 is illustrated in FIG. 2A in which a read voltage V is applied to array line 214 and ground is applied to orthogonal array line 204. A voltage of V/2 is applied to adjacent 1-R cells 220 to minimize the risk of disturbing the resistive states of adjacent cells. The read current includes current 230 from selected 1-R cell 225 and parasitic currents 235 from all the adjacent 1-R cells 220. Parasitic currents limit array size in all cross point memories. The size of individual sub-arrays forming the overall memory is dependent on the value of the ON state resistance $R_{ON}$ and the ratio of the OFF state and ON state resistances $R_{OFF}/R_{ON}$. This parasitic current problem is well known and is well documented in the literature. The following reference gives useful criteria for 1-R memory cell design: Liang, J. et al, "Cross-Point Memory Array Without Cell Selectors—Device Characteristics and Data Storage Pattern Dependencies", IEEE Transactions on Electron Devices, VOL. 57, No. 10, October 2010.

Figure 2B:
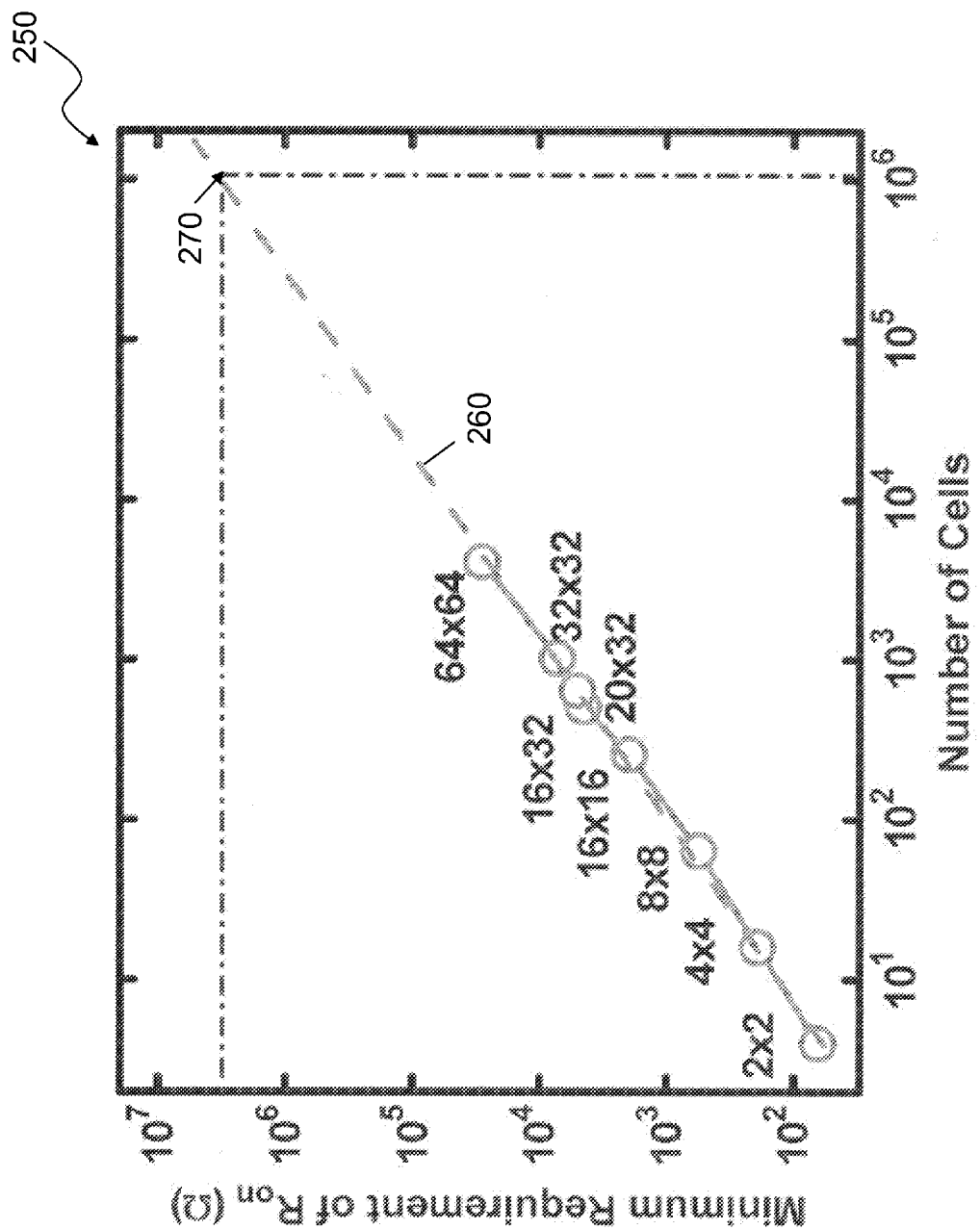
FIG. 2B illustrates a graph of cross point array requirements in terms of the number of cells as a function of the minimum ON-state resistance value of a nonvolatile nonlinear resistive storage element.

An illustration of cross point array requirements 250 shown in FIG. 2B describes the relationship between the cell minimum ON-state resistance $R_{ON}$ and the corresponding maximum number of corresponding 1-R cells as represented by curve 260, a straight line on a log-log plot as calculated based on assumptions described in the above Liang reference. The nonlinearity resistance requirement, not shown explicitly by curve 260, is that the ratio of the OFF-state state resistance $R_{OFF}$ to the ON-state resistance $R_{ON}$ (RoFF/RoN) be greater than 2. By way of example, a $10^6$ bit array size (point 270 on curve 260) requires $R_{ON} \geq 3 \times 10^6$ Ohms.

In the process of developing 1-T, 1-R NRAM memories formed using NV resistive memory cell 100 illustrated in FIG. 1A, millions of NV CNT resistive block switches 104 have been fabricated and electrically tested as individual switches on test sites and as part of NRAM memories over a wide range of fabrication conditions and using a variety of CNT fabrics (SWNTs, MWNTs, semiconducting, metallic, or combinations thereof) and conductive terminal materials. ON-state resistance $R_{ON}$ measurements of multiple NV CNT resistive block switches 104 show that $R_{ON}$ may be controlled over a wide range of resistance values from less than 1 kΩ to greater than 100 MΩ, which make NV CNT resistive block switches a good choice for use in 1-R cross point memory arrays.

In certain applications, during write (SET/RESET) operation, NV resistance memory cell 100 uses MOSFET select device 102 for cell selection and NV CNT resistive block switch 104 for nonvolatile resistance state storage. In operation, $R_{ON}$ values are typically controlled in a range of 100 kΩ to 200 kΩ, for example, to achieve nanosecond performance, and $R_{OFF}$ values are typically greater than 100 MΩ, with a buffer zone between ON-state and OFF-state resistance values of 500 to 1,000 times as described in U.S. patent application Ser. No. 12/618,448, herein incorporated by reference in its entirety. In this mode of operation, the nonlinearity of NV CNT resistive block switch 104 is not typically measured because it does not play a role in memory cell 100 selection.

However, for resistive memory cells in cross point array (1-R array) configurations, $R_{ON}$ values and nonlinearity as measured by the ratio of $R_{OFF}/R_{ON}$ are important parameters for estimating the maximum number of bits in a cross point array, as described further above with respect to cross point array requirements 250 illustrated in FIG. 2B. A sampling of existing NV CNT resistive block switches 104 were retested by performing a READ operation using an I-V scan between −2 Volts and +2 Volts, with I-V plotted as semi-log plot, for example, I-V curve 300 illustrated in FIG. 3A. The switches tested were fabricated using fabrics with mostly MWNTs and conductive terminals of TiN and W.

Figure 3A:
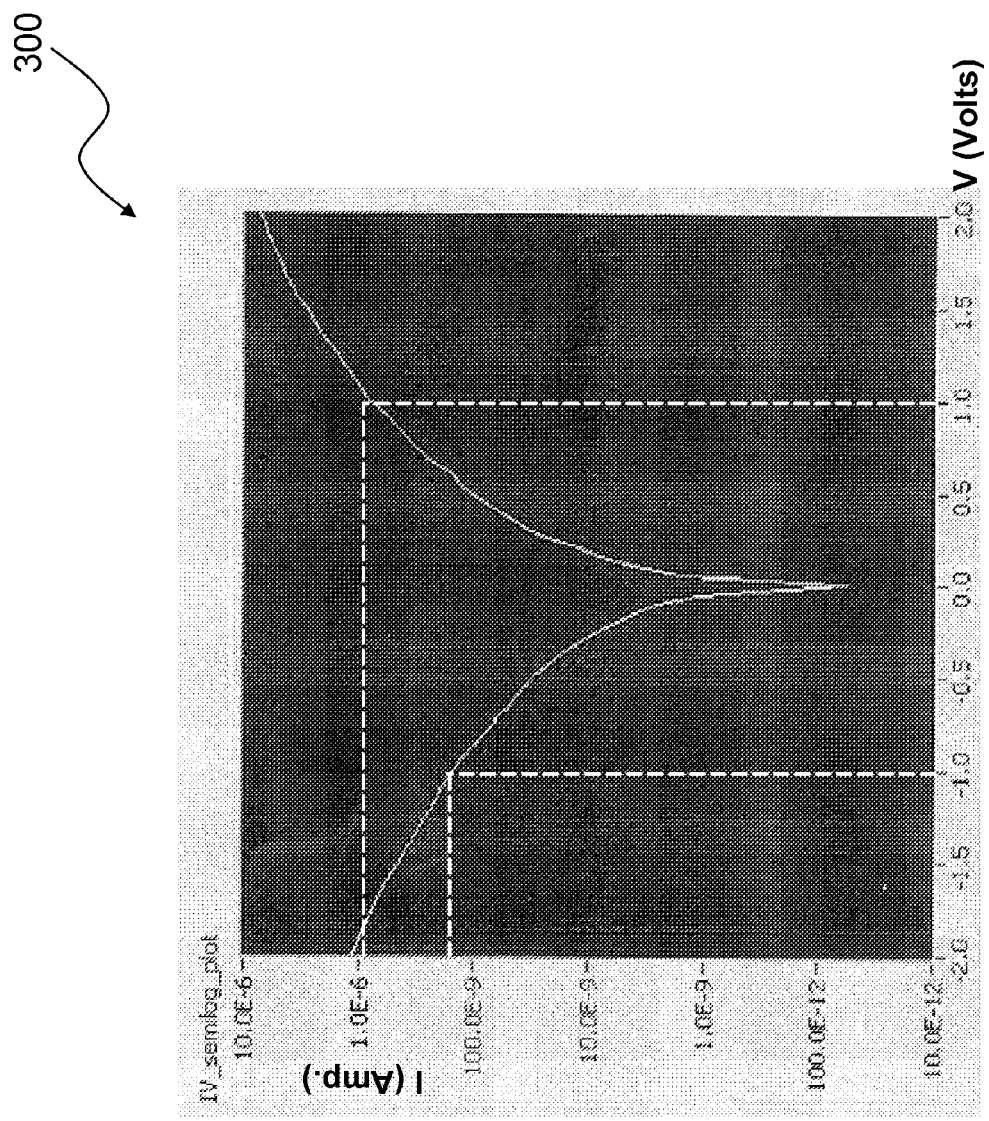
FIG. 3A illustrates an I-V curve of a NV CNT resistive block switch with an ON-state resistance of 1 mega-Ohm.

Referring to FIG. 3A, in operation, current values are measured at −1 V and +1 V, representative of typical READ voltage levels in cross point arrays such as cross point arrays 120 (FIG. 1B) and 200 (FIG. 2A), for example. From these, $R_{ON}$ and $R_{OFF}$ resistance values and the degree of nonlinearity of NV CNT resistive block switch 104 (FIG. 1) are determined. The current I was approximately 1 μA at +1 V and approximately 0.2 μA at −1 V, corresponding to a low resistance ON-state value of approximately 1 MΩ and a high resistance OFF-state value of approximately 5 MΩ, resulting in a high-to-low resistance ratio of approximately 5-to-1, well in excess of the required minimum of greater than 2-to-1.

Figure 3B:
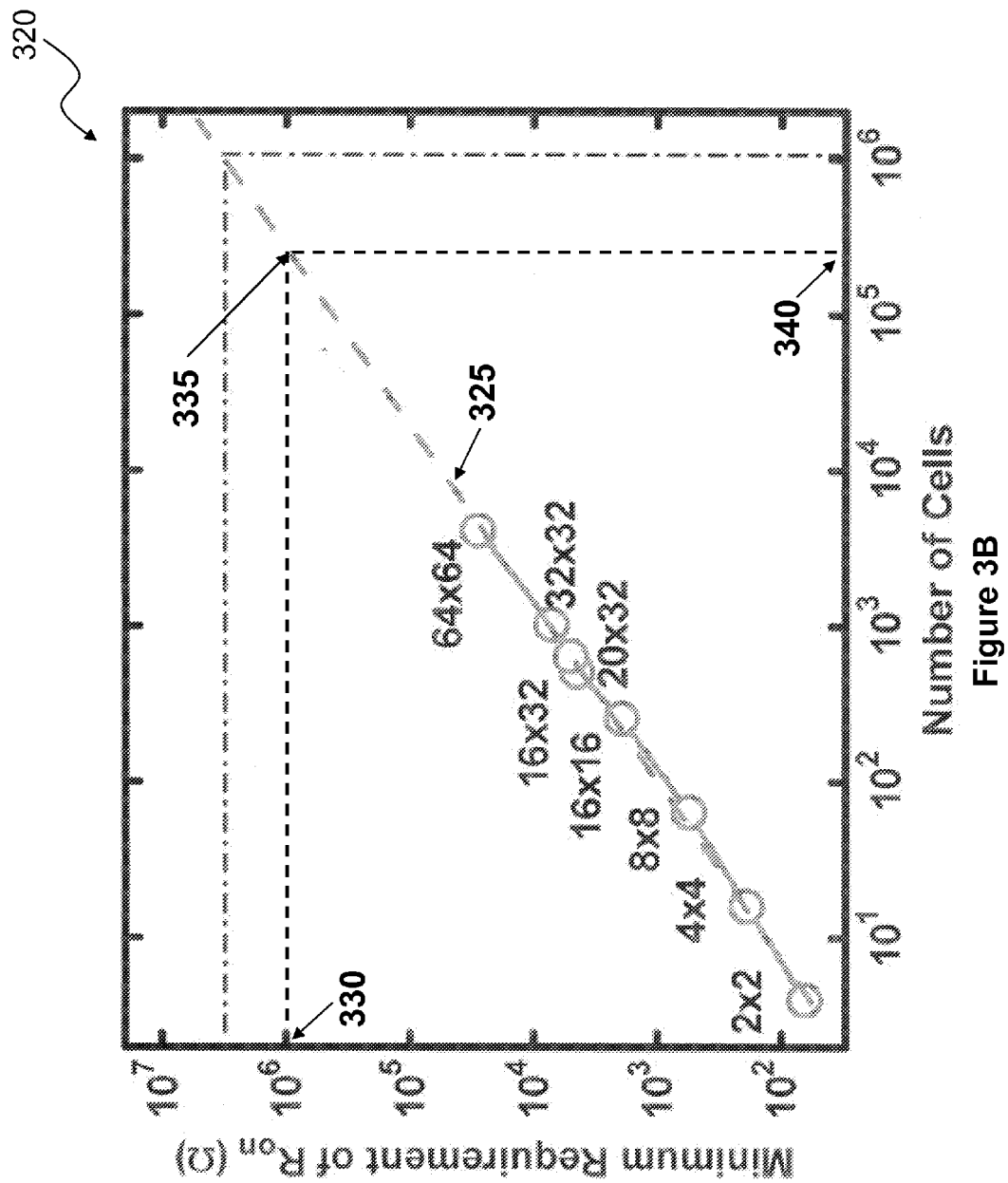
FIG. 3B illustrates a graph of cross point array requirements in terms of the number of cells in a cross point switch array for a NV CNT resistive block switch with an ON-state resistance of 1 mega-Ohm.

FIG. 3B depicts an illustration of cross point array requirements 320, the same curve as cross point array requirements 250 (FIG. 2B), showing the value of $R_{ON} \sim 1$ MΩ at point 330. A horizontal projection intersects curve 325 at point 335. A vertical projection intersects the horizontal axis at point 340 corresponding to approximately $4 \times 10^5$ cells, the estimated maximum number of 1-R cells in cross point arrays, such as cross point array 120 (FIG. 1B), for NV CNT resistive blocks switch 104 with measured I-V curve 300 (FIG. 3A).

Figure 3C:
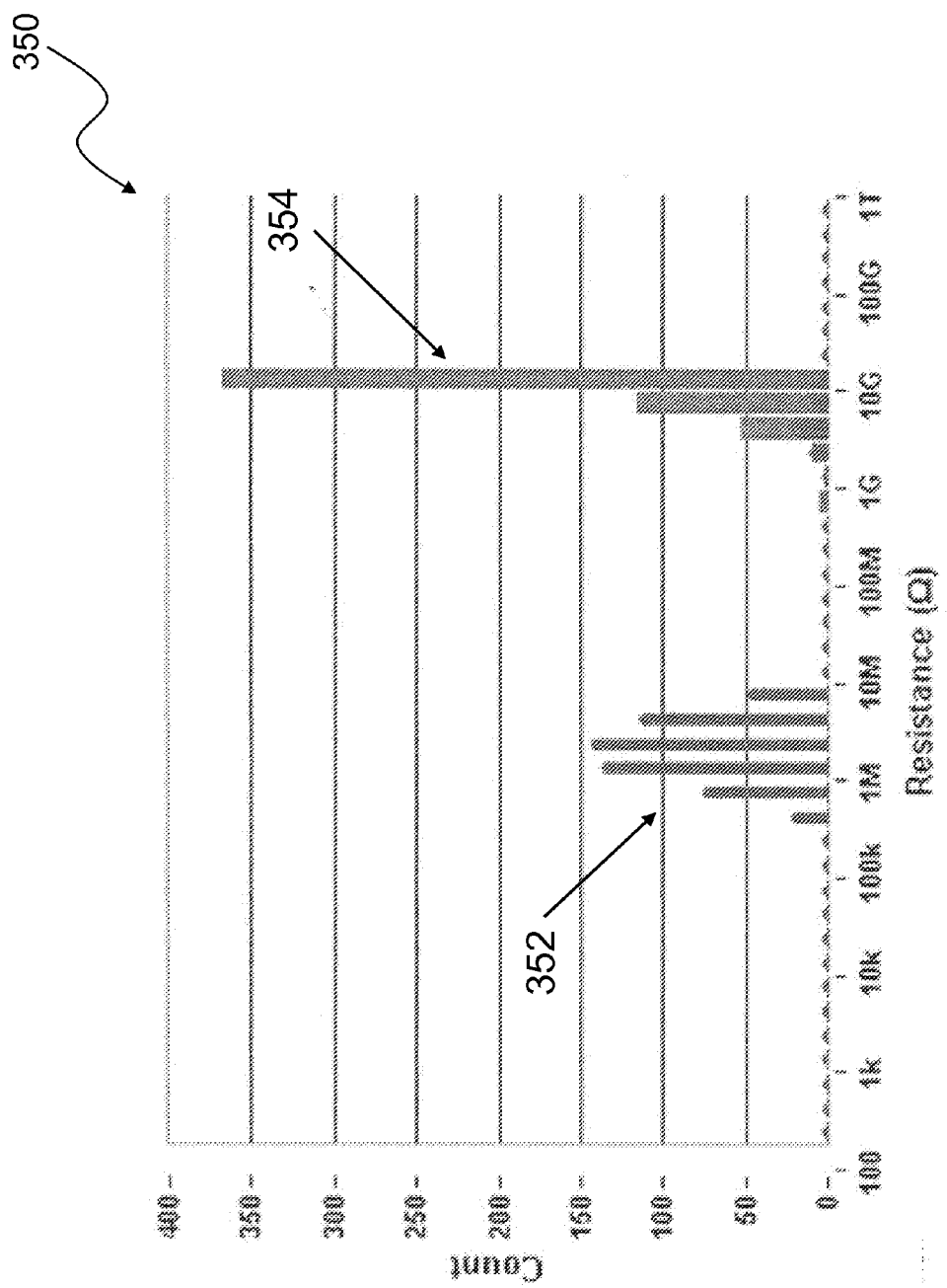
FIG. 3C illustrates ON-state and OFF-state resistance values for NV CNT resistive block switches.

FIG. 3C illustrates resistance values 350 of multiple NV CNT resistive block switches, tested as described in U.S. Pat. No. 8,000,127, and described in more detail in U.S. Pat. No. 8,102,018 and herein incorporated by reference in its entirety. Measured ON-state resistance values 352 are in range of ~800 kΩ to ~10 MΩ and OFF-state resistance values 354 are ~800 MΩ and greater. NV CNT resistive block switches corresponding to NV CNT resistive block switch 104 (FIG. 1) and 142 (FIG. 1C) were used. NV CNT block switches 104 have been measured (not shown) with ON-state resistance values as high as 100 MΩ. Various structures, materials, and geometries described further above with respect to FIGS. 1C-1E, and further below with respect to FIGS. 4-7, may be used to enable ON-state resistance values as high as 100 MΩ and $R_{OFF}/R_{ON}$ ratios in excess of two.

Figure 3E:
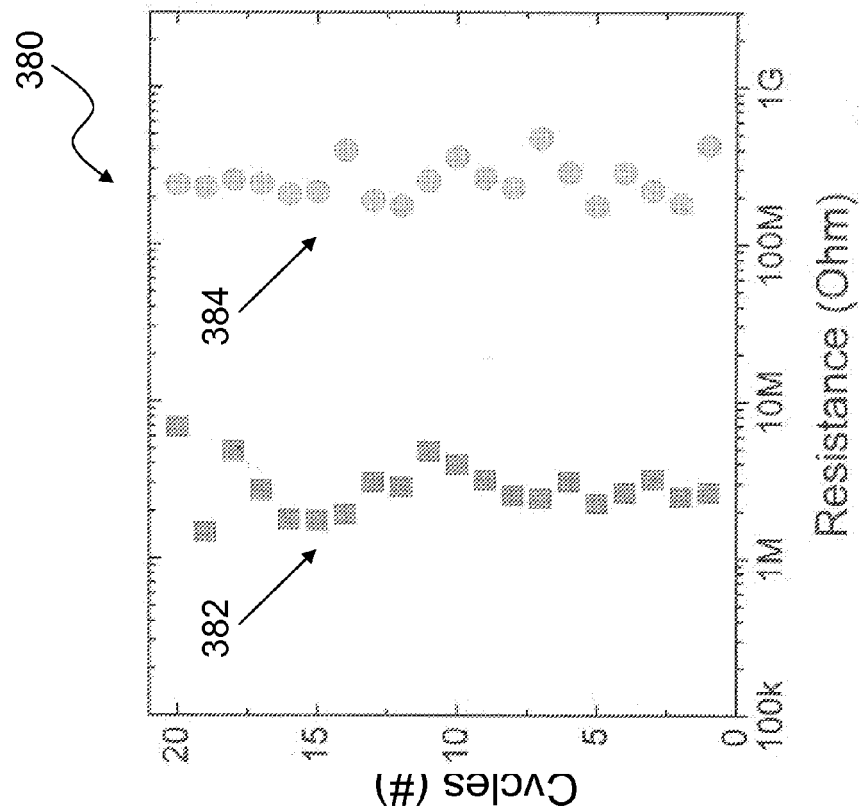
FIG. 3E illustrates the NV CNT resistive switch of FIG. 3D in operation.
Figure 3D:
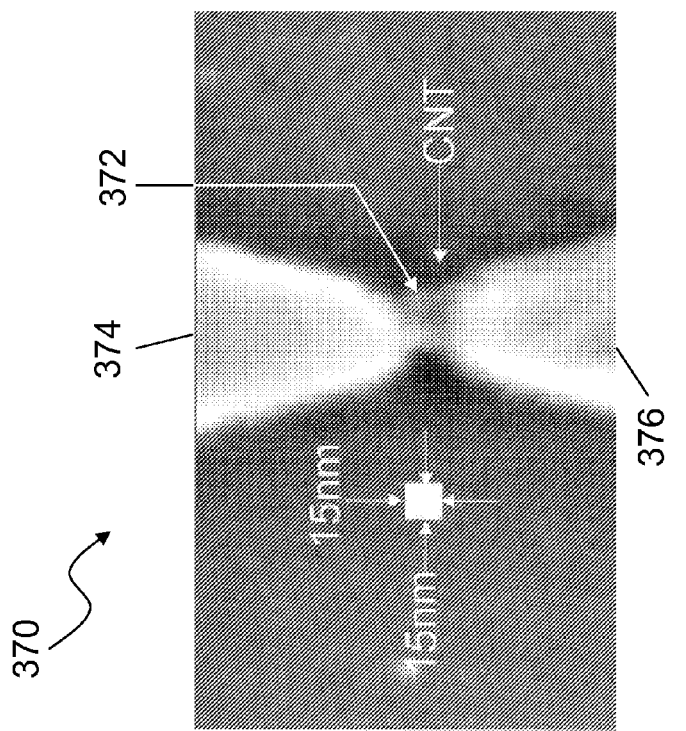
FIG. 3D illustrates an SEM of a NV CNT resistive switch formed with a square switch nanotube block having dimensions of 15 nm.

FIG. 3D illustrates an SEM of NV CNT resistive block switch 370 fabricated using eBeam lithography, which includes switch nanotube block 372 that has been scaled to 15 nm by 15 nm dimensions, and electrically contacted by contacts 374 and 376.

FIG. 3E illustrates resistance values 380 measured on NV CNT resistive block switch 370. Resistance values 380 show ON-state resistance values during cycling; that is SET (ON-state), READ, RESET (OFF-state), READ, and so forth. ON-state resistance values 382 and OFF-state resistance values 384 are shown across twenty cycles of NV CNT resistive block switch 370. ON-state resistance values 382 range from ~1.5 MΩ to ~6 MΩ, demonstrating the feasibility of fabricating NV CNT resistive block switches scaled to 15 nm dimensions. OFF-state resistance values 384 range from ~200 MΩ to ~400 MΩ. A description of a 1 Terabit memory chip formed with cross point arrays formed at a 15 nm technology node is described further below with respect to FIG. 21.

At this point in the present disclosure, various carbon based diodes, and enhanced cross point memory cells that include carbon nanotube diodes, are described further below.

Enhanced Cross Point Memory Cells

Figure 4B:
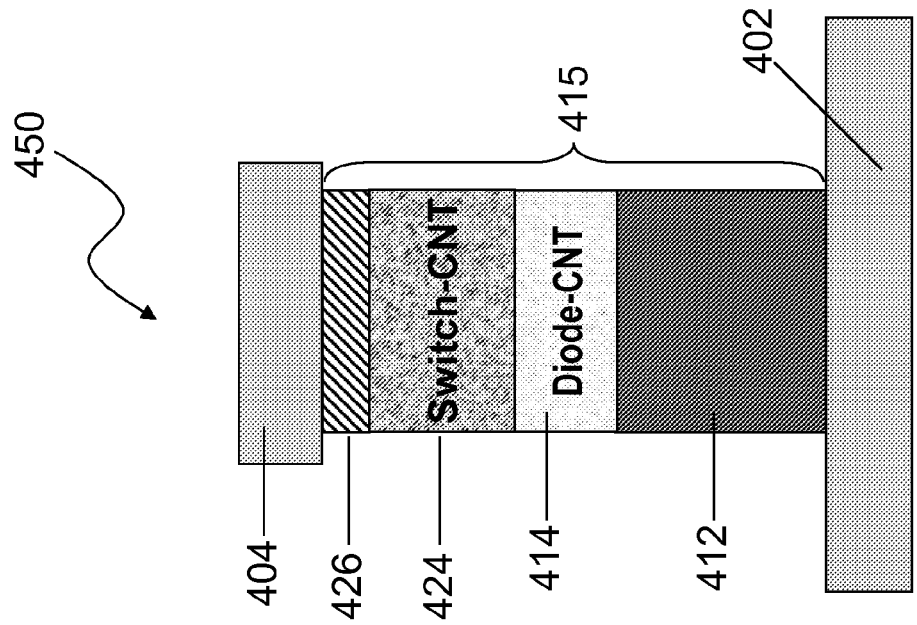
FIG. 4B illustrates an alternative embodiment of a resistive change memory element formed by a nonvolatile CNT resistive block switch and a carbon based diode configured as a Schottky diode having a conductive layer electrically contacting a diode nanotube fabric layer.
Figure 4A:
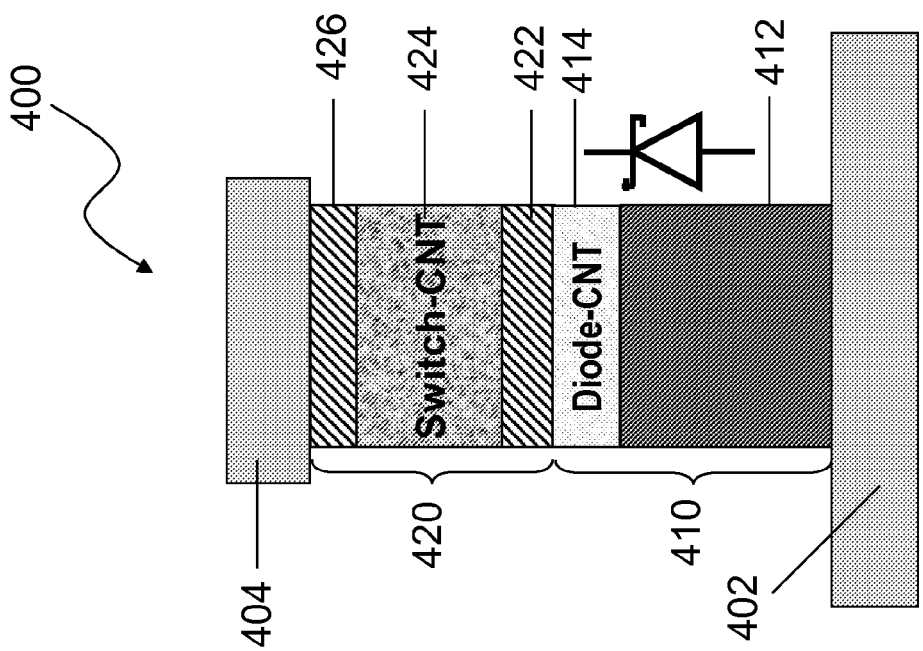
FIG. 4A illustrates a resistive change memory element formed by a nonvolatile CNT resistive block switch, an interposed conductive layer, and a carbon based diode configured as a Schottky diode having a conductive layer electrically contacting a diode nanotube fabric layer.

FIG. 4A illustrates a resistive change memory element 400 having a carbon based diode 410 in a series connection with a nonvolatile carbon nanotube (CNT) resistive block switch 420. The carbon based diode 410 illustrated in FIG. 4A is configured as a Schottky diode having a conductive layer 412 electrically contacting a diode nanotube fabric layer 414. The conductive layer 412 can be formed using any suitable metal, metal alloy, nitride, oxide, or silicide that has an appropriate work function to form a Schottky contact with the diode nanotube fabric layer 414. The diode nanotube fabric layer 414 can be formed using semiconducting single wall carbon nanotubes (s-SWNTs), as discussed in detail further below, and the diode nanotube fabric layer 414 can be doped p-type, doped n-type, or intrinsically semiconducting (e.g. undoped), as discussed in detail further below. Therefore, the carbon based diode 410 configured as a Schottky diode can have an anode formed by the conductive layer 412 and a cathode formed by the diode nanotube fabric layer 414 when the diode nanotube fabric layer 414 is n-type or an anode formed by the diode nanotube fabric layer 414 and a cathode formed by the conductive layer 412 when the diode nanotube fabric layer 414 is p-type. In alternative embodiments, the carbon based diode 410 configured as a Schottky diode may be replaced with a pn junction diode formed using semiconducting single wall carbon nanotubes (s-SWNTs) or any other suitable type of diode that can be formed using s-SWNTs.

The switch nanotube blocks, fabrics, fabric layers illustrated further can be a layer (or patterned layer or layers) of multiple, interconnected carbon nanotubes. A nanotube fabric, a nanotube fabric layer, a fabric of nanotubes, a nanotube fabric of multiple nanotube fabric layers, a nanofabric, or a nanotube block may be used interchangeably in the present disclosure, e.g., a non-woven CNT fabric, may for example, have a structure of multiple entangled nanotubes that are irregularly arranged relative to one another. Alternatively, or in addition, for example, the fabric of nanotubes for the present disclosure may possess some degree of positional regularity of the nanotubes, e.g., some degree of parallelism along their long axes.

The nonvolatile CNT resistive block switch 420 may be formed by a switch nanotube fabric layer 424 located between a first metal layer 422 and a second metal layer 426. The nonvolatile CNT resistive block switch 420 functions similar to the nonvolatile CNT resistive block switch 140 (FIG. 1C) discussed above, and therefore will not be described in detail below. The first metal layer 422 can be formed using any suitable metal, metal alloy, nitride, oxide, silicide, or carbon that has an appropriate work function to form an ohmic or near ohmic contact with the diode nanotube fabric layer 414. The switch nanotube fabric layer 424 is similar to the nanotube fabric layer 148 (FIG. 1C) discussed above, and therefore will not be described in detail below. The second metal layer 426 can be formed using metals, metal alloys, nitrides, oxides, silicides, or carbon. The resistive change memory element 400 is illustrated in FIG. 4A with the carbon based diode 410 electrically contacting a bottom wiring layer 402 and the nonvolatile CNT resistive block switch 420 electrically contacting a top wiring layer 404. Alternatively, the resistive change memory element 400 can be configured to have the carbon based diode 410 electrically contacting the top wiring layer 404 and the nonvolatile CNT resistive block switch 420 electrically contacting the bottom wiring layer 402. The bottom wiring layer 402 and the top wiring layer 404 can be fabricated using suitable metals, metal alloys, nitrides, oxides, or silicides.

For example, the resistive change memory element 400 is formed by the carbon based diode 410 and the nonvolatile CNT resistive block switch 420 as discussed above. When the diode nanotube fabric layer 414 is formed using p-type semiconducting single wall carbon nanotubes (s-SWNTs) with a work function of about $\Phi_{P-CNT} \approx 4.9$ eV, the conductive layer 412 selected should have a work function of less than or approximately equal to 4.9 eV and the first metal layer 422 should have a work function of greater than or approximately equal to 4.9 eV. In the present example, Titanium (Ti) with a work function of about 3.95-4.33 eV might be selected for the conductive layer 412 and Platinum (Pt) with a work function of about 5.32-5.5 eV might be selected for the first metal layer 422. Although, to reduce costs Titanium Nitride (TiN) with a work function of about 4.83 eV might be selected for the first metal layer 422.

Alternatively, the first metal layer 422 may be eliminated, such as in resistive change memory element 450 illustrated in FIG. 4B with like reference numbers representing like elements and components in FIGS. 4A and 4B. In the resistive change memory element 450 the interface between the diode nanotube fabric layer 414 and the switch nanotube fabric layer 424 forms an ohmic or near ohmic contact. However, when the first metal layer 422 is eliminated the diode nanotube fabric layer 414 might be required to be a thicker nanotube fabric layer, an ordered nanotube fabric layer, or both to reduce the risk of the diode nanotube fabric layer 414 being compromised by the application process of putting on the switch nanotube fabric layer 424. Additionally, the resistive change memory element 450 illustrated in FIG. 4B with the carbon based diode 410 electrically contacting the bottom wiring layer 402 and the nonvolatile CNT resistive block switch 420 electrically contacting the top wiring layer 404 can be configured to have the carbon based diode 410 electrically contacting the top wiring layer 404 and the nonvolatile CNT resistive block switch 420 electrically contacting the bottom wiring layer 402.

The diode nanotube fabric layer 414 can be a thinner nanotube fabric layer than the switch nanotube fabric layer 424, a nanotube fabric layer of approximately the same thickness as the switch nanotube fabric layer 424, or a thicker nanotube fabric layer than the switch nanotube fabric layer 424. The diode nanotube fabric layer 414 can be a less dense nanotube fabric layer than the switch nanotube fabric layer 424, a nanotube fabric layer of approximately the same density as the switch nanotube fabric layer 424, or a more dense nanotube fabric layer than the switch nanotube fabric layer 424. The diode nanotube fabric layer 414 can have a concentration of metallic carbon nanotubes that is lower than the concentration of metallic carbon nanotubes in the switch nanotube fabric layer 424. The diode nanotube fabric layer 414 can be formed using semiconducting single wall carbon nanotubes (s-SWNT) with methods of producing solutions approaching 100% s-SWNTs and removal of non-semiconducting SWNTs from nanotube fabrics described further below. Additionally, materials that increase the amount of contact among the s-SWNTs, such as amorphous carbon for example, can be added to the diode nanotube fabric layer 414 to increase the current flow though the diode nanotube fabric layer 414.

The s-SWNTs are typically formed as intrinsic semiconducting elements that may be considered p-type semiconducting elements. The s-SWNTs that are formed as intrinsic semiconducting elements can be converted to doped p-type semiconducting elements or doped n-type semiconducting elements by making the s-SWNTs in an environment with a dopant gas present, chemically modifying the s-SWNTs using wet chemistry techniques, using a chemical vapor deposit process to coat the s-SWNTs, plasma treatment of the s-SWNTs, and ion implantation of the s-SWNTs. Additionally, other carbon allotropes, such as graphitic layers (layered graphene) or buckyballs, that are formed as intrinsic semiconducting elements can be converted to doped p-type semiconducting elements or doped n-type semiconducting elements by making the carbon allotropes in an environment with a dopant gas present, chemically modifying the carbon allotropes using wet chemistry techniques, using a chemical vapor deposit process to coat the carbon allotropes, plasma treatment of the carbon allotropes, and ion implantation of the carbon allotropes.

Figure 4C:
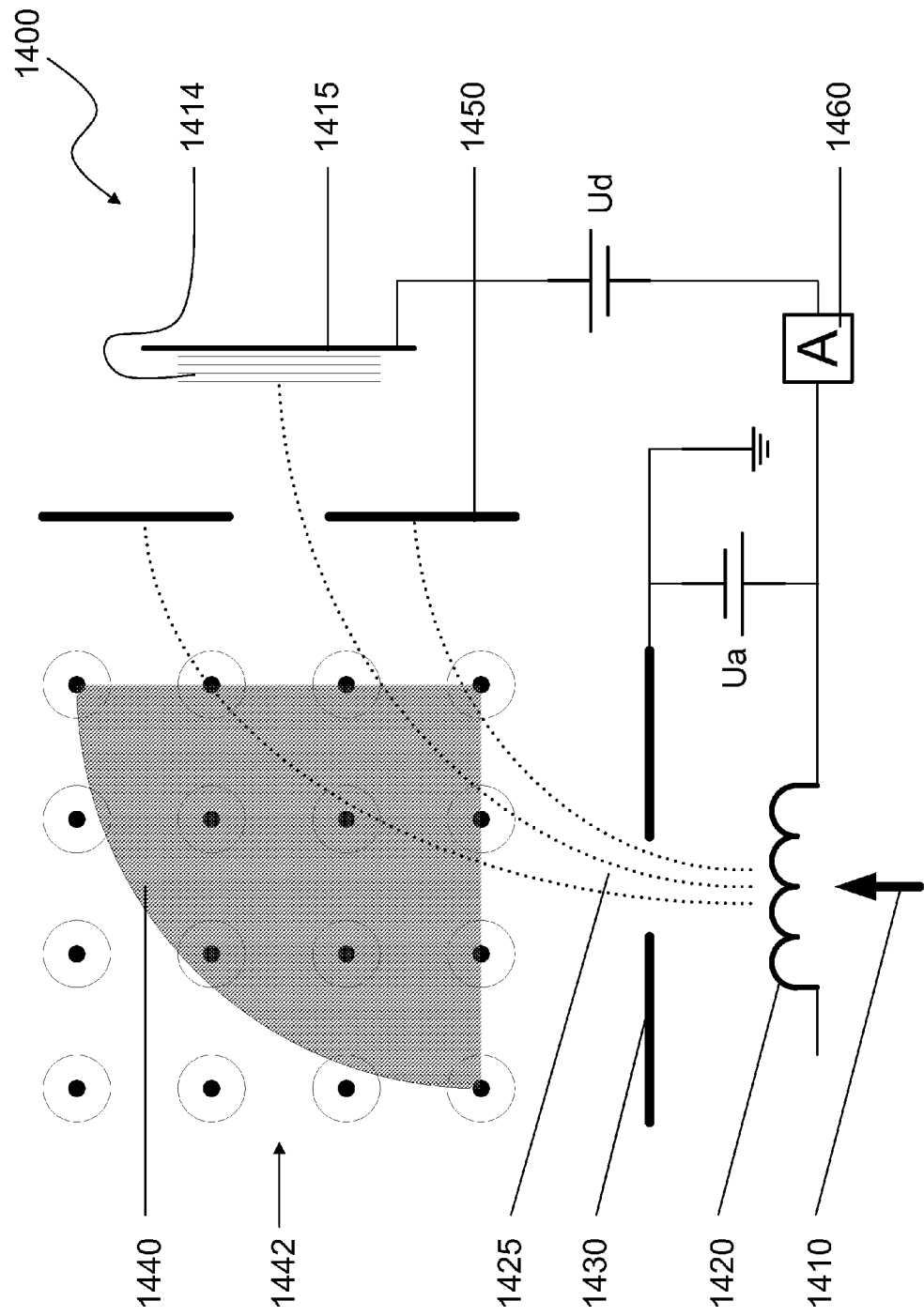
FIG. 4C illustrates an ion implantation device for in situ doping of a target material by ion implantation.

FIG. 4C illustrates an ion implantation device 1400 for in situ doping of a target material by ion implantation. The target material can be a carbon allotrope such as semiconducting single wall carbon nanotubes, semiconducting graphitic layers, or semiconducting buckyballs. However, the present example uses semiconducting single wall carbon nanotubes as the target material. The ion implantation device 1400 has an elemental source (e.g. a dopant gas) 1410, an ion producing coil 1420, an extraction slit 1430, a magnetic region 1440, a magnetic field 1442, a mass analyzing slit 1450, a first adjustable voltage difference Ua, a second adjustable voltage difference Ud, and a current integrator 1460. A nanotube fabric layer 1414 is fabricated on a substrate 1415 and the nanotube fabric layer 1414 can be an ordered nanotube fabric layer or layers, or an unordered nanotube fabric layer or layer, or combinations of ordered and unordered nanotube fabric layers. To implant ions into the nanotube fabric layer 1414 the elemental source (e.g. the dopant gas) 1410 is introduced to the ion producing coil 1420, which energizes the elemental source (e.g. dopant gas) 1410 and produces ions from there. The produced ions are then accelerated by applying the first adjustable voltage difference Ua; the accelerated ions form a plurality of ion beams 1425. Only those ion beams 1425 that pass through the extraction slit 1430 may enter into the magnetic region 1440. The ion beams 1425 are electrically charged, therefore, the ion beams that enter into the magnetic region 1440 may be deflected by the magnetic field 1442 based on, for example, the ions' masses, velocities, and/or charges. By using the mass analyzing slit 1450, ion beams of high purity may be extracted from a less pure ion source. After the ionization, extraction, and mass analysis of the elemental source 1410, ion beams 1425 may be accelerated or de-accelerated by adjusting the first adjustable voltage difference Ua and/or the second adjustable voltage difference Ud. Consequently, the ion implantation device 1400 may provide ion beams 1425 of desired energy to impinge the nanotube fabric layer 1414.

In order to uniformly implant ions into the nanotube fabric layer 1414, the ion beams 1425 may scan across the target materials by for example, an electrostatic technique, a magnetic technique, a mechanical technique, or a combination thereof. Additionally, neutral ions (i.e. ions that are charge neutral) previously included in ion beams 1425 can be removed from ion beams 1425 by using deflection techniques (e.g. electrostatic and/or magnetic techniques), before ion beams 1425 strike the nanotube fabric layer 1414. Further, the dosage of implanted ions (i.e. the number of ions implanted per unit area, ions/cm$^2$) in the nanotube fabric layer 1414 may be measured using a Faraday cup detector mounted before the nanotube fabric layer 1414, or an off-set cup mounted behind the nanotube fabric layer 1414. Given the species, energy, and dosage of the implanted ions, one can specify and adjust the concentration, depth, and uniformity of ions implanted in the nanotube fabric layer 1414. Examples of chemically active ions (or dopants) that may be implanted include atomic species, such as $N^+$, $F^+$, $B^+$, $P^+$, $As^+$, and $Sb^+$, molecular species, such as $BF_2^+$, $B_{10}H_{14}^+$, $PF_3^+$, and $AsF_3^+$, or any other ion implant species commonly used in the semiconductor industry to modify the band structure and conductivity of silicon. Further, implanting chemically reactive ion species may require a post thermal anneal following the ion implant to activate the chemical bonding of the chemically active ion species with carbon (C) and stabilize the structure of the carbon nanotubes.

FIGS. 4D and 4E illustrate an ion implantation process for the nanotube fabric layer 1414, where the nanotube fabric layer 1414 is an unordered nanotube fabric layer and ions 1426 are shown implanted in the nanotube fabric layer 1414. The desired ion dosage in the nanotube fabric layer 1414 depends on ion species, ion energy, angle of incidence of ion beams 1425, density of the nanotube fabric layer 1414, and thickness of the nanotube fabric layer 1414. FIG. 4D illustrates ion implantation of the nanotube fabric layer 1414 with an angle of incidence of the ion beams 1425 being a direct angle (i.e. zero degrees), namely, perpendicular to an upper surface of the nanotube fabric layer 1414. FIG. 4E illustrates ion implantation of the nanotube fabric layer 1414 with an angle of incidence of the ion beams 1425 being greater than zero degrees. Although FIGS. 4D and 4E illustrate ions 1426 being implanted directly into the nanotube fabric layer 1414 without any overlying layers, it is to be understood that ions may be implanted indirectly through one or more overlying layers. The implantation of ions indirectly may be required to support manufacturing processes where it might be difficult or otherwise inconvenient to implant ions directly into the nanotube fabric layer 1414 prior to the application of one or more overlying layers. For example, a first metal layer or other layers may be formed on the nanotube fabric layer 1414 prior to implanting ions. In the present example, ions can still be implanted to the desired thickness range of the nanotube fabric layer 1414 by properly adjusting the implant parameters, such as ion species, ion energy, and the angle of incidence of ion beams. Typically, carbon nanotubes in a nanotube fabric layer have implant characteristics similar to those of polymers, such as photoresists used in semiconductor lithography.

The ion implantation embodiments described above are for illustrative and explanatory purposes only. The ion implantation embodiments described above are not intended to be exhaustive and are not intended to limit the scope of the present disclosure to the precise ion implantation method described above. It is to be understood that modification and/or variations are possible in light of the above disclosures, or may be acquired from practice of the embodiments.

The primary synthesis technologies for producing CNTs in significant quantities are arc discharge, laser ablation, high pressure carbon monoxide (HiPCO), Chemical Vapor Deposition (CVD) including Plasma Enhanced CVD (PECVD), and controlled flame synthesized SWNTs (e.g., Nano-C). Depending on their physical structure, individual carbon nanotubes can be highly conductive or semiconducting. The conductivity of an individual carbon nanotube is determined by the orientation of the hexagonal rings around the wall of the nanotube. This orientation is referred to as the chirality (or twist) of the nanotube by those skilled in the art and can be quantified as the angle between the hexagonal pattern of the individual carbon rings making up the wall of the nanotube and the axis of the nanotube itself. In the case of semiconducting nanotubes the chirality of the nanotubes is responsible for the mobility of holes and/or electrons. Within a typical distribution of SWNTs, for example, roughly one third will be conducting (often simply referred to as metallic nanotubes) and two thirds will be semiconducting. Therefore, additional separation techniques are required to isolate the s-SWNT from other structures, such as MWNTs and metallic SWNTs.

Current techniques for separating metallic single wall carbon nanotubes (SWNTs) and multi-wall carbon nanotubes (MWNTs) from semiconducting-SWNTs result in semiconducting-SWNT concentrations in the range of approximately 80% to just less than 100%, with some metallic CNTs remaining Examples of separation techniques in use are dielectrophoresis (e.g., AC dielectrophoresis and agarose gel electrophoresis), Gel Chromatography, amine extraction, polymer wrapping, selective oxidation, CNT functionalization, and non-linear density-gradient ultracentrifugation. However, additional techniques are being developed within the industry to manufacture supplies of semiconducting-only carbon nanotubes. Such techniques include methods to sort metallic carbon nanotubes from semiconducting nanotubes, as well as methods for fabricating carbon nanotubes such that the percentage of metallic nanotubes produced is much smaller than the percentage of semiconducting nanotubes produced. Presently, >99.5% semiconducting SWNTs have been fabricated. As these techniques continue to develop, supplies of semiconducting-only carbon nanotubes are expected to become more readily available and achieve even greater levels of purity. Purity levels of 99.999% or greater semiconducting SWNTs are being targeted by nanotube suppliers.

Other methods of further processing metallic CNTs, such as post-processing of metallic CNTs, to either convert them to semiconducting CNTs or remove them after they have formed the nano-fabric layer may require 1) functionalizing the metallic CNTs so that they are converted to semiconducting CNTs or non-conducting CNTs (e.g., opens), 2) functionalizing the metallic CNTs so that they can be selectively removed from the nano-fabric layer, or 3) burning-off of the metallic CNTs. Process techniques to convert metallic CNTs to semiconducting CNTs such as a plasma treatment to convert metallic CNTs to semiconductor type (Chen, et al., Japanese Journal of Applied Physics, vol 45, no. 4B, pp. 3680-3685, 2006) or using protein-coated nanoparticles in the device contact areas to convert metallic CNTs to semiconductor type (Na, et. al., Fullerenes, Nanotubes, and Carbon Nanostructures, vol. 14, pp. 141-149, 2006) are further described in these references. Additionally, the metallic CNTs in the diode nanotube fabric layer 414 that short out the carbon based diode 410 by forming a conductive path can be burnt off because the metallic CNTs have a higher conductivity and lower resistance than the semiconducting CNTs. When an appropriate voltage is applied across the diode nanotube fabric layer 414, a burn-off current that flows primarily through metallic CNTs is generated causing electrical breakdown or burning off the metallic CNTs while leaving semiconducting SWNTs intact. The above processing techniques may be used individually, in combination, or in combination with other processing techniques to either remove or convert the metallic CNTs to semiconductor CNTs. The complete conversion or removal of all metallic CNTs from the nanotube fabric layer is not required and metallic CNTs that are not critical to the diode action may remain in the nanotube fabric layer.

The diode nanotube fabric layer 414 can be an unordered nanotube fabric layer with the semiconducting SWNTs in an orientation similar to that described above and illustrated in FIG. 12A or an ordered nanotube fabric layer with the semiconducting SWNTs in an orientation similar to that described above and illustrated in FIG. 12B. For a CNT Schottky diode current flow is created by the flow of majority carriers across the interface or junction between the nanotube fabric layer and the conductive layer. The majority carriers are electrons for a CNT Schottky diode having an n-type nanotube fabric layer and the majority carriers are holes for a CNT Schottky diode having a p-type nanotube fabric layer. The changes made to a nanotube fabric layer when rendering the nanotube fabric layer from an unordered layer into an ordered layer can change the boundary conditions for current flow across the interface or junction between the nanotube fabric layer and the suitable metal, metal alloy, nitride, oxide, or silicide electrically contacting the nanotube fabric layer. Further, the changes made to a nanotube fabric layer when rendering the nanotube fabric layer from an unordered layer into an ordered layer can also change how the current flows though the nanotube fabric layer on a microscopic level by changing frictional forces that oppose the acceleration of carriers in an electric field.

Figure 4H:
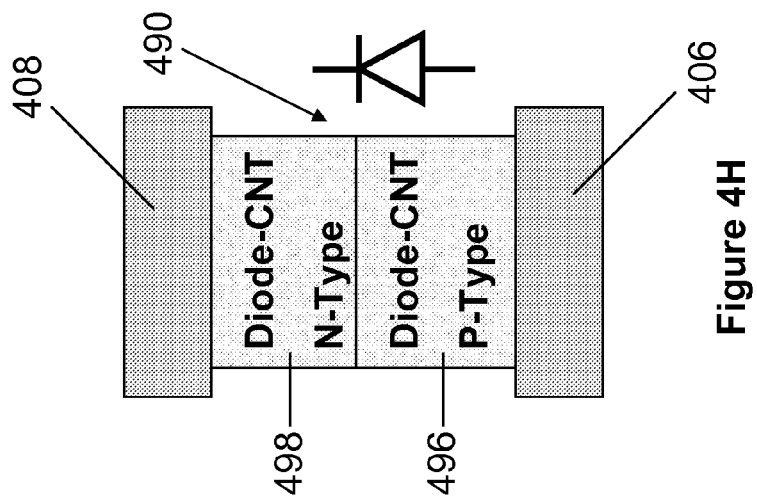
FIG. 4H illustrates a carbon based diode configured as a pn junction diode having a p-type diode nanotube fabric layer electrically contacting an n-type diode nanotube fabric layer.

The carbon based diodes formed using nanotube fabric layers discussed and shown above in a series connection with the nonvolatile CNT resistive block switch 420 can also be fabricated separately or in a connection with other devices or components. FIG. 4F illustrates a carbon based diode 470 formed as a Schottky diode having an anode formed by p-type diode nanotube fabric layer 474 and a cathode formed by a conductive layer 472. The p-type diode nanotube fabric layer 474 can be an unordered nanotube fabric layer or an ordered nanotube fabric layer formed using the above stated techniques and methods for forming the diode nanotube fabric layer 474. The conductive layer 472 can be formed using any suitable metal, metal alloy, nitride, oxide, or silicide that has an appropriate work function to form a Schottky contact with the p-type diode nanotube fabric layer 474. The p-type diode nanotube fabric layer 474 is illustrated in FIG. 4F electrically contacting a second diode wiring layer 408. The conductive layer 472 is illustrated in FIG. 4F electrically contacting a first diode wiring layer 406. The first diode wiring layer 406 can be formed using any suitable metal, metal alloy, nitride, oxide, or silicide. The second diode wiring layer 408 can be formed using any suitable metal, metal alloy, nitride, oxide, or silicide that has an appropriate work function to form an ohmic or near ohmic contact with the p-type diode nanotube fabric layer 474. Alternatively, the p-type diode nanotube fabric layer 474 can be in electrical communication with the first diode wiring layer 406 and the conductive layer 472 can be in electrical communication with the second diode wiring layer 408. In this alternative embodiment, the first diode wiring layer 406 can be formed using any suitable metal, metal alloy, nitride, oxide, or silicide that has an appropriate work function to form an ohmic or near ohmic contact with the p-type diode nanotube fabric layer 474 and the second diode wiring layer 408 can be formed using any suitable metal, metal alloy, nitride, oxide, or silicide.

Further, when the carbon based diode 470 is fabricated as a component that can be arranged by a circuit designer, the sequence in which the conducting layer 472 and the p-type diode nanotube fabric layer 474 are deposited may be based on fabrication parameters; the carbon based diode 470 can be rotated by the circuit designer to achieve the desired polarity. For example, the conducting layer 472 can be deposited as the bottom layer and the p-type diode nanotube fabric layer 474 can be deposited as the top layer, so that the p-type diode nanotube fabric layer 474 can be more easily doped using in situ doping methods and techniques. Although, the carbon based diode 470 formed as Schottky diode has been discussed above as being formed using a p-type nanotube fabric layer, the carbon based diode 470 can be formed as a Schottky diode using an intrinsically semiconducting (e.g. undoped) nanotube fabric layer.

Figure 4G:
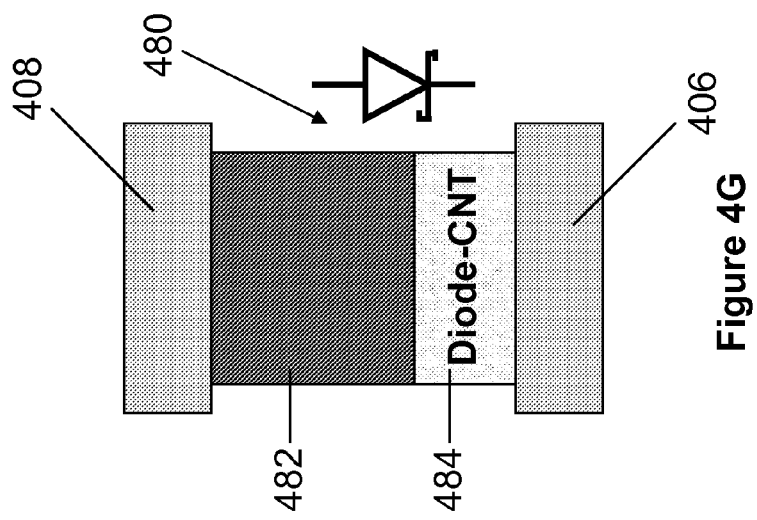
FIG. 4G illustrates a carbon based diode configured as a Schottky diode having a conductive layer electrically contacting an n-type diode nanotube fabric layer.
Figure 4F:
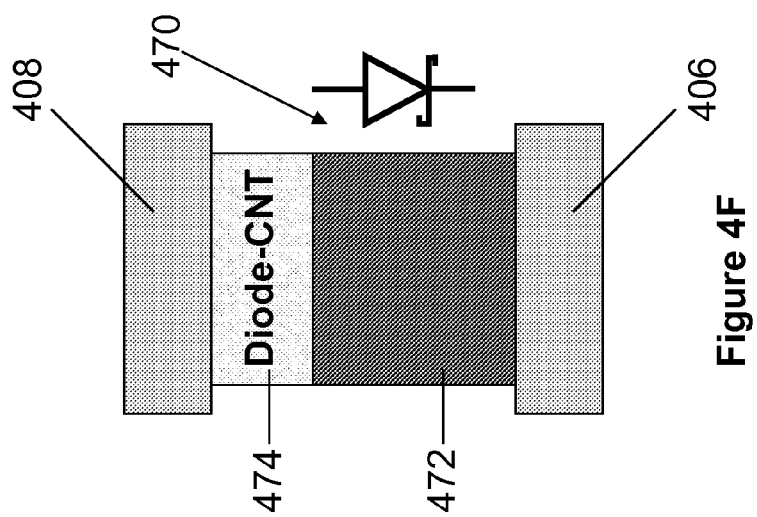
FIG. 4F illustrates a carbon based diode configured as a Schottky diode having a conductive layer electrically contacting a p-type diode nanotube fabric layer.

FIG. 4G illustrates a carbon based diode 480 formed as a Schottky diode having an anode formed by a conductive layer 482 and a cathode formed by n-type diode nanotube fabric layer 484. The conductive layer 482 can be formed using any suitable metal, metal alloy, nitride, oxide, or silicide that has an appropriate work function to form a Schottky contact with the n-type diode nanotube fabric layer 484. The n-type diode nanotube fabric layer 484 can be an unordered nanotube fabric layer or an ordered nanotube fabric layer formed using the above stated techniques and methods for forming the diode nanotube fabric layer 474. The n-type diode nanotube fabric layer 484 is illustrated in FIG. 4G electrically contacting a first diode wiring layer 406 and the conductive layer 482 is illustrated in FIG. 4G electrically contacting a second diode wiring layer 408. The first diode wiring layer 406 can be formed using any suitable metal, metal alloy, nitride, oxide, or silicide that has an appropriate work function to form an ohmic or near ohmic contact with the n-type diode nanotube fabric layer 484. The second diode wiring layer 408 can be formed using any suitable metal, metal alloy, nitride, oxide, or silicide. Alternatively, the n-type diode nanotube fabric layer 484 can be in electrical communication with the second diode wiring layer 408 and the conductive layer 482 can be in electrical communication with the first diode wiring layer

406. In this alternative embodiment, the first diode wiring layer 406 can be formed using any suitable metal, metal alloy, nitride, oxide, or silicide and the second diode wiring layer 408 can be formed using any suitable metal, metal alloy, nitride, oxide, or silicide that has an appropriate work function to form an ohmic or near ohmic contact with the n-type diode nanotube fabric layer 484.

Further, when the carbon based diode 480 is fabricated as a component that can be arranged by a circuit designer, the sequence in which the conducting layer 482 and the n-type diode nanotube fabric layer 484 are deposited may be based on fabrication parameters; the carbon based diode 480 can be rotated by the circuit designer to achieve the desired polarity. For example, the conducting layer 482 can be deposited as the bottom layer and the n-type diode nanotube fabric layer 484 can be deposited as the top layer, so that the n-type diode nanotube fabric layer 484 can be more easily doped using in situ doping methods and techniques.

FIG. 4H illustrates a carbon based diode 490 formed as a pn junction diode having an anode formed by a p-type diode nanotube fabric layer 496 and a cathode formed by an n-type diode nanotube fabric layer 498. The p-type diode nanotube fabric layer 496 can be an unordered nanotube fabric layer or an ordered nanotube fabric layer formed using the above stated techniques and methods for forming the diode nanotube fabric layer 474. The n-type diode nanotube fabric layer 498 can be an unordered nanotube fabric layer or an ordered nanotube fabric layer formed using the above stated techniques and methods for forming the diode nanotube fabric layer 484. The use of unordered nanotube fabric layers, ordered nanotube fabric layers, or an unordered nanotube fabric layer and an ordered nanotube fabric can change the boundary conditions for current flow across the pn junction formed by the p-type diode nanotube fabric layer 496 and the n-type diode nanotube fabric layer 498. Additionally, when the p-type diode nanotube fabric layer 496 is formed as an ordered nanotube fabric layer and the n-type diode nanotube fabric layer 498 is formed as an ordered nanotube fabric layer the angle of orientation of the p-type diode nanotube fabric layer 496 relative to the n-type diode nanotube fabric layer 498 can change the boundary conditions for current flow across the pn junction. The angle of orientation of the p-type diode nanotube fabric layer 496 relative to the n-type diode nanotube fabric layer 498 can be selected by a circuit designer. For example, the p-type diode nanotube fabric layer 496 can be oriented at an angle of about 90 degrees (i.e. perpendicular) relative to the n-type diode nanotube fabric layer 498.

The p-type diode nanotube fabric layer 496 is illustrated in FIG. 4H electrically contacting a first diode wiring layer 406 and the n-type diode nanotube fabric layer 498 is illustrated in FIG. 4H electrically contacting a second diode wiring layer 408. The first diode wiring layer 406 can be formed using any suitable metal, metal alloy, nitride, oxide, or silicide that has an appropriate work function to form an ohmic or near ohmic contact with the p-type diode nanotube fabric layer 496. The second diode wiring layer 408 can be formed using any suitable metal, metal alloy, nitride, oxide, or silicide that has an appropriate work function to form an ohmic or near ohmic contact with the n-type diode nanotube fabric layer 498. Alternatively, the p-type diode nanotube fabric layer 496 can be in electrical communication with the second diode wiring layer 408 and the n-type diode nanotube fabric layer 498 can be in electrical communication with the first diode wiring layer 406. In this alternative embodiment, the first diode wiring layer 406 can be formed using any suitable metal, metal alloy, nitride, oxide, or silicide that has an appropriate work function to form an ohmic or near ohmic contact with the n-type diode nanotube fabric layer 498 and the second diode wiring layer 408 can be formed using any suitable metal, metal alloy, nitride, oxide, or silicide that has an appropriate work function to form an ohmic or near ohmic contact with the p-type diode nanotube fabric layer 496.

Further, when the carbon based diode 490 is fabricated as a component that can be arranged by a circuit designer, the sequence in which the p-type diode nanotube fabric layer 496 and the n-type diode nanotube fabric layer 498 are deposited may be based on fabrication parameters; the carbon based diode 490 can be rotated by the circuit designer to achieve the desired polarity. For example, the n-type diode nanotube fabric layer 498 can be deposited as the bottom layer and the p-type diode nanotube fabric layer 496 can be deposited as the top layer. In the present example the n-type diode nanotube fabric layer 498 might be required to be a thicker nanotube fabric layer, an ordered nanotube fabric layer, or both to reduce the risk of the n-type diode nanotube fabric layer 498 being compromised by the application process of putting on the p-type nanotube fabric layer 496. The p-type diode nanotube fabric layer 496 might be formed as a thinner nanotube fabric layer and/or the p-type nanotube fabric layer 496 can be more easily doped using in situ doping methods and techniques. For example, the p-type diode nanotube fabric layer 496 can be deposited as the bottom layer and the n-type diode nanotube fabric layer 498 can be deposited as the top layer. In the present example the p-type diode nanotube fabric layer 496 might be required to be a thicker nanotube fabric layer, an ordered nanotube fabric layer, or both to reduce the risk of the p-type diode nanotube fabric layer 496 being compromised by the application process of putting on the n-type nanotube fabric layer 498. The n-type diode nanotube fabric layer 498 might be formed as a thinner nanotube fabric layer and/or the n-type nanotube fabric layer 498 can be more easily doped using in situ doping methods and techniques. Although, the carbon based diode 490 formed as a pn junction diode has been discussed above as being formed using a p-type nanotube fabric layer and an n-type nanotube fabric layer, the carbon based diode 490 can be formed as a pn junction diode using an intrinsically semiconducting (e.g. undoped) nanotube fabric layer and an n-type nanotube fabric layer.

Figure 5B:
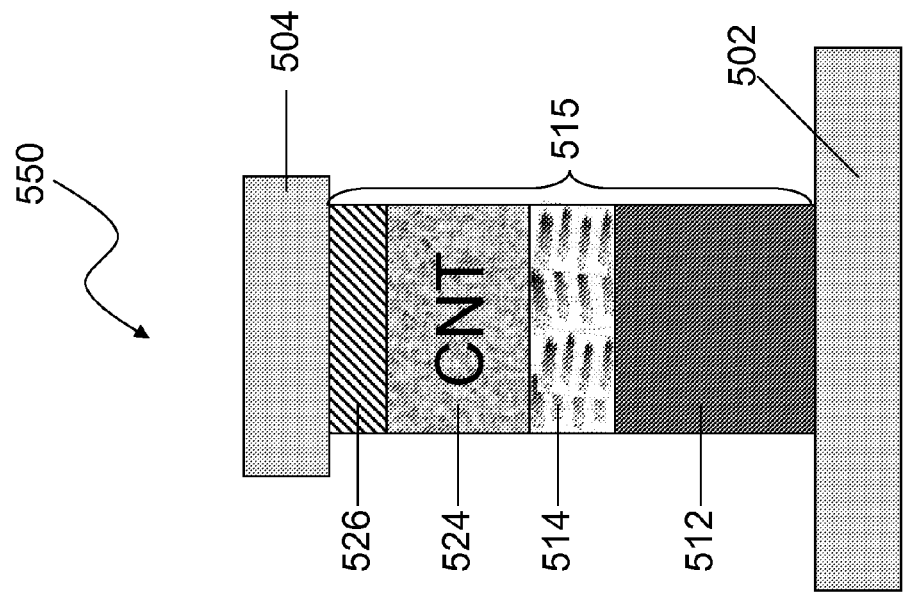
FIG. 5B illustrates an alternative embodiment of a resistive change memory element formed by a nonvolatile CNT resistive block switch and a carbon based diode configured as a Schottky diode having a conductive layer electrically contacting a diode graphitic layer.
Figure 5A:
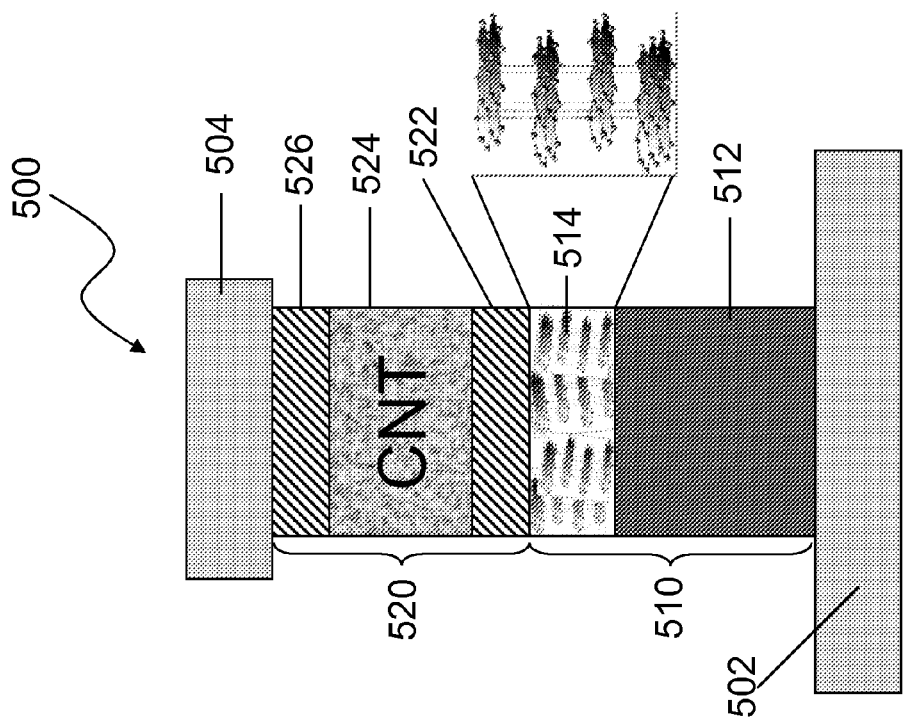
FIG. 5A illustrates a resistive change memory element formed by a nonvolatile CNT resistive block switch, an interposed conductive layer, and a carbon based diode configured as a Schottky diode having a conductive layer electrically contacting a diode graphitic layer.

FIG. 5A illustrates a resistive change memory element 500 having a carbon based diode 510 in a series connection with a nonvolatile carbon nanotube (CNT) resistive block switch 520. The carbon based diode 510 illustrated in FIG. 5A is configured as a Schottky diode having a conductive layer 512 electrically contacting a diode graphitic layer 514. The conductive layer 512 can be formed using any suitable metal, metal alloy, nitride, oxide, or silicide that has an appropriate work function to form a Schottky contact with the diode graphitic layer 514. The diode graphitic layer 514 can be formed by one or more graphene layers and the diode graphitic layer 514 can be doped p-type, doped n-type, or intrinsically semiconducting (e.g. undoped). Therefore, the carbon based diode 510 configured as a Schottky diode can have an anode formed by the conductive layer 512 and a cathode formed by the diode graphitic layer 514 when the diode graphitic layer 514 is n-type or an anode formed by the diode graphitic layer 514 and a cathode formed by the conductive layer 512 when the diode graphitic layer 514 is p-type. Graphene grows as a 2D zero gap semiconductor and graphene can be purified and mixed into solution in a similar manner to CNTs, therefore, the diode graphitic layer 514 can be formed using similar methods and techniques to those discussed above for forming nanotube fabric layers. Additionally, as discussed above for nanotube fabric layers, materials that increase the amount of contact among the graphene layers, such as amorphous carbon for example, can be added to the diode graphitic layer 514 to increase the current flow through the diode graphitic layer 514. In alternative embodiments, the carbon based diode 510 configured as a Schottky diode may be replaced with a pn junction diode formed using one or more graphene layers or any other suitable type of diode that can be formed using one or more graphene layers.

The nonvolatile CNT resistive block switch 520 may be formed by a switch nanotube fabric layer 524 located between a first metal layer 522 and a second metal layer 526. The nonvolatile CNT resistive block switch 520 functions similar to the nonvolatile CNT resistive block switch 140 (FIG. 1C) discussed above, and therefore, will not be described in detail below. The first metal layer 522 can be formed using any suitable metal, metal alloy, nitride, oxide, or silicide that has an appropriate work function to form an ohmic or near ohmic contact with the diode graphitic layer 514. Alternatively, the first metal layer 522 may be eliminated, such as in resistive change memory element 550 illustrated in FIG. 5B with like reference numbers representing like elements and components in FIGS. 5A and 5B. In the resistive change memory element 550 the interface between the diode graphitic layer 514 and the switch nanotube fabric layer 524 forms an ohmic or near ohmic contact. The switch nanotube fabric layer 524 is similar to the nanotube fabric layer 148 (FIG. 1C) discussed above, and therefore, will not be described in detail below. The second metal layer 526 can be formed using metals, metal alloys, nitrides, oxides, or silicides. A bottom wiring layer 502 and a top wiring layer 504 can be fabricated using suitable metals, metal alloys, nitrides, oxides, or silicides.

Figure 5D:
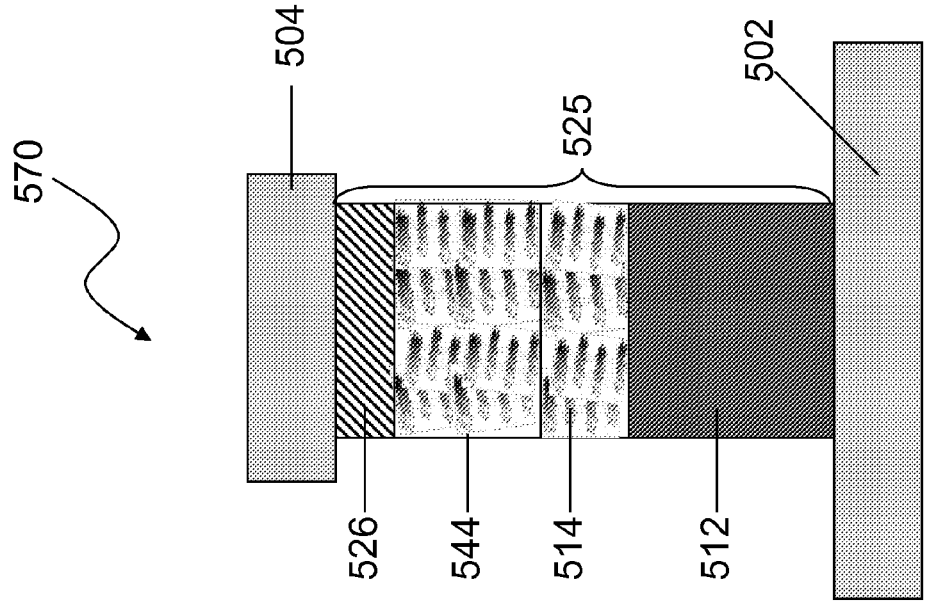
FIG. 5D illustrates an alternative embodiment of a resistive change memory element formed by a nonvolatile graphitic resistive block switch and a carbon based diode configured as a Schottky diode having a conductive layer electrically contacting a diode graphitic layer.
Figure 5C:
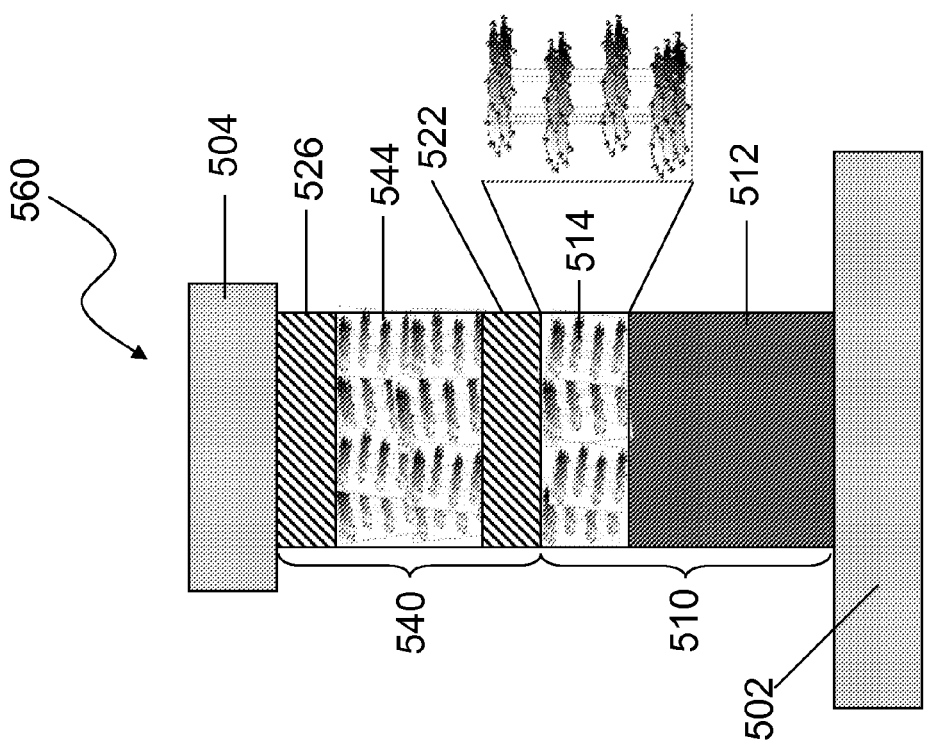
FIG. 5C illustrates a resistive change memory element formed by a nonvolatile graphitic resistive block switch, an interposed conductive layer, and a carbon based diode configured as a Schottky diode having a conductive layer electrically contacting a diode graphitic layer.

Alternatively, a nonvolatile graphitic resistive block switch 540 may be used in place of the nonvolatile CNT resistive block switch 520, such as in resistive change memory element 560 illustrated in FIG. 5C and in resistive change memory element 570 illustrated in FIG. 5D with like reference numbers representing like elements and components in FIGS. 5A-5D. The resistive change memory elements 560 and 570 can be used to store data by having different resistive states of the resistive change memory elements 560 and 570 correspond to different possible values based on an assigned convention. For example, the resistive change memory elements 560 and 570 can be configured to store a single bit by reversibly switching between a first resistive state (e.g., a high resistive state) that corresponds to a logic 0 and a second resistive state (e.g., a low resistive state) that corresponds to a logic 1. In another example, the resistive change memory elements 560 and 570 can be configured to store two bits by reversibly switching between a first resistive state (e.g., a very high resistive state) that corresponds to a logic 00, a second resistive state (e.g., a moderately high resistive state) that corresponds to a logic 01, a third resistive state (e.g. a moderately low resistive state) that corresponds to a logic 10, and a fourth resistive state (e.g., a very low resistive state) that corresponds to a logic 11. Further, the resistive change memory elements 560 and 570 can have additional resistive states.

The nonvolatile graphitic resistive block switch 540 can be formed by a switch graphitic layer 544 in place of the switch nanotube fabric layer 524. The switch graphitic layer 544 can be formed using any of the processing methods and techniques used to form the diode graphitic layer 514, as discussed in detail above. The different resistive states of the nonvolatile graphitic resistive block switch 540 are effectuated through the use of the switch graphitic layer 544 that adjusts the resistive state of the nonvolatile graphitic resistive block switch 540 in response to an electrical stimulus. The switch graphitic layer 544 can adjust the nonvolatile graphitic resistive block switch 540 from the low resistance state that corresponds to logic 1 to the high resistance state that corresponds to logic 0, through application of a first electrical stimulus in the form of a current pulse at an appropriate voltage to the switch graphitic layer 544. The first electrical stimulus changes how the current flows on a microscopic level from the first metal layer 522. Or, if the first metal layer 522 is not present, from the carbon based diode 510 through the switch graphitic layer 544 to the second metal layer 526. The switch graphitic layer 544 can adjust the nonvolatile graphitic resistive block switch 540 from the high resistance state that corresponds to logic 0 to the low resistance state that corresponds to logic 1 through application of a second electrical stimulus in the form of a current pulse at an appropriate voltage to the switch graphitic layer 544. The second electrical stimulus changes how the current flows on a microscopic level from the first metal layer 522 or if the first metal layer 522 is not present from the carbon based diode 510 through the switch graphitic layer 544 to the second metal layer 526.

Further, the resistive change memory elements 500 and 550 illustrated in FIGS. 5A and 5B having the carbon based diode 510 electrically contacting the bottom wiring layer 502 and the nonvolatile CNT resistive block switch 520 electrically contacting the top wiring layer 504 can be configured to have the carbon based diode 510 electrically contacting the top wiring layer 504 and the nonvolatile CNT resistive block switch 520 electrically contacting the bottom wiring layer 502. The resistive change memory elements 560 and 570 illustrated in FIGS. 5C and 5D having the carbon based diode 510 electrically contacting the bottom wiring layer 502 and the nonvolatile graphitic resistive block switch 540 contacting the top wiring layer 504 can be configured to have the carbon based diode 510 electrically contacting the top wiring layer 504 and the nonvolatile graphitic resistive block switch 540 electrically contacting the bottom wiring layer 502.

The carbon based diodes formed using graphitic layers discussed and shown above in a series connection with the nonvolatile CNT resistive block switch 520 and the nonvolatile graphitic resistive block switch 540 can also be fabricated separately or in a connection with other devices or components. FIG. 5E illustrates a carbon based diode 580 formed as a Schottky diode having an anode formed by p-type diode graphitic layer 584 and a cathode formed a conductive layer 582. The p-type diode graphitic layer 584 can be formed by one or more graphene layers and the p-type diode graphitic layer 584 can be formed using similar methods and techniques to those discussed above for forming the diode graphitic layer 514. The conductive layer 582 can be formed using any suitable metal, metal alloy, nitride, oxide, or silicide that has an appropriate work function to form a Schottky contact with the p-type diode graphitic layer 584. The p-type diode graphitic layer 584 is illustrated in FIG. 5E electrically contacting a second diode wiring layer 508 and the conductive layer 582 is illustrated in FIG. 5E electrically contacting a first diode wiring layer 506. The first diode wiring layer 506 can be formed using any suitable metal, metal alloy, nitride, oxide, or silicide. The second diode wiring layer 508 can be formed using any suitable metal, metal alloy, nitride, oxide, or silicide that has an appropriate work function to form an ohmic or near ohmic contact with the p-type diode graphitic layer 584. Alternatively, the p-type diode graphitic layer 584 can be in electrical communication with the first diode wiring layer 506 and the conductive layer 582 can be in electrical communication with the second diode wiring layer 508. In this alternative embodiment, the first diode wiring layer 506 can be formed using any suitable metal, metal alloy, nitride, oxide, or silicide that has an appropriate work function to form an ohmic or near ohmic contact with the p-type diode graphitic layer 584 and the second diode wiring layer 508 can be formed using any suitable metal, metal alloy, nitride, oxide, or silicide.

Further, when the carbon based diode 580 is fabricated as a component that can be arranged by a circuit designer, the sequence in which the conducting layer 582 and the p-type diode graphitic layer 584 are deposited may be based on fabrication parameters; the carbon based diode 580 can be rotated by the circuit designer to achieve the desired polarity. For example, the conducting layer 582 can be deposited as the bottom layer and the p-type diode graphitic layer 584 can be deposited as the top layer, so that the p-type diode graphitic layer 584 can be more easily doped using in situ doping methods and techniques. Although, the carbon based diode 580 formed as Schottky diode has been discussed above as being formed using a p-type graphitic layer, the carbon based diode 580 can be formed as a Schottky diode using an intrinsically semiconducting (e.g. undoped) graphitic layer.

FIG. 5F illustrates a carbon based diode 585 formed as a Schottky diode having an anode formed by a conductive layer 586 and a cathode formed by n-type diode graphitic layer 588. The conductive layer 586 can be formed using any suitable metal, metal alloy, nitride, oxide, or silicide that has an appropriate work function to form a Schottky contact with the n-type diode graphitic layer 588. The n-type diode graphitic layer 588 can be formed by one or more graphene layers and the n-type diode graphitic layer 588 can be formed using similar methods and techniques to those discussed above for forming the diode graphitic layer 514. The n-type diode graphitic layer 588 is illustrated in FIG. 5F electrically contacting a first diode wiring layer 506 and the conductive layer 586 is illustrated in FIG. 5F electrically contacting a second diode wiring layer 508. The first diode wiring layer 506 can be formed using any suitable metal, metal alloy, nitride, oxide, or silicide that has an appropriate work function to form an ohmic or near ohmic contact with the n-type diode graphitic layer 588. The second diode wiring layer 508 can be formed using any suitable metal, metal alloy, nitride, oxide, or silicide. Alternatively, the n-type diode graphitic layer 588 can be in electrical communication with the second diode wiring layer 508 and the conductive layer 586 can be in electrical communication with the first diode wiring layer 506. In this alternative embodiment, the first diode wiring layer 506 can be formed using any suitable metal, metal alloy, nitride, oxide, or silicide and the second diode wiring layer 508 can be formed using any suitable metal, metal alloy, nitride, oxide, or silicide that has an appropriate work function to form an ohmic or near ohmic contact with the n-type diode graphitic layer 588.

Further, when the carbon based diode 585 is fabricated as a component that can be arranged by a circuit designer, the sequence in which the conducting layer 586 and the n-type diode graphitic layer 588 are deposited may be based on fabrication parameters; the carbon based diode 585 can be rotated by the circuit designer to achieve the desired polarity. For example, the conducting layer 586 can be deposited as the bottom layer and the n-type diode graphitic layer 588 can be deposited as the top layer, so that the n-type diode graphitic layer 588 can be more easily doped using in situ doping methods and techniques.

FIG. 5G illustrates a carbon based diode 590 formed as a pn junction diode having an anode formed by a p-type diode graphitic layer 596 and a cathode formed by an n-type diode graphitic layer 598. The p-type diode graphitic layer 596 can be formed by one or more graphene layers and the p-type diode graphitic layer 596 can be formed using similar methods and techniques to those discussed above for forming the diode graphitic layer 514. The n-type diode graphitic layer 598 can be formed by one or more graphene layers and the n-type diode graphitic layer 598 can be formed using similar methods and techniques to those discussed above for forming the diode graphitic layer 514. The p-type diode graphitic layer 596 is illustrated in FIG. 5G electrically contacting a first diode wiring layer 506 and the n-type diode graphitic layer 598 is illustrated in FIG. 5G electrically contacting a second diode wiring layer 508. The first diode wiring layer 506 can be formed using any suitable metal, metal alloy, nitride, oxide, or silicide that has an appropriate work function to form an ohmic or near ohmic contact with the p-type diode graphitic layer 596. The second diode wiring layer 508 can be formed using any suitable metal, metal alloy, nitride, oxide, or silicide that has an appropriate work function to form an ohmic or near ohmic contact with the n-type diode graphitic layer 598. Alternatively, the p-type diode graphitic layer 596 can be in electrical communication with the second diode wiring layer 508 and the n-type diode graphitic layer 598 can be in electrical communication with the first diode wiring layer 506. In this alternative embodiment, the first diode wiring layer 506 can be formed using any suitable metal, metal alloy, nitride, oxide, or silicide that has an appropriate work function to form an ohmic or near ohmic contact with the n-type diode graphitic layer 598 and the second diode wiring layer 508 can be formed using any suitable metal, metal alloy, nitride, oxide, or silicide that has an appropriate work function to form an ohmic or near ohmic contact with the p-type diode graphitic layer 596.

Further, when the carbon based diode 590 is fabricated as a component that can be arranged by a circuit designer, the sequence in which the p-type diode graphitic layer 596 and the n-type diode graphitic layer 598 are deposited may be based on fabrication parameters; the carbon based diode 590 can be rotated by the circuit designer to achieve the desired polarity. For example, the n-type diode graphitic layer 598 can be deposited as the bottom layer and the p-type diode graphitic layer 596 can be deposited as the top layer. In the present example the n-type diode graphitic layer 598 might be required to be a thicker graphitic layer to reduce the risk of the n-type diode graphitic layer 598 being compromised by the application process of putting on the p-type graphitic layer 596, while the p-type diode graphitic layer 596 might be formed as a thinner graphitic layer and/or the p-type graphitic layer 596 can be more easily doped using in situ doping methods and techniques. For example, the p-type diode graphitic layer 596 can be deposited as the bottom layer and the n-type diode graphitic layer 598 can be deposited as the top layer. In the present example the p-type diode graphitic layer 596 might be required to be a thicker graphitic layer to reduce the risk of the p-type diode graphitic layer 596 being compromised by the application process of putting on the n-type graphitic layer 598. The n-type diode graphitic layer 598 might be formed as a thinner graphitic layer and/or the n-type graphitic layer 598 can be more easily doped using in situ doping methods and techniques. Although, the carbon based diode 590 formed as a pn junction diode has been discussed above as being formed using a p-type graphitic layer and an n-type graphitic layer, the carbon based diode 590 can be formed as a pn junction diode using an intrinsically semiconducting (e.g. undoped) graphitic layer and an n-type graphitic layer.

FIG. 6A illustrates a resistive change memory element 600 having a carbon based diode 610 in a series connection with a nonvolatile carbon nanotube (CNT) resistive block switch

620. The carbon based diode 610 illustrated in FIG. 6A is configured as a Schottky diode having a conductive layer 612 electrically contacting a diode buckyball layer 614. The conductive layer 612 can be formed using any suitable metal, metal alloy, nitride, oxide, or silicide that has an appropriate work function to form a Schottky contact with the diode buckyball layer 614. The diode buckyball layer 614 can be formed by a layer of semiconducting Buckminsterfullerenes $C_{60}$, although buckyballs having other shapes and sizes can be used in place of or in combination with Buckminsterfullerenes $C_{60}$ or buckyballs formed by elements other than carbon can be used in place of or in combination with Buckminsterfullerenes $C_{60}$. Additionally, materials that increase the amount of contact among the buckyballs, such as amorphous carbon for example, can be added to the diode buckyball layer 614 to increase the current flow through the diode buckyball layer 614. The diode buckyball layer 614 can be doped p-type, doped n-type, or intrinsically semiconducting (e.g. undoped). Therefore, the carbon based diode 610 configured as a Schottky diode can have an anode formed by the conductive layer 612 and a cathode formed by the diode buckyball layer 614 when the diode buckyball layer 614 is n-type or an anode formed by the diode buckyball layer 614 and a cathode formed by the conductive layer 612 when the diode buckyball layer 614 is p-type. In alternative embodiments, the carbon based diode 610 configured as a Schottky diode may be replaced with a pn junction diode formed using semiconducting buckyballs or any other suitable type of diode that can be formed using semiconducting buckyballs.

The shape of a Buckminsterfullerene $C_{60}$ is a truncated icosahedrod and resembles a soccer ball. The Buckminsterfullerene $C_{60}$ is the smallest fullerene molecule where no two pentagons share an edge, therefore, Buckminsterfullerenes $C_{60}$ are very stable molecules that are intrinsically semiconducting with a small band gap (~2 eV). The Buckminsterfullerenes $C_{60}$ can be purified and mixed into solution; therefore, the diode buckyball layer 614 can be formed using similar methods and techniques to those discussed above for forming nanotube fabric layers. Because the Buckminsterfullerenes $C_{60}$ are essentially insoluble in water ($\sim 10^{-11}$ mg/ml), to mix the Buckminsterfullerenes $C_{60}$ into solution sufficient to form the diode buckyball layer 614 the dispersion of the Buckminsterfullerenes $C_{60}$ in an aqueous medium has to be enhanced to achieve a usable level of solubility. Additionally, when the Buckminsterfullerenes $C_{60}$ are dispersed in a solvent there should not be significant coagulation or colloidal formation in the solvent. For example, one method to disperse the Buckminsterfullerenes $C_{60}$ into an aqueous solution is to incorporate organic solvents forming admixtures of water and organic solvents. In the present example, the Buckminsterfullerenes $C_{60}$ are initially dissolved in an organic solvent or organic solvents and then are added to water with strong sonication for further dilution. Examples of organic solvents that can dissolve Buckminsterfullerenes $C_{60}$ include but are not limited to: carbon disulphide, bromoform, toluene, chlorobenzene, and benzene.

The nonvolatile CNT resistive block switch 620 may be formed by a switch nanotube fabric layer 624 located between a first metal layer 622 and a second metal layer 626. The nonvolatile CNT resistive block switch 620 functions similar to the nonvolatile CNT resistive block switch 140 (FIG. 1C) discussed above, and therefore, will not be described in detail below. The first metal layer 622 can be formed using any suitable metal, metal alloy, nitride, oxide, or silicide that has an appropriate work function to form an ohmic or near ohmic contact with the diode buckyball layer 614. Alternatively, the first metal layer 622 may be eliminated, such as in resistive change memory element 650 illustrated in FIG. 6B with like reference numbers representing like elements and components in FIGS. 6A and 6B. In the resistive change memory element 650 the interface between the diode buckyball layer 614 and the switch nanotube fabric layer 624 is in ohmic or near ohmic contact. The switch nanotube fabric layer 624 is similar to the nanotube fabric layer 148 (FIG. 1C) discussed above, and therefore, will not be described in detail below. The second metal layer 626 can be formed using metals, metal alloys, nitrides, oxides, or silicides. A bottom wiring layer 602 and a top wiring layer 604 can be fabricated using suitable metals, metal alloys, nitrides, oxides, or silicides.

Alternatively, a nonvolatile buckyball resistive block switch 640 may be used in place of the nonvolatile CNT resistive block switch 620, such as in resistive change memory element 660 illustrated in FIG. 6C and in resistive change memory element 670 illustrated in FIG. 6D with like reference numbers representing like elements and components in FIGS. 6A-6D. The resistive change memory elements 660 and 670 can be used to store data by having different resistive states of the resistive change memory elements 660 and 670 correspond to different possible values based on an assigned convention. For example, the resistive change memory elements 660 and 670 can be configured to store a single bit by reversibly switching between a first resistive state (e.g., a high resistive state) that corresponds to a logic 0 and a second resistive state (e.g., a low resistive state) that corresponds to a logic 1. In another example, the resistive change memory elements 660 and 670 can be configured to store two bits by reversibly switching between a first resistive state (e.g., a very high resistive state) that corresponds to a logic 00, a second resistive state (e.g., a moderately high resistive state) that corresponds to a logic 01, a third resistive state (e.g., a moderately low resistive state) that corresponds to a logic 10, and a fourth resistive state (e.g., a very low resistive state) that corresponds to a logic 11. Further, the resistive change memory elements 660 and 670 can have additional resistive states.

The nonvolatile buckyball resistive block switch 640 can be formed by a switch buckyball layer 644 in place of the switch nanotube fabric layer 624. The switch buckyball layer 644 can be formed using any of the processing methods and techniques used to form the diode buckyball layer 614, as discussed in detail above. The different resistive states of the nonvolatile buckyball resistive block switch 640 are effectuated through the use of the switch buckyball layer 644 that adjusts the resistive state of the nonvolatile buckyball resistive block switch 640 in response to an electrical stimulus. The switch buckyball layer 644 can adjust the nonvolatile buckyball resistive block switch 640 from the low resistance state that corresponds to logic 1 to the high resistance state that corresponds to logic 0, through application of a first electrical stimulus in the form of a current pulse at an appropriate voltage to the switch buckyball layer 644. The first electrical stimulus changes how the current flows on a microscopic level from the first metal layer 622 or if the first metal layer 622 is not present from the carbon based diode 610 through the switch buckyball layer 644 to the second metal layer 626. The switch buckyball layer 644 can adjust the nonvolatile buckyball resistive block switch 640 from the high resistance state that corresponds to logic 0 to the low resistance state that corresponds to logic 1 through application of a second electrical stimulus in the form of a current pulse at an appropriate voltage to the switch buckyball layer 644. The second electrical stimulus changes how the current flows on a microscopic level from the first metal layer 622. Or, if the first metal layer 622 is not present, from the carbon based diode 610 through the switch buckyball layer 644 to the second metal layer 626.

Further, the resistive change memory elements 600 and 650 illustrated in FIGS. 6A and 6B having the carbon based diode 610 electrically contacting the bottom wiring layer 602 and the nonvolatile CNT resistive block switch 620 electrically contacting the top wiring layer 604 can be configured to have the carbon based diode 610 electrically contacting the top wiring layer 604 and the nonvolatile CNT resistive block switch 620 electrically contacting the bottom wiring layer 602. The resistive change memory elements 660 and 670 illustrated in FIGS. 6C and 6D having the carbon based diode 610 electrically contacting the bottom wiring layer 602 and the nonvolatile buckyball resistive block switch 640 contacting the top wiring layer 604 can be configured to have the carbon based diode 610 electrically contacting the top wiring layer 604 and the nonvolatile buckyball resistive block switch 640 electrically contacting the bottom wiring layer 602.

The carbon based diodes formed using buckyball layers discussed and shown above in a series connection with the nonvolatile CNT resistive block switch 620 and the nonvolatile buckyball resistive block switch 640 can also be fabricated separately or in a connection with other devices or components. FIG. 6E illustrates a carbon based diode 680 formed as a Schottky diode having an anode formed by p-type diode buckyball layer 684 and a cathode formed a conductive layer 682. The p-type diode buckyball layer 684 can be formed by a layer of semiconducting buckyballs and the p-type diode buckyball layer 684 can be formed using similar methods and techniques to those discussed above for forming the diode buckyball layer 614. The conductive layer 682 can be formed using any suitable metal, metal alloy, nitride, oxide, or silicide that has an appropriate work function to form a Schottky contact with the p-type diode buckyball layer 684. The p-type diode buckyball layer 684 is illustrated in FIG. 6E electrically contacting a second diode wiring layer 608 and the conductive layer 682 is illustrated in FIG. 6E electrically contacting a first diode wiring layer 606. The first diode wiring layer 606 can be formed using any suitable metal, metal alloy, nitride, oxide, or silicide. The second diode wiring layer 608 can be formed using any suitable metal, metal alloy, nitride, oxide, or silicide that has an appropriate work function to form an ohmic or near ohmic contact with the p-type diode buckyball layer 684. Alternatively, the p-type diode buckyball layer 684 can be in electrical communication with the first diode wiring layer 606 and the conductive layer 682 can be in electrical communication with the second diode wiring layer 608. In this alternative embodiment, the first diode wiring layer 606 can be formed using any suitable metal, metal alloy, nitride, oxide, or silicide that has an appropriate work function to form an ohmic or near ohmic contact with the p-type diode buckyball layer 684 and the second diode wiring layer 608 can be formed using any suitable metal, metal alloy, nitride, oxide, or silicide.

Further, when the carbon based diode 680 is fabricated as a component that can be arranged by a circuit designer, the sequence in which the conducting layer 682 and the p-type diode buckyball layer 684 are deposited may be based on fabrication parameters; the carbon based diode 680 can be rotated by the circuit designer to achieve the desired polarity. For example, the conducting layer 682 can be deposited as the bottom layer and the p-type diode buckyball layer 684 can be deposited as the top layer, so that the p-type diode buckyball layer 684 can be more easily doped using in situ doping methods and techniques. Although, the carbon based diode 680 formed as Schottky diode has been discussed above as being formed using a p-type buckyball layer, the carbon based diode 680 can be formed as a Schottky diode using an intrinsically semiconducting (e.g. undoped) buckyball layer.

FIG. 6F illustrates a carbon based diode 685 formed as a Schottky diode having an anode formed by a conductive layer 686 and a cathode formed by n-type diode buckyball layer 688. The conductive layer 686 can be formed using any suitable metal, metal alloy, nitride, oxide, or silicide that has an appropriate work function to form a Schottky contact with the n-type diode buckyball layer 688. The n-type diode buckyball layer 688 can be formed by a layer of semiconducting buckyballs and the n-type diode buckyball layer 688 can be formed using similar methods and techniques to those discussed above for forming the diode buckyball layer 614. The n-type diode buckyball layer 688 is illustrated in FIG. 6F electrically contacting a first diode wiring layer 606 and the conductive layer 686 is illustrated in FIG. 6F electrically contacting a second diode wiring layer 608. The first diode wiring layer 606 can be formed using any suitable metal, metal alloy, nitride, oxide, or silicide that has an appropriate work function to form an ohmic or near ohmic contact with the n-type diode buckyball layer 688. The second diode wiring layer 608 can be formed using any suitable metal, metal alloy, nitride, oxide, or silicide. Alternatively, the n-type diode buckyball layer 688 can be in electrical communication with the second diode wiring layer 608 and the conductive layer 686 can be in electrical communication with the first diode wiring layer 606. In this alternative embodiment, the first diode wiring layer 606 can be formed using any suitable metal, metal alloy, nitride, oxide, or silicide and the second diode wiring layer 608 can be formed using any suitable metal, metal alloy, nitride, oxide, or silicide that has an appropriate work function to form an ohmic or near ohmic contact with the n-type diode buckyball layer 688.

Further, when the carbon based diode 685 is fabricated as a component that can be arranged by a circuit designer, the sequence in which the conducting layer 686 and the n-type diode buckyball layer 688 are deposited may be based on fabrication parameters; the carbon based diode 685 can be rotated by the circuit designer to achieve the desired polarity. For example, the conducting layer 686 can be deposited as the bottom layer and the n-type diode buckyball layer 688 can be deposited as the top layer, so that the n-type diode buckyball layer 688 can be more easily doped using in situ doping methods and techniques.

FIG. 6G illustrates a carbon based diode 690 formed as a pn junction diode having an anode formed by a p-type diode buckyball layer 696 and a cathode formed by an n-type diode buckyball layer 698. The p-type diode buckyball layer 696 can be formed by a layer of semiconducting buckyballs and the p-type diode buckyball layer 696 can be formed using similar methods and techniques to those discussed above for forming the diode buckyball layer 614. The n-type diode buckyball layer 698 can be formed by a layer of semiconducting buckyballs and the n-type diode buckyball layer 698 can be formed using similar methods and techniques to those discussed above for forming the diode buckyball layer 614. The buckyballs in the layer of semiconducting buckyballs forming the p-type diode buckyball layer 696 can have shapes and sizes that are different from the shapes and sizes of the buckyballs in the layer of semiconducting buckyballs forming the n-type diode buckyball layer 698. For example, the p-type diode buckyball layer 696 can be formed using truncated icosahedrod $C_{60}$ buckyballs and the n-type diode buckyball layer 698 can be formed using dodecahedral $C_{20}$ buckyballs. The use of layers of semiconducting buckyballs where each layer of semiconducting buckyballs has buckyballs with different shapes and sizes can change the boundary conditions for current flow across the pn junction formed by the p-type diode buckyball layer 696 and the n-type diode buckyball layer 698. Additionally, the buckyballs in the layer of semiconducting buckyballs forming the p-type diode buckyball layer 696 can be formed from elements that are different from the elements forming the buckyballs in the layer of semiconducting buckyballs forming the n-type diode buckyball layer 698. For example, the p-type diode buckyball layer 696 can be formed using boron buckyballs and the n-type diode buckyball layer 698 can be formed using carbon buckyballs. The use of layers of semiconducting buckyballs where each layer of semiconducting buckyballs has buckyballs formed from different elements can change the boundary conditions for current flow across the pn junction formed by the p-type diode buckyball layer 696 and the n-type diode buckyball layer 698.

The p-type diode buckyball layer 696 is illustrated in FIG. 6G electrically contacting a first diode wiring layer 606 and the n-type diode buckyball layer 698 is illustrated in FIG. 6G electrically contacting a second diode wiring layer 608. The first diode wiring layer 606 can be formed using any suitable metal, metal alloy, nitride, oxide, or silicide that has an appropriate work function to form an ohmic or near ohmic contact with the p-type diode buckyball layer 696. The second diode wiring layer 608 can be formed using any suitable metal, metal alloy, nitride, oxide, or silicide that has an appropriate work function to form an ohmic or near ohmic contact with the n-type diode buckyball layer 698. Alternatively, the p-type diode buckyball layer 696 can be in electrical communication with the second diode wiring layer 608 and the n-type diode buckyball layer 698 can be in electrical communication with the first diode wiring layer 606. In this alternative embodiment, the first diode wiring layer 606 can be formed using any suitable metal, metal alloy, nitride, oxide, or silicide that has an appropriate work function to form an ohmic or near ohmic contact with the n-type diode buckyball layer 698 and the second diode wiring layer 608 can be formed using any suitable metal, metal alloy, nitride, oxide, or silicide that has an appropriate work function to form an ohmic or near ohmic contact with the p-type diode buckyball layer 696.

Further, when the carbon based diode 690 is fabricated as a component that can be arranged by a circuit designer, the sequence in which the p-type diode buckyball layer 696 and the n-type diode buckyball layer 698 are deposited may be based on fabrication parameters; the carbon based diode 690 can be rotated by the circuit designer to achieve the desired polarity. For example, the n-type diode buckyball layer 698 can be deposited as the bottom layer and the p-type diode buckyball layer 696 can be deposited as the top layer. In the present example the n-type diode buckyball layer 698 might be required to be a thicker semiconducting buckyball layer to reduce the risk of the n-type diode buckyball layer 698 being compromised by the application process of putting on the p-type buckyball layer 696, while the p-type diode buckyball layer 696 might be formed as a thinner semiconducting buckyball layer and/or the p-type buckyball layer 696 can be more easily doped using in situ doping methods and techniques. For example, the p-type diode buckyball layer 696 can be deposited as the bottom layer and the n-type diode buckyball layer 698 can be deposited as the top layer. In the present example the p-type diode buckyball layer 696 might be required to be a thicker semiconducting buckyball layer to reduce the risk of the p-type diode buckyball layer 696 being compromised by the application process of putting on the n-type buckyball layer 698. The n-type diode buckyball layer 698 might be formed as a thinner semiconducting buckyball layer and/or the n-type buckyball layer 698 can be more easily doped using in situ doping methods and techniques. Although, the carbon based diode 690 formed as a pn junction diode has been discussed above as being formed using a p-type buckyball layer and an n-type buckyball layer, the carbon based diode 690 can be formed as a pn junction diode using; an intrinsically semiconducting (e.g. undoped) buckyball layer and an n-type buckyball layer, a p-type buckyball layer and an intrinsically semiconducting buckyball layer, and two intrinsically semiconducting buckyball layers.

Figure 7A:
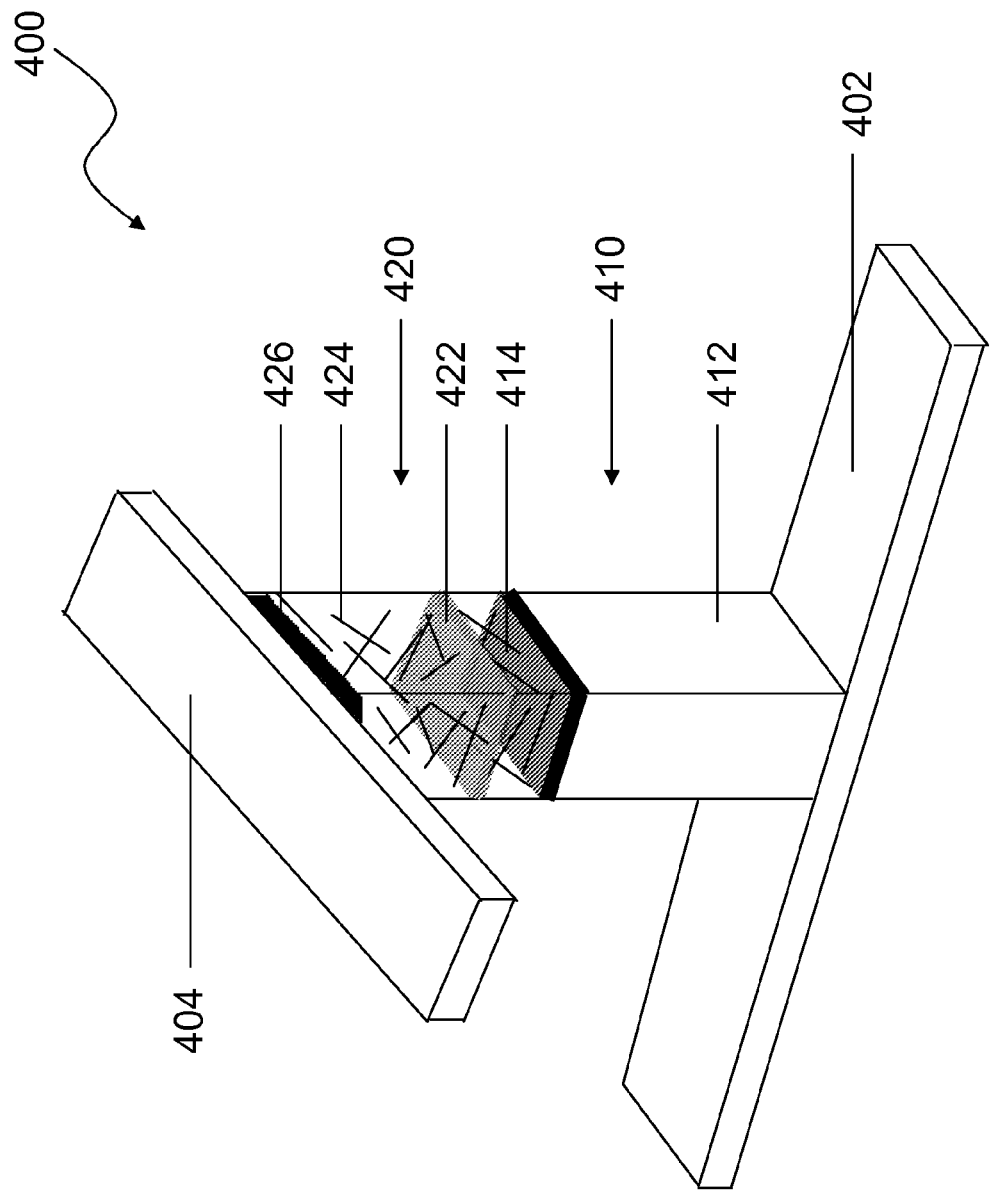
FIG. 7A illustrates a resistive change memory element in a high density cross-point array configuration, where the resistive change memory element is formed by a nonvolatile CNT resistive block switch and a carbon based diode configured as a Schottky diode having a conductive layer electrically contacting a diode nanotube fabric layer.
Figure 7B:
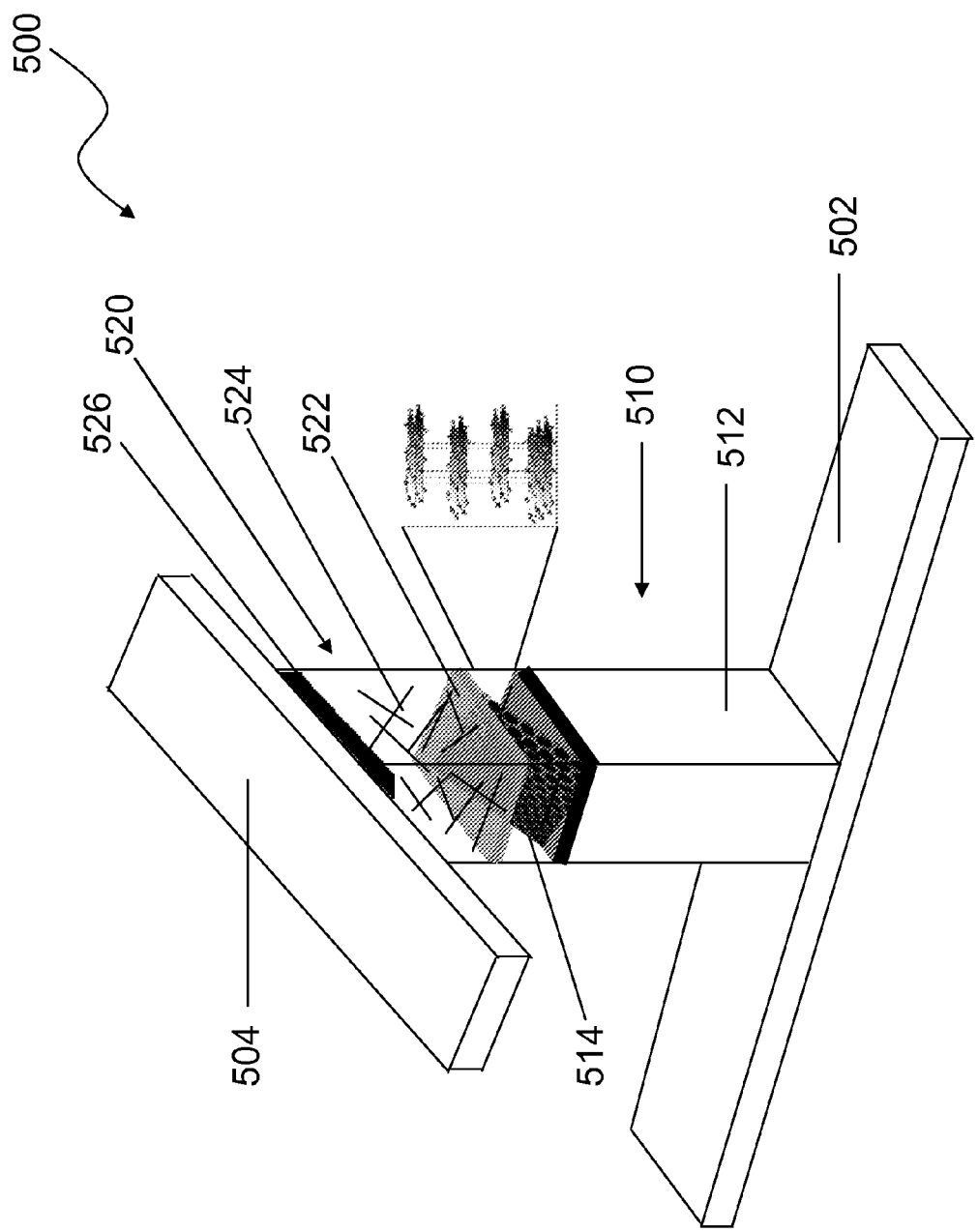
FIG. 7B illustrates a resistive change memory element in a high density cross-point array configuration, where the resistive change memory element is formed by a nonvolatile CNT resistive block switch and a carbon based diode configured as a Schottky diode having a conductive layer electrically contacting a diode graphitic layer.
Figure 7C:
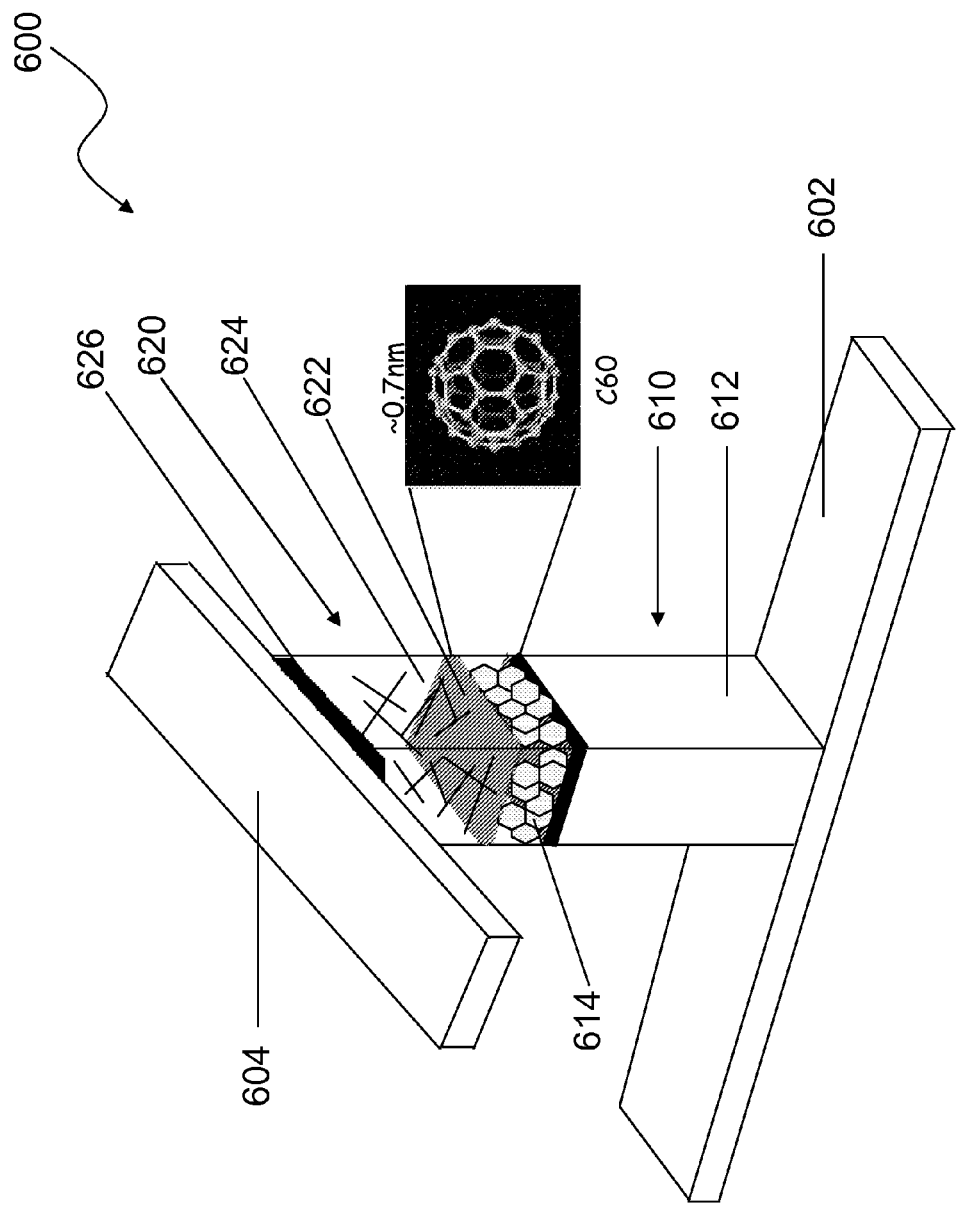
FIG. 7C illustrates a resistive change memory element in a high density cross-point array configuration, where the resistive change memory element is formed by a nonvolatile CNT resistive block switch and a carbon based diode configured as a Schottky diode having a conductive layer electrically contacting a diode buckyball layer.

Resistive change memory elements formed by nonvolatile CNT resistive block switches in series connections with carbon based diodes formed using nanotube fabric layers such as the resistive change memory element 400 illustrated in FIG. 4A and the resistive change memory element 450 illustrated in FIG. 4B can be fabricated in high density cross-point arrays. For example, FIG. 7A illustrates the resistive change memory element 400 fabricated in a high density cross point array, with like reference numbers representing like elements and components in FIGS. 4A and 7A. Resistive change memory elements formed by nonvolatile CNT resistive block switches in series connections with carbon based diodes formed using graphitic layers such as the resistive change memory element 500 illustrated in FIG. 5A and the resistive change memory element 550 illustrated in FIG. 5B can be fabricated in high density cross-point arrays. Resistive change memory elements formed by nonvolatile graphitic resistive block switches in series connections with carbon based diodes formed using graphitic layers such as the resistive change memory element 560 illustrated in FIG. 5C and the resistive change memory element 570 illustrated in FIG. 5D can be fabricated in high density cross-point arrays. For example, FIG. 7B illustrates the resistive change memory element 500 fabricated in a high density cross-point array, with like reference numbers representing like elements and components in FIGS. 5A and 7B. Resistive change memory elements formed by nonvolatile CNT resistive block switches in series connections with a carbon based diodes formed using buckyballs layer such as the resistive change memory element 600 illustrated in FIG. 6A and the resistive change memory element 650 illustrated in FIG. 6B can be fabricated in high density cross-point arrays. Resistive change memory elements formed by nonvolatile buckyball resistive block switches in series connections with carbon based diodes formed using buckyball layers such as the resistive change memory element 660 illustrated in FIG. 6C and the resistive change memory element 670 illustrated in FIG. 6D can be fabricated in high density cross-point arrays. For example, FIG. 7C illustrates the resistive change memory element 600 fabricated in a high density cross-point array, with like reference numbers representing like elements and components in FIGS. 6A and 7C.

Figure 8A:
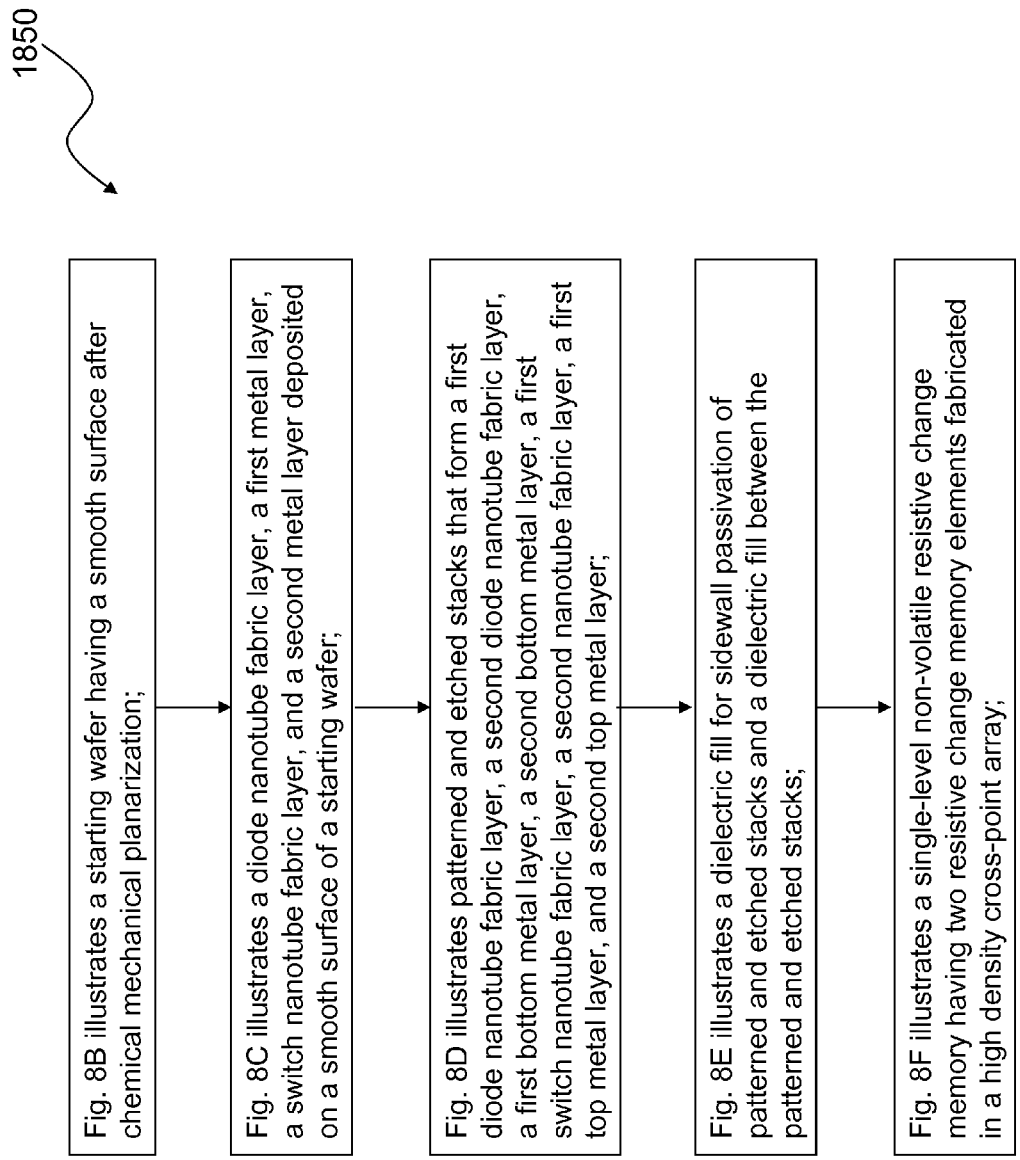
FIG. 8A illustrates an example of a process flow for fabricating resistive change memory elements in a high density cross-point array.

FIG. 8A illustrates an example of a process flow 1850 for fabricating resistive change memory elements in a high density cross-point array. The process flow 1850 is discussed in detail below and the process flow 1850 is directed toward fabricating resistive change memory elements having nonvolatile CNT resistive block switches in series connections with carbon based diodes formed using nanotube fabric layers, such as resistive change memory elements 400 and 450 illustrated in FIGS. 4A and 4B. The fabrication processes for other resistive change memory elements described in other embodiments, such as resistive change memory elements 500, 550, 560, and 570 illustrated in FIGS. 5A-5D and resistive change memory elements 600, 650, 660, and 670 illustrated in FIGS. 6A-6D, are similar to the process flow 1850. Therefore, the process flow 1850 is generally applicable to the resistive change memory elements described in other embodiments. The process flow 1850 is an example of a process for fabricating resistive change memory elements in a high density cross-point array and other processes for fabricating resistive change memory elements in a high density cross-point array, such as damascene based processes, can be used. The process flow 1850 is not required to be a standalone fabrication process and the process flow 1850 can be a part of other fabrication processes or the process flow 1850 can be used in combination with other fabrication processes. The steps described and shown in the process flow 1850 can be performed in orders other than the order described and shown. Further, select steps from the process flow 1850 can be a part of other fabrication processes or select steps from the process flow 1850 can be used in combination with other fabrication processes.

Figure 8B:
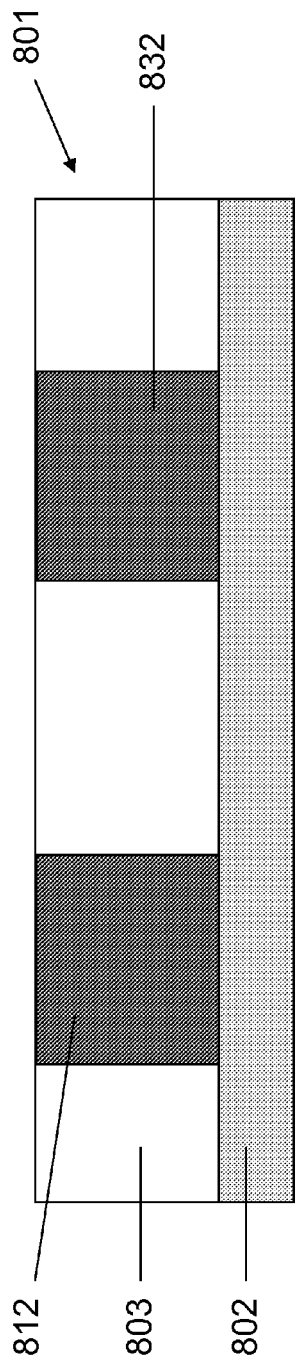
FIG. 8B illustrates a starting wafer having a smooth surface after chemical mechanical planarization.

The process flow 1850 for fabricating resistive change memory elements in a high density cross-point array begins after chemical mechanical planarization (CMP) of a starting wafer. FIG. 8B illustrates a starting wafer 801 having a smooth surface after chemical mechanical planarization of an insulating layer 803, a first conductive layer 812, and a second conductive layer 832. The insulating layer 803 has via holes for the first conductive layer 812 and the second conductive layer 832 and the insulating layer 803 is formed on a bottom wiring layer 802. The first conductive layer 812 is formed using any suitable metal, metal alloy, nitride, oxide, or silicide that has an appropriate work function to form a Schottky contact with a later deposited diode nanotube fabric layer. The first conductive layer 812 is formed electrically contacting the bottom wiring layer 802. The second conductive layer 832 is formed using any suitable metal, metal alloy, nitride, oxide, or silicide that has an appropriate work function to form a Schottky contact with a later deposited diode nanotube fabric layer. The second conductive layer 832 is formed electrically contacting the bottom wiring layer 802. The starting wafer 801 can have a substrate element, additional layers, logic devices, and/or circuitry located below the bottom wiring layer 802, however the substrate element, additional layers, logic devices, and/or circuitry have been omitted from FIG. 8B for simplicity of illustration. For example, logic devices and circuitry that form a memory device can be located below the bottom wiring layer 802 and the logic devices and circuitry can be electrically connected with the resistive change memory elements through bottom wiring layer 802.

Figure 8C:
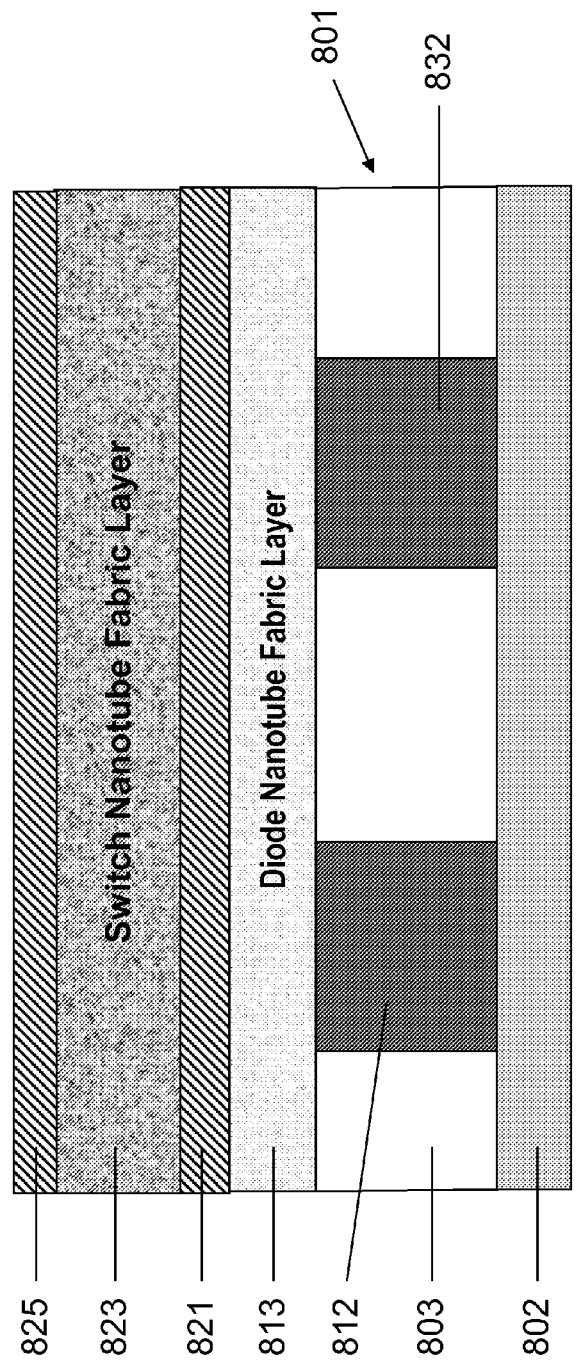
FIG. 8C illustrates a diode nanotube fabric layer, a first metal layer, a switch nanotube fabric layer, and a second metal layer deposited on a smooth surface of a starting wafer.

The process flow 1850 begins with depositing layers of materials that form Schottky diodes and nonvolatile CNT resistive block switches on the smooth surface of the starting wafer 801. FIG. 8C illustrates a diode nanotube fabric layer 813, a bottom metal layer 821, a switch nanotube fabric layer 823, and a top metal layer 825 deposited on the smooth surface of the starting wafer 801. The diode nanotube fabric layer 813 can be deposited by spin coating, spray coating, roll-to-roll coating, dip coating, electrostatic spray coating, or printing processes, as discussed in detail above. The diode nanotube fabric layer 813 is in electrical contact with the first conductive layer 812 and the second conductive layer 832. The diode nanotube fabric layer 813 can be deposited as an unordered nanotube fabric layer or as an ordered nanotube fabric layer. When the diode nanotube fabric layer 813 is deposited as an unordered nanotube fabric layer and an ordered nanotube fabric layer is desired, a step for rendering an unordered nanotube fabric layer into an ordered nanotube fabric layer can be included. The semiconducting single wall carbon nanotubes (s-SWNTs) that form the diode nanotube fabric layer 813 can be deposited as intrinsically semiconducting elements, doped p-type semiconducting elements, or doped n-type semiconducting elements. The s-SWNTs can be doped before being deposited or doped after being deposited using the doping methods and techniques discussed in detail above. When the s-SWNTs are deposited as intrinsically semiconducting elements and doped p-type semiconducting elements or doped n-type semiconducting elements are desired, a step for doping the s-SWNTs can be included. The deposited s-SWNTs can be doped directly before the bottom metal layer 821 is deposited or the s-SWNTs can be doped indirectly after any of the bottom metal layer 821, the switch nanotube fabric layer 823, and the top metal layer 825 is deposited. Additionally, any of the processing methods and techniques used to form the diode nanotube fabric layer 414, as discussed above, can be included.

The bottom metal layer 821 can be deposited by physical vapor deposition (PVD) or chemical vapor deposition (CVD). The bottom metal layer 821 forms an ohmic or near ohmic contact with the diode nanotube fabric layer 813 and the bottom metal layer 821 forms the bottom electrode of the nonvolatile CNT resistive block switch. The switch nanotube fabric layer 823 can be deposited by spin coating, spray coating, roll-to-roll coating, dip coating, electrostatic spray coating, or printing processes, as discussed in detail above. The switch nanotube fabric layer 823 can be deposited as an unordered nanotube fabric layer or as an ordered nanotube fabric layer. When the switch nanotube fabric layer 823 is deposited as an unordered nanotube fabric layer and an ordered nanotube fabric layer is desired, a step for rendering an unordered nanotube fabric layer into an ordered nanotube fabric layer, as discussed in detail above, can be included. When an adjustment to a range of resistivity and/or resistive states of the switch nanotube fabric layer 823 is desired, a step for adjusting the range of resistivity and/or the resistive states of the switch nanotube fabric layer 823, as discussed in detail in U.S. patent application Ser. No. 12/874,501, can be included. Additionally, any of the processing methods and techniques used to form the switch nanotube fabric layer 424, as discussed above, can be included. The switch nanotube fabric layer 823 can have a concentration of metallic carbon nanotubes that is higher than the concentration of metallic carbon nanotube in the diode nanotube fabric layer 813. The top metal layer 825 can deposited by physical vapor deposition (PVD) or chemical vapor deposition (CVD); the top metal layer 825 forms the top electrode/contact of the nonvolatile CNT resistive block switch.

Figure 8D:
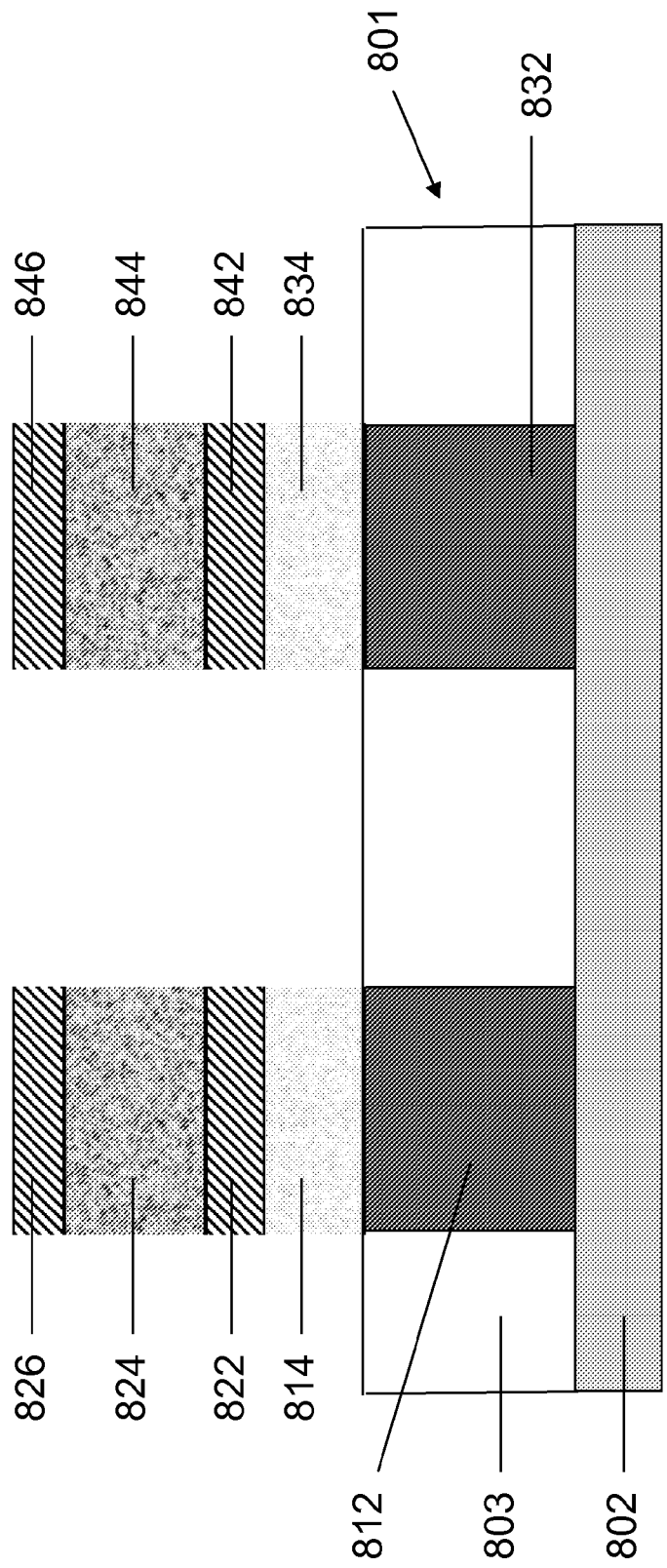
FIG. 8D illustrates patterned and etched stacks that form a first diode nanotube fabric layer, a second diode nanotube fabric layer, a first bottom metal layer, a second bottom metal layer, a first switch nanotube fabric layer, a second switch nanotube fabric layer, a first top metal layer, and a second top metal layer.
Figure 8E:
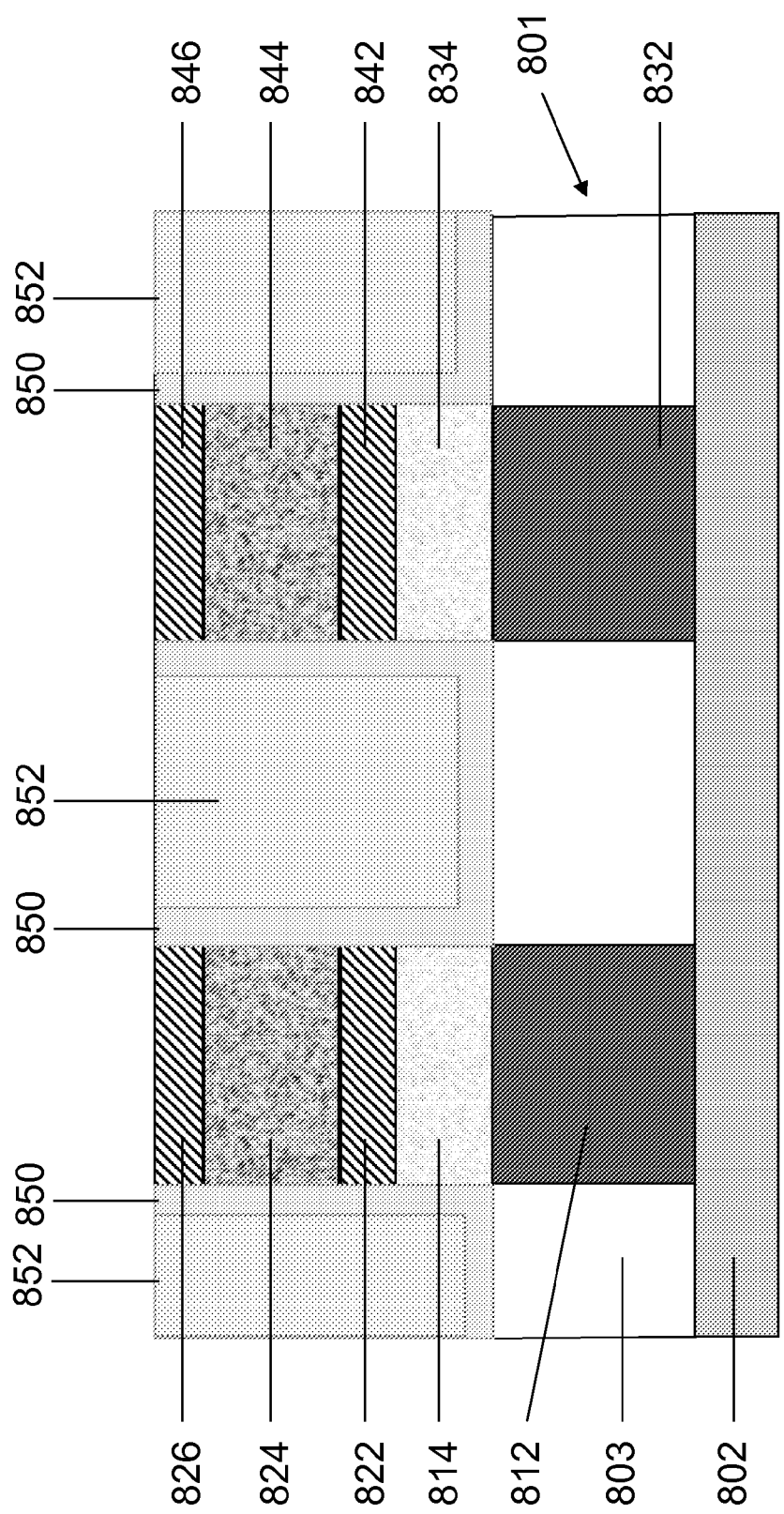
FIG. 8E illustrates a dielectric fill for sidewall passivation of patterned and etched stacks and a dielectric fill between the patterned and etched stacks.

The deposition of the diode nanotube fabric layer 813, the bottom metal layer 821, the switch nanotube fabric layer 823, and the top metal layer 825 creates a stack that is subsequently patterned and etched to the smooth surface of the starting wafer 801. The patterning and etching of the stack forms a first diode nanotube fabric layer 814, a second diode nanotube fabric layer 834, a first bottom metal layer 822, a second bottom metal layer 842, a first switch nanotube fabric layer 824, a second nanotube fabric layer 844, a first top metal layer 826, and a second top metal layer 846 as illustrated in FIG. 8D. Following the pattern and etch of the stack and a post etch clean, a sidewall passivation and a dielectric fill between the stacks in the array are done by depositing a dielectric fill for sidewall passivation 850, such as but not limited to SiN, and a dielectric fill between the stacks 852, such as but not limited to $SiO_2$, as illustrated in FIG. 8E. However, those skilled in the art will note many options, depending on array pitch and topology, are available.

After the dielectric depositions, the array topology is planarized to the first top metal layer 826 and the second top metal layer 846 using a planarization process, such as but not limited chemical mechanical planarization (CMP), so that the first top metal layer 826 and the second top metal layer 846 are exposed. Following planarization and cleaning of the first top metal layer 826, the second top metal layer 846, the dielectric fill for sidewall passivation 850, and the dielectric fill between the stacks 852, a top wiring layer fabrication is performed by depositing a metal film such as Al, Cu, or other suitable metal, metal alloy, nitride, oxide, or silicide. The top wiring layer is then patterned and plasma metal etched to form a first top wiring layer 804 and a second top wiring layer 805 as illustrated by a single-level nonvolatile resistive change memory 800 in FIG. 8F.

Figure 8F:
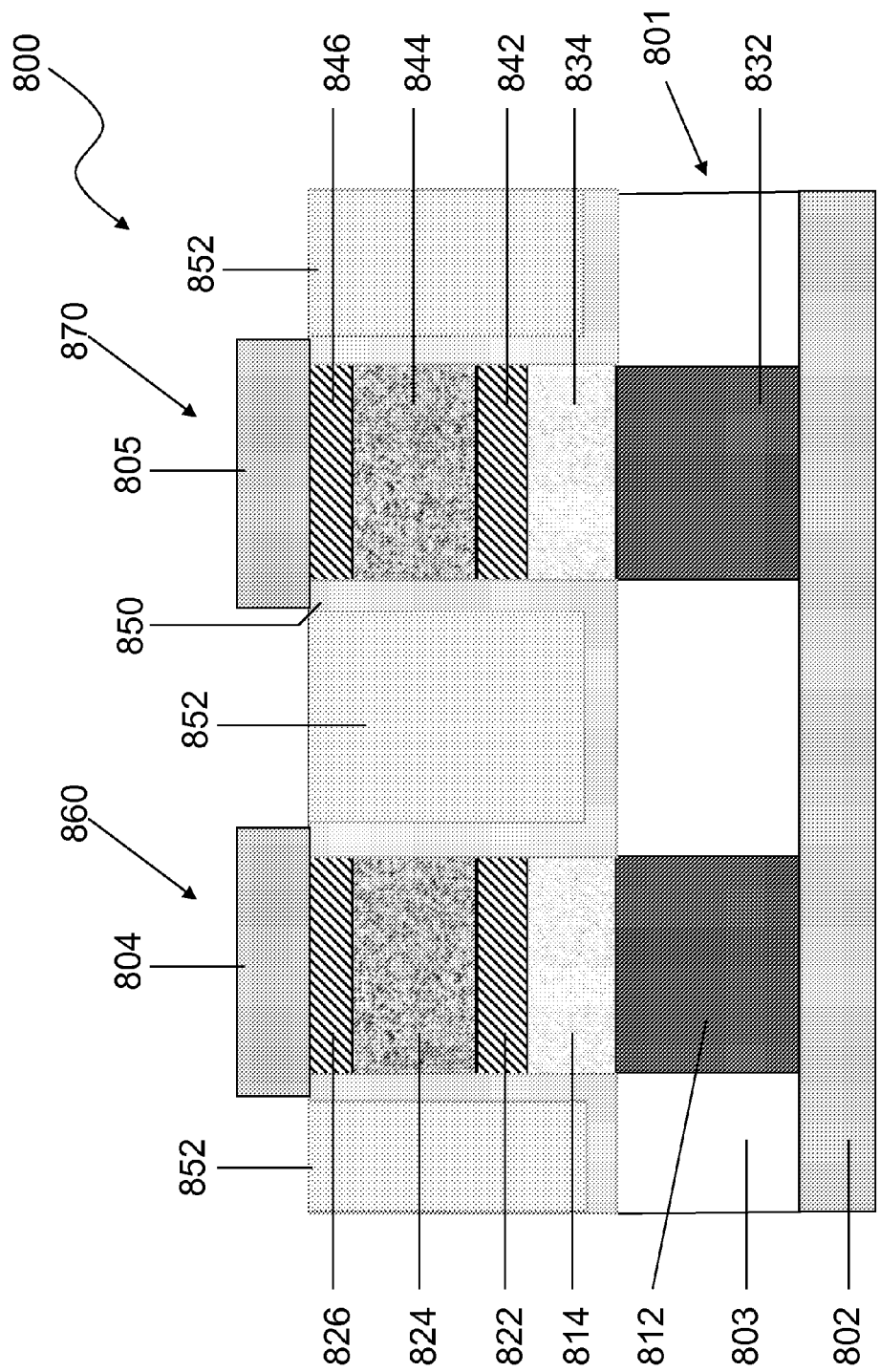
FIG. 8F illustrates a single-level nonvolatile resistive change memory having two resistive change memory elements fabricated in a high density cross-point array.

The single-level nonvolatile resistive change memory 800 shown in FIG. 8F has a first resistive change memory element 860 and a second resistive change memory element 870. The first resistive change memory element 860 is formed by a first nonvolatile CNT resistive block switch in a series connection with a first carbon based diode configured as a Schottky diode. The first nonvolatile CNT resistive block switch is formed by the first bottom metal layer 822, the first switch nanotube fabric layer 824, and the first top metal layer 826. The first carbon based diode is formed by the first conductive layer 812 and the first diode nanotube fabric layer 814. The second resistive change memory element 870 is formed by a second nonvolatile CNT resistive block switch in a series connection with a second carbon based diode configured as a Schottky diode. The second nonvolatile CNT resistive block switch is formed by the second bottom metal layer 842, the second switch nanotube fabric layer 844, and the second top metal layer 846. The second carbon based diode is formed by the second conductive layer 832 and the second diode nanotube fabric layer 834. Although not shown in FIG. 8F, the first resistive change memory element 860 and the second resistive change memory element 870 can have carbon based diodes configured as pn junction diodes formed in place of the carbon based diodes configured as Schottky diodes. The carbon based diodes configured as pn junction diodes can be formed by depositing nanotube fabric layers in place of the first conductive layer 812 and the second conductive layer 832 on the starting wafer 801.

The formation of ohmic or near ohmic contacts between materials, such as metals, metal alloys, nitrides, oxides, silicides, and semiconductors frequently includes a high temperature annealing step that reduces unintentional barriers at the interfaces of the materials. In the example shown in FIGS. 8A-8F, a high temperature annealing step can be included that reduces unintentional barriers at the interfaces between the first and second bottom metal layers and the first and second diode nanotube fabric layers and at the interfaces between the first and second top metal layers and the first and second switch nanotube fabric layers. Typically, but not limited to, the high temperature annealing step is done at approximately 475° C. in a reducing ambient such as forming gas (20:1 $N_2/H_2$). Although, the high temperature annealing step can improve the formation of ohmic or near ohmic contacts between the first and second bottom metal layers and the first and second diode nanotube fabric layers and between the first and second top metal layers and the first and second switch nanotube fabric layers, the high temperature annealing step should be optimized to not significantly adversely affect the Schottky diode action between the first and second conductive layers and the first and second diode nanotube fabric layers.

Figure 9A:
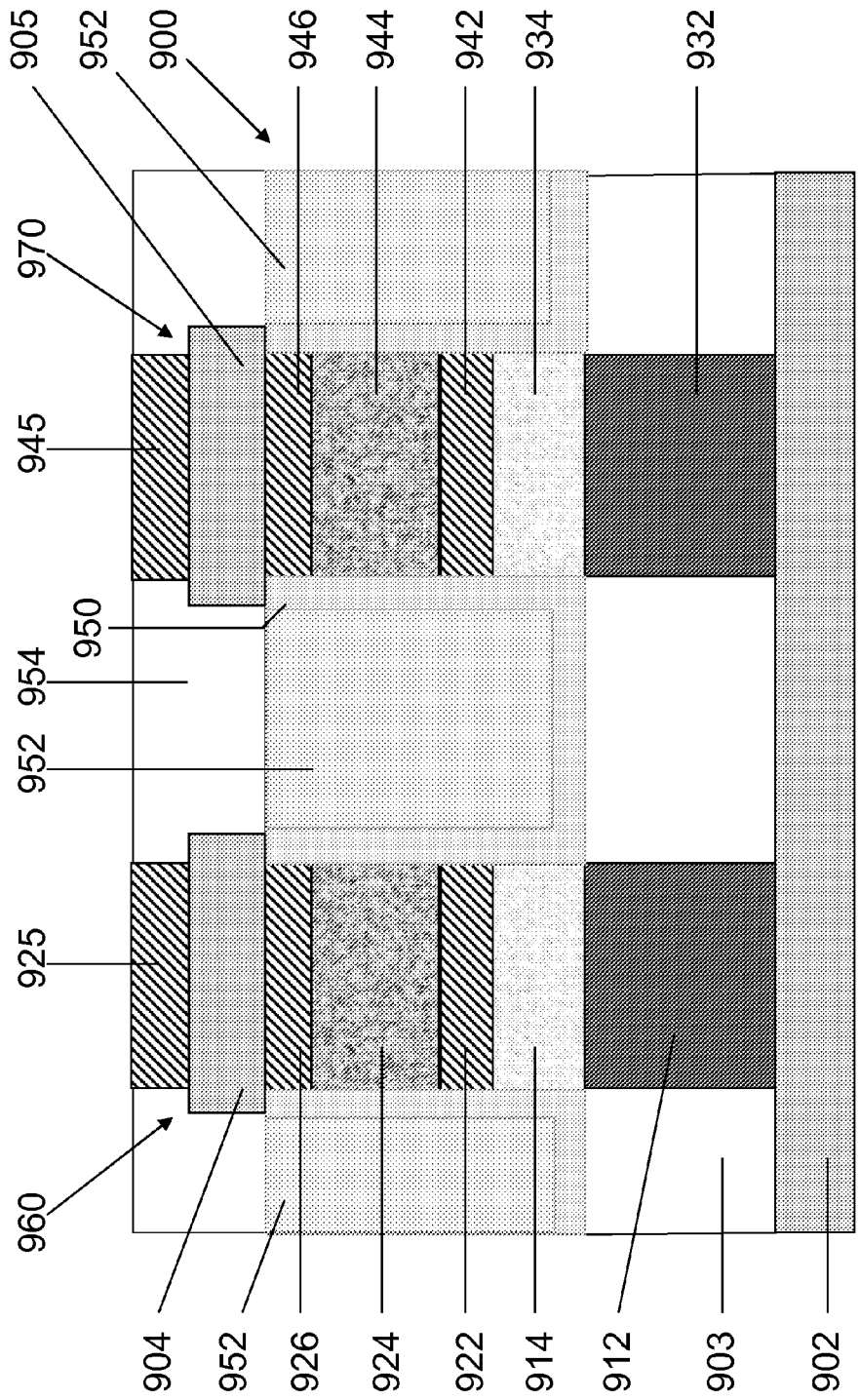
FIG. 9A illustrates a single-level nonvolatile resistive change memory having two resistive change memory elements fabricated in a high density cross-point array with a thick dielectric layer, a third top metal layer, and a fourth top metal layer deposited and planarized on top of the single-level nonvolatile resistive change memory.

Additional steps for fabricating a multi-level nonvolatile resistive change memory can be included to the process flow for fabricating resistive change memory elements in a high density cross-point array as shown in FIGS. 8A-8F and discussed in detail above. The additional steps for fabricating the multi-level nonvolatile resistive change memory can be added after fabrication of a single-level nonvolatile resistive change memory. FIG. 9A illustrates a single-level nonvolatile resistive change memory 900 that can be fabricated in a similar manner to the single-level nonvolatile resistive change memory 800 shown in FIG. 8F and discussed in detail above. The single-level nonvolatile resistive change memory 900 is formed by a bottom wiring layer 902, an insulating layer 903, a first conductive layer 912, a second conductive layer 932, a first diode nanotube fabric layer 914, a second diode nanotube fabric layer 934, a first bottom metal layer 922, a second bottom metal layer 942, a first switch nanotube fabric layer 924, a second switch nanotube fabric layer 944, a first top metal layer 926, a second top metal layer 946, a dielectric fill for sidewall passivation 950, a dielectric fill between the stacks 952, a first common wiring layer 904, and a second common wiring layer 905.

The single-level nonvolatile resistive change memory 900 illustrated in FIG. 9A has a first resistive change memory element 960 and a second resistive change memory element 970. The first resistive change memory element 960 is formed by a first nonvolatile CNT resistive block switch in a series connection with a first carbon based diode configured as a Schottky diode. The first nonvolatile CNT resistive block switch is formed by the first bottom metal layer 922, the first switch nanotube fabric layer 924, and the first top metal layer 926. The first carbon based diode is formed by the first conductive layer 912 and the first diode nanotube fabric layer 914. The second resistive change memory element 970 is formed by a second nonvolatile CNT resistive block switch in a series connection with a second carbon based diode configured as a Schottky diode. The second nonvolatile CNT resistive block switch is formed by the second bottom metal layer 942, the second switch nanotube fabric layer 944, and the second top metal layer 946. The second carbon based diode is formed by the second conductive layer 932 and the second diode nanotube fabric layer 934. Although not shown in FIG. 9A, the first resistive change memory element 960 and the second resistive change memory element 970 can have carbon based diodes configured as pn junction diodes formed in place of the carbon based diodes configured as Schottky diodes. The carbon based diodes configured as pn junction diodes can be formed by depositing nanotube fabric layers in place of the first conductive layer 912 and the second conductive layer 932.

Figure 9B:
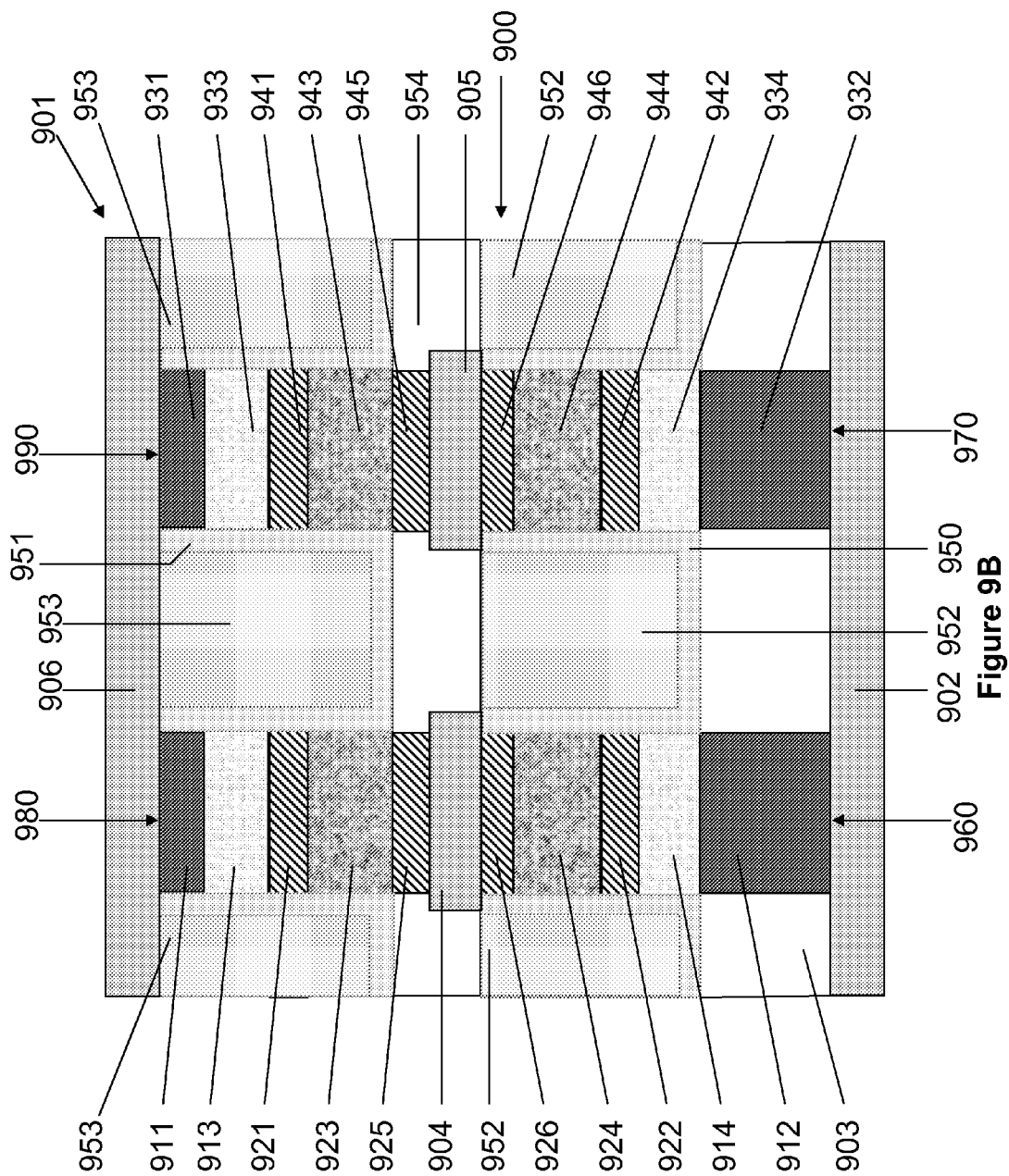
FIG. 9B illustrates a multi-level nonvolatile resistive change memory having resistive change memory elements formed by nonvolatile CNT resistive block switches and carbon based diodes configured as Schottky diodes having conductive layers electrically contacting diode nanotube fabric layers.

The additional steps for fabricating a multi-level nonvolatile resistive change memory begin with depositing a sufficiently thick dielectric layer 954 on top of the first common wiring layer 904 and the second common wiring layer 905 of the single-level nonvolatile resistive change memory 900. The thick dielectric layer 954 is then planarized and contact vias are patterned and etched through the thick dielectric layer 954 stopping on the first common wiring layer 904 and the second common wiring layer 905. After the contact etch and a resist removal/clean, a third top metal layer 925 is deposited on top of the first common wiring layer 904 and a fourth top metal layer 945 is deposited on top of the second common wiring layer 905. A chemical mechanical planarization (CMP) of the thick dielectric layer 954, the third top metal layer 925, and the fourth top metal layer 945 is performed following the deposition as illustrated in FIG. 9A. A third switch nanotube fabric layer 923, a fourth switch nanotube fabric layer 943, a third bottom metal layer 921, a fourth bottom metal layer 941, a third diode nanotube fabric layer 913, a fourth diode nanotube fabric layer 933, a third conductive layer 911, a fourth conductive layer 931, a dielectric fill for sidewall passivation 951, a dielectric fill between the stacks 953, and a top wiring layer 906 are then formed above the third top metal layer 925 and the fourth top metal layer 945 as illustrated in FIG. 9B. The third switch nanotube fabric layer 923, the fourth switch nanotube fabric layer 943, the third bottom metal layer 921, the fourth bottom metal layer 941, the third diode nanotube fabric layer 913, the fourth diode nanotube fabric layer 933, the third conductive layer 911, the fourth conductive layer 931, and the top wiring layer 906 are formed in a similar manner but with the order being reversed from the first switch nanotube fabric layer 824, the second switch nanotube fabric layer 844, the first bottom metal layer 822, the second bottom metal layer 842, the first diode nanotube fabric layer 814, the second diode nanotube fabric layer 834, the first conductive layer 812, the second conductive layer 832, and the top wiring layer discussed in detail above with respect to the single-level nonvolatile resistive change memory 800.

FIG. 9B illustrates a multi-level nonvolatile resistive change memory 901 having a third resistive change memory element 980 and a fourth resistive change memory element 990 vertically stacked above the first resistive change memory element 960 and the second resistive change memory element 970 of the single-level nonvolatile resistive change memory 900. The third resistive change memory element 980 is formed by a third nonvolatile CNT resistive block switch in a series connection with a third carbon based diode configured as a Schottky diode. The third nonvolatile CNT resistive block switch is formed by the third bottom metal layer 921, the third switch nanotube fabric layer 923, and the third top metal layer 925. The third carbon based diode is formed by the third conductive layer 911 and the third diode nanotube fabric layer 913. The fourth resistive change memory element 990 is formed by a fourth nonvolatile CNT resistive block switch in a series connection with a fourth carbon based diode configured as Schottky diode. The fourth nonvolatile CNT resistive block switch is formed by the fourth bottom metal layer 941, the fourth switch nanotube fabric layer 943, and the fourth top metal layer 945. The fourth carbon based diode is formed by the fourth conductive layer 931 and the fourth diode nanotube fabric layer 933. The first common wiring layer 904 can operate as a common wordline for the first resistive change memory element 960 and the third resistive change memory element 980. The second common wiring layer 905 can operate as a common wordline for the second resistive change memory element 970 and the fourth resistive change memory element 990. Although not shown in FIG. 9B, the first resistive change memory element 960, the second resistive change memory element 970, the third resistive change memory element 980, and the fourth resistive change memory element 990 can have carbon based diodes configured as pn junction diodes formed in place of the carbon based diodes configured as Schottky diodes. The carbon based diodes configured as pn junction diodes can be formed by depositing nanotube fabric layers in place of the first conductive layer 912, the second conductive layer 932, the third conductive layer 911, and the fourth conductive layer 931.

Further, the multi-level nonvolatile resistive change memory 901 can have additional resistive change memory elements vertically stacked above the third resistive change memory element 980 and the fourth resistive change memory element 990. The additional resistive change memory elements can be formed by repeating the additional steps for fabricating a multi-level nonvolatile resistive change memory with proper logic to address the multi-level memory array being incorporated into the memory device. The number of vertically stacked resistive change memory elements is a design variable that can be selected by a circuit designer with the additional steps for fabricating a multi-level nonvolatile resistive change memory element being repeated.

Figure 10A:
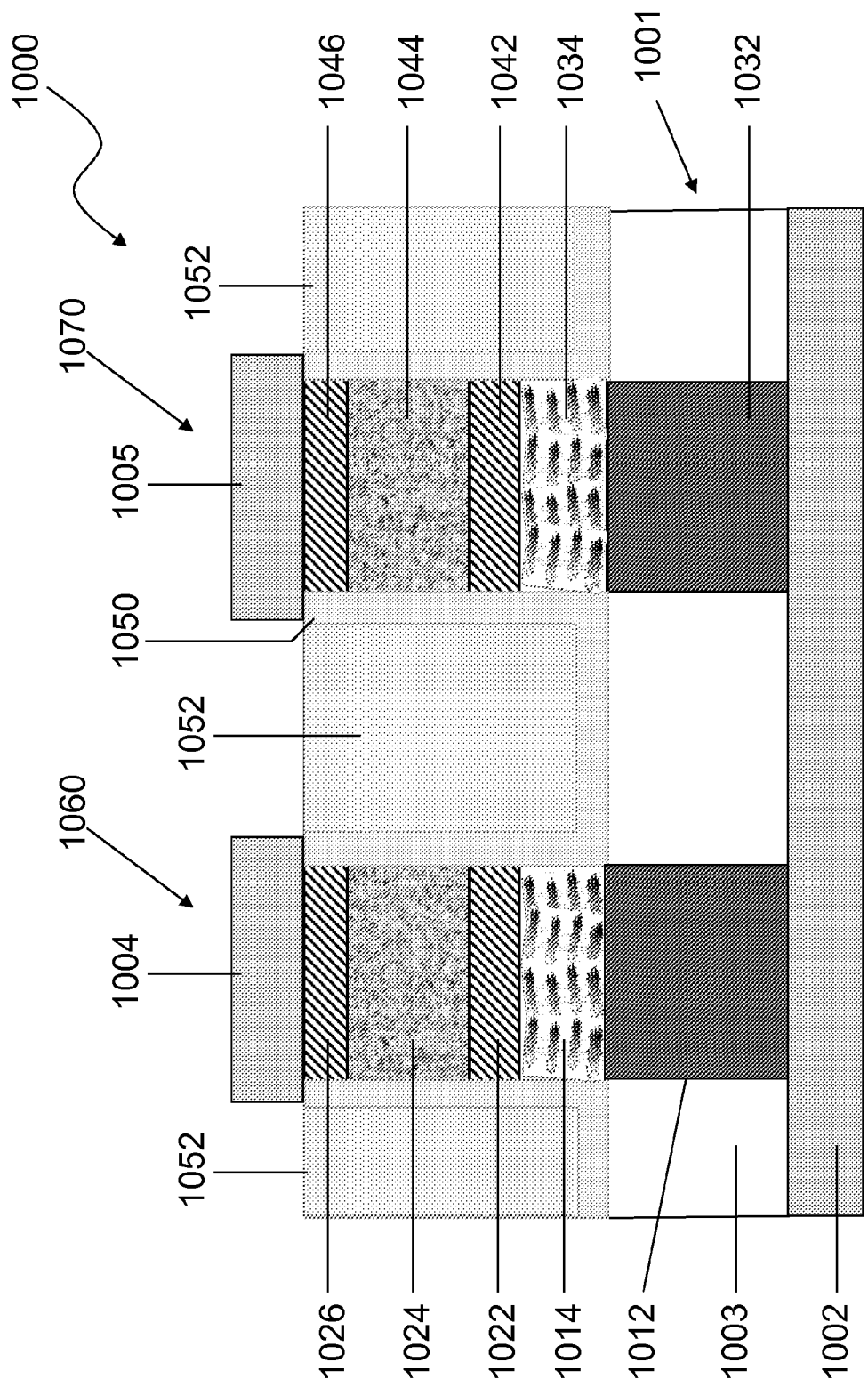
FIG. 10A illustrates a single-level nonvolatile resistive change memory having two resistive change memory elements fabricated in a high density cross-point array using a graphitic layer.

FIG. 10A illustrates a single-level nonvolatile resistive change memory 1000 that can be fabricated in a similar manner to the single-level nonvolatile resistive change memory 800 shown in FIG. 8F and discussed in detail above. However, the fabrication process for the single-level nonvolatile resistive change memory 1000 should deposit a diode graphitic layer in place of the diode nanotube fabric layer deposited for the single-level nonvolatile resistive change memory 800. The diode graphitic layer can be formed using any of the processing methods and techniques used to form the diode graphitic layer 514, as discussed in detail above. The single-level nonvolatile resistive change memory 1000 is formed by a bottom wiring layer 1002, an insulating layer 1003, a first conductive layer 1012, a second conductive layer 1032, a first diode graphitic layer 1014, a second diode graphitic layer 1034, a first bottom metal layer 1022, a second bottom metal layer 1042, a first switch nanotube fabric layer 1024, a second switch nanotube fabric layer 1044, a first top metal layer 1026, a second top metal layer 1046, a dielectric fill for sidewall passivation 1050, a dielectric fill between the stacks 1052, a first common wiring layer 1004, and a second common wiring layer 1005.

The single-level nonvolatile resistive change memory 1000 illustrated in FIG. 10A has a first resistive change memory element 1060 and a second resistive change memory element 1070. The first resistive change memory element 1060 is formed by a first nonvolatile CNT resistive block switch in a series connection with a first carbon based diode configured as a Schottky diode. The first nonvolatile CNT resistive block switch is formed by the first bottom metal layer 1022, the first switch nanotube fabric layer 1024, and the first top metal layer 1026. The first carbon based diode is formed by the first conductive layer 1012 and the first diode graphitic layer 1014. The second resistive change memory element 1070 is formed by a second nonvolatile CNT resistive block switch in a series connection with a second carbon based diode configured as a Schottky diode. The second nonvolatile CNT resistive block switch is formed by the second bottom metal layer 1042, the second switch nanotube fabric layer 1044, and the second top metal layer 1046. The second carbon based diode is formed by the second conductive layer 1032 and the second diode graphitic layer 1034.

Although not shown in FIG. 10A, the first resistive change memory element 1060 and the second resistive change memory element 1070 can have nonvolatile graphitic resistive block switches formed in place of the nonvolatile CNT resistive block switches. The nonvolatile graphitic resistive block switches can be formed by depositing a switch graphitic layer in place of the switch nanotube fabric layer. The switch graphitic layer can be formed using any of the processing methods and techniques used to form the switch graphitic layer 544, as discussed in detail above. Further, the first resistive change memory element 1060 and the second resistive change memory element 1070 can have carbon based diodes configured as pn junction diodes formed in place of the carbon based diodes configured as Schottky diodes. The carbon based diodes configured as pn junction diodes can be formed by depositing graphitic layers in place of the first conductive layer 1012 and the second conductive layer 1032.

Figure 10B:
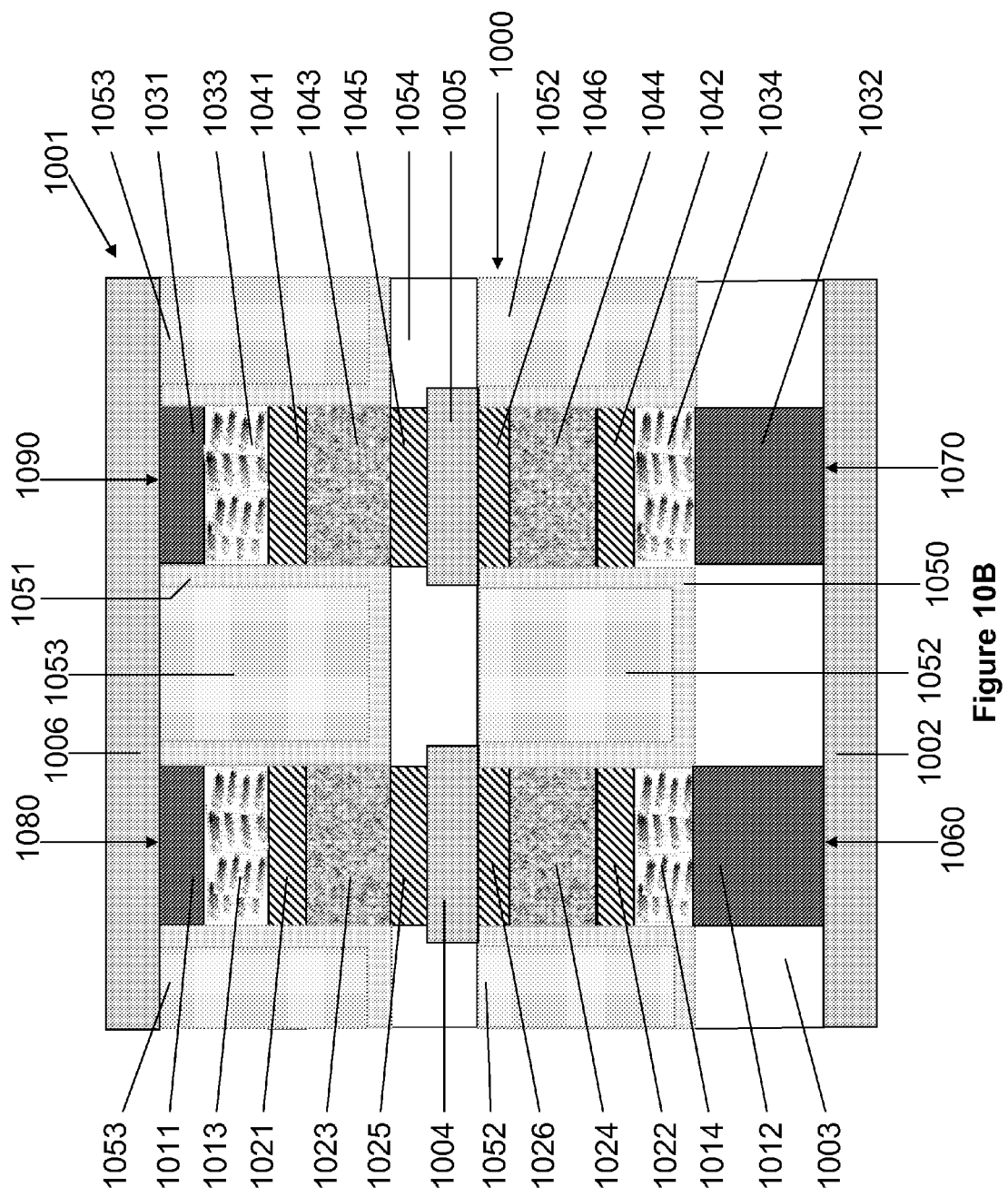
FIG. 10B illustrates a multi-level nonvolatile resistive change memory having vertically stacked resistive change memory elements formed by nonvolatile CNT resistive block switches and carbon based diodes configured as Schottky diodes having conductive layers electrically contacting diode graphitic layers.

FIG. 10B illustrates a multi-level nonvolatile resistive change memory 1001 having a third resistive change memory element 1080 and a fourth resistive change memory element

1090 vertically stacked above the first resistive change memory element 1060 and the second resistive change memory element 1070 of the single-level nonvolatile resistive change memory 1000. The multi-level nonvolatile resistive change memory 1001 is formed by the bottom wiring layer 1002, the insulating layer 1003, the first conductive layer 1012, the second conductive layer 1032, the first diode graphitic layer 1014, the second diode graphitic layer 1034, the first bottom metal layer 1022, the second bottom metal layer 1042, the first switch nanotube fabric layer 1024, the second switch nanotube fabric layer 1044, the first top metal layer 1026, the second top metal layer 1046, the dielectric fill for sidewall passivation 1050, the dielectric fill between the stacks 1052, the first common wiring layer 1004, and the second common wiring layer 1005, as discussed in detail above with respect to the single-level nonvolatile resistive change memory 1000 with like reference numbers representing like elements and components in FIGS. 10A and 10B. The multi-level nonvolatile resistive change memory 1001 is additionally formed by a thick dielectric layer 1054, a third top metal layer 1025, a fourth top metal layer 1045, a third switch nanotube fabric layer 1023, a fourth switch nanotube fabric layer 1043, a third bottom metal layer 1021, a fourth bottom metal layer 1041, a third diode graphitic layer 1013, a fourth diode graphitic layer 1033, a third conductive layer 1011, a fourth conductive layer 1031, a dielectric fill for sidewall passivation 1051, a dielectric fill between the stacks 1053, and a top wiring layer 1006.

The first resistive change memory element 1060 and the second resistive change memory element 1070 can be fabricated as discussed in detail above with respect to the single-level nonvolatile resistive change memory 1000 with like reference numbers representing like elements and components in FIGS. 10A and 10B. The third resistive change memory element 1080 and the fourth resistive change memory element 1090 can be fabricated in a similar manner to the third resistive change memory element 980 and the fourth resistive change memory element 990 illustrated in FIG. 9B. However, the fabrication process for the third resistive change memory element 1080 and the fourth resistive change memory element 1090 should deposit a diode graphitic layer in place of the diode nanotube fabric layer deposited for the third resistive change memory element 980 and the fourth resistive change memory element 990 illustrated in FIG. 9B. The diode graphitic layer can be formed using any of the processing methods and techniques used to form the diode graphitic layer 514, as discussed in detail above.

The first resistive change memory element 1060 is formed by a first nonvolatile CNT resistive block switch in a series connection with a first carbon based diode configured as a Schottky diode. The first nonvolatile CNT resistive block switch is formed by the first bottom metal layer 1022, the first switch nanotube fabric layer 1024, and the first top metal layer 1026. The first carbon based diode is formed by the first conductive layer 1012 and the first diode graphitic layer 1014. The second resistive change memory element 1070 is formed by a second nonvolatile CNT resistive block switch in a series connection with a second carbon based diode configured as a Schottky diode. The second nonvolatile CNT resistive block switch is formed by the second bottom metal layer 1042, the second switch nanotube fabric layer 1044, and the second top metal layer 1046. The second carbon based diode is formed by the second conductive layer 1032 and the second diode graphitic layer 1034. The third resistive change memory element 1080 is formed by a third nonvolatile CNT resistive block switch in a series connection with a third carbon based diode configured as a Schottky diode. The third nonvolatile CNT resistive block switch is formed by the third bottom metal layer 1021, the third switch nanotube fabric layer 1023, and the third top metal layer 1025. The third carbon based diode is formed by the third conductive layer 1011 and the third diode graphitic layer 1013. The fourth resistive change memory element 1090 is formed by a fourth nonvolatile CNT resistive block switch in a series connection with a fourth carbon based diode configured as Schottky diode. The fourth nonvolatile CNT resistive block switch is formed by the fourth bottom metal layer 1041, the fourth switch nanotube fabric layer 1043, and the fourth top metal layer 1045. The fourth carbon based diode is formed by the fourth conductive layer 1031 and the fourth diode graphitic layer 1033. The first common wiring layer 1004 can operate as a common word-line for the first resistive change memory element 1060 and the third resistive change memory element 1080. The second common wiring layer 1005 can operate as a common word-line for the second resistive change memory element 1070 and the fourth resistive change memory element 1090.

Although not shown in FIG. 10B, the first resistive change memory element 1060, the second resistive change memory element 1070, the third resistive change memory element 1080, and the fourth resistive change memory element 1090 can have nonvolatile graphitic resistive block switches formed in place of the nonvolatile CNT resistive block switches. The nonvolatile graphitic resistive block switches can be formed by depositing switch graphitic layers in place of the switch nanotube fabric layers. The switch graphitic layers can be formed using any of the processing methods and techniques used to form the switch graphitic layer 544, as discussed in detail above. Further, the first resistive change memory element 1060, the second resistive change memory element 1070, the third resistive change memory element 1080, and the fourth resistive change memory element 1090 can have carbon based diodes configured as pn junction diodes formed in place of the carbon based diodes configured as Schottky diodes. The carbon based diodes configured as pn junction diodes can be formed by depositing diode graphitic layers in place of the conductive layers.

Figure 11A:
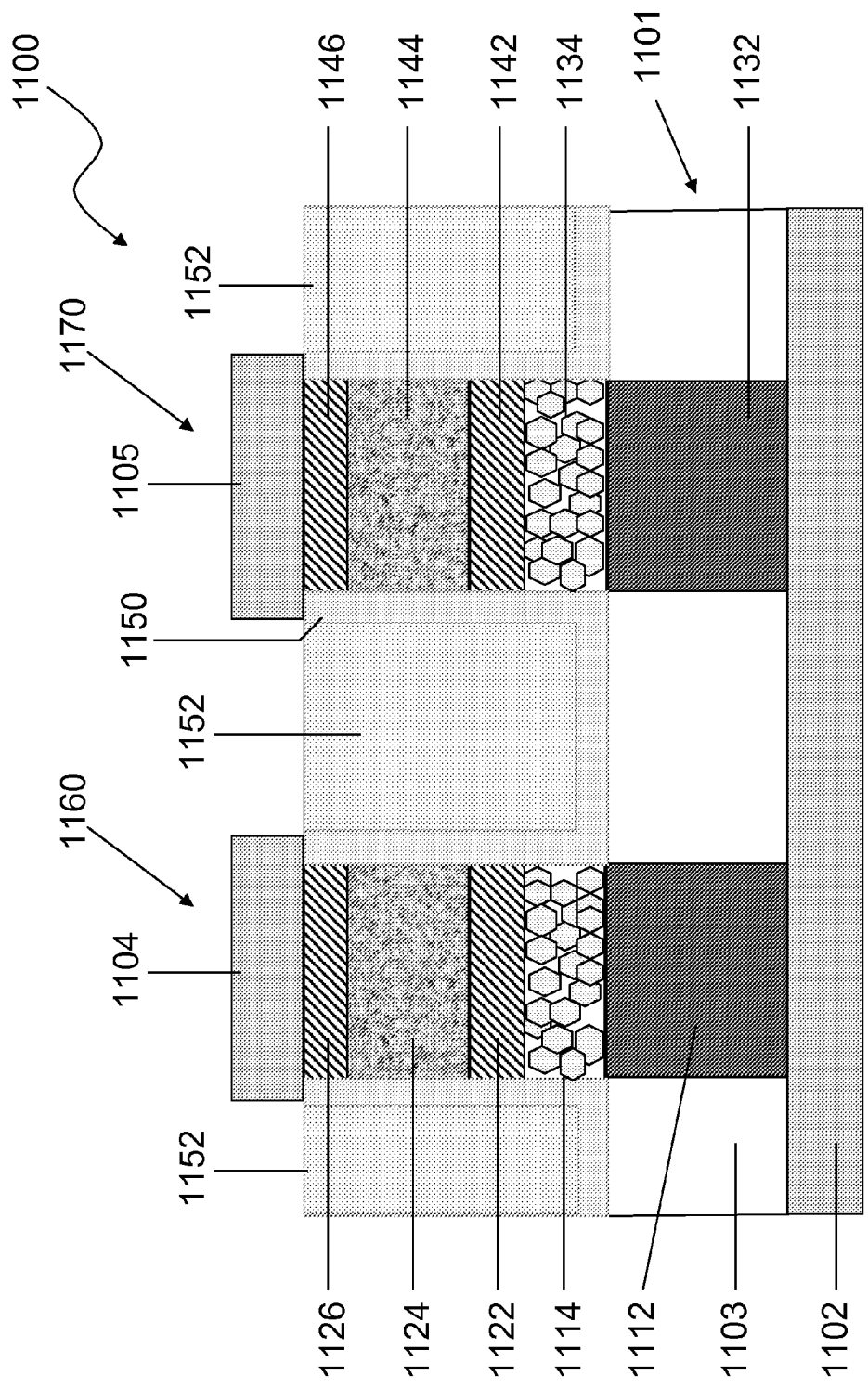
FIG. 11A illustrates a single-level nonvolatile resistive change memory having two resistive change memory elements fabricated in a high density cross-point array using a buckyball layer.

FIG. 11A illustrates a single-level nonvolatile resistive change memory 1100 that can be fabricated in a similar manner to the single-level nonvolatile resistive change memory 800 shown in FIG. 8F and discussed in detail above. However, the fabrication process for the single-level nonvolatile resistive change memory 1100 deposits a diode buckyball layer in place of the diode nanotube fabric layer deposited for the single-level nonvolatile resistive change memory 800. The diode buckyball layer can be formed using any of the processing methods and techniques used to form the diode buckyball layer 614, as discussed in detail above. The single-level nonvolatile resistive change memory 1100 is formed by a bottom wiring layer 1102, an insulating layer 1103, a first conductive layer 1112, a second conductive layer 1132, a first diode buckyball layer 1114, a second diode buckyball layer 1134, a first bottom metal layer 1122, a second bottom metal layer 1142, a first switch nanotube fabric layer 1124, a second switch nanotube fabric layer 1144, a first top metal layer 1126, a second top metal layer 1146, a dielectric fill for sidewall passivation 1150, a dielectric fill between the stacks 1152, a first common wiring layer 1104, and a second common wiring layer 1105.

The single-level nonvolatile resistive change memory 1100 illustrated in FIG. 11A has a first resistive change memory element 1160 and a second resistive change memory element 1170. The first resistive change memory element 1160 is formed by a first nonvolatile CNT resistive block switch in a series connection with a first carbon based diode configured as a Schottky diode. The first nonvolatile CNT resistive block switch is formed by the first bottom metal layer 1122, the first switch nanotube fabric layer 1124, and the first top metal layer 1126. The first carbon based diode is formed by the first conductive layer 1112 and the first diode buckyball layer 1114. The second resistive change memory element 1170 is formed by a second nonvolatile CNT resistive block switch in a series connection with a second carbon based diode configured as a Schottky diode. The second nonvolatile CNT resistive block switch is formed by the second bottom metal layer 1142, the second switch nanotube fabric layer 1144, and the second top metal layer 1146. The second carbon based diode is formed by the second conductive layer 1132 and the second diode buckyball layer 1134.

Although not shown in FIG. 11A, the first resistive change memory element 1160 and the second resistive change memory element 1170 can have nonvolatile buckyball resistive block switches formed in place of the nonvolatile CNT resistive block switches. The nonvolatile buckyball resistive block switches can be formed by depositing a switch buckyball layer in place of the switch nanotube fabric layer. The switch buckyball layer can be formed using any of the processing methods and techniques used to form the switch buckyball layer 644, as discussed in detail above. Further, the first resistive change memory element 1160 and the second resistive change memory element 1170 can have carbon based diodes configured as pn junction diodes formed in place of the carbon based diodes configured as Schottky diodes. The carbon based diodes configured as pn junction diodes can be formed by depositing buckyball layers in place of the first conductive layer 1112 and the second conductive layer 1132.

Figure 11B:
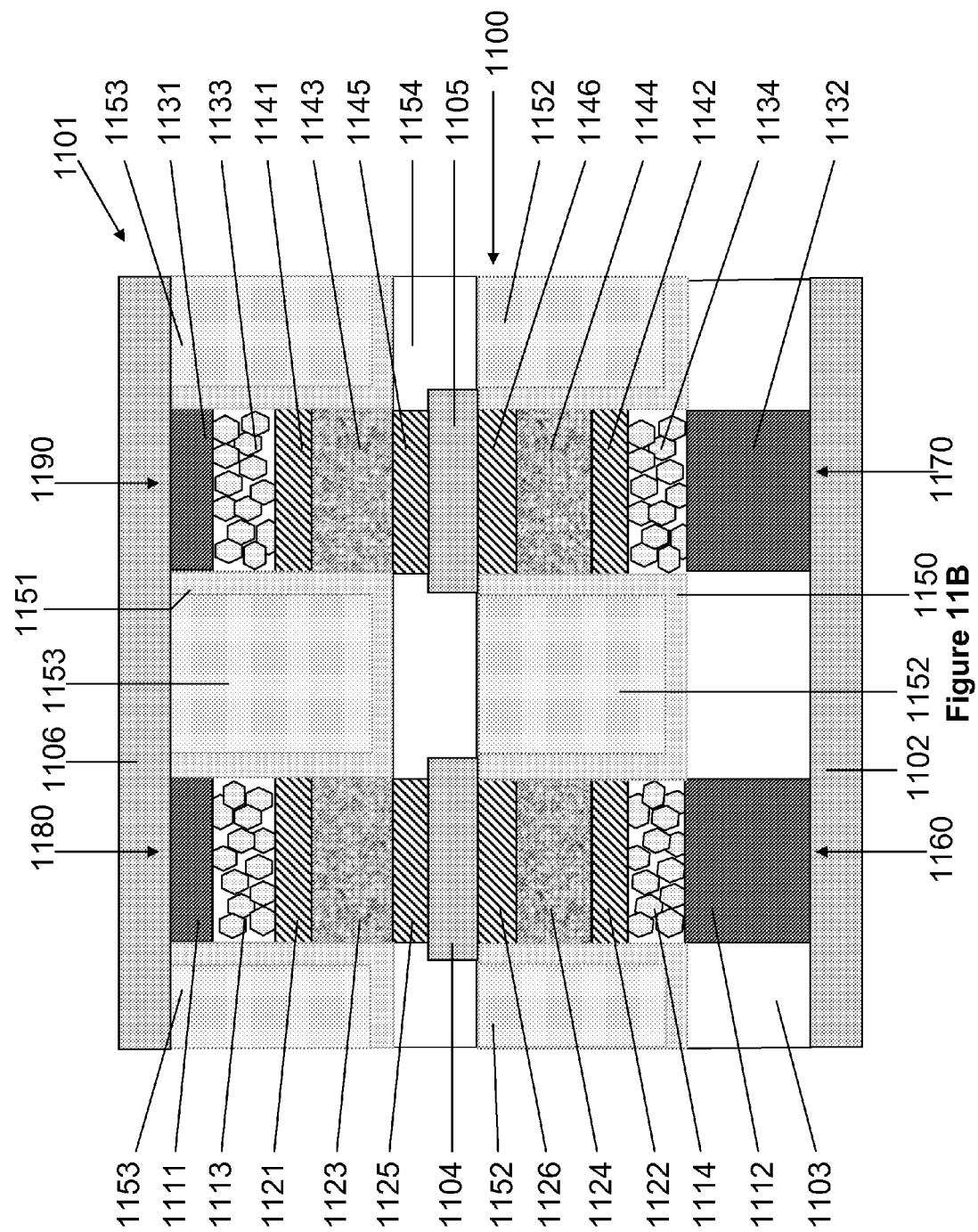
FIG. 11B illustrates a multi-level nonvolatile resistive change memory having vertically stacked resistive change memory elements formed by nonvolatile CNT resistive block switches and carbon based diodes configured as Schottky diodes having conductive layers electrically contacting diode buckyball layers.

FIG. 11B illustrates a multi-level nonvolatile resistive change memory 1101 having a third resistive change memory element 1180 and a fourth resistive change memory element 1190 vertically stacked above the first resistive change memory element 1160 and the second resistive change memory element 1170 of the single-level nonvolatile resistive change memory 1100. The multi-level nonvolatile resistive change memory 1101 formed by the bottom wiring layer 1102, the insulating layer 1103, the first conductive layer 1112, the second conductive layer 1132, the first diode buckyball layer 1114, the second diode buckyball layer 1134, the first bottom metal layer 1122, the second bottom metal layer 1142, the first switch nanotube fabric layer 1124, the second switch nanotube fabric layer 1144, the first top metal layer 1126, the second top metal layer 1146, the dielectric fill for sidewall passivation 1150, the dielectric fill between the stacks 1152, the first common wiring layer 1104, and the second common wiring layer 1105 as discussed in detail above with respect to the single-level nonvolatile resistive change memory 1100 with like reference numbers representing like elements and components in FIGS. 11A and 11B. The multi-level nonvolatile resistive change memory 1101 is additionally formed by a thick dielectric layer 1154, a third top metal layer 1125, a fourth top metal layer 1145, a third switch nanotube fabric layer 1123, a fourth switch nanotube fabric layer 1143, a third bottom metal layer 1121, a fourth bottom metal layer 1141, a third diode buckyball layer 1113, a fourth diode buckyball layer 1133, a third conductive layer 1111, a fourth conductive layer 1131, a dielectric fill for sidewall passivation 1151, a dielectric fill between the stacks 1153, and a top wiring layer 1106.

The first resistive change memory element 1160 and the second resistive change memory element 1170 can be fabricated as discussed in detail above with respect to the single-level nonvolatile resistive change memory 1100 with like reference numbers representing like elements and components in FIGS. 11A and 11B. The third resistive change memory element 1180 and the fourth resistive change memory element 1190 can be fabricated in a similar manner to the third resistive change memory element 980 and the fourth resistive change memory element 990 illustrated in FIG. 9B. However, the fabrication process for the third resistive change memory element 1180 and the fourth resistive change memory element 1190 should deposit a diode buckyball layer in place of the diode nanotube fabric layer deposited for the third resistive change memory element 980 and the fourth resistive change memory element 990 illustrated in FIG. 9B. The diode buckyball layer can be formed using any of the processing methods and techniques used to form the diode buckyball layer 614, as discussed in detail above.

The first resistive change memory element 1160 is formed by a first nonvolatile CNT resistive block switch in a series connection with a first carbon based diode configured as a Schottky diode. The first nonvolatile CNT resistive block switch is formed by the first bottom metal layer 1122, the first switch nanotube fabric layer 1124, and the first top metal layer 1126. The first carbon based diode is formed by the first conductive layer 1112 and the first diode buckyball layer 1114. The second resistive change memory element 1170 is formed by a second nonvolatile CNT resistive block switch in a series connection with a second carbon based diode configured as a Schottky diode. The second nonvolatile CNT resistive block switch is formed by the second bottom metal layer 1142, the second switch nanotube fabric layer 1144, and the second top metal layer 1146. The second carbon based diode is formed by the second conductive layer 1132 and the second diode buckyball layer 1134. The third resistive change memory element 1180 is formed by a third nonvolatile CNT resistive block switch in a series connection with a third carbon based diode configured as a Schottky diode. The third nonvolatile CNT resistive block switch is formed by the third bottom metal layer 1121, the third switch nanotube fabric layer 1123, and the third top metal layer 1125. The third carbon based diode is formed by the third conductive layer 1111 and the third diode buckyball layer 1113. The fourth resistive change memory element 1190 is formed by a fourth nonvolatile CNT resistive block switch in a series connection with a fourth carbon based diode configured as Schottky diode. The fourth nonvolatile CNT resistive block switch is formed by the fourth bottom metal layer 1141, the fourth switch nanotube fabric layer 1143, and the fourth top metal layer 1145. The fourth carbon based diode is formed by the fourth conductive layer 1131 and the fourth diode buckyball layer 1133. The first common wiring layer 1104 can operate as a common wordline for the first resistive change memory element 1160 and the third resistive change memory element 1180. The second common wiring layer 1105 can operate as a common wordline for the second resistive change memory element 1170 and the fourth resistive change memory element 1190.

Although not shown in FIG. 11B, the first resistive change memory element 1160, the second resistive change memory element 1170, the third resistive change memory element 1180, and the fourth resistive change memory element 1190 can have nonvolatile buckyball resistive block switches formed in place of the nonvolatile CNT resistive block switches. The nonvolatile buckyball resistive block switches can be formed by depositing switch buckyball layers in place of the switch nanotube fabric layers. The switch buckyball layers can be formed using any of the processing methods and techniques used to form the switch buckyball layer 644, as discussed in detail above. Further, the first resistive change memory element 1160, the second resistive change memory element 1170, the third resistive change memory element 1180, and the fourth resistive change memory element 1190 can have carbon based diodes configured as pn junction diodes formed in place of the carbon based diodes configured as Schottky diodes. The carbon based diodes configured as pn junction diodes can be formed by depositing diode buckyball layers in place of the conductive layers.

Cross Point Memory Arrays with Vertical Columns of Array Line Segments

Prior cross point memory and cell examples, such as those illustrated and described further above with respect to FIGS. 1-12 are formed with approximately orthogonal array lines representative of word lines and bit lines on horizontal planes, and multiple stacked horizontal planes. However, cross point memory arrays with interconnected vertical columns of array line segments, bit line segments for example, may also be used to achieve high density cross point memory arrays.

FIG. 13 illustrates a four layer column cross point cell 1300 with each layer in the cell having a pair of bits, for a total of eight bits in the four layers. In this example, each cell stores information in the form of a resistive state (resistance value). Each cell may store 1 bit of information in the form a low and a high resistance state. Or each cell may store multiple bits of information with multiple resistance states. For example two bits of information may be stored with four resistance states as described in U.S. Pat. No. 8,102,018. Methods of fabrication are described further below with respect to FIGS. 16A and 16B.

Column cross point cell 1300 is formed on a substrate 1302. Substrate 1302 may be formed of a wide range of materials. For example, substrate 1302 may be a semiconductor with interconnected devices forming circuits used in memory operation. Substrate 1302 may be an insulator layer as part of an integrated circuit, and may include filled via contacts connecting column cross point cell 1300 with underlying devices and circuits. Substrate 1302 may also be a ceramic or organic material and may be rigid or flexible.

Array wire 1304 on the surface of substrate 1302 as illustrated in FIGS. 13A-E may be used to interconnect various bit line segments, such bit line segment 1310 with other bit line segments (not shown). Bit line segment 1310 may be a conductor-filled via for example. Or bit line segment 1310 may formed with a cylindrical conductive ring on the sidewalls of the via for example. The multiple bit line segments form a bit line of a larger array or sub-array region. Bit line segments may all be connected in parallel, for example, to form a bit line of an array or sub-array. For example, an array wire orthogonal to the word lines connects the tops of all bit line segments 1310. For example, referring to FIG. 13C, array wire 1352 may be connected to bit line segment 1313 at contact 1354. Alternatively, for example, an array wire orthogonal to the word lines connects the bottoms of all bit line segments 1310. Referring to FIG. 13A, bit line segment 1310 contacts filled via contact 1306 at contact 1307, which in turn contacts array wire 1304. However, bit line segments may also be connected in series. For example, the bottom of bit line segment 1310 connected to array wire 1304 by filled via contact 1306 may be wired to the bottom of another bit line segment (not shown), whose top is connected to another bit line (not shown), and so on, forming a snaking bit line with vertical columns of bit line segments connected in series in a direction perpendicular to the word lines.

In a first storage bit plane, word lines 1312-1 and word lines 1312-2 contact switch nanotube blocks 1316-1 and 1316-2, respectively, to form end contacts 1320-1 and 1320-2, respectively. Bit line segment 1310 contacts switch nanotube blocks 1316-1 and 1316-2 to form end contacts 1322-1 and 1322-2, respectively. Protective insulators 1318-1 and 1318-2 on the top surface of switch nanotube blocks 1316-1 and 1316-2, respectively, are included as part of the methods of fabrication described further below with respect to FIGS. 16A and 16B. However, these insulators are not required as part of the memory cell operation. NV CNT resistive block switch 1314-1 includes end contact 1320-1 and end contact 1322-1. NV CNT resistive block switch 1314-2 includes end contact 1320-2 and end contact 1322-2. Insulators 1308-1 and 1308-2 are used to prevent electrical contact between filled via contact 1306 and switch nanotube blocks 1316-1 and 1316-2. Storage bit planes are separated by insulator 1324.

In a second storage bit plane, word lines 1312-3 and word lines 1312-4 contact switch nanotube blocks 1316-3 and 1316-4, respectively, to form end contacts 1320-3 and 1320-4, respectively. Bit line segment 1310 contacts switch nanotube blocks 1316-3 and 1316-4 to form end contacts 1322-3 and 1322-4, respectively. Protective insulators 1318-3 and 1318-4 on the top surface of switch nanotube blocks 1316-3 and 1316-4, respectively, are included as part of the methods of fabrication described further below with respect to FIGS. 16A and 16B. However, these insulators are not required as part of the memory cell operation. NV CNT resistive block switch 1314-3 includes end contact 1320-3 and end contact 1322-3. NV CNT resistive block switch 1314-4 includes end contact 1320-4 and end contact 1322-4.

In a third storage bit plane, word lines 1312-5 and word lines 1312-6 contact switch nanotube blocks 1316-5 and 1316-6, respectively, to form end contacts 1320-5 and 1320-6, respectively. Bit line segment 1310 contacts switch nanotube blocks 1316-5 and 1316-6 to form end contacts 1322-5 and 1322-6, respectively. Protective insulators 1318-5 and 1318-6 on the top surface of switch nanotube blocks 1316-5 and 1316-6, respectively, are included as part of the methods of fabrication described further below with respect to FIGS. 16A and 16B. However, these insulators are not required as part of the memory cell operation. NV CNT resistive block switch 1314-5 includes end contact 1320-5 and end contact 1322-5. NV CNT resistive block switch 1314-6 includes end contact 1320-6 and end contact 1322-6.

In a fourth storage bit plane, word lines 1312-7 and word lines 1312-8 contact switch nanotube blocks 1316-7 and 1316-8, respectively, to form end contacts 1320-7 and 1320-8, respectively. Bit line segment 1310 contacts switch nanotube blocks 1316-7 and 1316-8 to form end contacts 1322-7 and 1322-8, respectively. Protective insulators 1318-7 and 1318-8 on the top surface of switch nanotube blocks 1316-7 and 1316-8, respectively, are included as part of the methods of fabrication described further below with respect to FIGS. 16A and 16B. However, these insulators are not required as part of the memory cell operation. NV CNT resistive block switch 1314-7 includes end contact 1320-7 and end contact 1322-7. NV CNT resistive block switch 1314-8 includes end contact 1320-8 and end contact 1322-8.

In this example, four storage bit planes are illustrated in column cross point cell 1300. However, other storage bit planes may be formed using methods described further below with respect to FIGS. 16A and 16B. For example, 8 bit planes, 16 bit planes, and even more bit planes may be formed.

Figure 13B:
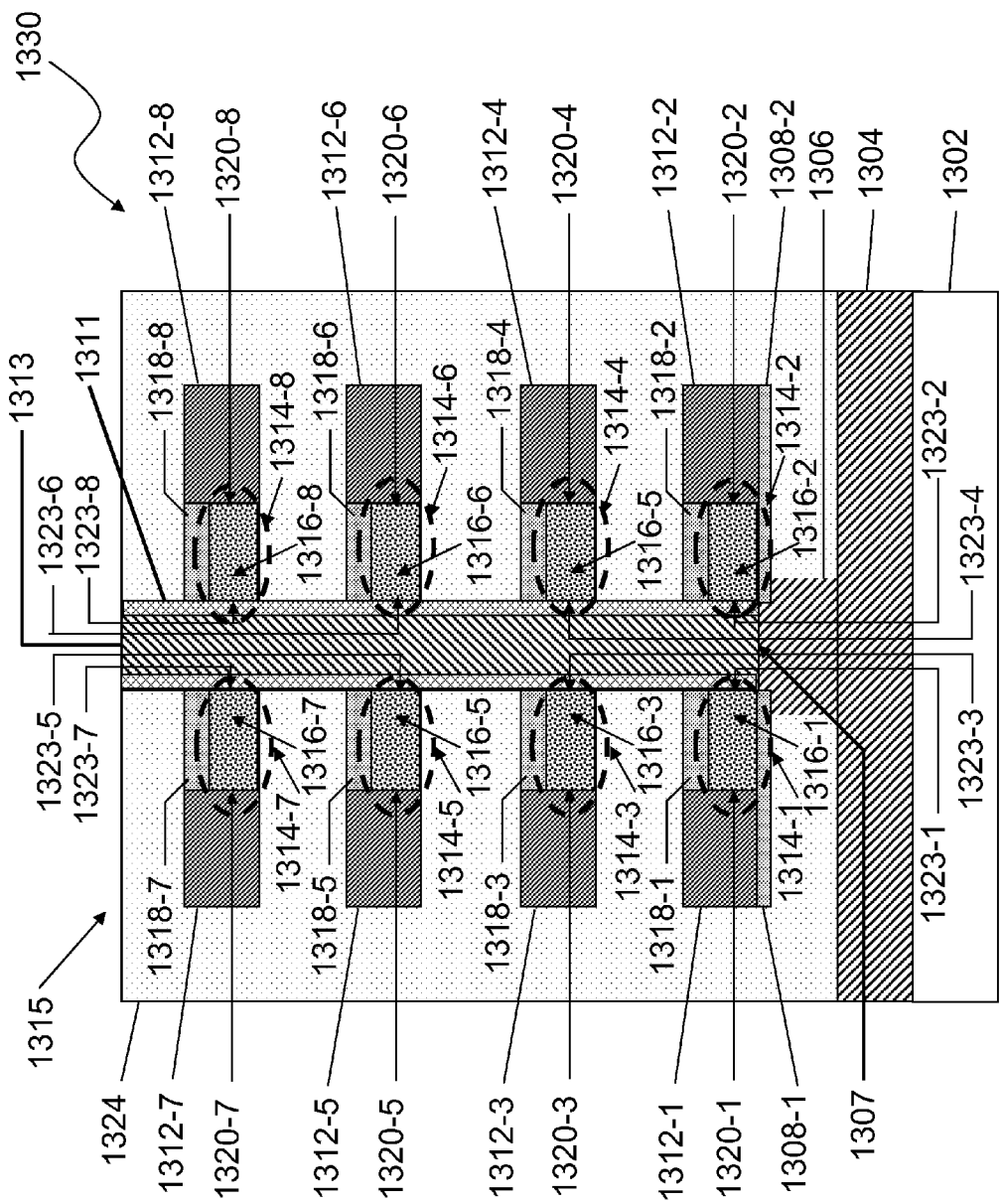

Referring to FIG. 13B, which is the same as FIG. 13A except for the addition of diode-forming liner 1311. The sidewalls of via hole 1740 formed by etching through top surface 1315, as illustrated further below in FIG. 17H, may be coated with diode-forming liner 1311 (typically formed by using industry ALD process methods and tools), then conductor-filled (using known industry methods) in contact with diode-forming liner 1311 and filled via contact 1306 at contact 1307, to form bit line segment 1313 and column cross point cell 1330 illustrated in FIG. 13B. Bit line segment 1313 contacts the inner sidewall of diode-forming liner 1311, whose outer sidewall contacts switch nanotube blocks 1316-1 and 13-16-2 at end contacts 1323-1 and 1323-2, respectively, forming series diodes between bit line segment 1313 and switch nanotube blocks 1316-1 and 1316-2. Series diodes are also formed between bit line segment 1313 and switch nanotube blocks 1316-3, 1316-4, 1316-5, 1316-6, 1316-7, and 1316-8.

Figure 13C:
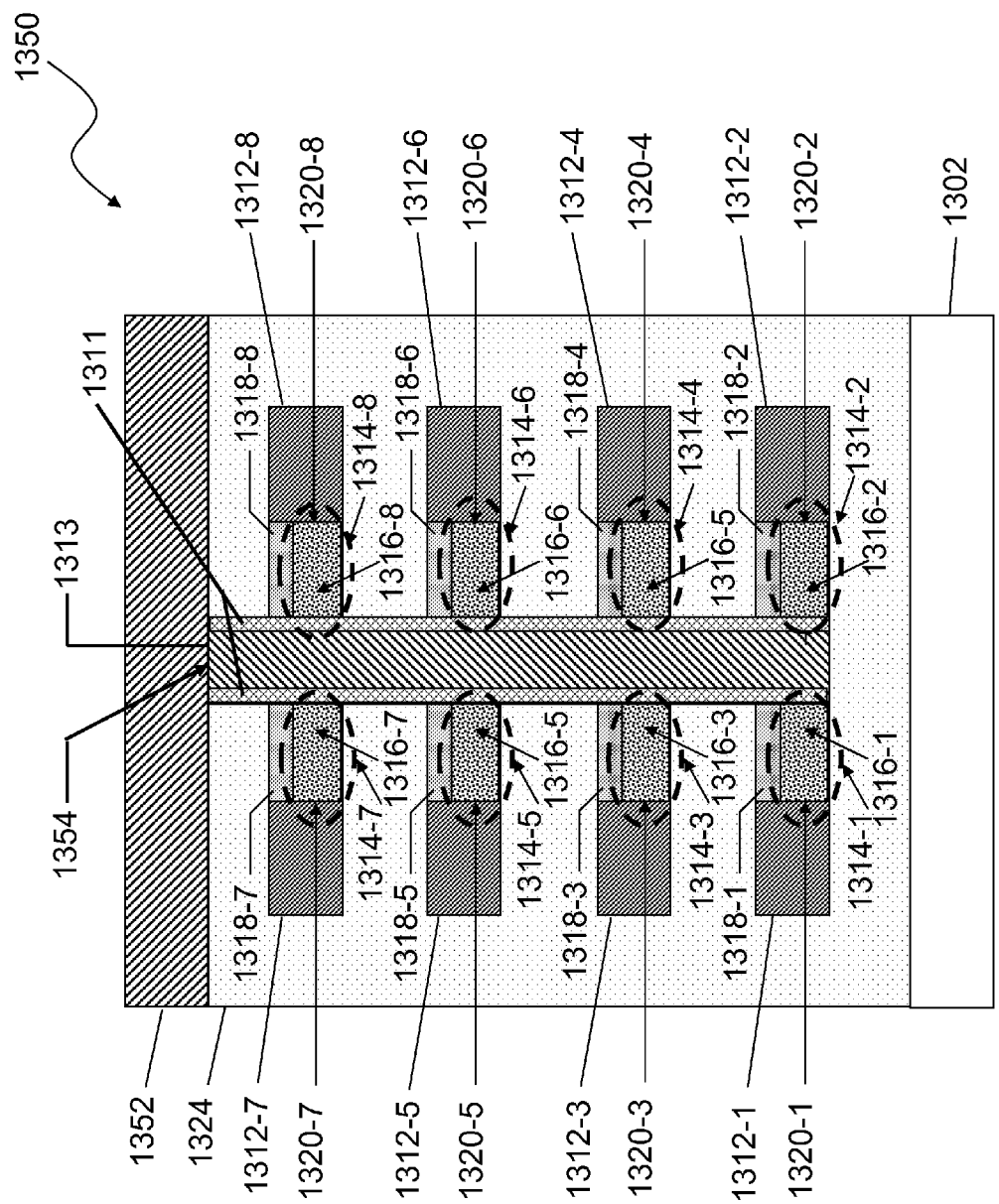

FIG. 13C illustrates column cross point cell 1350, which is similar to column cross point cell 1330 shown in FIG. 13B, except that array wire 1352 is formed on top surface 1315 (FIG. 13B). When forming cross point cell 1350, array wire 1304, filled via contact 1306, and insulators 1308-1 and 1308-2, illustrated in FIG. 13A, may be omitted as described by methods 1610 and array wire 1352 may be formed by methods 1680 as shown in methods flow chart 1600 illustrated in FIGS. 16A and 16B.

Measurements of uncorrelated (that is, unaligned) fabrics illustrated in FIG. 12A and correlated (that is, aligned) fabrics illustrated in FIG. 12B result in differences in sheet resistance values as measured using known four-point measurement techniques. A CNT fabric was deposited on a wafer forming an uncorrelated fabric layer and the sheet resistance was measured. Then this CNT fabric layer was processed with mechanical pressure alignment methods similar to those described further above with respect to FIGS. 12A and 12B and also in U.S. patent application Ser. No. 13/076,152, and sheet resistance was again measured using four-point probe measurements. These sheet resistance measurements showed that the sheet resistance of ordered CNT fabrics was at least 2× larger than for unordered CNT fabrics.

Figure 13D:
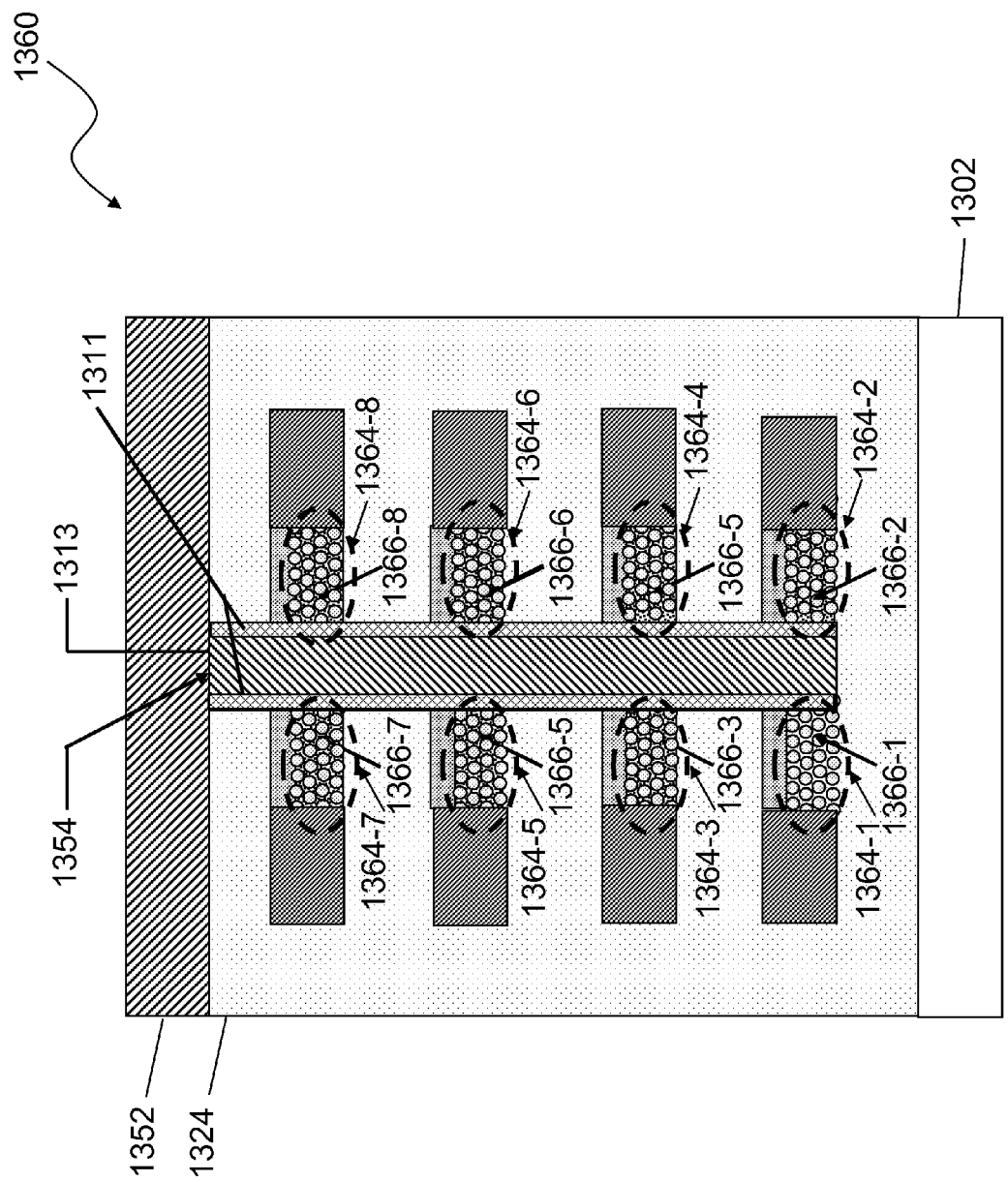

FIG. 13D is the same as FIG. 13C, except that the switch nanotube blocks 1316-1, 1316-2, 1316-3, 1316-4, 1316-5, 1316-6, 1316-7, and 1316-8 have been replaced by switch nanotube blocks 1366-1, 1366-2, 1366-3, 1366-4, 1366-5, 1366-6, 1366-7, and 1366-8, respectively, to form column cross point cell 1360 as illustrated in FIG. 13D using ordered CNT fabrics. In this example, CNTs in the ordered CNT fabric are approximately aligned in the direction of word lines 1312-1, 1312-2, 1312-3, 1312-4, 1312-5, 1312-6, 1312-7, and 1312-8 and may be formed by methods 1620 illustrated in FIG. 16A and methods described further above with respect to FIG. 16B. However, CNTs may be aligned approximately parallel to array wire 1352, or may be approximately aligned in any direction between parallel to word lines and parallel to array wires, which are orthogonal to word lines. CNT alignment may be used to modulate switch nanotube block resistance as described further above. Switch nanotube blocks may also be formed by layers of both unaligned and aligned CNT fabrics as well.

Figure 13E:
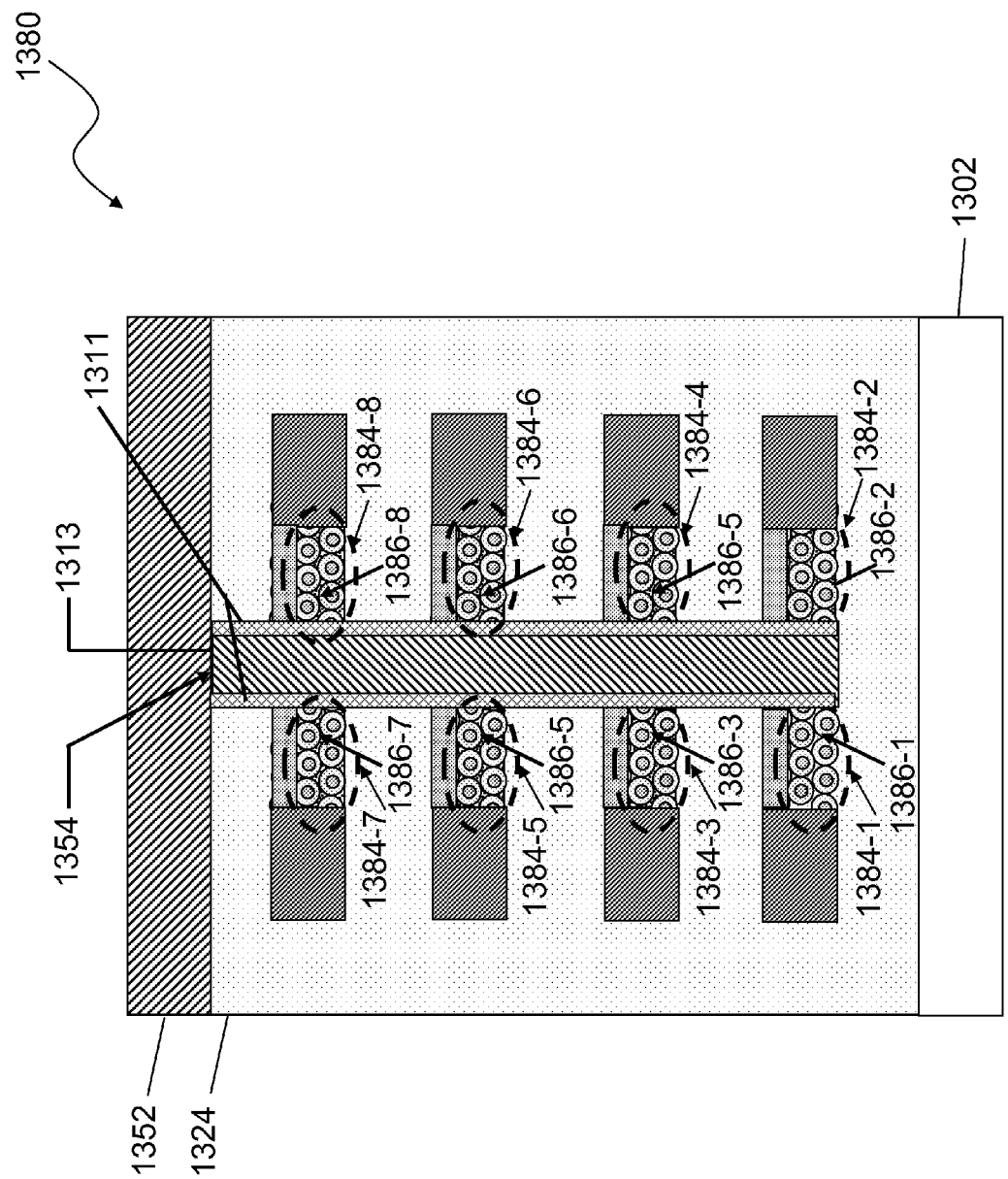

FIG. 13E is the same as FIG. 13D, except that the switch nanotube blocks 1366-1, 1366-2, 1366-3, 1366-4, 1366-5, 1366-6, 1366-7, and 1366-8 have been replaced by switch nanotube blocks 1386-1, 1386-2, 1386-3, 1386-4, 1386-5, 1386-6, 1386-7, and 1386-8, respectively, to form column cross point cell 1380 as illustrated in FIG. 13E using ordered coated CNT fabrics. In this example, coated CNTs in the ordered coated CNT fabric are approximately aligned in the direction of word lines 1312-1, 1312-2, 1312-3, 1312-4, 1312-5, 1312-6, 1312-7, and 1312-8 and may be formed by methods 1620 illustrated in FIG. 16A and methods described further above with respect to FIG. 16B. However, coated CNTs may be aligned parallel to array wire 1352, or may be aligned in any direction between parallel to word lines and parallel to array wires. Coated CNTs may be used to form unaligned CNT fabrics. The coating may be used to modulate switch nanotube block resistance by introducing an insulating layer such as silica between the CNTs in the coated CNT layer thereby increasing the switch nanotube block resistance. CNTs may also be functionalized as described further above with respect to FIGS. 4C, 4D, and 4E. Switch nanotube blocks may also be formed by layers of unaligned and aligned, coated and uncoated, and functionalized and non-functionalized CNT fabrics as well.

In addition to the various switch nanotube blocks described in FIGS. 13A-13E, the switch nanotube blocks illustrated in FIGS. 13A-13E may be replaced by switch graphitic blocks corresponding to switch graphitic block 168 illustrated in FIG. 1D. Also, the switch nanotube blocks illustrated in FIGS. 13A-13E may be replaced by switch buckyball blocks corresponding to switch buckyball block 188 illustrated in FIG. 1E by adapting methods 1620 illustrated in FIG. 16A for deposition and patterning of graphitic layers and buckyball layers.

Figure 14:
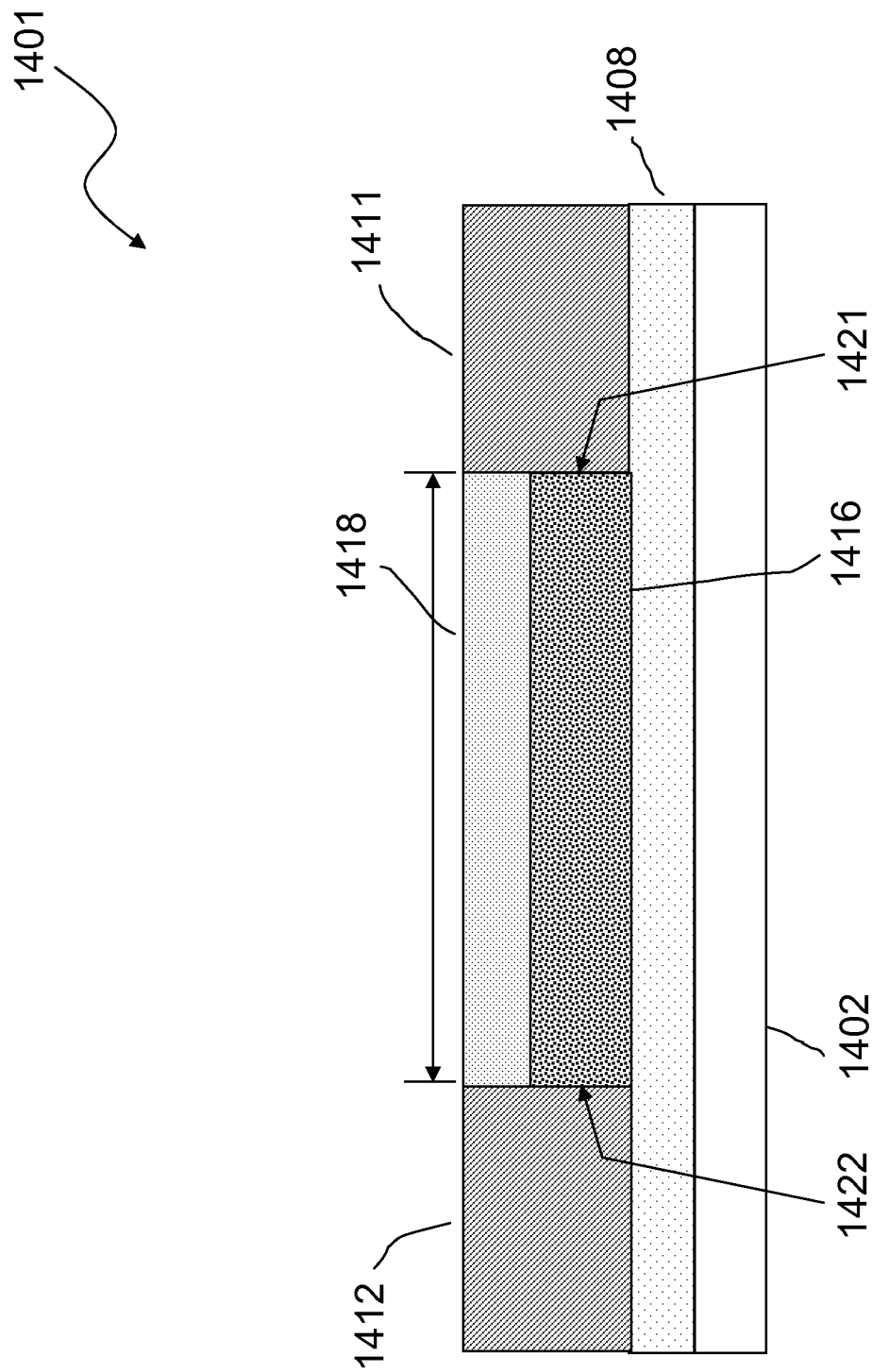
FIG. 14 illustrates a discrete two-terminal nonvolatile nanotube switch with end contacts.

FIG. 14 illustrates NV CNT resistive block switch 1401 including switch nanotube block 1416 on insulator 1408 which is supported by substrate 1402. Protective insulator 1418 is in contact with the top surface of switch nanotube block 1416. Contacts 1411 and 1412 formed adjacent to the end regions of switch nanotube block 1416 form end contacts 1421 and 1422, respectively, separated by a distance of 250 nm. In this example, contacts 1411 and 1412 were formed of TiPd. However, they may instead be formed using a wide variety of contact materials such as conductors, semiconductors, carbon nanotubes, various nanowires, and other materials as described further below with respect to FIG. 17A. Contact 1411 corresponds to any of the word lines illustrated in FIGS. 13A-13E, such as word line 1312-2 for example. Contact 1412 corresponds to bit line segment 1310. End contact 1421 corresponds to any of the end contacts to word lines in FIG. 13, such as end contact 1320-2 for example. End contact 1422 corresponds to any of the end contacts to bit line segment 1310, end contract 1322-2 for example. NV CNT resistive block switch 1401 is described in U.S. Patent Pub. No. 2008/0160734.

Figure 15:
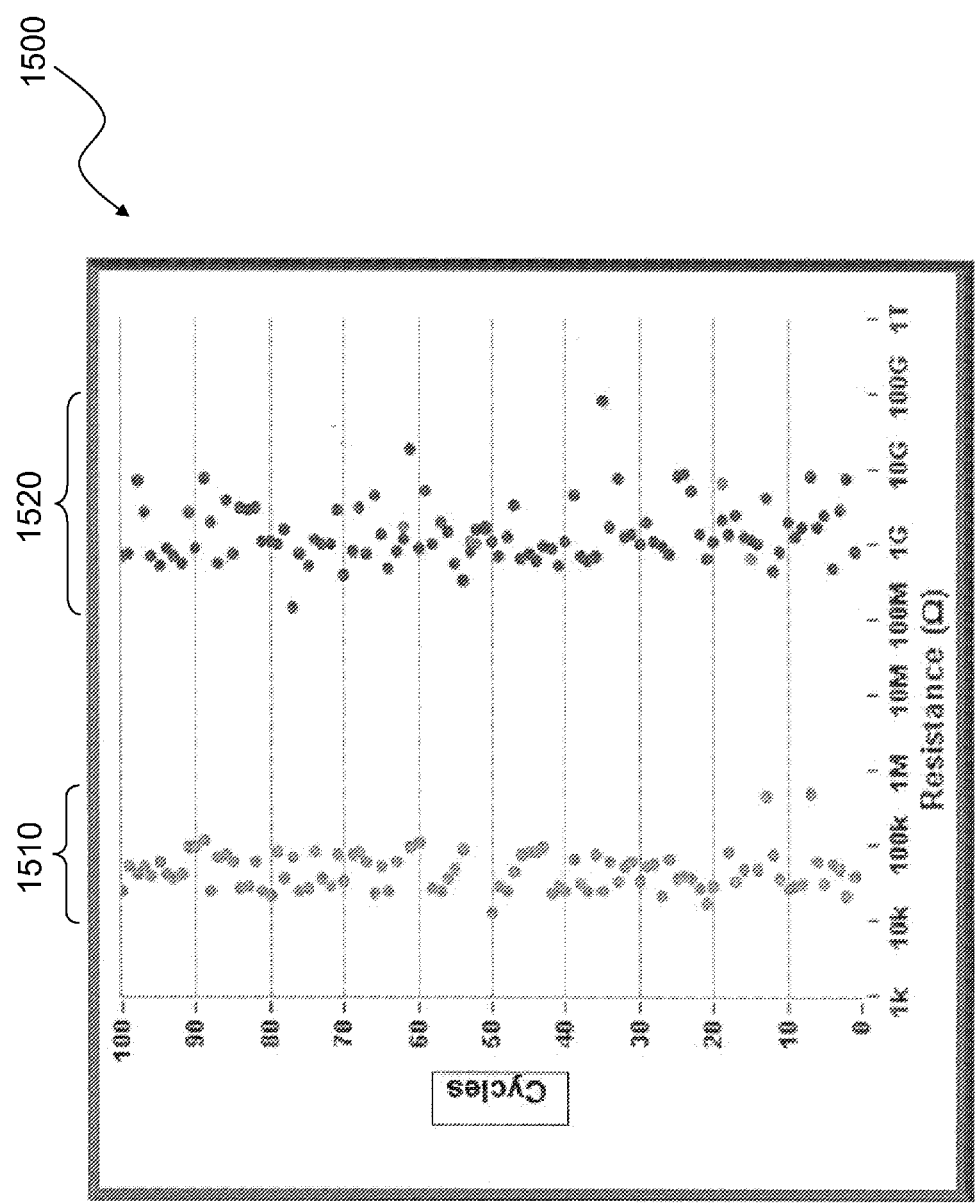
FIG. 15 illustrates the measured electrical behavior of the nonvolatile nanotube switch of FIG. 14.

In operation, test results of individual NV CNT resistive block switches 1401 are illustrated by graph 1500 shown in FIG. 15, and also described in U.S. Patent Pub. No. 2008/0160734. READ-SET-READ-RESET-READ-SET-etc. operations are performed and nonvolatile low resistance SET state values 1510 and nonvolatile high resistance RESET state values 1520 are measured and plotted. Low resistance SET states 1510 show a low resistance range of 20 k$\Omega$ to 100 k$\Omega$, with two points at 500 k$\Omega$. Tighter low resistance SET state value spreads are observed after several tens of cycles. High resistance RESET state values in excess of 100 M$\Omega$, and 200 M$\Omega$ in most cases, were measured. The ratio of the lowest value of high resistance RESET state value to the highest value of the low resistance SET value is 200:1 (ratio=100 M$\Omega$/0.5 M$\Omega$). SET and RESET operations were performed with a single pulse; however, multiple pulses may be used as well for finer control of low and high resistance state values. As described in U.S. Patent Pub. No. 2008/0160734, various combinations of pairs of contacts to switch nanotube block surfaces, such as switch nanotube block 1416, may be formed including a top contact and a side contact; contacts fully or partially contacting switch nanotube block surfaces, and other combinations used to form NV CNT resistive block switches. NV CNT resistive block switch 1401, and variations thereof, may be used in any memory architecture; for example, in column cross point cell 1300 illustrated in FIGS. 13A-13E.

Figure 16A:
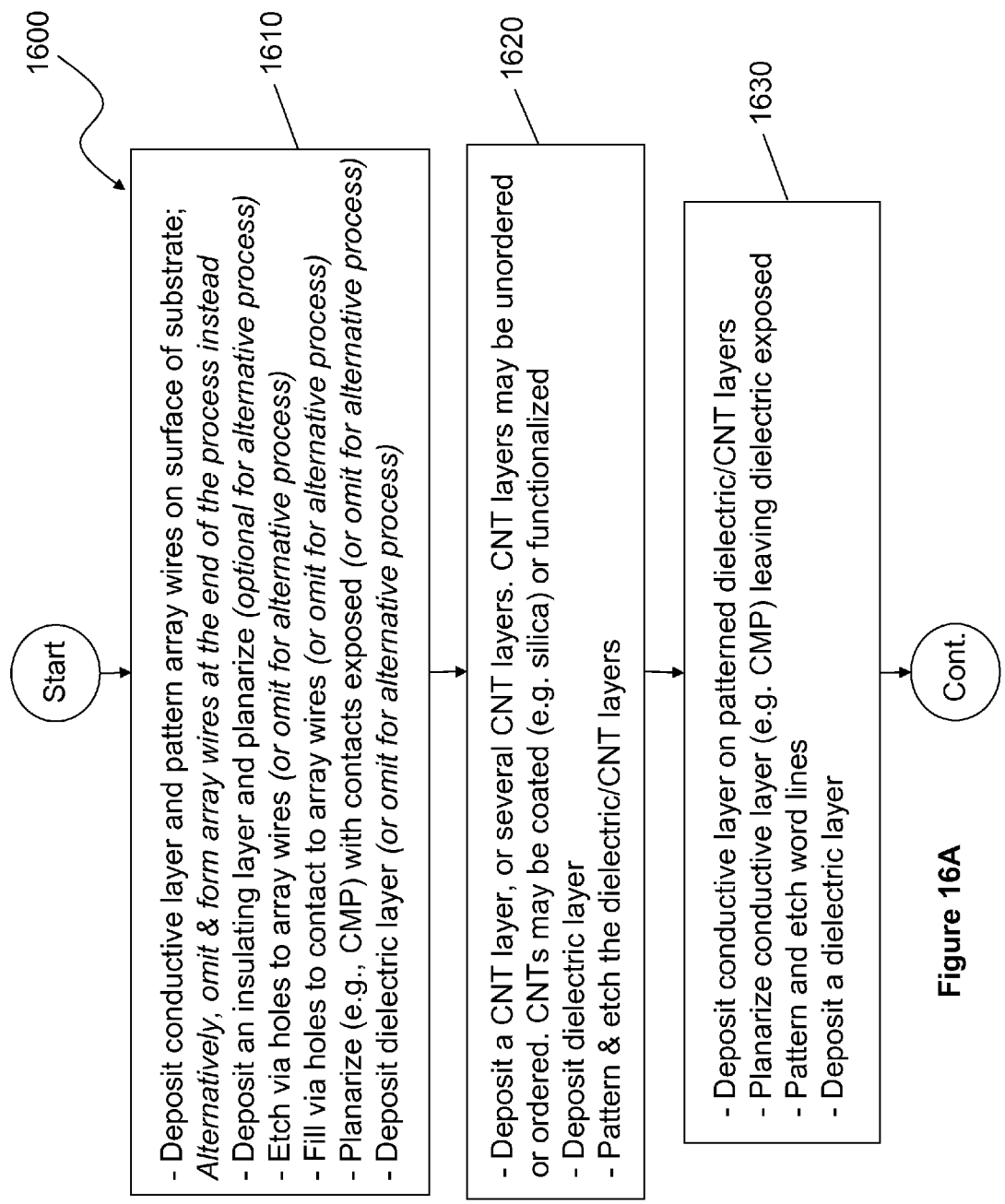
FIGS. 16A and 16B illustrate methods of fabrication for making the cross point array structure of FIGS. 13A-13E.
Figure 16B:
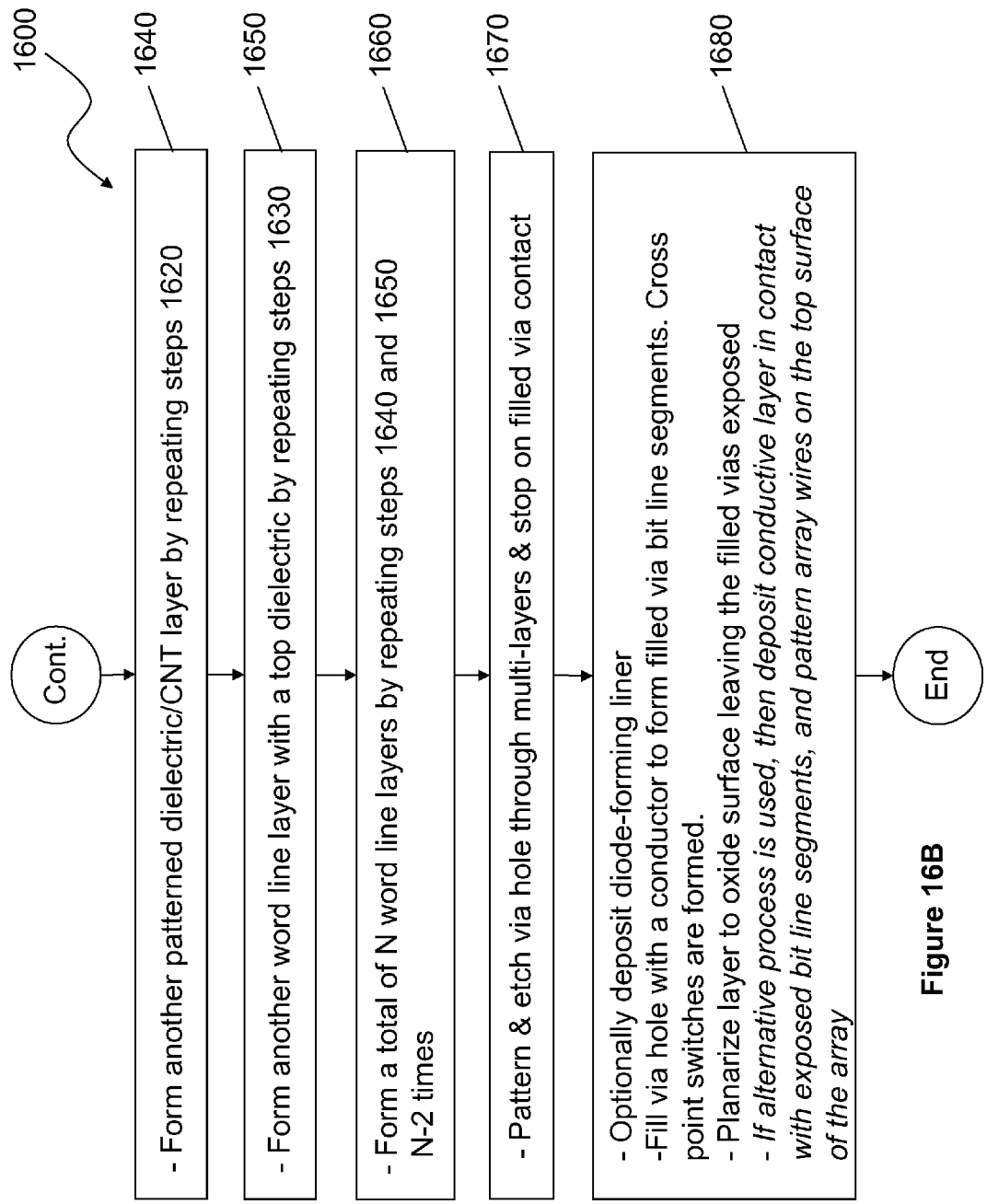

Methods of Fabrication and Structures of Cross Point Memory Arrays Formed with Vertical Columns of Array Line Segments Methods (of fabrication) flow chart 1600 illustrated in FIGS. 16A and 16B describes methods (processes) of forming the structures illustrated in FIGS. 17A-17I. Variations to methods of fabrication 1600 such as the addition or omission of steps and varying the order of steps are still within the scope described below with respect to FIGS. 16 and 17.

Figure 17A:
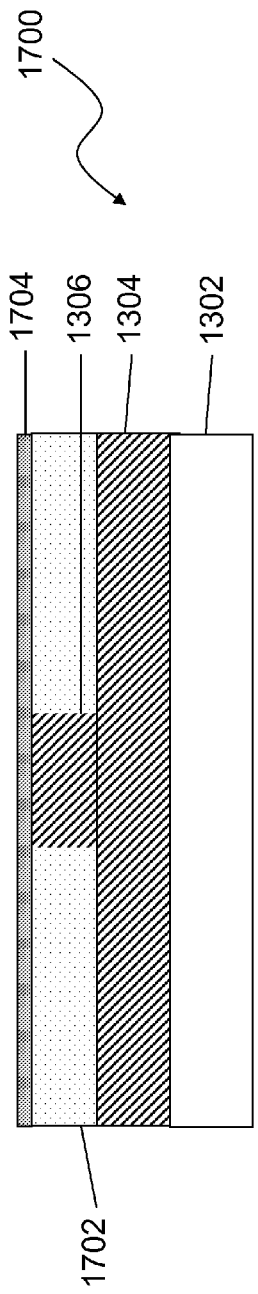

Methods 1610 assumes that substrate 1302 illustrated in FIG. 17A includes many of the components of n-type and p-type field effect devices (MOSFETs) with drain, source, and gate nodes and interconnections to form circuits (typically CMOS circuits) in support of the memory function to be fabricated on the surface of substrate 1302. Further, connections between memory arrays and sub-arrays formed on the surface of substrate 1302 and circuits are present within substrate 1302.

Methods 1610 deposit a conductor layer on the surface of substrate 1302 illustrated in structure 1700 shown in FIG. 17A using known industry methods, or methods described further below in the case of nanotube fabrics for example. Thicknesses may range from 5 nm to 500 nm for example. The term conductor may include metals, metal alloys, semiconductors, silicides, conductive oxides, various allotropes of carbon, and other materials. The following are examples of conductors, conductive alloys, and conductive oxides: Al, Al(Cu), Ag, Au, Bi, Ca, Co, CoSi$_x$, Cr, Cu, Fe, In, Ir, Mg, Mo, MoSi$_2$, Na, Ni, NiSi$_x$, Os, Pb, PbSn, PbIn, Pd, Pd$_2$Si, Pt, PtSi$_x$, Rh, RhSi, Ru, RuO, Sb, Sn, Ta, TaN, Ti, TiN, TiAu, TiCu, TiPd, TiSi$_x$, TiW, W, WSi$_2$, Zn, ZrSi$_2$, and others for example.

The following are examples of semiconductors that may be used as conductors: Si (doped and undoped), Ge, SiC, GaP, GaAs, GaSb, InP, InAs, InSb, ZnS, ZnSe, CdS, CdSe, CdTe, GaN, and other examples.

Various allotropes of carbon may also be used as conductors such as: amorphous carbon (aC), carbon nanotubes such as nanotube fabrics, graphene, buckyballs, and other examples.

In addition to the materials described further above such conductors, semiconductors, conductive oxides, and allotropes of carbon, nanowires formed of various conductor, semiconductor, and conductive oxide materials, such as those described further above, may also be used as well.

Next, methods 1610 deposit a resist layer, expose and develop the resist, and etch to pattern array wires on the surface of substrate 1302 using known industry methods, forming array wire 1304 as illustrated in FIG. 17A. Array wire 1304 width may vary over a large range; for example, F may be scaled over a large range: on the order of 250 nm to on the order of 10 nm.

Next, methods 1610 deposit an insulating layer 1702 using known industry methods to a thickness of 5 to 500 nm for example. Examples of insulators are SiO$_2$, SiN, Al$_2$O$_3$, TEOS, polyimide, HfO$_2$, TaO$_5$, combinations of these insulator materials, and other insulator materials.

Then, methods 1610 etch via holes in the insulating layer 1702 to the top surface of array wire 1304 using known industry methods. Then, a conductive layer is deposited filling the via hole. The combined structure is planarized using known industry (e.g. CMP) methods, leaving the surface of filled via contacts 1306 exposed. The formation of insulator 1702 and filled via contact 1306 is complete in this step.

Then, methods 1610 deposit insulator layer 1704 on the top surface of insulator 1702 and the top surface of filled via contact 1306 in a thickness range of 1 nm to 500 nm as needed. Insulator layer 1704 is formed to prevent the subsequent CNT layer deposition from electrically contacting the surface of filled via contacts 1306. Insulator 1704 may be formed of SiN for example. However, insulator 1704 may also be formed with SiO$_2$, Al$_2$O$_3$, TEOS, polyimide, HfO$_2$, TaO$_5$, combinations of these insulator materials, and other insulator materials. At this point in the process, structure 1700 illustrated in FIG. 17A is complete.

Figure 17B:
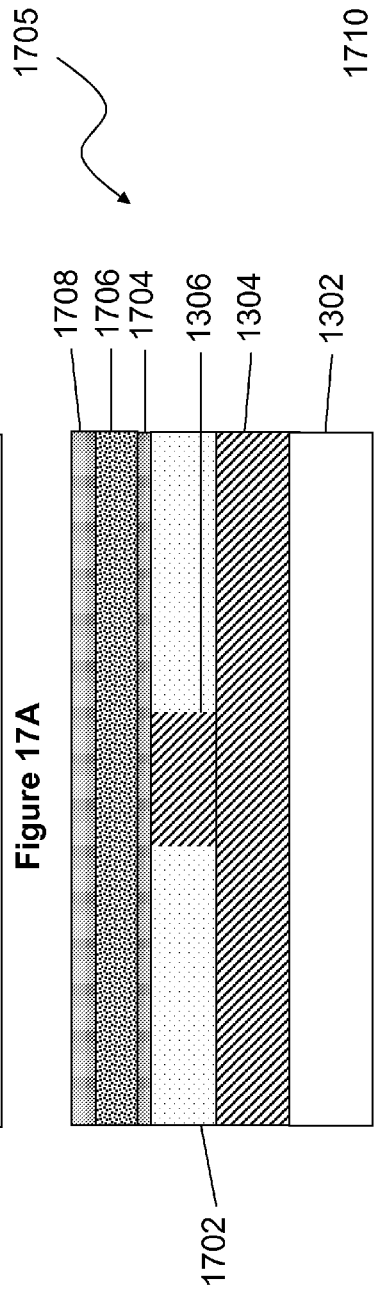

Next, methods 1620 deposit a CNT layer, or several CNT layers, as illustrated in structure 1705 shown in FIG. 17B, to form a porous unordered nanotube (CNT) fabric layer 1706 of matted carbon nanotubes. An unordered nanotube fabric layer deposited on a substrate element is shown by the scanning electron microscope (SEM) image 1200 in FIG. 12A. This may be done with spin-on technique or other appropriate technique as described in U.S. Pat. Nos. 6,643,165, 6,574,130, 6,919,592, 6,911,682, 6,784,028, 6,706,402, 6,835,591, 7,560,136, 7,566,478, 7,335,395, 7,259,410 and 6,924,538, and U.S. Patent Pub. No. 2009/0087630, the contents of which are hereby incorporated by reference in their entireties (hereinafter and hereinbefore, the "incorporated patent references"). Under preferred embodiments, the carbon nanotube layer may have a thickness of approximately 0.5-500 nm for example. The CNT layer may be formed of multiwalled nanotubes, single wall nanotubes, metallic nanotubes, semiconductor nanotubes, and various combinations of all nanotube types, doped and functionalized as described in more detail in U.S. patent application Ser. No. 12/356,447 and U.S. patent application Ser. No. 12/874,501, herein incorporated by reference in their entirety.

Alternatively, methods 1620 may, after the deposition of one or more CNT layers such as described further above, use mechanical or other methods to approximately align some or most of the nanotubes in a preferred direction to form an ordered nanotube fabric layer, or several ordered nanotube layers, as described in U.S. Patent App. No. 61/319,034. Ordered nanotube fabrics may be ordered throughout the nanotube fabric thickness. However, ordered nanotube fabrics may be present for only a portion of the nanotube fabric thickness, while the rest of the nanotube fabric remains an unordered fabric. Ordered and unordered nanotube fabrics may be present in multiple layers that form nanotube fabric layer 1706. FIG. 12B illustrates a scanning electron microscope (SEM) image 1250 of an ordered nanotube fabric.

Next, insulator layer 1708 is deposited over nanotube fabric layer 1706 in a thickness range of 1 nm to 500 nm as needed. This insulator layer may be formed of SiN for example. However, the insulator layer may also be formed using SiO$_2$, Al$_2$O$_3$, TEOS, polyimide, HfO$_2$, TaO$_5$, combinations of these insulator materials, and other insulator materials.

Then, methods 1620 deposit, expose, and develop a resist layer on the surface of insulator 1708. If nanotube fabric layer 1706 is an unordered nanotube fabric layer (FIG. 12A), the resist layer images may have any orientation with respect to the nanotube fabric layer.

However, referring to column cross point cell 1300 in FIGS. 13A-13E and end contacts 1320-1 and 1322-1 of switch nanotube block 1316-1 for example, if nanotube fabric 1706 is a fully or partially ordered nanotube fabric (FIG. 12B), then the orientation of the resist images with respect to the orientation of CNTs in nanotube fabric 1706 may be important to the electrical operation of NV CNT resistive block switches, such as NV CNT resistive block switch 1314-1.

For example, if CNTs in nanotube fabric layer 1706 are ordered (FIG. 12B), then resist images may be aligned relative to the preferred CNT direction such that the CNTs in nanotube fabric layer 1706 are approximately orthogonal to end contacts 1320-1 and 1322-1 when formed later in the process. Alternatively, resist images may be aligned relative to the preferred CNT direction such that the CNTs in nanotube fabric layer 1706 are approximately parallel to end contacts 1320-1 and 1322-1 when formed later in the process. In still another alternative, resist images may be aligned relative to the preferred CNT direction such that the CNTs in nanotube fabric layer 1706 are approximately positioned at any desired angle relative to end contacts 1320-1 and 1322-1 when formed later in the process. For ordered nanotube fabrics, the desired angles for CNTs in nanotube fabric layer 1706 may be determined by building test devices, such as NV CNT resistive block switch 1400 illustrated in FIG. 14, and then electrically testing such devices as illustrated by graph 1500 in FIG. 15. CNT orientations with respect to end contacts may depend on the intended applications. For NV CNT resistive block switches, such as NV CNT resistive block switch 1314-1, for example, used in column cross point cell 1300 (FIG. 13A), achieving NV high resistance states for both high and low resistance values, with a high resistance state-to-low resistance state ratio greater than 2:1 is needed, as described further above with respect to FIGS. 3A and 3B. At this point in the process, structure 1705 illustrated in FIG. 17B is complete.

Figure 17C:
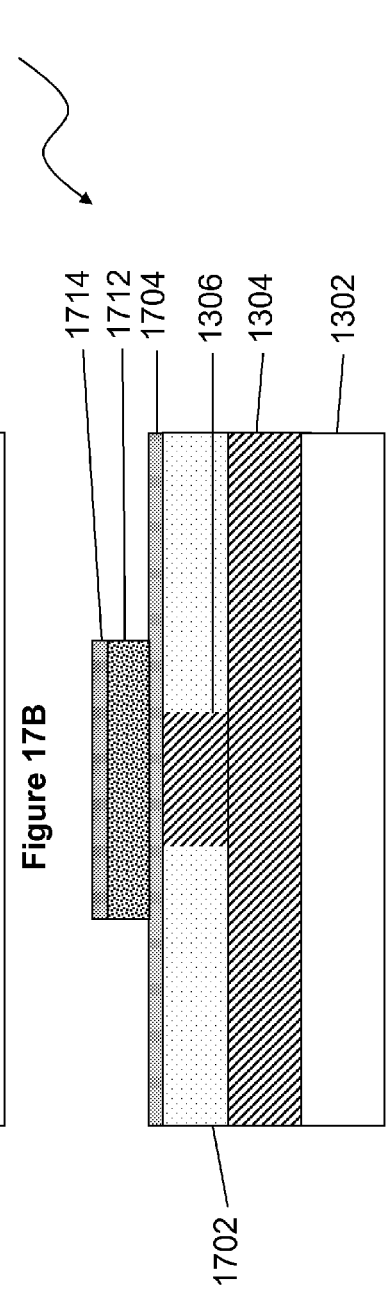

Then, with developed lithographic images formed on the surface of insulator 1708, methods 1620 etch insulator layer 1708 using industry standard methods and etch underlying nanotube fabric layer 1706 using an oxygen plasma, for example, resulting in protective insulator 1714 and nanotube fabric 1712 illustrated by structure 1710 shown in FIG. 17C. At this point in the process, structure 1710 illustrated in FIG. 17C is complete.

Next, methods 1630 deposit a conductive layer on the surfaces of insulator 1704, protective insulator 1714, and the approximately vertical sidewalls of nanotube fabric 1712. This conductive layer may be formed using conductors, semiconductors, and various allotropes of carbon, and other materials as described further above with respect to the conductive layer deposited on the surface of substrate 1302 illustrated in FIG. 17A.

Next, methods 1630 planarize the conductive layer (e.g. CMP) leaving the top surface of protective insulator 1714 exposed using known industry methods. Then, methods 1630 form a resist layer on the surface of the planarized conductive layer using known industry methods. Then, methods 1630 etch the planarized conductive layer forming a first word line level including word lines 1312-1 and 1312-2 with end contacts 1711 and 1713, respectively, to nanotube fabric 1712 as illustrated in FIG. 17D. At this point in the process, structure 1715 illustrated in FIG. 17D is complete.

Next, methods 1630 deposit and planarize an insulator layer using known industry methods. This insulator layer may be formed of $SiO_2$ for example. However, the insulator layer may also be formed using $SiN_2$, $Al_2O_3$, TEOS, polyimide, $HfO_2$, $TaO_5$, combinations of these insulator materials, and other insulator materials. At this point in the process, structure 1720 illustrated in FIG. 17E is complete.

Figure 17F:
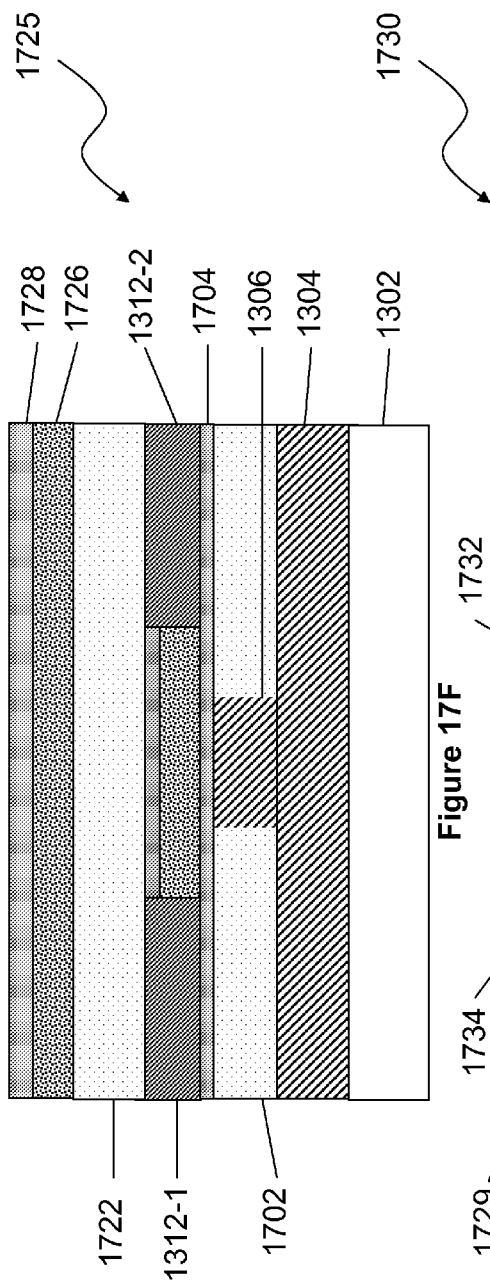

Next, methods 1640 form insulator layer 1728 and nanotube fabric layer 1726 illustrated in structure 1725 illustrated in FIG. 17F, corresponding to dielectric layer 1708 and nanotube fabric layer 1706, respectively in FIG. 17B. Methods 1640 correspond to methods 1620 described further above. At this point in the process, structure 1725 illustrated in FIG. 17F is complete.

Figure 17G:
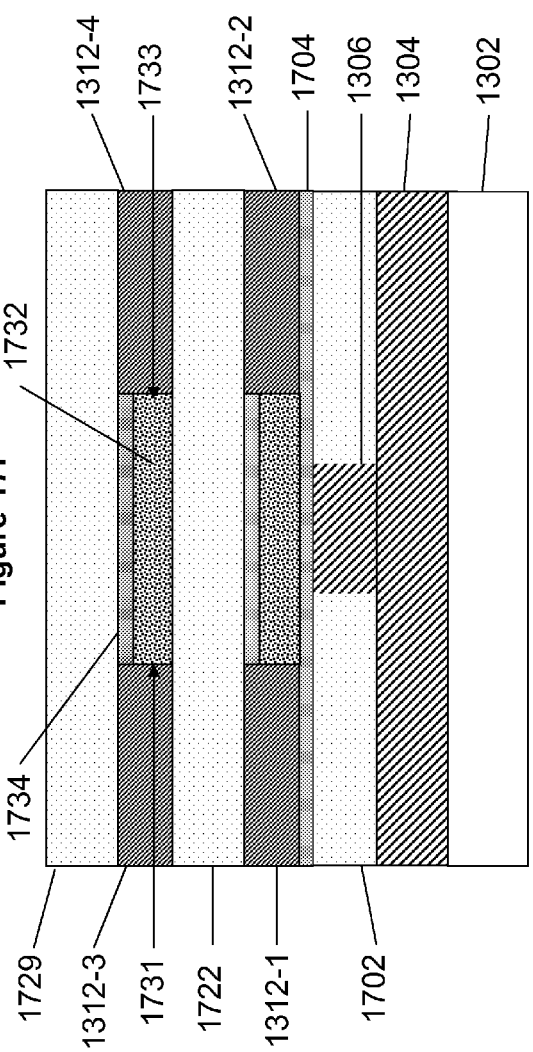

Next, methods 1650 form a second word line level with protective insulator 1734 and word lines 1312-3 and 1312-4 with end contacts 1731 and 1733, respectively, to nanotube fabric 1732 as illustrated in FIG. 17G. Word lines 1312-3 and 1312-4 correspond to word lines 1312-1 and 1312-2 illustrated in FIG. 17D; end contacts 1731 and 1733 correspond to end contacts 1711 and 1713, respectively illustrated in FIG. 17D; nanotube fabric 1732 corresponds to nanotube fabric 1712 illustrated in FIG. 17D; and protective insulator 1734 corresponds to protective insulator 1714 illustrated in FIG. 17D.

Then, methods 1650 form insulator layer 1729, corresponding to insulator layer 1722 illustrated in FIG. 17E. Methods 1650 correspond to methods 1630 described further above. At this point in the process, structure 1730 illustrated in FIG. 17G is complete.

Figure 17H:
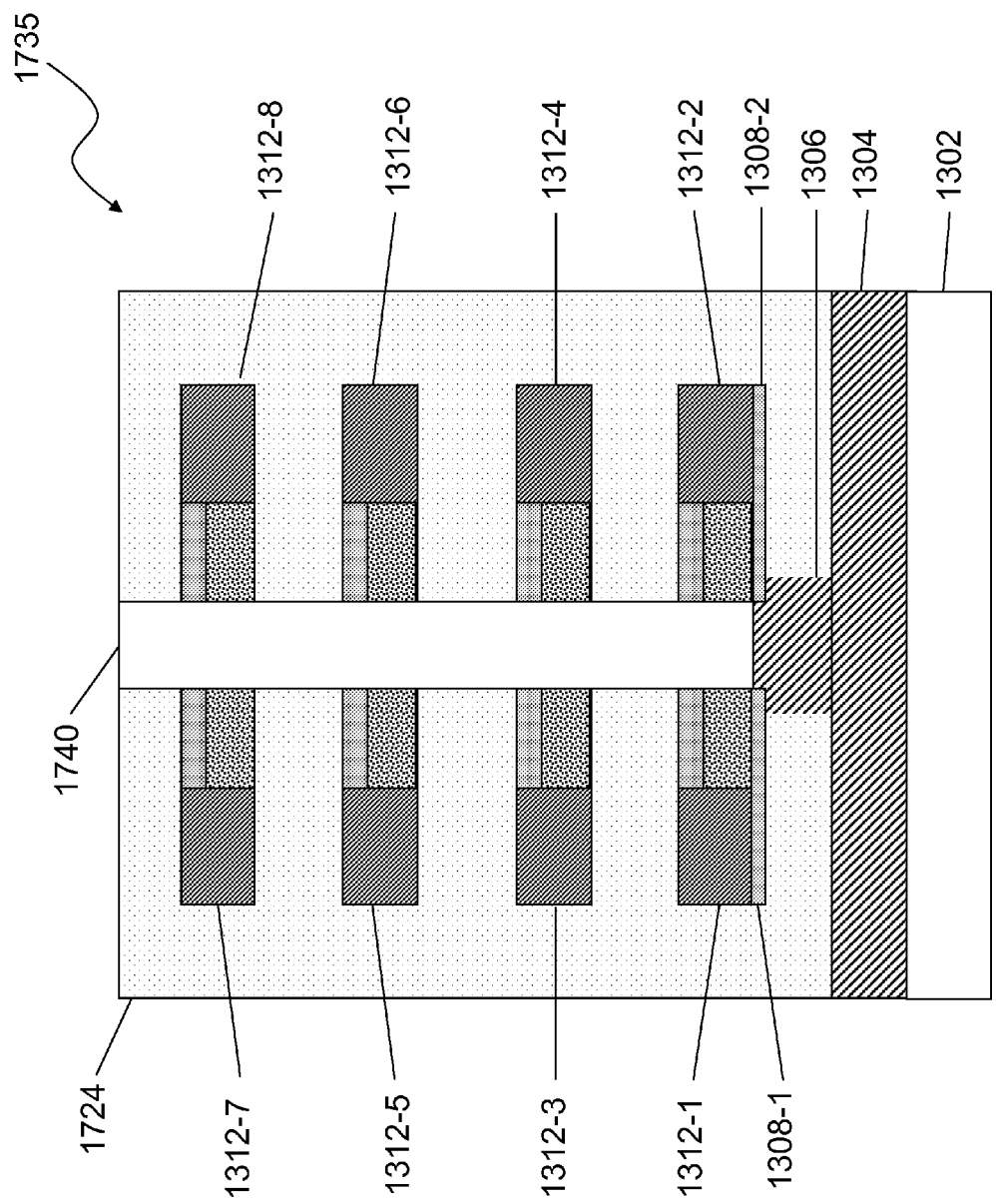

Next, methods 1660 form additional N−2 word line levels beginning on the top surface of insulator 1729 illustrated by structure 1730 in FIG. 17G by repeating methods 1640 and 1650 N−2 times. In this example, there are four word line levels corresponding to N=4. Structure 1735 illustrated in FIG. 17H shows four word line levels with insulator 1724.

Next, methods 1670 form resist images on the top surface of insulator 1724 with a hole in the resist image centered approximately mid-way between the inner edges of the underlying word lines. Then, methods 1670 etch through insulator, protective insulator, nanotube fabric layers, and insulator 1704 to the top surface of via hole contact 1306 using industry processes to form via hole 1740 illustrated by structure 1735 shown in FIG. 17H. For nanotube fabrics, an oxygen plasma etch may be used. After etching, insulator 1704 is cut into two parts, insulators 1308-1 and 1308-2. At this point in the process, structure 1735 illustrated in FIG. 17H is complete.

Figure 17I:
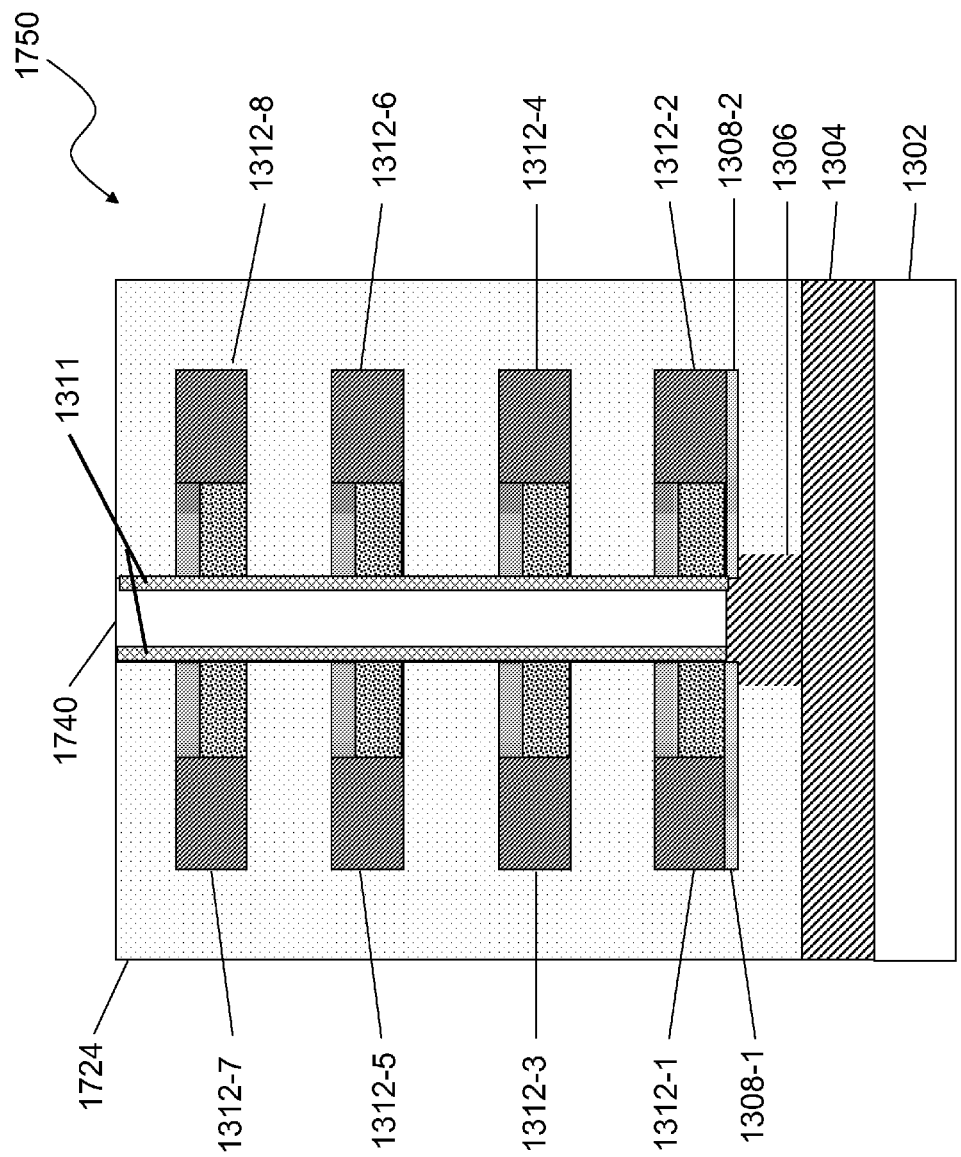

Optionally, at this point in the process flow, methods 1680 may deposit diode-forming liner 1311 on the sidewalls of via hole 1740 using known industry methods, ALD deposition for example. Diode forming liner 1311 may be semiconducting, metallic, conductive oxide or nitride, carbon, and other material. Diode-forming liner 1311 may be formed with a single layer or two or more layers of various materials. At this point in the process, structure 1750 illustrated in FIG. 17I is complete.

Next, methods 1680 deposit a conductive layer on top surface of insulator 1724 filling via hole 1740. Alternatively, methods 1680 may deposit a conformal layer on the walls of via hole 1740 for purposes of forming a preferred contact with switch nanotube blocks. Preferred contacts may be used to enhance NV CNT resistive block switch performance by forming linear contacts or non-linear contacts such as Schottky diodes for example. Then, methods 1680 deposit a conductive layer on the top surface of the conformal layer filling the via hole 1740.

Next, the top surface is planarized to the top surface of insulator 1724. At this point in the process, bit line segment 1310 in column cross point cell 1300 illustrated and described further above with respect to FIGS. 13A and 13B is complete for column cross point cells with array wire 1304 below the array structure.

However, for column cross point cells with array wire 1352 above the array structure, optional steps in methods 1610 are omitted. Then methods 1680 deposit and pattern a conductive layer in contact with the exposed top surface of bit line segments 1313 forming array lines 1352. Array lines 1352 contact bit line segments 1313 at contacts 1354 as shown in FIGS. 13C-13E. Array wire 1352 may, but need not, contact the top surface of diode-forming liner 1311. Also, while FIGS. 14A and 14B show array wires 1304 below the array and FIGS. 14C-14E show array wires 1352 above the array, each of the figures may be formed with array wires below the array or above the array.

Variations to methods of fabrication 1600 such as the addition or omission of steps and varying the order of steps are still within the scope described above with respect to FIGS. 16 and 17 and may be used to form diodes in series with switch nanotube blocks. For example, referring to FIG. 13A, a diode may be formed in contact with word line 1312-2 and switch nanotube block 1316-2 at end contact location 1320-2, with a near-Ohmic contact at end contact 1322-2 between switch nanotube block 1316-2 and bit line segment 1310. Alternatively, a diode may be formed in diode liner 1311 in contact with bit line segment 1310 and switch nanotube block 1316-2 at end contact location 1322-2, with a near-Ohmic contact at end contact 1320-2 between switch nanotube block 1316-2 and word line 1312-2 as illustrated in FIG. 13B. Combinations of diode and near-ohmic contact described further above may be formed for all bit locations in column cross point cell 1300.

Size and Performance of Cross Point Memory Arrays

Figure 18:
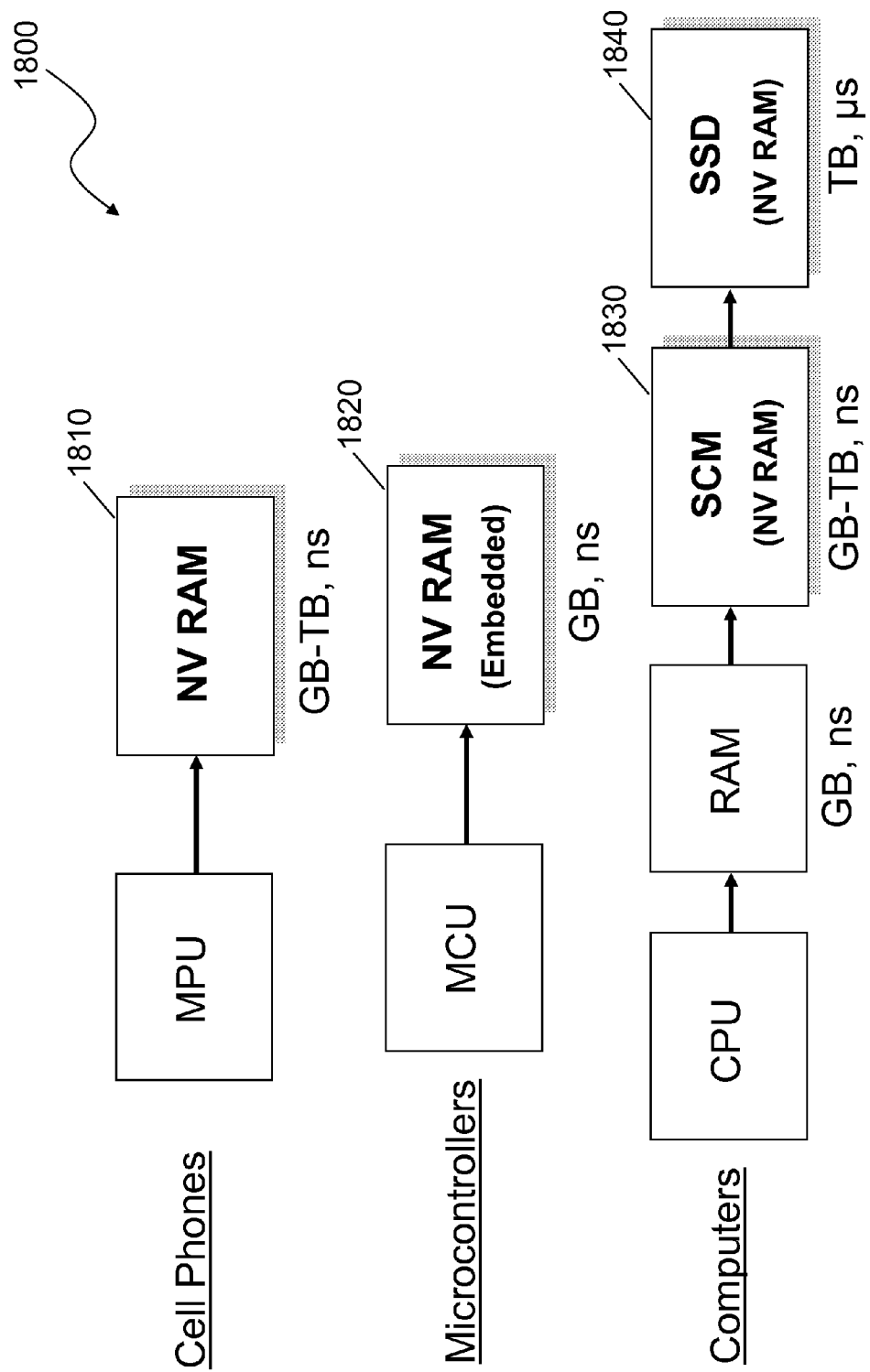
FIG. 18 illustrates expected nonvolatile random access memory capacity and nanosecond speed requirements for the 15 nm and sub-15 nm technology nodes.

There are two memory tracks: volatile memory (mostly DRAM at nanosecond speed) and nonvolatile memory (mostly NAND Flash at microsecond speed). However, there is a strong desire by memory users for memory functions that are: nonvolatile (NV), fast (nanosecond), low power, with high endurance, and low cost for applications as diverse as cell phones and high speed computers as shown by chart 1800 as illustrated in FIG. 18. Chart 1800 shows various examples of nonvolatile random access memories (NV RAMs) for use in various applications. In these various examples, the nonvolatile memories may have different architectures for the different applications. However, all are formed using CNT-based, or graphitic-based, or buckyball-based, or combinations thereof, cross point memory arrays and may use nonvolatile cross point cells illustrated further above in FIGS. 1, 4, 5, 6, 7, 8, 9, 10, 11, and 13.

NV RAM 1810 refers to Gigabyte-to-Terabyte nonvolatile memory functions formed with Gigabit (Gb)-to-Terabit (Tb) NV NRAM chips with nanosecond (ns) performance. NV RAM 1820 is an example of an embedded Gigabit, nanosecond, and nonvolatile memory with logic circuits on the same chip to form a microcontroller function. IBM and other industry leaders have identified a new memory category (architecture) referred to as Storage Class Memory (SCM) also with an objective of nonvolatile operation, gigabyte-to-terabyte size, with nanosecond performance, high endurance, and low cost as illustrated by SCM memory 1830. SCM memory 1830 is formed with Gb—Tb chips of NV RAM-based nanosecond memory as are NV RAMs 1810 and 1820. However, SCM memory 1830 is architected as part of a memory hierarchy that interfaces between a smaller volatile RAM operating at nanosecond speed and a larger solid state drive (SSD) 1840 operating at microsecond speed. And also, there is a need to increase nonvolatile solid state drive (SSD) 1840 capacity to Terabyte size at microsecond performance. The memory size and performance requirements determines the underlying cross point cell configurations used to meet the requirements of NV RAMs 1810 and 1820 and those of SCM memory 1830 and SSD 1840 as described further below. Numerous other applications are possible (not shown).

Very low contamination and particulate levels achieved in CNT fabrics have enabled Nantero, Inc. to develop reproducible NV CNT switches as nonvolatile resistive storage devices (FIG. 1A) in functioning 4 Mb NRAM chips, with underlying CMOS circuits, that have been tested for functionality and performance as summarized in table 1900 illustrated in FIG. 19 further below. 4 Mb NRAM arrays are formed by interconnecting nonvolatile cells, such as resistive memory cell 100 illustrated in FIG. 1A. Discrete NV CNT switch test sites have led to an understanding of the inherently fast CNT fabric switching behavior as described further below with respect to FIG. 20. 4 Mb NRAM chips have been made in various fabricators operating at technology nodes in the 45 to 250 nm range.

Figure 19:
FIG. 19 illustrates measured 4 Mb NRAM memory chip electrical performance characteristics.

The electrical characteristics shown in table 1900, illustrated in FIG. 19, are from 4 Mb NRAM chips with arrays formed with resistive memory cell 100 (FIG. 1A) and sorted for high performance operation. Operating speeds of 20 ns for SET (program) and RESET (erase) write operations are exceptionally fast for nonvolatile devices. SET, RESET, and READ operating speeds are primarily determined by the resistance of the NV CNT switch and array capacitances. The switching mechanisms themselves within the CNT device are much faster, picoseconds for example. The emphasis has also been on wide and robust operating margins, with high temperature operation and data retention, and high endurance as illustrated in table 1900. These NV CNT switches are operated so that high resistance and low resistance states are separated by at least 100×, and often up to 1,000×, corresponding to READ currents at 1 Volt having SET/RESET ratios of 10 µA/0.1 µA and 10 µA/0.01 µA, respectively. A 10 µA current at 1 V corresponds to a low resistance SET state of 100 kΩ, and currents in the 0.01-0.1 µA range at 1 V correspond to high resistance RESET states in the 10-100 MΩ range. NV CNT resistive block switch 104 (FIG. 1A) may be operated in bidirectional and/or unidirectional mode. The wide separation between high and low nonvolatile resistance states stored in NV CNT resistive block switch 104 (FIG. 1A) enables a large resistance (current) exclusion (buffer) zone for achieving the operational integrity needed for high volume production. The 100-1000× high-to-low resistance ratio enables storage of multiple (two or more) resistance state for multi-bit storage in each NV CNT resistive block switch 104. For example, two resistive states store 1 bit of data, four resistive states store 2 bits of data, and so-on, as described in U.S. Pat. No. 8,102,018.

Figure 20:
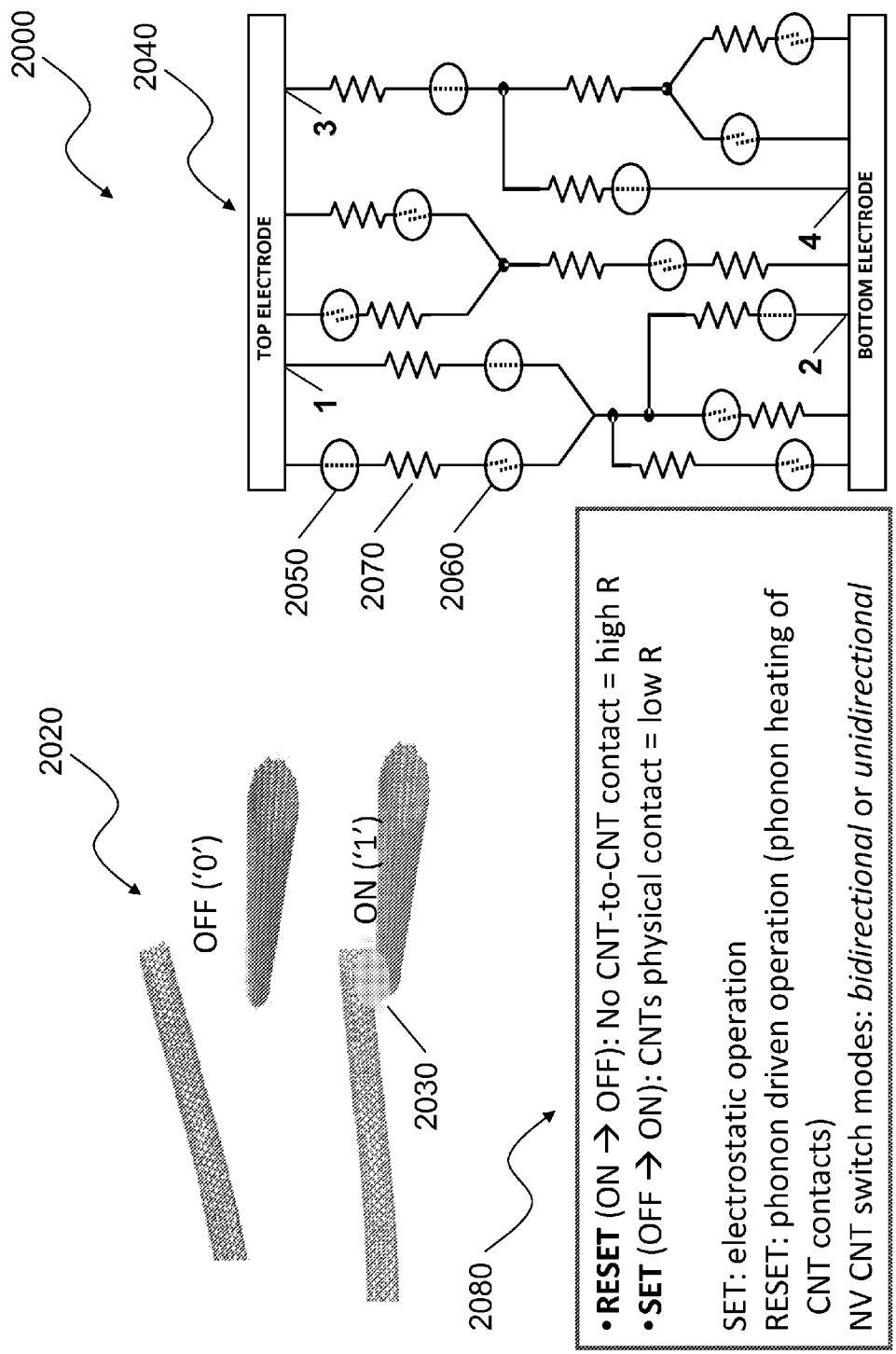
FIG. 20 illustrates a schematic representation of CNT switch characteristic illustrating the inherently high speed switching of carbon nanotube fabrics.

CNT fabric switching is inherently high speed as explained with respect to CNT switch characteristics 2000 illustrated in FIG. 20, which is an electrical representation of NV CNT resistive block switch 104 illustrated in FIG. 1A, which includes switch nanotube block 108 in contact with a bottom electrode, first conductive terminal 106, and a top electrode, second conductive terminal 110. Switch nanotube block 108 is formed using one, or several, patterned CNT fabric layers between top and bottom electrodes. Measurements of millions of these switches show that nonvolatile resistance state values depend on applied voltages and currents and are a function of the number and state of a combination of multiple series and parallel nanoscopic switches formed by pairs of CNTs in the porous CNT fabric. CNT pairs 2020 form individual nanoscopic switches that may be in electrical contact in contact region 2030 representing a SET (ON) or "1" state, and shown schematically in schematic 2040, or may be separated representing a RESET (OFF) or "0" state and also shown schematically in schematic 2040. Schematic 2040 includes: multiple closed nanoscopic switches 2050, open nanoscopic switches 2060, and resistors 2070 in series and parallel combinations. In this example, there are two electrical paths formed between top and bottom electrodes. A first electrical path is between nodes 1 and 2, and a second electrical path is between nodes 3 and 4. Physical CNT pair 2020 separation in an OFF state may be in the range of 1-2 nm, so the inertia associated with nanoscopic switching of CNT pairs between ON and OFF states is very small enabling nanoscopic contact closing and opening at picosecond speeds. Table 2080 summarizes SET and RESET write modes, resulting low and high resistance states, respectively, and corresponding electrostatic and phonon-driven switching, respectively. The NV CNT resistive block switch 104 capacitance is very low, typically in the atto-Farad (aF) range ($10^{-18}$ F), because of the porosity of the CNT fabric and the separation of the top and bottom electrodes. NV CNT switches may be operated in combinations of bidirectional and unidirectional operating modes. While electrical characteristics and switching speeds have been described further above with respect to NV CNT resistive block switches 104 and 142 illustrated in FIGS. 1A and 1C, respectively, it is reasonable to expect similar electrical characteristics and switching speeds from resistive block switches formed with other allotropes of carbon such NV graphitic resistive block switches 162 and NV buckyball resistive block switches 182 illustrated in FIGS. 1D and 1E, respectively.

NV RAM cells that include a MOSFET select device, such as resistive memory cell 100 illustrated in FIG. 1A, cannot be scaled to sufficiently small dimensions to meet computing needs described with respect to chart 1800 illustrated in FIG. 18. What is needed for these applications are much smaller nonvolatile cells retaining the inherent nonvolatile high speed electrical switching characteristics of CNT fabrics described with respect to FIG. 20 and demonstrated with respect to 4 Mb NRAM chips as described further above with respect to FIG. 19. What is needed are new CNT fabric-based devices that perform both select and storage functions for use in 1-R resistive cross point cells for the 15 nm technology node in the examples described further below, but scalable to sub-10 nm dimensions. 1-R cross point cells are compatible with 100 Gbit-to-Terabit size memory chips. Such large memory functions formed with 1-R cross point switches require minimizing or eliminating the cross point array parasitic currents and data disturb limitations described further above with respect to FIG. 2A. Nanosecond speed requirements make 1-R cross point cell operation even more difficult as described further below with respect to nanoscale material and structural innovations for nanosecond performance, terabit scale memory chips.

At this point in the present disclosure, by way of example, an estimate is made of the physical size of a cross point array-based memory of 1 terabit using NV CNT resistive block switches similar to those used to form cells in cross point array 120 shown in FIG. 1B. Such NV CNT resistive block switches may be formed with switch nanotube blocks similar to switch nanotube block 372 illustrated in FIG. 3D, for example, with dimensions F=15 nm corresponding to a 15 nm technology node. Cross point arrays have a periodicity of 2F so the cell area is $4F^2$ as illustrated in FIG. 1B. For F=15 nm, cross point array cell is 30 nm by 30 nm, with an area=900 $nm^2$.

In this example, the 1 terabit ($10^{12}$ bits) memory is formed with 10,000 cross point sub-arrays, each cross point sub-array having 100 megabits ($10^8$ bits). Cross point array requirements 320 are illustrated in FIG. 3B. Curve 325, a linear log-log plot illustrated in FIG. 3B, shows the corresponding relationship between the minimum required value of $R_{ON}$ as a function of the maximum number of cells in a cross point array. Curve 325 may be used to estimate the minimum $R_{ON}$ resistance required for a $10^8$ cell cross point array as follows. Based on I-V curve 300 illustrated in FIG. 3A the minimum measured $R_{ON}$ value for NV CNT resistive block switch 104 (FIG. 1A) is $R_{ON}=10^6 \Omega$; that is $R_{ON}=1$ MΩ. From curve 325 illustrated in FIG. 3B, a minimum $R_{ON}$ value of 1 MΩ (point 330) corresponds to a maximum number of cells in cross point arrays using NV CNT resistive block switches 104 (FIG. 1A) of $4 \times 10^5$ (point 340). For a cross point array of $10^8$ bits, a NV CNT resistive block switch of higher resistance is required to increase the maximum number of cells in a cross point array by 250 times, from $4 \times 10^5$ cells (point 340) to a sub-array size of $10^8$ cells. From a section of linear log-log curve 325, an estimated increase in the number of cells by 100 times (100×), from $10^3$ to $10^5$ cells, corresponds to an increase in the required $R_{ON}$ by approximately 40×, from corresponding $R_{ON}$ values of $10^4$ to $4 \times 10^5 \Omega$. Scaling for an increase in the number of cells by 250×, from $4 \times 10^5$ cells (point 340) to $10^8$ cells, the resistance value needs to increase by an additional 2.5× more than the 40×$R_{ON}$ resistance increase corresponding to a 100× increase in the number of cells. That is, an increase in the number of cross point sub-array cells by 250× to $10^8$ cells requires an $R_{ON}$ resistance increase of 100×. Since a cross point array of $4 \times 10^5$ bits (point 340) corresponds to an $R_{ON}$ resistance of 1 MΩ (point 330), then the $R_{ON}$ resistance for a sub-array of $10^8$ bits is 100×1 MΩ or a minimum $R_{ON}$ value of 100 MΩ.

Figure 21:
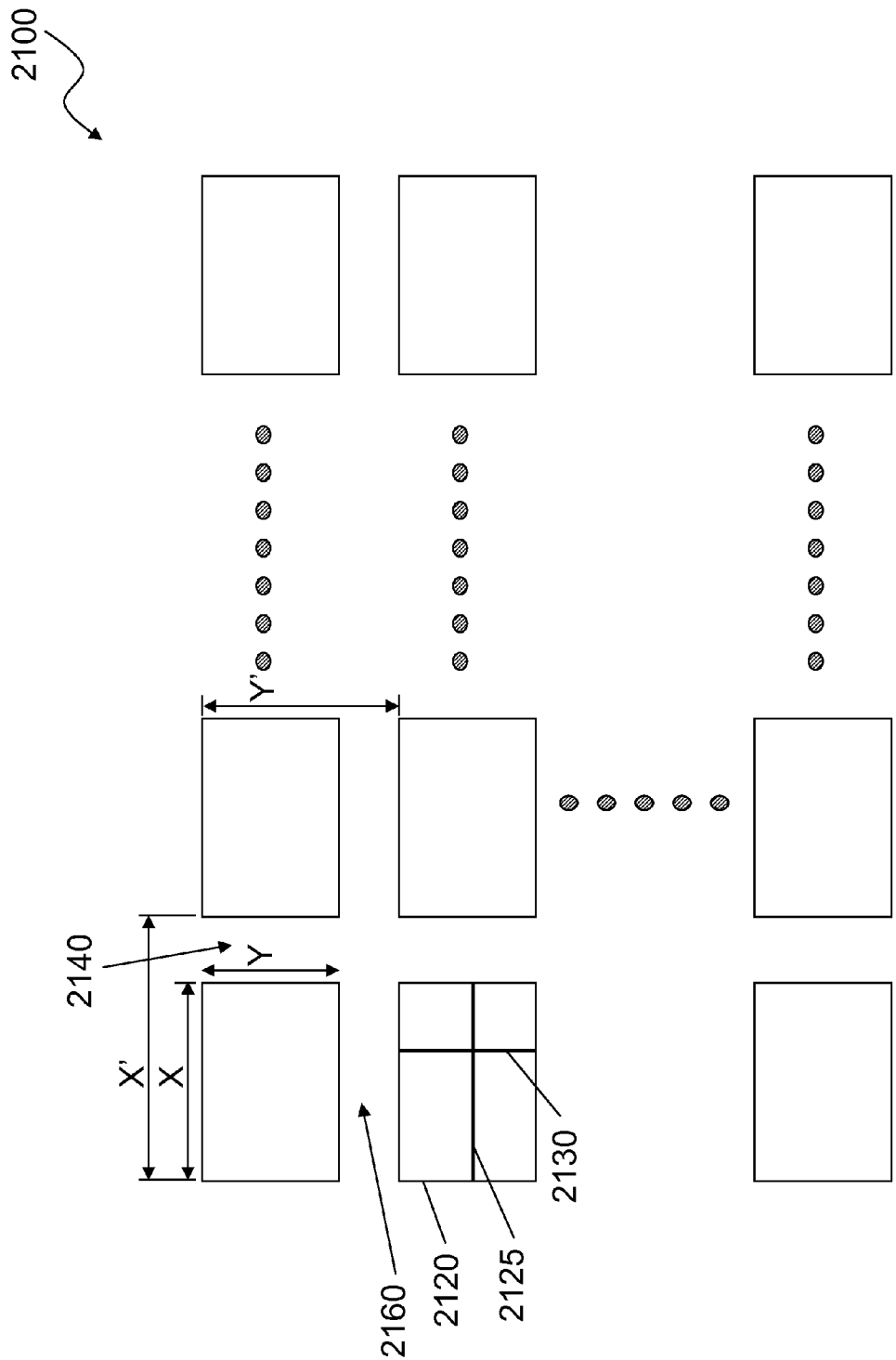
FIG. 21 illustrates a block diagram representation of a cross point memory array and corresponding sub-arrays.

FIG. 21 illustrates a schematic representation of a cross point memory array 2100 formed with multiple cross point sub-arrays 2120. In this example, cross point memory array 2100 is configured as a 1 terabit (1 Tb) cross point memory array with 10,000 cross point sub-arrays 2120, each sub-array corresponding to cross point array 120 illustrated in FIG. 1B, and each sub-array having 100 megabits (100 Mb). In this example, cross point sub-arrays 2120 may be formed with 10,000 bits along the X-direction array wire 2125 and 10,000 bits in the Y-direction along array wire 2130, in an approximately square configuration. However, cross point sub-array 2120 may also be formed in other 100 Mb configurations, rectangular for example, with an unequal number of cells on array wires 2125 and 2530. By way of example, 20,000 cells along array wire 2125 and 5,000 cells along array wire 2130. Cross point sub-arrays 2120 may be laid out in equal number in horizontal and vertical directions to form a square 1 Tb cross point memory array 2100. Alternatively, 1 Tb cross point memory array 2100 may be implemented in other memory array configurations, such as with rectangular array configurations for example.

In this example, each cross point sub-array 2120 cell has a horizontal cell pitch of 2F=30 nm. Therefore, cross point sub-array 2120 has a horizontal physical dimension X=300 μm formed by 10,000 cells of periodicity 2F=30 nm. Cross point sub-array 2120 has a vertical physical dimension Y=300 μm formed by 10,000 cells of periodicity 2F=30 nm. Spacing 2140 between horizontally placed cross point sub-arrays 2120 and spacing 2160 between vertically placed cross point sub-arrays 2120 are for sub-array interconnections with underlying memory circuits (not shown). In this example, assuming spacing 2140 is 15% of the sub-array 2120 horizontal X-dimension (45 nm), and spacing 2160 is 15% of the sub-array 2160 vertical Y-dimension (45 nm), then cross point sub-array 2120 plus spacing will have a periodicity of X'=345 um and Y'=345 um in both horizontal and vertical directions. In this example, there are 100 cross point sub-arrays 2120 in each of the horizontal and vertical directions. The resulting cross point memory array 2100 dimensions may be calculated as 100×345 um, approximately 35 mm in both horizontal vertical directions. In this example, it is assumed that all memory circuits may be placed and wired in regions below (and/or above) cross point memory array 2100, including interconnections with cross point sub-arrays 2120. In this example, the combined areas of cross point memory array 2120 and input/output circuits (I/O circuits) and interconnect terminals may be contained within chip dimensions of no more than 50 mm×50 mm. For embedded memories, chip dimensions would be even smaller.

With respect to FIG. 21, if minimum dimensions are scaled from F=15 nm to F=10 nm, then cell periodicity in sub-arrays 2120 are 20 nm. Assuming 10,000 cells in the X and Y directions, then sub-array 2120 is square with dimensions of 200 nm. Allowing for sub-array-to-sub-array spacing 2140 of 15% of the sub-array dimensions, then sub-array-to-sub-array periodicity X' and Y' are 230 nm in both X and Y directions. For 100 sub-arrays in both the X and Y directions, then corresponding memory array size is 23×23 mm. As described further above with respect to FIG. 21, for a memory array formed with 100 sub-arrays in both X and Y directions with F=15 nm, the memory array dimensions are 34.5×34.5 mm. Scaling from F=15 to F=10 nm results in a memory array size reduction of 2.5 times.

At this point in the present disclosure, an estimate may be made of the approximate maximum memory operating speed, that is, in the nanosecond or the microsecond range, for the 1 Tb cross point memory array 2100 described further above with respect to FIG. 21. This estimated memory speed may be compared with chart 1800 (FIG. 18) to determine which memory applications are compatible with the maximum estimated operating speed when using sub-arrays formed with 1-R cells for example.

Figure 22:
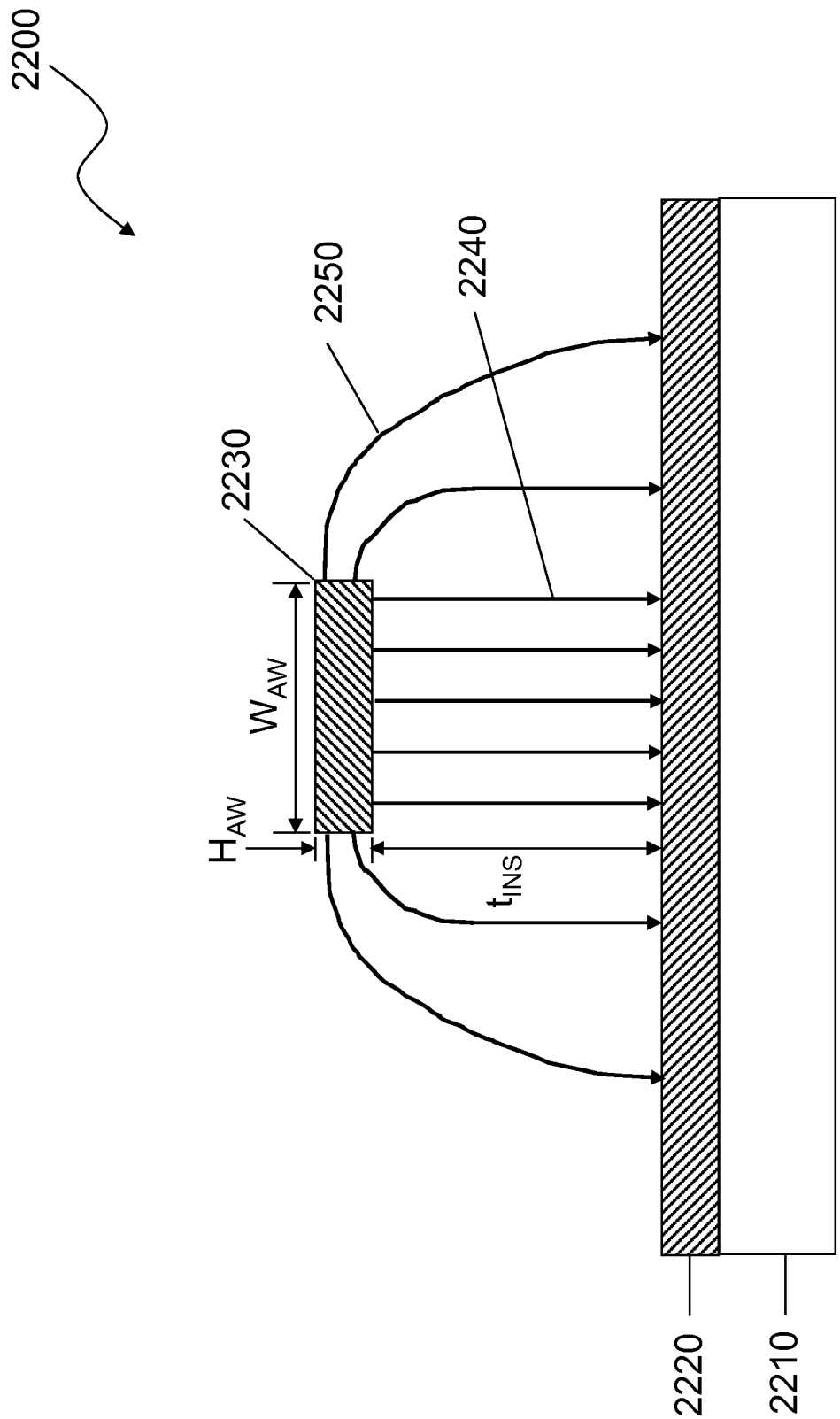
FIG. 22 illustrates a cross sectional representation of array wires in the sub-arrays of FIG. 21.

FIG. 22 illustrates an approximation of a structure for calculating the array line capacitance of a cross point memory array with 1-R nonvolatile cells, for example, arrays similar in cross section to cross point array 120 (FIG. 1B). Referring to FIG. 22, array wire 2220 on substrate 2210 corresponds to array wire 122 (FIG. 1B-3). Array wire 2230 corresponds to array wire 126 in direct contact with porous switch nanotube block 136 by eliminating second electrical contact 138. Electric non-fringing field lines 2240 and fringing electrical field lines 2250 contribute to the array wire 2230 capacitance with respect to an underlying orthogonal grid of array wires (FIG. 1B-1), one of which is array wire 2220. The direction of the electric field is shown as if array wire 2230 is at a positive voltage with respect to array wire 2220. However, the voltage polarity may be reversed. As described further above with respect to sub-arrays 2120 (FIG. 21), the array wire 2230 width $W_{AW}$=15 nm, the length is 300 um, the insulator thickness $t_{INS}$=20 nm, and the array wire thickness $H_{AW}$=200 nm. For such a structure, fringe electrical fields significantly increase the capacitance of array wires beyond the non-fringing field capacitance by approximately 5 times as estimated using equation 1 further below. For relatively high fringing fields, underlying orthogonal wire grids can be approximated by a continuous plane.

The capacitance of individual NV CNT resistive block switches, such as NV CNT resistive block switch 104 illustrated in FIG. 1A, was measured on a test site. NV CNT resistive block switch dimensions on the test site were 250 nm×250 nm with a switch nanotube block, such as switch nanotube block 108, having a thickness of 50 nm and a porosity of approximately 90%. The capacitance was so small that it could only be determined to be substantially less than 1 fF. For a parallel-plate capacitor with plate dimensions of 15 nm×15 nm, a plate-to-plate capacitance separation of 20 nm, and top and bottom electrode thicknesses of 200 nm, and even assuming a dielectric with a relative constant as high as $\epsilon_R$=16 and a fringing field multiplier of 5 times, the parallel plate capacitance is less than $10\times10^{-18}$ F; that is, a capacitance of <10 aF. A porous switch nanotube block may increase the capacitance because of CNT-to-CNT capacitance and CNT-to-electrode capacitance. However, with $\epsilon_R$=1 between the CNTs in the CNT fabric and the CNT-to-electrodes, the effect is likely to be small as indicated by test site results.

The array wire delay is estimated as described further below. In this example, array wires 2125 and 2130 (FIG. 21) are assumed to have the same length of 300 μm as described further above. Cross section 2200 is an approximation of a cross section through array wire 2125 or 2130, in which array wire cross section 2230 corresponds to an array wire 2125 or 2130 cross section. Array wire 2220 is one of multiple parallel array wires that are orthogonal to array wire 2230, and which are approximated by a conductive plane as described further above with respect to FIG. 22.

Equation 1 may be used to calculate array wire capacitance per unit length $C_{AW}/l$, including fringing fields, as described in the reference H. B. Bakoglu, "Circuits, Interconnections and Packaging for VLSI", Addison-Wesley Publishing Company, 1990, pages 137-139.

$$C_{AW}/l = \epsilon_0 \epsilon_R \{W_{AW}/t_{INS} - H_{AW}/2t_{INS} + 2\pi/(\ln\,[1+(2t_{INS}/H_{AW})\cdot(1+(1+H_{AW}/t_{INS})^{0.5})])\} \quad [\text{EQ 1}]$$

where:

$\epsilon_0$=8.854×10$^{-12}$ F/m;
$\epsilon_R$=4;
$W_{AW}$=15 nm;
$H_{AW}$=200 nm; and
$t_{INS}$=20 nm Substituting in equation 1:

$$C_{AW}/l = 8.854\times10^{-12}\times4\{15/20-200/40+2\pi/(\ln\,[1+(40/200)\cdot(1+(1+200/20)^{0.5})])\}$$

results in an array wire capacitance per unit length of:

$$C_{AW}/l = 207\times10^{-12}\text{ F/m} \quad [\text{EQ 2}]$$

as shown in equation 2. For an array wire of length l=300 um, $$C_{AW} = 207\times10^{-12}\text{ F/m}\times300\times10^{-6}\text{ m/um}$$

Array wire capacitance $C_{AW}$ for 300 um array lines, such as array lines 2125 or 2130 illustrated in FIG. 21, has an estimated capacitance value of:

$$C_{AW}=62\times10^{-15}\text{ F; or }C_{AW}=62\text{ fF} \quad [\text{EQ 3}]$$

As described further above with respect to FIG. 3B, the minimum on resistance $R_{ON}$=100 MΩ for a NV CNT resistive block switch in a 100 Mb sub-array, such as sub-array 2120 (FIG. 21). The maximum performance range (microsecond or nanosecond) may be estimated using an RC delay time constant in which the resistive state of a NV CNT resistive block switch with $R_{ON}$=100 M, connected to an array line such as array line 2125 or 2130, is read-out. Multiplying the $R_{ON}$ value and the array wire capacitance $C_{AW}$ results in an RC time constant of:

$$R_{ON}C_{AW}=100\times10^6\times62\times10^{-15}=6.2\text{ us} \quad [\text{EQ 4}]$$

6.2 microseconds (equation 4). The rise (and fall time) of waveforms on array wires may be approximated as 2.2 $R_{ON}C_{AW}$ as described in the reference: H. B. Bakoglu "Circuits, Interconnections and Packaging for VLSI", Addison-Wesley Publishing Company, 1990, pages 239-241. In this example, the rise time $t_R$ may be estimated as shown in equation 5.

$$t_R=2.2\,R_{ON}C_{AW};\ t_R=2.2\times6.2;\ t_R=13.6\text{ us} \quad [\text{EQ 5}]$$

The equation 5 rise time $t_R$ estimate indicates that a 1 Terabit nonvolatile memory, such as described further above with respect to FIG. 21, and formed with 10,000 100-megabit sub-arrays of interconnected 1-R cells with NV CNT resistive block switches of a minimum resistance $R_{ON}$=100 MΩ, operates in the microsecond performance range. The Array wire $C_{AW}$ capacitance of 62 fF (equation 3) is a relatively low array line capacitance value. However, the NV CNT resistive block switch minimum resistance $R_{ON}$=100 MΩ is relatively high in order to enable a sub-array size of 100 megabits as described further above with respect to FIG. 3B, which results in a maximum estimated memory performance (speed of operation) in the microsecond range, limited by the multiple sub-array 2120 performance used in cross point memory array 2100 (FIG. 21) and as calculated further above based on equations 1-5.

A 1 terabit nonvolatile memory chip in the microsecond range has many applications. Such chips may be used to form a solid state drive (SSD) 1840 shown in chart 1800 illustrated in FIG. 18. Microsecond operation may also be used in many microcontroller applications, but not in microcontroller applications requiring nanosecond performance such as NRAM 1820. And there are other applications for microsecond performance nonvolatile memory chips not shown in chart 1800.

As illustrated further above with respect to equations 1-5, for nanosecond operation, the minimum resistance $R_{ON}$ must be substantially reduced below 100 MΩ since the array wire capacitance is already relatively low. NRAMs formed with memory arrays using 1-T, 1-R resistive memory cells 100 with a MOSFET select devices enable NV CNT resistive block switches 104 (FIG. 1A) with ON resistance values of 100 kΩ as described further above with respect to FIG. 19, and have 1000 times smaller low resistance state values than the 1-R cells described further above but are not sufficiently scalable. However, 100 kΩ minimum values would limit 1-R cells to approximately 100 bits per sub-array based on cross point array requirements 320 and curve 325 shown in FIG. 3B, and therefore compatible only with small memory sizes of perhaps a few thousand bits.

Achieving nanosecond performance terabit nonvolatile memory chips requires sub-arrays of 100 Mb or larger with ON resistance values of 100 kΩ, while eliminating or minimizing current sneak paths 235 illustrated in FIG. 2A, and compatible with $4F^2$ cell dimensions of 30 nm×30 nm at the 15 nm technology node. What is needed is the addition of a relatively high selectivity in NV CNT resistive block switches (RS switches) to achieve high selectivity 1-RS cells, with the same footprint as 1-R cells. However, the switch nanotube block thickness cannot increase significantly above approximately 20 nm at the 15 nm technology node as discussed above with respect to FIG. 22 for reasons of image resolution, and also so as not to increase array wire fringing electric fields 2250 (FIG. 22) that may couple to adjacent array lines.

NV CNT resistive block switches 104 (FIG. 1A) described further above in FIG. 19 were fabricated with mostly MWCNTs. However, NV CNT resistive block switches 104 have recently been fabricated with CNT fabrics formed with metallic and semiconducting SWCNTs having approximately the same electrical characteristics as described in FIG. 19. The smaller diameter of SWCNTs compared with MWCNTs results in a lower switch CNT block thickness and may be used to facilitate increasing the selectivity of NV CNT resistive block switches without increasing the overall thickness.

Dense high selectivity 1-RS cells require that a high selectivity diode, that is, having relatively low forward resistance and relatively high reverse leakage current, be integrated with a NV CNT resistive block switch optimized for nonvolatile storage, at approximately $4F^2$ cell size at the 15 nm technology node, for example. Such dense 1-RS cells may be formed by leveraging the multi-layer NV CNT resistive block switch fabrication methods. For example, semiconducting CNT fabrics may be developed with low defect levels that are compatible with semiconductor fabricator processes and tools, and compatible with multi-wall mostly metallic CNT fabrics, and single-wall mixed metallic and semiconducting CNTs, presently used to form NV CNT resistive block switches in NRAM cells. In this way, an integrated select diode (Schottky or p/n for example) and a CNT block may be optimized to achieve a 1-RS cross point cell compatible with terabit memory chips operating in the nanosecond range. A semiconducting CNT fabric may be formed with available or to be available 90-99.999% single wall CNTs using methods similar to those presently used to make fabrics illustrated and described further above with respect to SEM image 1200 illustrated in FIG. 12A and SEM image 1250 illustrated in FIG. 12B.

FIG. 23A illustrates cross point array 2300 formed with interconnected 1-RS cells 2350 illustrated in FIG. 23B. Each 1-RS cell 2350 includes integrated NV resistive switch 2360 and integrated diode 2370, with the cathode terminal connected to one terminal of NV resistive switch 2360. Integrated NV resistive switch 2360 is connected to an array wire at node 1 and integrated diode 2370 is connected to another array wire at node 2. Integrated diode 2370 has a sufficiently large write forward current to switch integrated NV resistive switch 2360 between multiple low and high resistance states, and sufficiently low reverse leakage current to eliminate, or minimize, parasitic currents from adjacent array cells. For example, 1-RS cell 2350 may operate with a forward current to reverse current ratio of 10/1 to 100/1. Integrated NV resistive switch 2360 may be formed as switch nanotube block fabric layers of various combinations of semiconducting and metallic SWNTs and MWNTs carbon nanotubes, switch graphitic layers, or switch buckyball layers as described further above with respect to FIGS. 4, 5, 6, and 7. Integrated diode 2370 may be formed as diode nanotube fabric layers, diode graphitic layers, or diode buckyball layers. Integrated diode 2370 may also be formed as diode nanotube fabric layers in contact with a first or second conductor (or semiconductor or carbon conductor) layer, diode graphitic layers in contact with a first or second conductor (or semiconductor or carbon conductor) layer, or diode buckyball layers in contact with a first or second conductor (or semiconductor or carbon conductor) layer. Integrated diodes may introduce a voltage drop of 0.15-0.6 volts as a function of diode type (Schottky or PN diode for example) and material choices. Voltage V shown in FIG. 23A may be increased to compensate for integrated diode voltage drops as needed. Schottky diodes typically have forward voltage drops in the 0.15-0.45 V range. PN diodes have forward voltage drops of 0.3 for Ge and 0.6 V for Si. Diodes formed between conductors (or semiconductors) and carbon nanotubes have forward voltage drops in these ranges, and depend on barrier heights between the conductor and the carbon nanotubes.

While FIG. 23A illustrates cross point array 2300 formed with interconnected 1-RS cells 2350 illustrated in FIG. 23B, cross point array 2300 may also be formed with interconnected 1-RS cells 2380 illustrated in FIG. 23C. Each 1-RS cell 2380 includes integrated NV resistive switch 2385 and integrated diode 2390, with the anode terminal of integrated diode 2390 connected to one terminal of NV resistive switch 2385.

Cross point array 2300 illustrated in FIG. 23A is formed with interconnected 1-RS cells 2350 illustrated in FIG. 23B. Parallel horizontal array wires 2302, 2304, and 2306 are approximately orthogonal to parallel vertical array wires 2312, 1214, and 1216. 1-RS cell C00 is formed by connecting array wire 2302 to node 1 and connecting array wire 2312 to node 2; 1-RS cell C01 is formed by connecting array wire 2302 to node 1 and connecting array wire 2314 to node 2; 1-RS cell C02 is formed by connecting array wire 2302 to node 1 and connecting array wire 2316 to node 2; 1-RS cell C10 is formed by connecting array wire 2304 to node 1 and connecting array wire 2312 to node 2; 1-RS cell C11 is formed by connecting array wire 2304 to node 1 and connecting array wire 2314 to node 2; 1-RS cell C12 is formed by connecting array wire 2304 to node 1 and connecting array wire 2316 to node 2; 1-RS cell C20 is formed by connecting array wire 2306 to node 1 and connecting array wire 2312 to node 2; 1-RS cell C21 is formed by connecting array wire 2306 to node 1 and connecting array wire 2314 to node 2; 1-RS cell C22 is formed by connecting array wire 2306 to node 1 and connecting array wire 2316 to node 2.

In operation, 1-RS cell C11 is selected by applying a voltage V to vertical array line 2314 and a voltage V=0 voltage to horizontal array line 2304 resulting in current 2330 if 1-RS cell C11 is in a low resistance state. If cell C11 is in a high resistance state, then current 2330 is a low leakage current, which is not detected by a sense amplifier. However, 1-RS cell C11 may contain multiple resistance states. For example, four resistance states may store two bits of information in 1-RS cell C11; eight resistance states may store three bits of information in 1-RS cell C11; and so on as described with respect to U.S. Pat. No. 8,102,018. Unselected 1-RS cells C00, C20, C02, and C22 are biased across terminals 1 and 2 such that integrated diodes 2370 are biased in the reverse direction (back biased) and do not conduct or conduct a negligibly small leakage current. Unselected 1-RS cells C01, C10, C12, and C21 have equal voltages applied across terminals 1 and 2 and no parasitic currents flow.

At this point in the present disclosure, an estimate may be made of the approximate maximum memory operating speed, that is, in the nanosecond or the microsecond range, for 1 Tb cross point memory array 2100 described further above with respect to FIG. 21 with sub-arrays 2120 corresponding to cross point array 2300 illustrated in FIG. 23, formed with 1-RS cells. This estimated memory speed may be compared with chart 1800 (FIG. 18) to determine which memory applications are compatible with maximum estimated operating speeds when using sub-arrays formed with 1-RS cells. The estimated memory speed for sub-arrays formed with 1-RS cells may be calculated using the same methods and equations described further above with respect to equations 1-5.

In this example, array wires 2125 and 2130 (FIG. 21) formed with cross point array 2300 (FIG. 23A) have the same length of 300 um as described further above, with cross section 2200 approximating a cross section through array wire 2125 or 2130, in which array wire cross section 2230 corresponds to an array wire 2125 or 2130 cross section. Array wire 2220 is one of multiple parallel array wires that are orthogonal to array wire 2230, and which are approximated by a conductive plane as described further above with respect to FIG. 22. Accordingly, the array wire capacitance calculated using equations 1-3 further above may be used for array wires 2125 and 2130 when formed with cross point array 2300 (FIG. 23A), that is, 62 fF. The array wire RC time constant may be calculated using equation 4, and the rise (or fall) time may be calculated using equation 5 for low resistance state $R_{ON}$ values corresponding to 1-RS cells 2350 illustrated in FIG. 23B.

Estimated sub-array performances may be calculated as illustrated further below for sub-arrays 2120 formed with cross point arrays 2300. The 1-RS cell 2350 low resistance state $R_{ON}$=100 kΩ and the array wire capacitance $C_{AW}$=62 fF as calculated above for each sub-array example. Time constant and rise time examples are calculated in Eq. 6 and 7 as follows:

For sub-arrays with 10,000 1-RS cells per array wire 2125 and 2130:

$C_{AW}=62 \times 10^{-15}$ F; or $C_{AW}=62$ fF, from equation 3;

$$R_{ON}C_{AW}=10^5 \times 62 \times 10^{-15}=6.2 \text{ ns} \quad [\text{Eq. 6}]$$

$$t_R=2.2\, R_{ON}C_{AW};\ t_R=2.2 \times 6.2;\ t_R=13.6 \text{ ns} \quad [\text{Eq. 7}]$$

and the cross point memory arrays with 1-RS cells are approximately 1000 times faster than cross point memory arrays with 1-R cells for the same array sizes.

For sub-arrays with 20,000 1-RS cells per array wire 2125 and 2130:

In this example, there are two times the number of cells per sub-array wire, the array wire length increases to 600 um, and array wire capacitance increases by 2 times. The number of sub-arrays needed to form a 1 Tb memory array is reduced from 10,000 to 2,500 sub-arrays. However, 10,000 sub-arrays may be used instead, resulting in 4 Tb memory chip.

$$C_{AW}=2 \times 62 \times 10^{-15}\text{ F; or } C_{AW}=124\text{ fF, from equation 3;} \quad [\text{Eq. 8}]$$

$$R_{ON}C_{AW}=10^5 \times 124 \times 10^{-15}=12.4 \text{ ns} \quad [\text{Eq. 9}]$$

$$t_R=2.2\, R_{ON}C_{AW};\ t_R=2.2 \times 12.4;\ t_R=27.3 \text{ ns} \quad [\text{Eq. 10}]$$

Equation 7 and 10 rise times $t_R$ estimates indicates that a 1 Terabit and 4 Terabit nonvolatile memories, such as described further above with respect to FIGS. 21, 22, 23, and formed with 10,000 100-megabit sub-arrays and 400-megabit arrays, respectively, of interconnected 1-RS cells with NV CNT resistive block switches of a minimum resistance $R_{ON}$=100 kΩ, operates in the nanosecond performance range. The array wire $C_{AW}$ capacitance values of 62 fF (equation 3) and 124 fF (equation 8) are relatively low array line capacitance values. The NV CNT resistive block switch minimum resistance $R_{ON}$=100 MΩ is relatively low when using 1-RS cells in sub-array sizes of 100 megabits as described further above with respect to FIGS. 21, 22, and 23. The combination of relatively low array line capacitance and relatively low minimum resistance $R_{ON}$ values results in a maximum estimated memory performance (speed of operation) in the nanosecond range as shown by equations 7 and 10.

A 1 terabit nonvolatile memory chip in the nanosecond range has many applications. These terabit nanosecond memory chips meet the nonvolatile random access nanosecond speed memory objectives described further above with respect to FIG. 18, which includes the following: NRAM 1810 for cell phones, and numerous other applications (not shown); NV RAM 1820 as embedded memories in microcontroller chips, and numerous other applications (not shown); SCM memory 1830 and solid state drive 1840 for computer applications, and numerous other applications (not shown).

Structures and Methods of Fabrication of Cross Point Memory Arrays

FIGS. 8C, 8D, and 8E show the patterning of adjacent cross point array cells into stacks by etching multiple layers, followed by sidewall passivation and dielectric fill between the stacks, such as sidewall passivation 850 and dielectric fill 852 illustrated in FIG. 8E. Such methods have been successfully used with respect to NRAM memories using NV resistive memory cell 100 illustrated in FIG. 1A. However, for cross point arrays scaled to minimum dimensions such as F=15 nm and smaller, it may be desirable to use fabrication methods that do not require sidewall passivation of switch nanotube fabric layers, such as switch nanotube fabric layer 824 with sidewall passivation 850 illustrated in FIG. 8E, in order to prevent possible penetration of the passivation layer into switch nanotube fabric layers from the sides as that could alter the electrical switching characteristics.

Figure 24A:
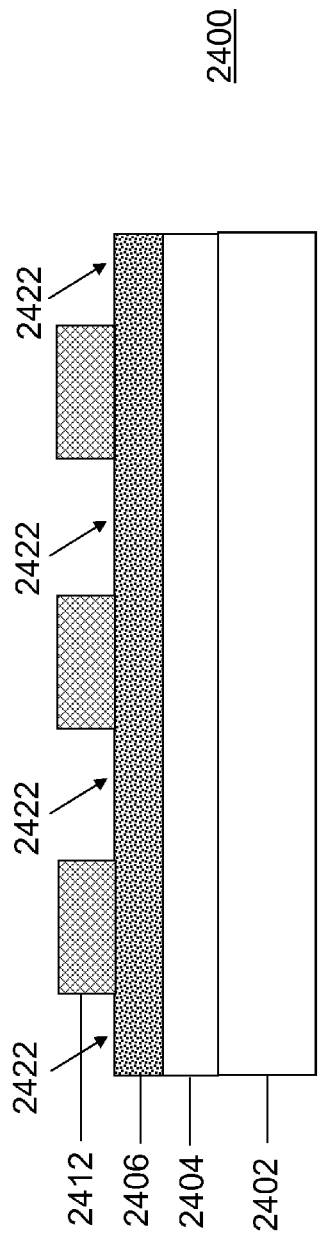
FIGS. 24A, 24B, and 24C illustrate cross sections of structures formed as a result of fabrication methods that may be used to form switch nanotube blocks using regions of conductive CNT fabrics and regions of nonconductive CNT fabrics to isolate switch nanotube blocks from adjacent cells in cross point memory arrays.
Figure 24B:
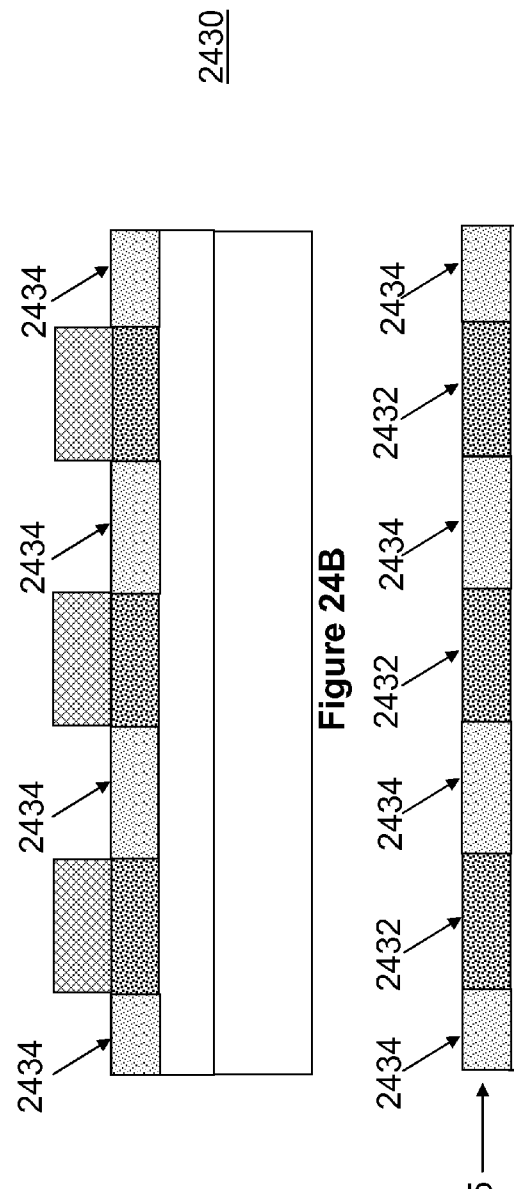
Figure 24C:
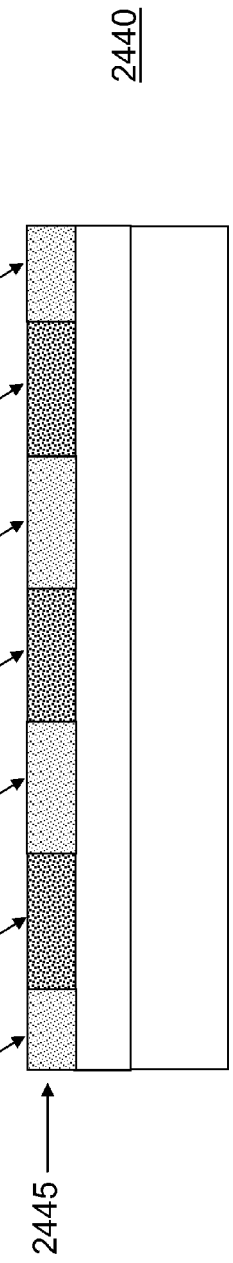

One method described in U.S. Patent Pub. No. US 2006/0276056 teaches converting portions of a carbon nanotube fabric from a conducting to a nonconducting fabric; such patterning is done by converting portions of the CNT fabric to an electrically nonconducting state while other portions are left electrically conducting. FIGS. 24A-24C illustrate structures corresponding to fabrication methods to form CNT fabric 2445 with conducting regions 2432 and nonconducting regions 2434 shown by structure 2440 illustrated in FIG. 24C. Nonconducting CNT fabric regions may be used as an insulating layer preventing undesired current flow between adjacent cells (adjacent bit disturb) in a cross point array for example as an alternative to trench isolation described further above.

Structure 2400 illustrated in FIG. 24A shows conducting CNT fabric 2406 formed with conducting and/or semiconducting carbon nanotubes, on an underlying layer 2404, which is on substrate 2402. Substrate 2402 may be formed of a semiconductor with CMOS circuits that may be used to operate a cross point array. Underlying layer 2404 may be an insulator that includes filled via holes to contact underlying CMOS circuits, first electrical terminals, arrays wires, and diodes used to form cross point interconnected cross point cells overlying substrate 2402, that are similar to those described further above with respect to FIGS. 1B-1, 1B-2, and 1B-3. A patterned masking layer 2412 may be formed using known methods of fabrication. Patterned masking layer 2412 may be formed as a sacrificial layer using a resist. Alternatively, patterned masking layer 2412 may be a second conductive terminal, such as second conductive terminal 138 illustrated in FIG. 1B-2, which may be used as a masking layer and is not etched away.

Conductive CNT fabric 2406 illustrated in FIG. 24A has exposed regions 2422. Structure 2400 is exposed to a Reactive Ion Etch (RIE) plasma such as $CF_4$, $CHF_3$, etc. in order to change the electrical properties of the exposed regions 2422 of conductive CNT fabric 2406. Unprotected portions 2422 of the CNT fabric will be fully converted to a nonconductive CNT fabric 2434, thus forming intermediate structure 2430 illustrated in FIG. 24B. The masking pattern protects the underlying CNT fabric from the plasma, preventing conversion to a non-conducting CNT fabric. After RIE plasma exposure, the pattern mask may be removed, as illustrated in structure 2440 illustrated in FIG. 24C. CNT fabric 2445 is a CNT fabric with conducting CNT fabric regions 2432 and nonconducting CNT fabric regions 2434 as illustrated in FIG. 24C. If the masking layer 2412 is also a second conductive terminal, then it remains on the surface of CNT fabric 2445 over conducting CNT fabric regions 2432. Ion implantation, such as illustrated in FIGS. 4C-4E, and other known methods, may also be used instead of a RIE plasma. Examples of ion implantation and other methods are illustrated in U.S. patent application Ser. No. 12/066,053 and U.S. patent application Ser. No. 12/874,501.

Figure 25:
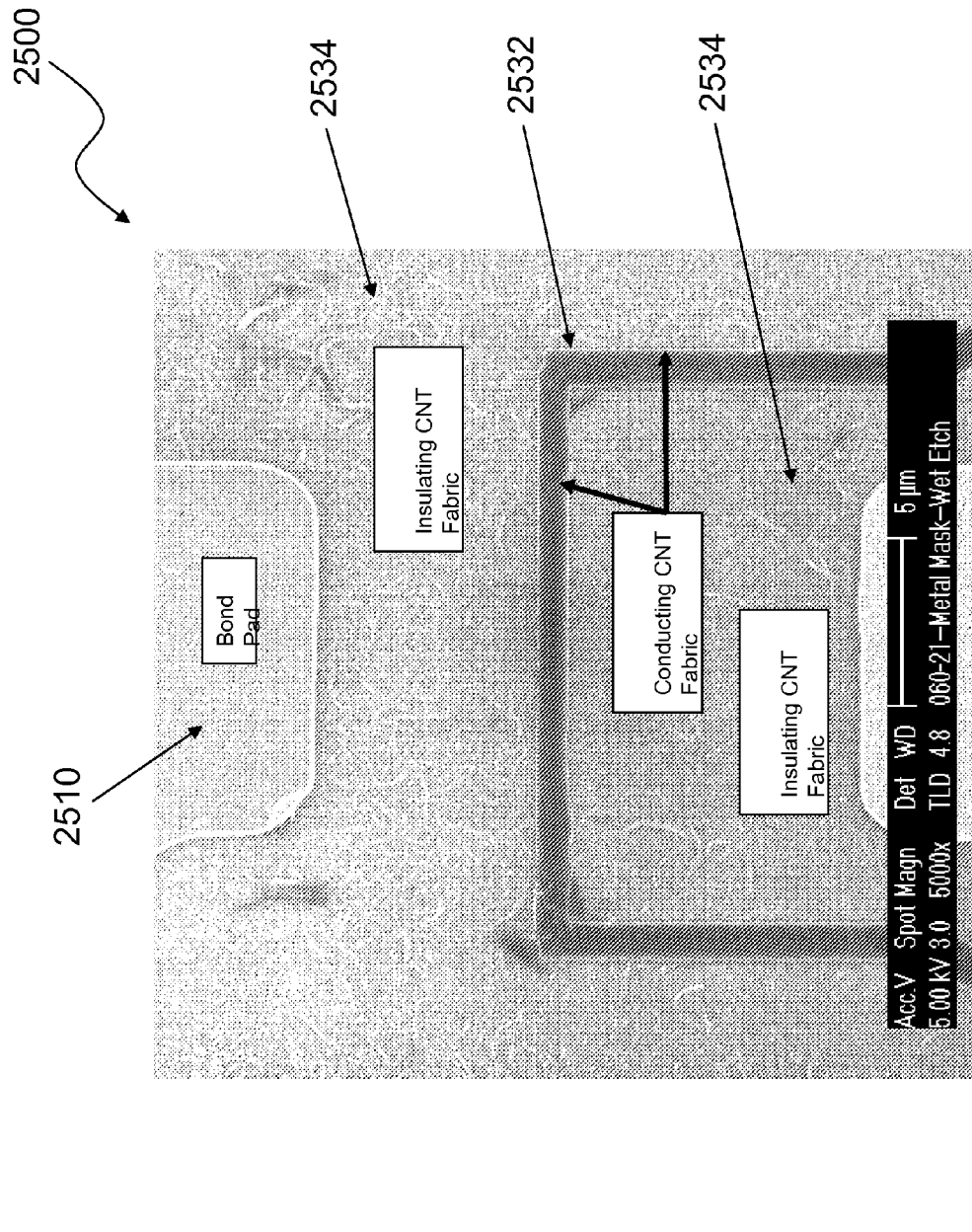
FIGS. 25 and 26 illustrate images from a field emission scanning electron microscope (FESEM) showing the results of experiments used to demonstrate methods of converting regions (portions) of CNT fabrics from conductive to nonconductive, while leaving conductive regions intact.

Field Emission Scanning Electron Microscope (FESEM) 2500 illustrated in FIG. 25 shows a CNT fabric deposited on a substrate with bond pads, such as bond pads 2510 and 2515, after non-protected regions of the CNT fabric have been converted to nonconductive CNT fabric 2534 to provide cell-to-cell isolation. The conducting. CNT fabric 2532 remains conducting in the protected region.

A layer of carbon nanotubes from several nanometers up to a micron thick may be applied to the substrate either by spray coating, spin coating, dip coating, etc. Then, a mask pattern is fabricated on top of the CNT fabric by spinning, exposing, and developing photoresist. The carbon nanotubes are then exposed to a typical reactive ion etching (RIE) gas such as $CF_4$, $CHF_3$, etc. The RIE gas reacts with the unmasked carbon nanotubes to convert the conducting nanotubes into nonconducting nanotubes. Care can be taken to minimize morphological damage to the CNT fabric while changing the electrical properties from conducting to nonconducting. Single and multilayer depositions of CNT layers may be used. As an example, a carbon nanotube fabric is sprayed onto a substrate to produce a low Ohm resistance fabric (<50Ω per square). After depositing the CNT fabric, the substrate is loaded into an RIE chamber containing $CF_4$ gas is at a pressure of 30 mTorr at 30 Watts for 30 seconds. Unprotected portions of the CNT fabric were fully converted to an insulating fabric, while the mask prevented the underlying portion from being converted to a non-conducting CNT fabric. After RIE plasma exposure, the patterned mask was removed, leaving a patterned conducting CNT fabric 2532 within the nonconducting CNT fabric 2534 as illustrated in FIG. 25. Processing conditions are not limited to these parameters.

Figure 26:
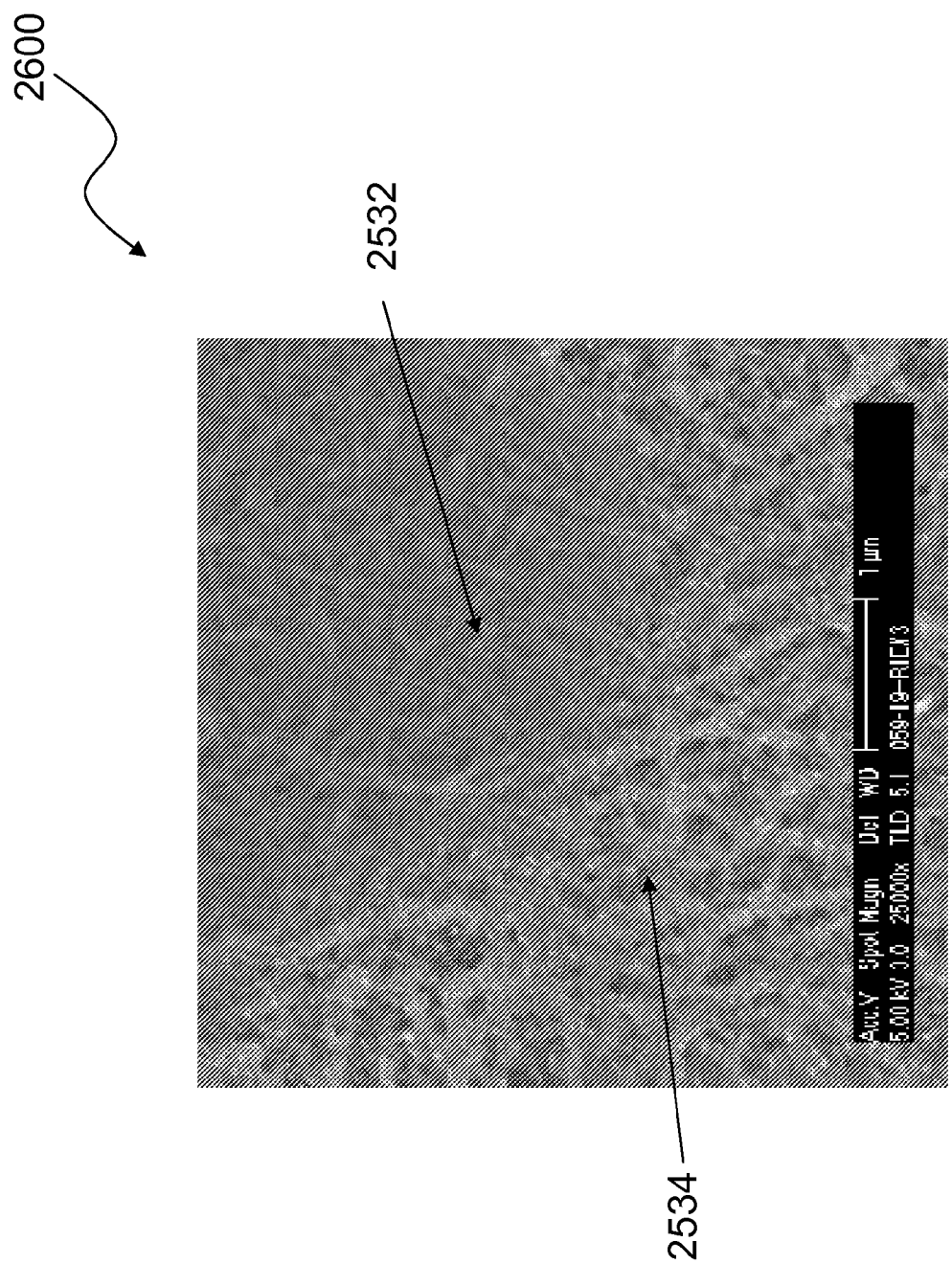

FESEM 2600 illustrated in FIG. 26 shows a magnified view of adjacent nonconductive CNT fabric 2534 and conductive CNT fabric 2532 regions from FIG. 25.

At this point in the present disclosure, structures and methods described further above with respect to FIGS. 24, 25, and 26 may be used to convert conductive CNT fabrics to nonconductive CNT fabrics for cell-to-cell isolation, and may be applied to cross point array 120 illustrated in FIGS. 1B-1, 1B-2, and 1B-3 as an alternative to the structures and methods using sidewall passivation and dielectric fill 852 illustrated in FIG. 8E for cell-to-cell isolation. In many applications, nonconductive CNT fabric 2434 used for cell-to-cell isolation may be converted to high-resistance CNT fabric regions instead of nonconductive CNT fabric regions, in which the high-resistance is sufficiently high to prevent significant cell-to-cell leakage.

FIG. 27A illustrates plan view 2700 of a cross point array formed with a continuous CNT fabric plane 2706 deposited on top of the planarized surface of underlying layer 2704, which corresponds to underlying layer 2404 illustrated in FIG. 24A. Cross section 2750, illustrated in FIG. 27B, is a representation of cross section A-A' in FIG. 27A In this example, underlying layer 2704 includes array wires 2703, which also form first conductor terminals 2703, embedded in a dielectric 2701 as illustrated in FIG. 27B. First conductor terminal 2703 corresponds to first conductor terminal 134 shown in FIG. 1B-2. CNT fabric plane 2706 replaces discrete NV CNT resistive block switches 130-1, 130-2, 130-3, and 130-4 illustrated in FIG. 1B-1. In this example, second conductor terminals 2738 are formed on the surface of CNT fabric plane 2738 at locations corresponding cross point array switches and corresponds to second conductive terminal 138 illustrated in FIGS. 1B-2. In this example, second conductive terminals 2738 are also used as a masking layer.

FIG. 28A illustrates plan view 2800 of the cross point array illustrated in plan view 2700 and corresponding cross section 2850 shown in FIG. 28B after exposed areas of CNT fabric plane 2706 have been exposed to $CF_4$ gas, ion implantation, or other methods described further above to form high-resistance or nonconductive CNT fabric 2834 regions. Non-exposed areas of CNT fabric plane 2706, located under second conductor terminals 2738, remain conducting CNT fabric regions 2832 as illustrated in FIG. 28B. Nonconductive CNT fabric 2834 regions isolate conductive CNT fabric regions 2832 that form NV CNT resistive block switches corresponding to NV CNT resistive block switches 130-1, 130-2, 130-3, and 130-4 illustrated in FIG. 1B-1.

FIG. 29 illustrates cross section 2900 in which an insulation layer has been deposited and planarized on the structures illustrated in FIGS. 28A and 28B using known methods to form insulator 2940. Insulator 2940 may be formed using $SiO_2$, SiN, $Al_2O_3$, and other insulator materials. Insulator material 2940 is unlikely to significantly penetrate the conductive CNT regions 2832 between second conductor terminal 2738 and first conductor terminal 2703.

FIG. 30 illustrates cross section 3000 after the deposition and patterning of array top wire 3050, corresponding to array top wire 126 illustrated in FIG. 1B-2. As this point in the process, cross point array cells have been formed with high-resistance or nonconductive CNT fabric regions isolating adjacent cells, instead of sidewall passivation and dielectric fill.

While the example illustrated in FIGS. 24-30 have been illustrated with CNT fabrics, the same principles may be applied to graphitic fabrics used to form switch graphitic blocks 168 (FIG. 1D) and buckyball fabrics used to form switch buckyball blocks 188 (FIG. 1E). For example, FIG. 31 illustrates cross section 3100 corresponding to cross section 3000 illustrated in FIG. 30, except that conductive CNT fabrics and high-resistance or nonconductive CNT fabric regions have been replaced with conductive and nonconductive graphitic layer regions. For example, conductive graphitic layers 3132 form the nonvolatile storage switches in cross point array cells and high-resistance or nonconductive graphitic layers 3134 are used for isolation between cross point array cells. In another example, FIG. 32 illustrates cross section 3200 corresponding to cross section 3000 illustrated in FIG. 30, except that conductive CNT fabric and nonconductive CNT fabric regions have been replaced with conductive and high-resistance or nonconductive buckyball layer regions. For example, conductive buckyball layers 3232 form the nonvolatile storage switches in cross point array cells and high-resistance or nonconductive buckyball layers 3234 are used for isolation between cross point array cells.

Methods of Fabrication and Structures of Cross Point Memory Arrays Formed with Continuous CNT Fabrics and Intersecting Array Lines of Minimum Width F Scaling cross point arrays to sub-15 nm minimum dimensions and sub-10 nm minimum dimensions, requires process methods and structures that address various limitations to scaling. Of the various dimensional scaling limitations, there are several limitations with respect to forming CNT switching regions described further below with respect to methods 3300 and structures illustrated in FIGS. 34A-39. While these are not the only limitations, they are among the most difficult to overcome and are listed as problems 1, 2, and 3 further below. These problems are described with respect to cross point array 120 illustrated in FIGS. 1B-1, 1B-2, and 1B-3. F is used to indicate a minimum dimension.

1) Forming Multiple F×F Structures: Cross point array 120 shows a top electrode, referred to as second electrical contact 138. It has dimensions F×F and is also used as an etch mask to define switch nanotube block 136 dimensions of F×F. Minimum dimension shapes of F×F, as drawn, typically result in circular etch mask shapes. Ideally, these would all have a diameter F, or at least the same diameter even if smaller than F for example. However, the various circular mask shape dimensions may vary over the chip surface, and in some cases may be missing altogether at some locations.

2) Forming Switch Nanotube Block Structures: As illustrated in cross point array 120 FIGS. 1B-2 and 1B-3, second electrical contact 138 is also used as an etch mask to etch a CNT layer and form switch nanotube block 136 of minimum dimensions F, ideally having the same cross section as second electrical contact 138. However, even with the use of directional etch some undercutting and non-uniformity may occur in switch nanotube block 136. A combination of the second electrical contact 138, switch nanotube block 136, and the first electrical contact 134 form NV CNT block switch 130-1.

3) Insulating NV CNT Block Switches: As illustrated in FIGS. 1B-1, 1B-2 and 1B-3, insulator 132 is used between NV CNT block switches 130-1, 130-2, 130-3, and 130-4 in two-by-two cross point array 120. These NV CNT block switches include a switch nanotube block of patterned CNT fabric which is porous. Insulator 132 may penetrate the porous sidewalls of the NV CNT block switches and change the electrical switching properties.

Approaches to solving problems 2 and 3 are described and illustrated with respect FIGS. 24A-30 as described further above. However, these solutions require formation of a top contact of minimum dimensions F×F, a scaling limitation as described above with respect to problem 1. An approach to solving problem 1 is described below with respect to methods (of fabrication) 3300 illustrated in FIGS. 33A, 33B, and 33C and structures illustrated in FIGS. 34A-39. This approach is based on using overlapping array wires of F×l, dimensions, where l is much greater than minimum dimension F, and where the regions of array wire overlap are dimensionally F×F as illustrated further below. A contact layer remains on the surface of the CNT fabric layer to protect CNTs from the various process steps until just prior to passivation. Ion implantation through the contact layer is used to form high-R CNT fabric isolation regions between CNT fabric conducting regions, while preserving F×F CNT switching regions below overlapping array wire regions. Then, at the end of the process flow, exposed regions of the contact layer are removed (etched) using top array wires as a masking layer. Methods 3300 illustrate methods of fabrication and structures that may be used to fabricate cross point memory array 2100 illustrated schematically in FIG. 21.

Figure 33A:
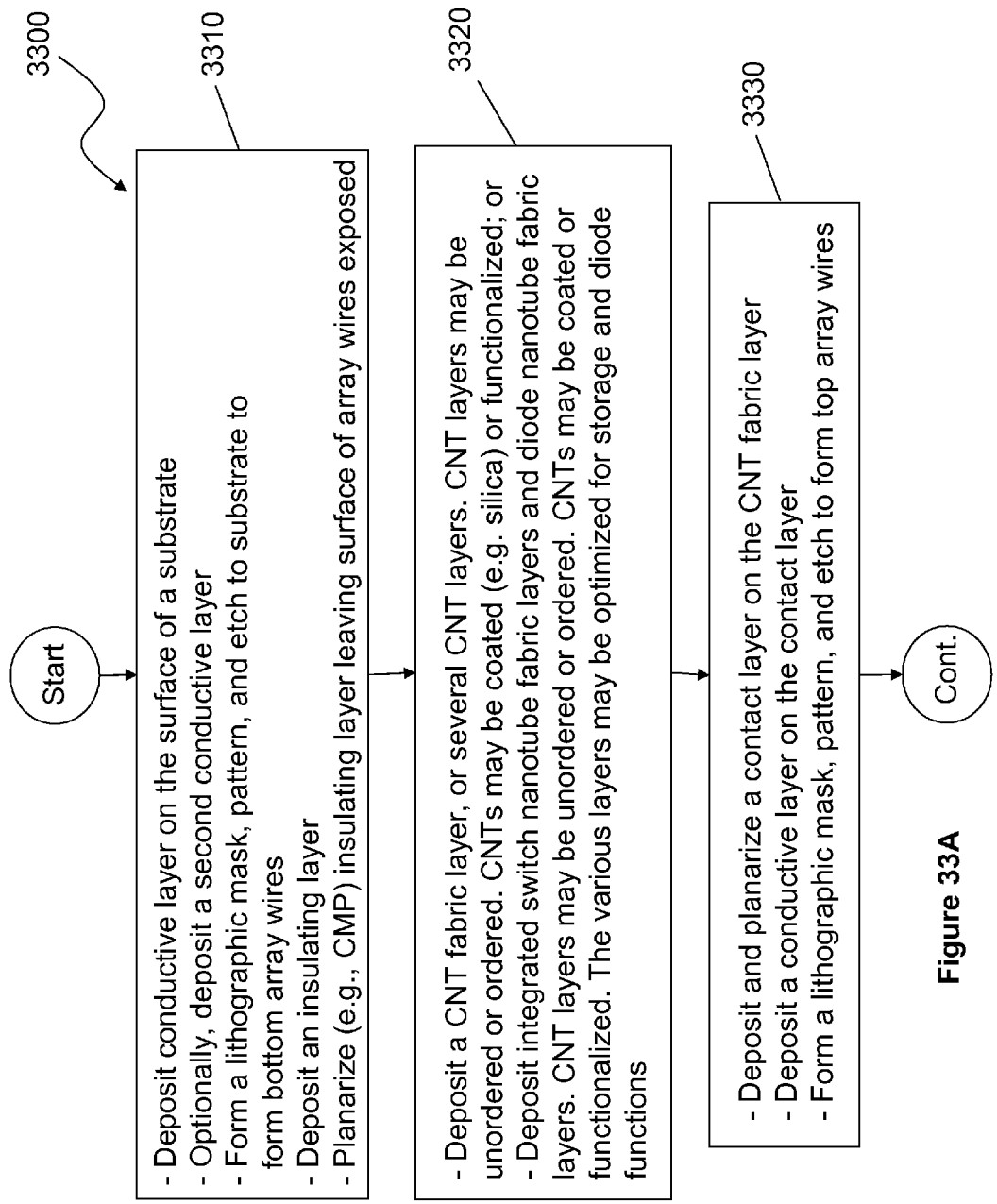
FIGS. 33A, 33B, and 33C illustrate methods of fabrication for making the cross point array structure of FIG. 21.
Figure 33B:
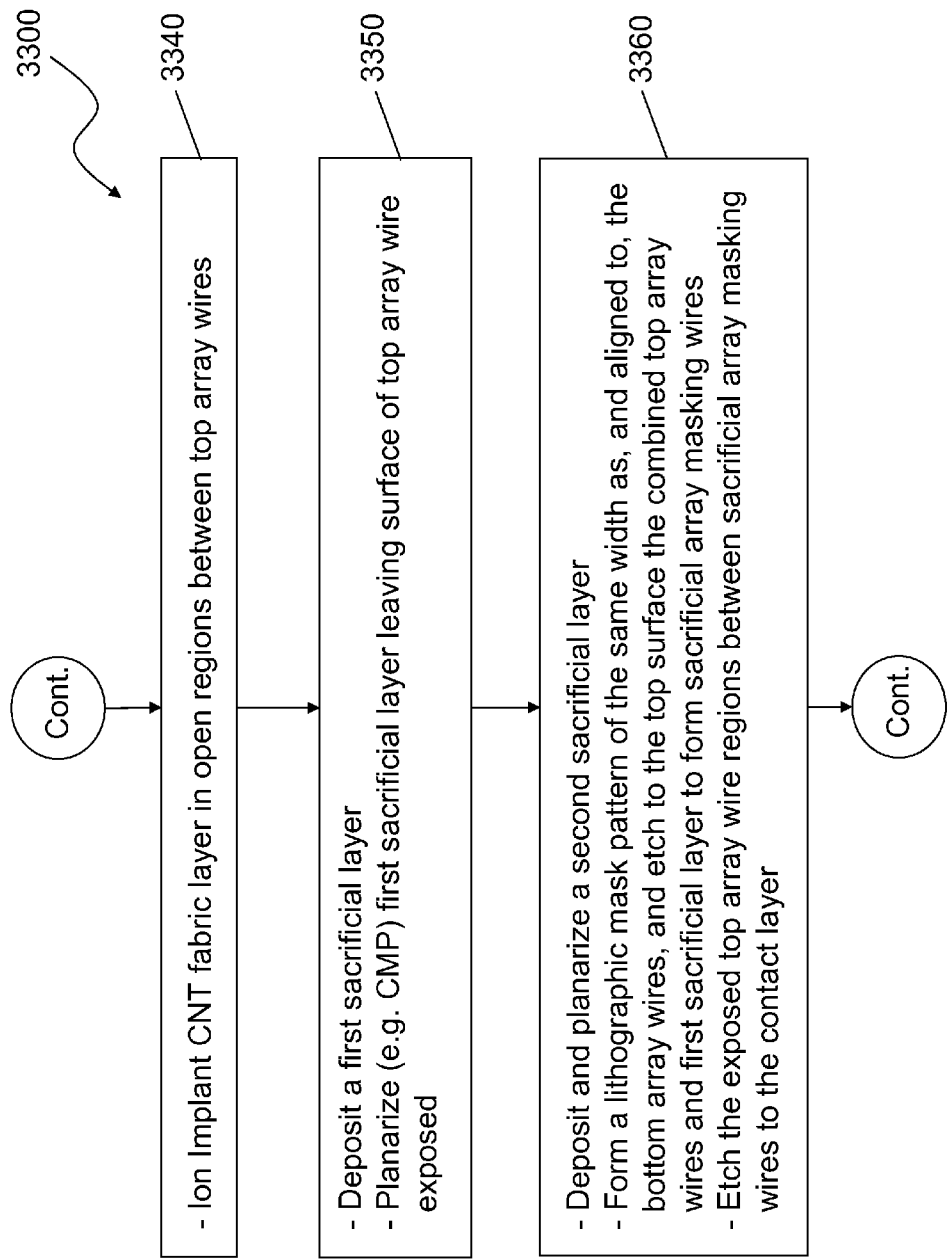
Figure 33C:
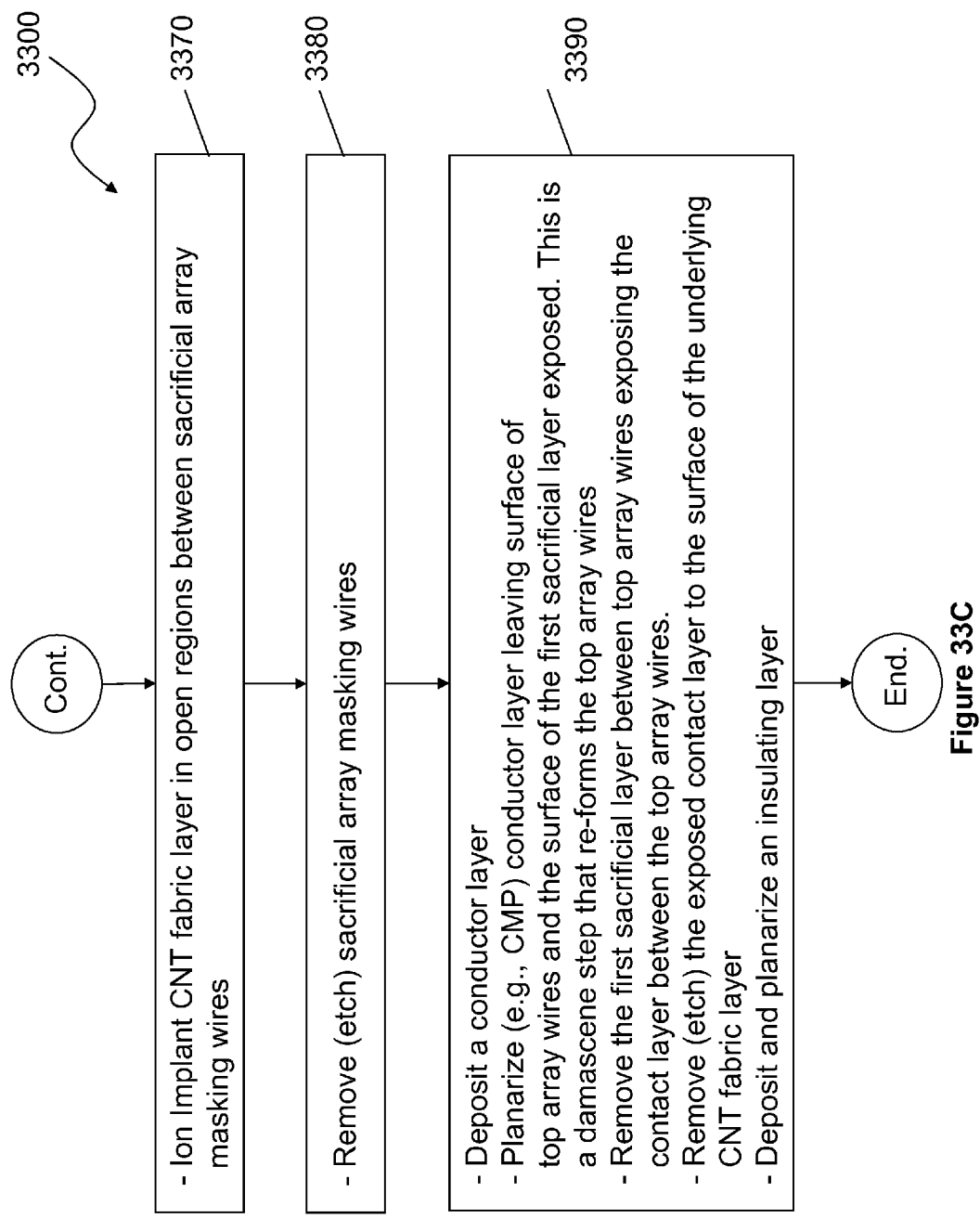

Methods (of fabrication) 3300 flow chart illustrated in FIGS. 33A, 33B, and 33C describe methods (processes) of forming structures illustrated in FIGS. 34A-39. Variations to methods of fabrication 3300 such as the addition or omission of steps and varying the order of steps are still within the scope described below with respect to FIGS. 33A, 33B, and 33C and FIGS. 34A-39.

Methods 3300 and structures illustrated in FIGS. 34A-39 form cross point memory arrays, or sub-arrays, which correspond to cross point memory array 2100 and sub-arrays 2120, and cross point memory array 2300, illustrated schematically in FIGS. 21 and 23, respectively. By way of example, bottom array wire 3404 illustrated in FIG. 34A, may have a minimum width F and X-direction length $l_X$, and corresponds to X-direction array wire 2125. By way of example, top array wire 3430 illustrated in FIG. 34C, may have a minimum width F and Y-direction length $l_Y$, and corresponds to Y-direction array wire 2130. F represents the minimum dimension at a technology node, 2F represents the minimum periodicity along an array wire, and array wire lengths $l_X$ and $l_Y$ are determined by the number of bits along each array wire as described further above with respect to FIG. 21. Array wires lengths $l_X$ and $l_Y$ may be of the same length l, or different lengths.

Methods 3300 assumes that substrate 3402 illustrated in FIG. 34A includes many of the components of n and p-type field effect devices (MOSFETs) with drain, source, and gate nodes, interconnections to form circuits (typically CMOS circuits) in support of the memory function to be fabricated on the surface of substrate 3402. And, also that connections between memory arrays and sub-arrays formed on the surface of substrate 3402 and the underlying circuits are present within substrate 3402.

Methods 3310 deposit a conductor layer on the surface of substrate 3402 illustrated in plan view 3400 shown in FIG. 34A using known industry methods, or methods described further below in the case of nanotube fabrics for example. Thicknesses may range from 5 nm to 500 nm for example. The term conductor may include metals, metal alloys, semiconductors, silicides, conductive oxides, various allotropes of carbon, and other materials. The following are examples of conductors, conductive alloys, and conductive oxides: Al, Al(Cu), Ag, Au, Bi, Ca, Co, $CoSi_x$, Cr, Cu, Fe, In, Ir, Mg, Mo, $MoSi_2$, Na, Ni, $NiSi_x$, Os, Pb, PbSn, PbIn, Pd, Pd2Si, Pt, $PtSi_x$, Rh, RhSi, Ru, RuO, Sb, Sn, Ta, TaN, Ti, TiN, TiAu, TiCu, TiPd, $TiSi_x$, TiW, W, $WSi_2$, Zn, $ZrSi_2$, and others for example.

The following are examples of semiconductors that may be used as conductors: Si (doped and undoped), Ge, SiC, GaP, GaAs, GaSb, InP, InAs, InSb, ZnS, ZnSe, CdS, CdSe, CdTe, GaN, and other examples.

Various allotropes of carbon may also be used as conductors such as: amorphous carbon (aC), carbon nanotubes such as nanotube fabrics, graphite, buckyballs, and other examples.

In addition to the materials described further above such conductors, semiconductors, conductive oxides, and allotropes of carbon, nanowires formed of various conductor, semiconductor, and conductive oxide materials, such as those described further above, may also be used as well.

Optionally, methods 3310 may deposit another conductive layer, which may be referred to as a second conductive layer. The first conductive layer deposited may be optimized for array wiring and the second conductive layer may be used to enhance contact properties between the first conductive layer and the CNT fabric layer. The second conductive layer may be formed with any of the materials described further above with respect to methods 3310. FIG. 34A shows a bottom array wires as formed from one conductor layer. However, optionally, two conductors may be used as described.

Next, methods 3310 deposit a resist layer, expose and develop the resist, then etch to pattern array wires on the surface of substrate 3402 using known industry methods forming array wires 3404 as illustrated by plan view 3400 in FIG. 34A. Array wire 3404 width may be scaled over a large range: on the order of 250 nm to on the order of 10 nm. Methods 3300 may be used to form array wire 3404 widths of less than 10 nm.

Next, methods 3310 deposit an insulating layer using known industry methods to a thickness of 5 to 500 nm for example. Examples of insulators are $SiO_2$, SiN, $Al_2O_3$, TEOS, polyimide, $HfO_2$, $TaO_5$, combinations of these insulator materials and other insulator materials.

Then, methods 3310 planarize the insulating layer to the top surface of array wires 3404 using known industry methods, forming insulator 3406, as illustrated by cross section 3410 illustrated in FIG. 34B along the Y direction and corresponds to cross section CC' shown in FIG. 34A.

Next, methods 3320 deposit a CNT layer, or several CNT layers, as illustrated in plan view 3420 and cross sections 3420-1, 3420-2, and 3420-3 in the X-direction illustrated in FIGS. 34C, 34D-1, 34D-2, and 34D-3, respectively, to form a porous unordered carbon nanotube (CNT) fabric layer, such as CNT fabric layer 3422, or 3424, or 3426 of matted carbon nanotubes as shown in FIGS. 34D-1, 34-2, and 34D-3, respectively. Cross sections 3420-1, 3420-2, and 3420-3 correspond to cross section DD' shown in FIG. 34C. CNT fabric layer 3422 illustrated in FIG. 34D-1 may be used to form 1-R type nonvolatile resistive change memory cells (or elements) as described further above with respect to FIG. 1C. CNT fabric layer 3426 may be used to form 1-RS type nonvolatile resistive change memory cells (or elements) as described further above with respect to FIG. 4B, in which switch nanotube fabric layer 3426A is integrated with diode nanotube fabric layer 3426B for high cell selectivity as illustrated in FIG. 34D-3. Alternatively, the integrated diode nanotube fabric layer may be placed above the switch nanotube fabric layer such as illustrated by CNT fabric layer 3424 in which diode nanotube fabric layer 3424B is placed above switch nanotube layer 3424A as illustrated in FIG. 34D-2. For the structures described further below, CNT fabric layer 3426 illustrated in FIG. 34D-3 will be used. While diode nanotube fabric layers have been illustrated at the top or bottom of CNT fabric layers, such diode fabric layers may be included anywhere in the CNT fabric layer. Multiple diode fabric layers may be included as well (not shown).

An unordered nanotube fabric layer deposited on a substrate element is shown by the scanning electron microscope (SEM) image 1200 illustrated in FIG. 12A. This may be done with spin-on technique or other appropriate technique as described in U.S. Pat. Nos. 6,643,165, 6,574,130, 6,919,592, 6,911,682, 6,784,028, 6,706,402, 6,835,591, 7,560,136, 7,566,478, 7,335,395, 7,259,410 and 6,924,538, and U.S. Patent Pub. No. 2009/0087630, the contents of which are hereby incorporated by reference in their entireties (hereinafter and hereinbefore, the "incorporated patent references"). Under preferred embodiments, the carbon nanotube layer may have a thickness of approximately 0.5-500 nm for example. The CNT layer may be formed of multiwalled nanotubes, single wall nanotubes, metallic nanotubes, semiconductor nanotubes, and various combinations of all nanotube types, doped and functionalized as described in more detail in U.S. patent application Ser. No. 12/356,447 and U.S. patent application Ser. No. 12/874,501, herein incorporated by reference in their entirety.

Alternatively, methods 3320 may, after the deposition of one or more CNT layers such as described further above, use mechanical or other methods, to approximately align some or most of the nanotubes in a preferred direction to form an ordered nanotube fabric layer, or several ordered nanotube layers, as described in U.S. Patent App. No. 61/319,034. Ordered nanotube fabrics may be ordered throughout the nanotube fabric thickness. However, ordered nanotube fabrics may be present for only a portion of the nanotube fabric thickness, while the rest of the nanotube fabric remains an unordered fabric. Ordered and unordered nanotube fabrics may be present in multiple layers that form CNT fabric layers 3422, 3424, and 3426. FIG. 12B illustrates a scanning electron microscope (SEM) image 1250 of an ordered nanotube fabric.

Next, methods 3330 deposit contact layer 3428 over CNT fabric layer 3422, or 3424, or 3426, as illustrated in FIGS. 34D-1, 34D-2, and 34D-3, respectively, in a thickness range of 1 nm to 100 nm as needed using known industry methods. Contact layer 3428 may be formed using conductive material, semiconductive material, or various allotropes of carbon, and other materials, as discussed further above with respect to methods 3310. Contact layer 3428 is used to enhance resistive change memory cell (or element) switching characteristics. However, it is also used as a protective layer for underlying CNT fabric layers 3422 or 3424 or 3426 for all subsequent processing until patterning and passivation near the end of the process flow.

Next, methods 3330 deposit a conductor layer on the surface of contact layer 3428 as illustrated in structures 3420-1, 3420-2, and 3420-3 as shown in FIGS. 34D-1, 34D-2, and 34D-3, respectively, using known industry methods. Thicknesses may range from 5 nm to 500 nm for example. The term conductor may include metals, metal alloys, semiconductors, silicides, conductive oxides, various allotropes of carbon, and other materials, as described further above with respect to methods 3310.

Next, methods 3330 deposit a resist layer, expose and develop the resist, then etch to pattern array wires on the surface of contact layer 3428 using known industry methods, forming top array wires 3430 as illustrated by plan view 3420 in FIG. 34C and in cross sections 3420-1, 3420-2, and 3420-3 illustrated in FIGS. 34D-1, 34D-2, and 34D-3. Top array wire 3430 width may be scaled over a large range: on the order of 250 nm to on the order of 10 nm. Methods 3300 may be used to form array wire 3440 widths of less than 10 nm.

Next, methods 3340 ion implant CNT fabric layer 3426 through contact layer 3428 in exposed regions 3444 shown in cross section 3440 illustrated in FIG. 34E. Ion implant 3442 methods are described further above with respect to FIGS. 4C, 4D, and 4E. Ion implant 3442 forms high-resistance (high-R) CNT fabric isolation regions 3454 between top array wires 3430 as shown in cross section 3450 illustrated in FIG. 34F. High-R values may be in the hundreds of mega-Ohms or giga-Ohm range; that is forming essentially insulating regions, thereby eliminating parasitic currents in the CNT fabric layer between top array wires. CNT switching regions 3452 under top array wire 3430 are unchanged.

Next, methods 3350 deposit a first sacrificial layer using known industry methods. Examples of first sacrificial layer materials are $SiO_2$, SiN, $Al_2O_3$, TEOS, polyimide, $HfO_2$, $TaO_5$, combinations of these insulator materials, and other insulator materials. Various conductors, semiconductors, allotropes of carbon, or other materials as described further above with respect to methods 3310 may also be used. In addition, various resists may also be used to form a first sacrificial layer.

Figure 34G:
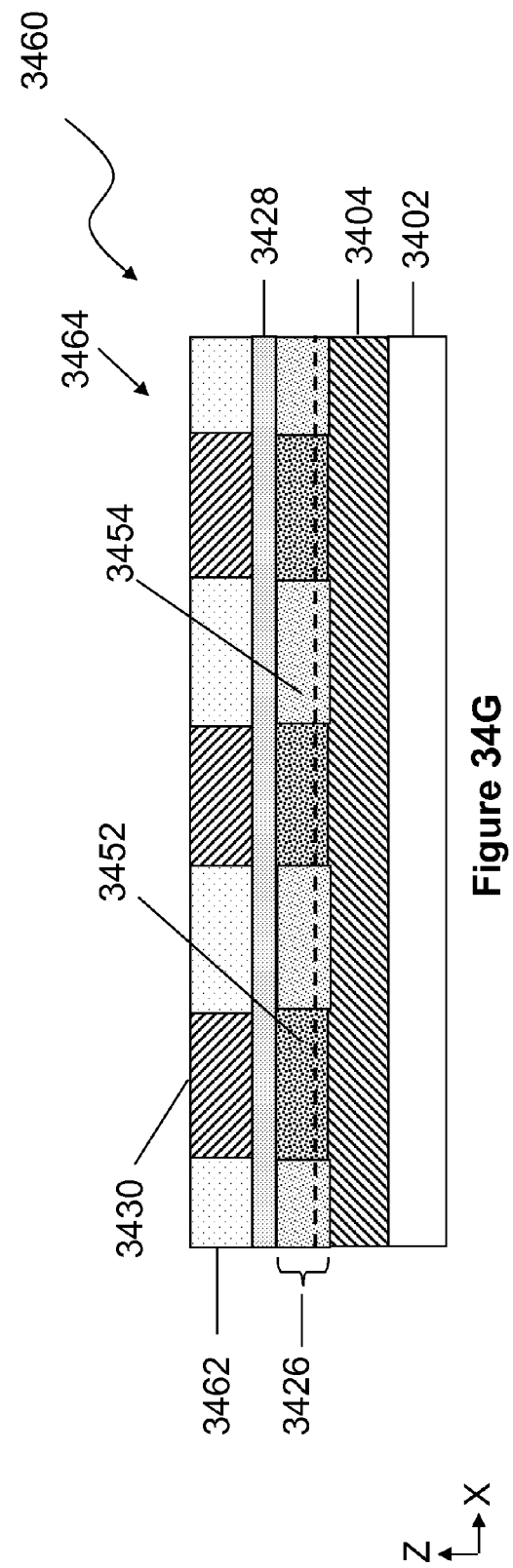
FIG. 34G illustrates the cross section shown in FIG. 34F after the formation of a first sacrificial layer.

Then, methods 3350 planarize the first sacrificial layer to the top surface of top array wires 3430 using known industry methods, forming first sacrificial layer 3462, as illustrated by cross section 3460 illustrated in FIG. 34G. The top surface 3464 of cross section 3460 includes the top surface of top array wires 3430 and the top surface of first sacrificial layer 3462.

At this point in the process, CNT fabric layer 3426 has been transformed by ion implant 3442 into high-R CNT fabric isolation regions 3454 or left as CNT switching regions 3452 as illustrated in FIGS. 34F and 34G. CNT switching regions 3452 are approximately $F \times l_Y$ in size, located under top array wires 3430, and high-R CNT fabric isolation regions 3454 are approximately $F \times l_Y$ in size, and located between top array wires 3430.

In the continuing process described further below, CNT switching regions $F \times l_Y$ along the Y-direction are transformed by another ion implant through contact layer 3428 and similar to ion implant 3442 described further above, into high-R CNT fabric isolation regions of F×F dimensions, alternating with F×F CNT switching regions that are left unchanged. At the end of process flow, CNT switching regions of CNT fabric layer 3426 of approximately F×F minimum dimensions remain in regions of overlap between top array wires 3430 and bottom array wires 3404. All other regions of CNT fabric layer 3426 in the memory array have been transformed into high-R CNT fabric isolation regions by ion implantation. These F×F minimum dimension CNT switching regions are formed by the intersection of array wires and sacrificial array wires of F×1 dimensions, without requiring the etching of minimum F×F shapes.

Next, methods 3360 deposit and planarize a second sacrificial layer on surface 3464 illustrated in FIG. 34G using known industry methods. Examples of first sacrificial layer materials are SiO2, SiN, $Al_2O_3$, TEOS, polyimide, HfO2, TaO5, combinations of these insulator materials, and other insulator materials. Various conductors, semiconductors, allotropes of carbon, or other materials as described further above with respect to methods 3310 may also be used. In addition, various resists may be used as well.

Figure 35A:
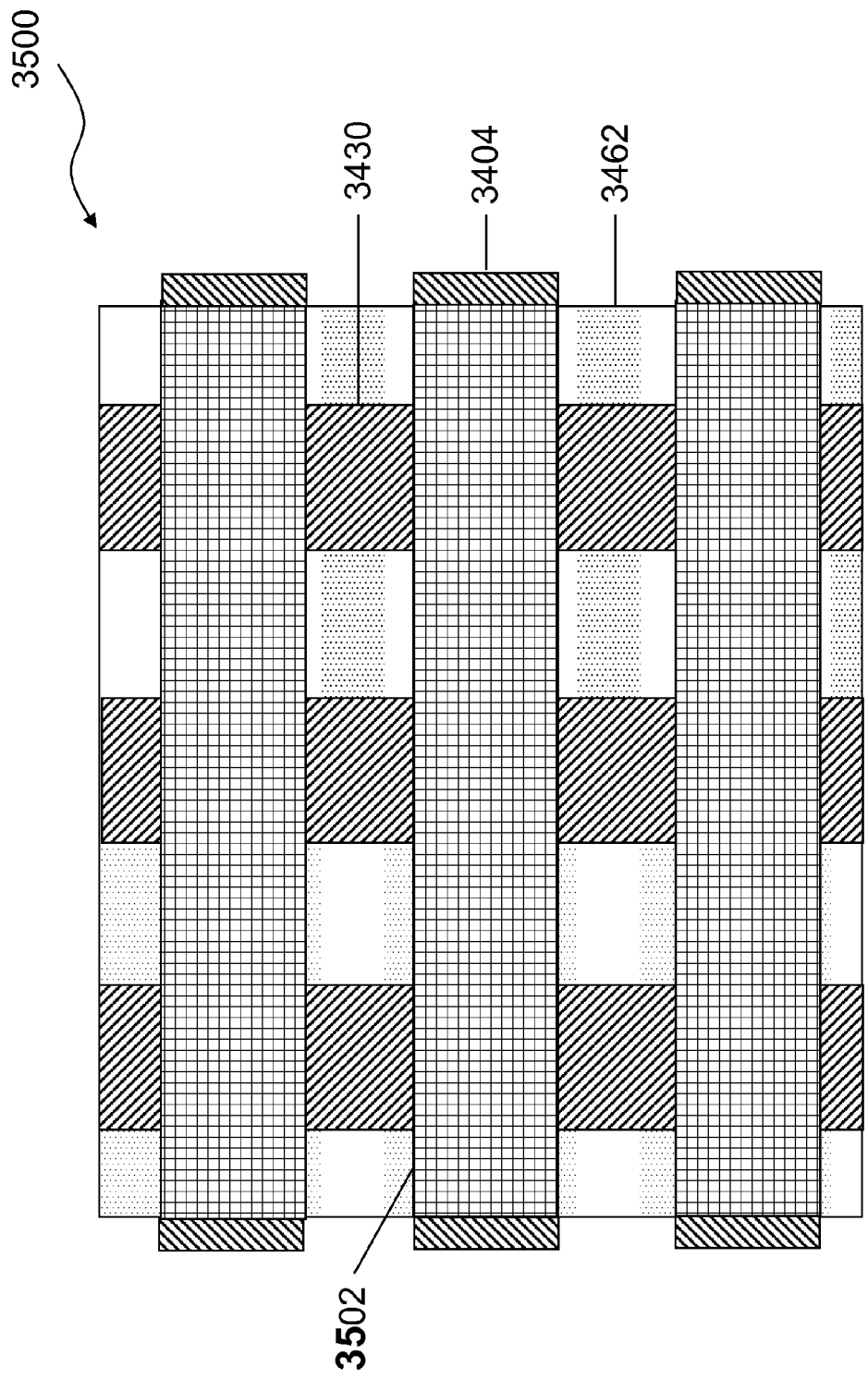
FIG. 35A illustrates a plan view of sacrificial array masking wires, parallel to underlying bottom array wires, formed on the surface of FIG. 34G.

Next, methods 3360 deposit a resist layer on the top surface of the second sacrificial layer, expose and develop the resist, then etch to form sacrificial array masking wires 3502 illustrated in FIG. 35A on surface 3464 (FIG. 34G) using known industry methods. The etch is selective to first sacrificial layer 3462 and top array wires 3430. Sacrificial array masking wires 3502 are aligned to, and positioned above, bottom array wires 3404 and have approximately the same dimensions. Sacrificial array wire 3502 width may be scaled over a large range: on the order of 250 nm to on the order of 10 nm. Methods 3300 may be used to form sacrificial array masking wire 3502 widths of less than 10 nm.

Figures 35B, 35C:
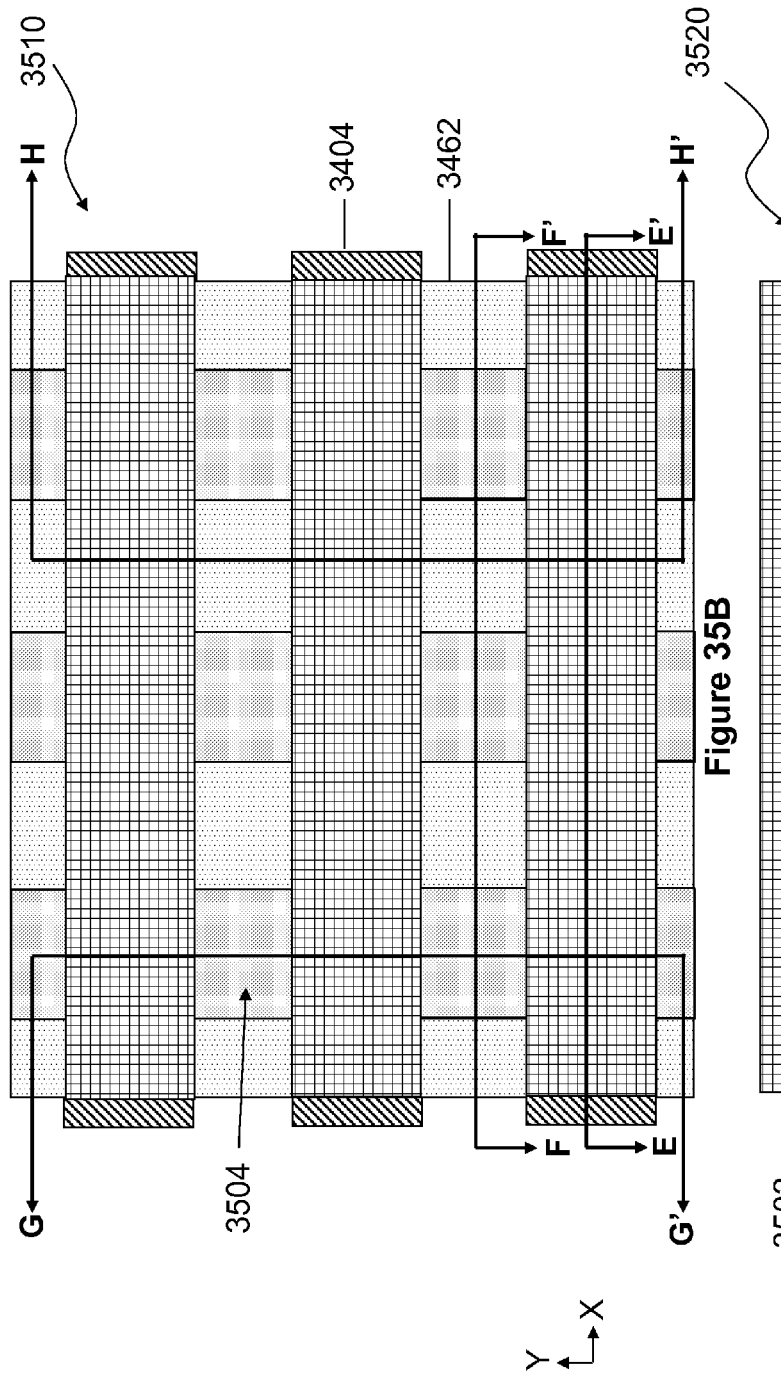
FIG. 35B illustrates a plan view of FIG. 35A after exposed regions of top array wires have been removed (etched) revealing contact layer regions. Top array wires are segmented.
FIG. 35C illustrates a cross section of FIG. 35B through the length of sacrificial array masking wire.

Then, methods 3360 etch (remove) exposed top array wires 3430 shown in plan view 3500 illustrated in FIG. 35A, selective to first sacrificial layer 3462 and contact layer 3428, exposing the top surface of contact layer regions 3504 as shown in plan view 3510 illustrated in FIG. 35B, and changing continuous top array wires 3430 to top array wire segments 3430S shown in cross section 3520 along the X-direction as illustrated in FIG. 35C, using known industry methods. Cross section 3520 corresponds to cross section EE' shown in FIG. 35B. Cross section 3520 shows sacrificial array masking wire 3502 in contact with the top surface of top array wire segments 3430S, which are on top of contact layer 3428, and above CNT switching region 3452 in CNT fabric layer 3426. The combination of sacrificial array masking wire 3502 and top array wire segments 3430S prevent a subsequent ion implant step shown further below in FIG. 36A from changing the resistance of CNT switching region 3452. High-R CNT fabric isolation region 3454 is already at a high resistance because of ion implant 3442 shown in FIG. 34E. And while the combination of sacrificial array masking wire 3502 and first sacrificial layer 3462 may prevent a subsequent ion implant step from reaching high-R CNT fabric isolation region 3454, this is not a requirement, and in fact can have the beneficial effect of further increasing high-R CNT fabric isolation resistance values.

Figure 35D:
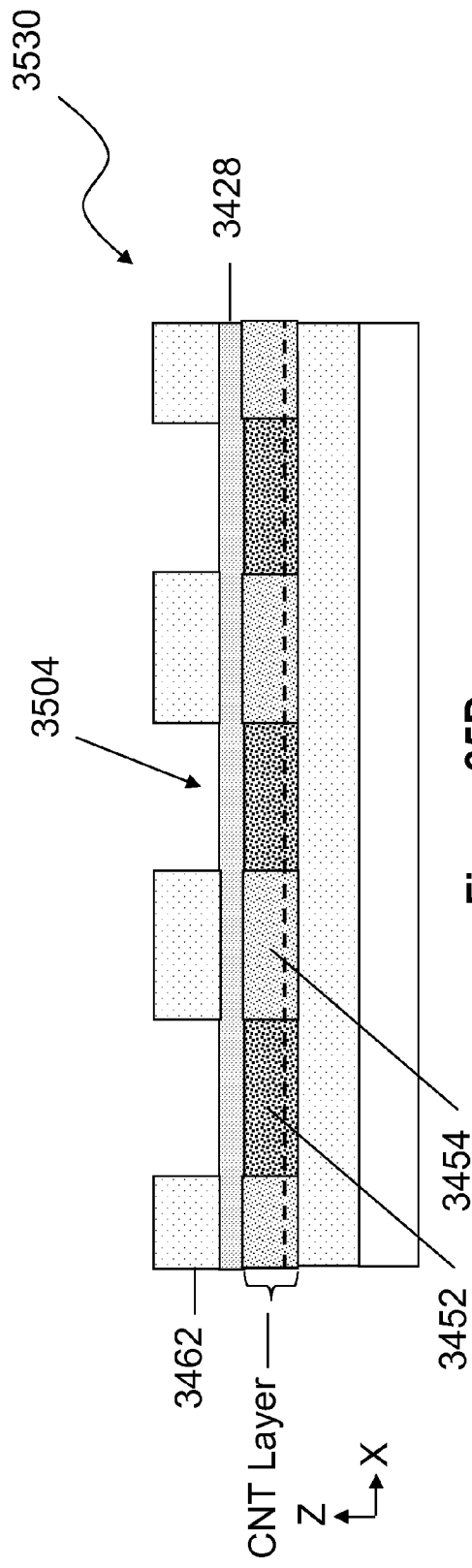
FIG. 35D illustrates a cross section of FIG. 35B between sacrificial array masking wires and parallel to the sacrificial array masking wires.

Cross section 3530 along the X-direction illustrated in FIG. 35D, corresponds to cross section FF' shown in FIG. 35B, and shows first sacrificial layer 3462 with exposed contact layer regions 3504 of contact layer 3428 as a result of applying methods 3360 described further above. CNT switching regions 3452 may be converted to high-R CNT fabric isolation regions 3654 by ion implantation 3602 as described further below with respect to FIGS. 36C and 36D.

Cross section 3540 along the Y-direction illustrated in FIG. 35E, corresponds to cross section GG' shown in FIG. 35B, and shows the combination of sacrificial array masking wire 3502 and top array wire segments 3430S that protect (mask) underlying CNT fabric layer 3426 regions from a subsequent ion implant step shown further below in FIG. 36A. Exposed CNT fabric layer 3426 regions may be converted to high-R CNT fabric isolation regions by ion implantation as described further below with respect to FIGS. 36C and 36D.

Figure 35E:
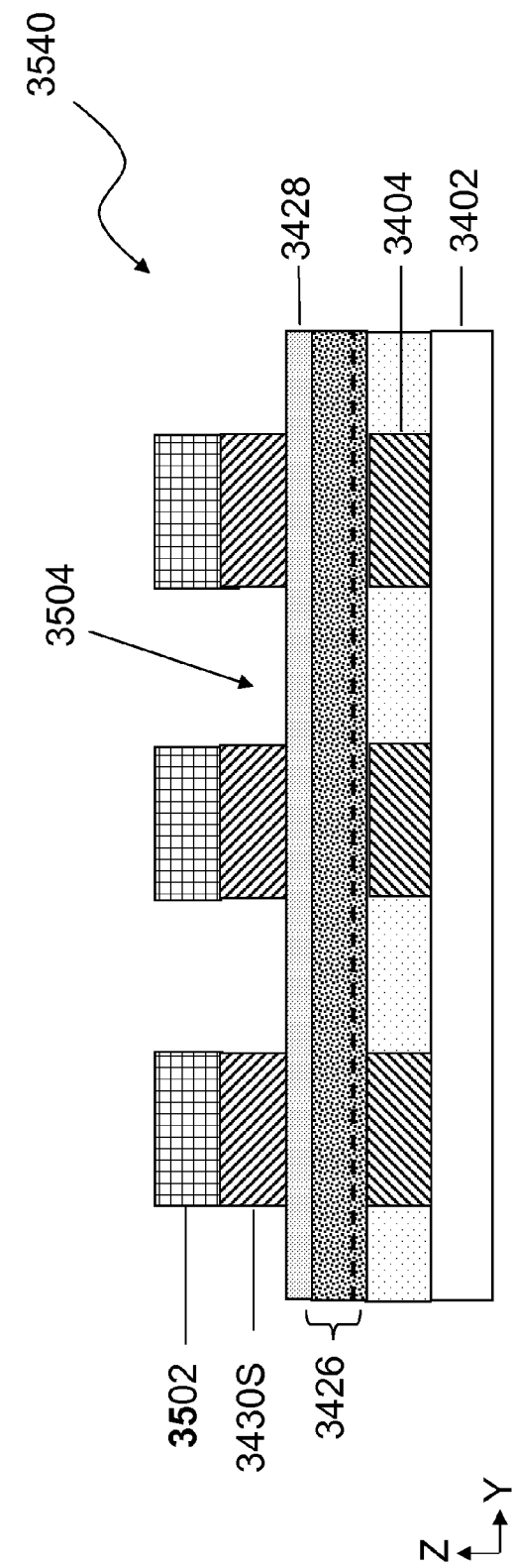
FIG. 35E illustrates a cross section of FIG. 35B through the entire FIG. 35B structure, orthogonal to the sacrificial array masking wires, through top array wire segments, and through the length of the bottom array wires.
Figure 35F:
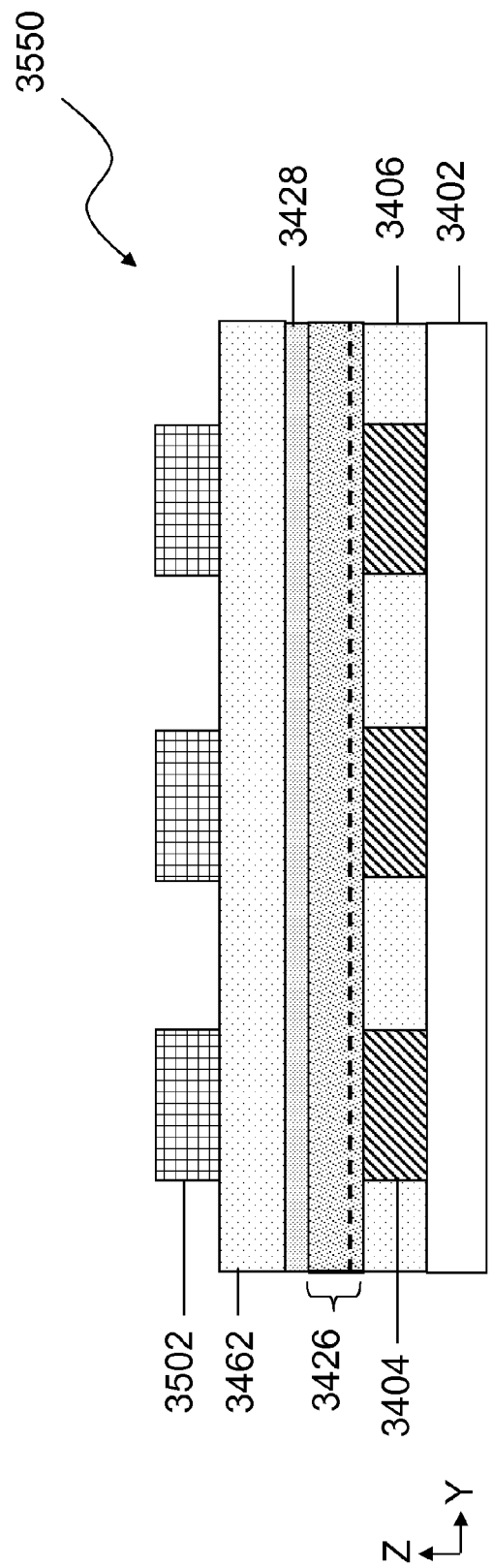
FIG. 35F illustrates a cross section of FIG. 35B through the entire FIG. 35B structure orthogonal to the sacrificial array masking wires and between top array wires segments.

Cross section 3550 along the Y-direction illustrated in FIG. 35F, corresponds to cross section HH' shown in FIG. 35B, and shows sacrificial array masking wires 3502 on the top surface of first sacrificial insulator 3462. Underlying CNT fabric layer 3426 was converted to a high-R CNT fabric isolation region by ion implant 3442 illustrated in FIGS. 34E and 34F. Subsequent ion implantation may reach underlying 3426, which can have the beneficial effect of further increasing high-R CNT fabric isolation resistance values.

At this point in the process, as described further below, a second ion implant, ion implant 3602 through contact layer 3428, converts regions of CNT fabric layer 3426 below exposed contact layer regions 3504, as shown in plan view 3510 illustrated in FIG. 35B, from CNT switching regions to high-R CNT fabric isolation regions. After ion implant 3602, CNT switching regions 3452 of CNT fabric layer 3426 remain only in regions at the intersection of sacrificial array masking wires 3502 and top array wire segments 3430S.

Methods 3370 ion implant the structure illustrated in plan view 3510 illustrated in FIG. 35B as shown in FIGS. 36A, 36C, and 36E with ion implant 3602. Ion implant 3602 is similar to ion implant 3442 described further above. Ion implant methods are described further above with respect to FIGS. 4C, 4D, and 4E.

FIG. 36A illustrates ion implant 3602 applied with respect to cross section 3520, also shown in FIG. 35C. As shown in corresponding cross section 3620 illustrated in FIG. 36B along the X-direction, CNT switching regions 3452 in CNT fabric layer 3426 remain unchanged, protected by the combination of sacrificial array masking wire 3502 and top array wire segment 3430S. High-R CNT fabric isolation regions 3454 formed by ion implant 3442 (FIG. 34E) remains essentially unchanged by ion implant 3602. If any ion implant 3602 dosage reaches high-R CNT fabric isolation region 3454, it can only have the beneficial effect of further increasing high-R resistance values.

FIG. 36C illustrates ion implant 3602 applied with respect to cross section 3530, also shown in FIG. 35D. As shown in corresponding cross section 3630 illustrated in FIG. 36D along the X-direction, CNT switching regions 3452 in CNT fabric layer 3426 are changed to high-R isolation regions 3654 in exposed regions 3504 between first sacrificial layer 3462 openings by ion implant 3602 through contact layer 3428. CNT high-R isolation regions 3454 formed by ion implant 3442 (FIG. 34E) remains essentially unchanged by ion implant 3602. If any ion implant 3602 dosage reaches high-R CNT fabric isolation region 3454, it can only have the beneficial effect of further increasing high-R isolation resistance values.

FIG. 36E illustrates ion implant 3602 applied with respect to cross section 3540, also shown in FIG. 35E. As shown in corresponding cross section 3640 illustrated in FIG. 36F along the Y-direction, CNT switching regions 3452 in CNT fabric layer 3426 are left unchanged, protected at the intersection of sacrificial array masking wires 3502 and top array wire segments 3430S. However, in unprotected regions 3504, switching regions in CNT fabric layer 3426 are changed from CNT switching regions 3452 to high-R CNT fabric isolation regions 3654 by ion implant 3602 through contact layer 3428.

At this point in the process, as described further below, sacrificial array masking wires 3502, formed as described further above by etching a second sacrificial layer, may be removed (etched) selective to contact layer 3428, top array wire segments 3430S, and first sacrificial layer 3462. Exposed regions of contact layer 3428 are defined in the X-direction by edges of first sacrificial layer 3462 openings separated by a distance F, and in the Y-direction by edges of top array wire segments 3430S separated by a distance F. A damascene process may be used to fill the exposed regions with a conductor that interconnects top array wire segments 3430S, thereby converting top array wire segments 3430S to top array wires 3730 of dimensions F×$l_Y$ as illustrated in FIG. 37D further below. First sacrificial layer 3462 may then be removed (etched), and then exposed regions of contact layer 3428 may also be removed as well. An insulating layer is then deposited and planarized to protect the underlying cross point memory array, all as described further below.

Figure 37A:
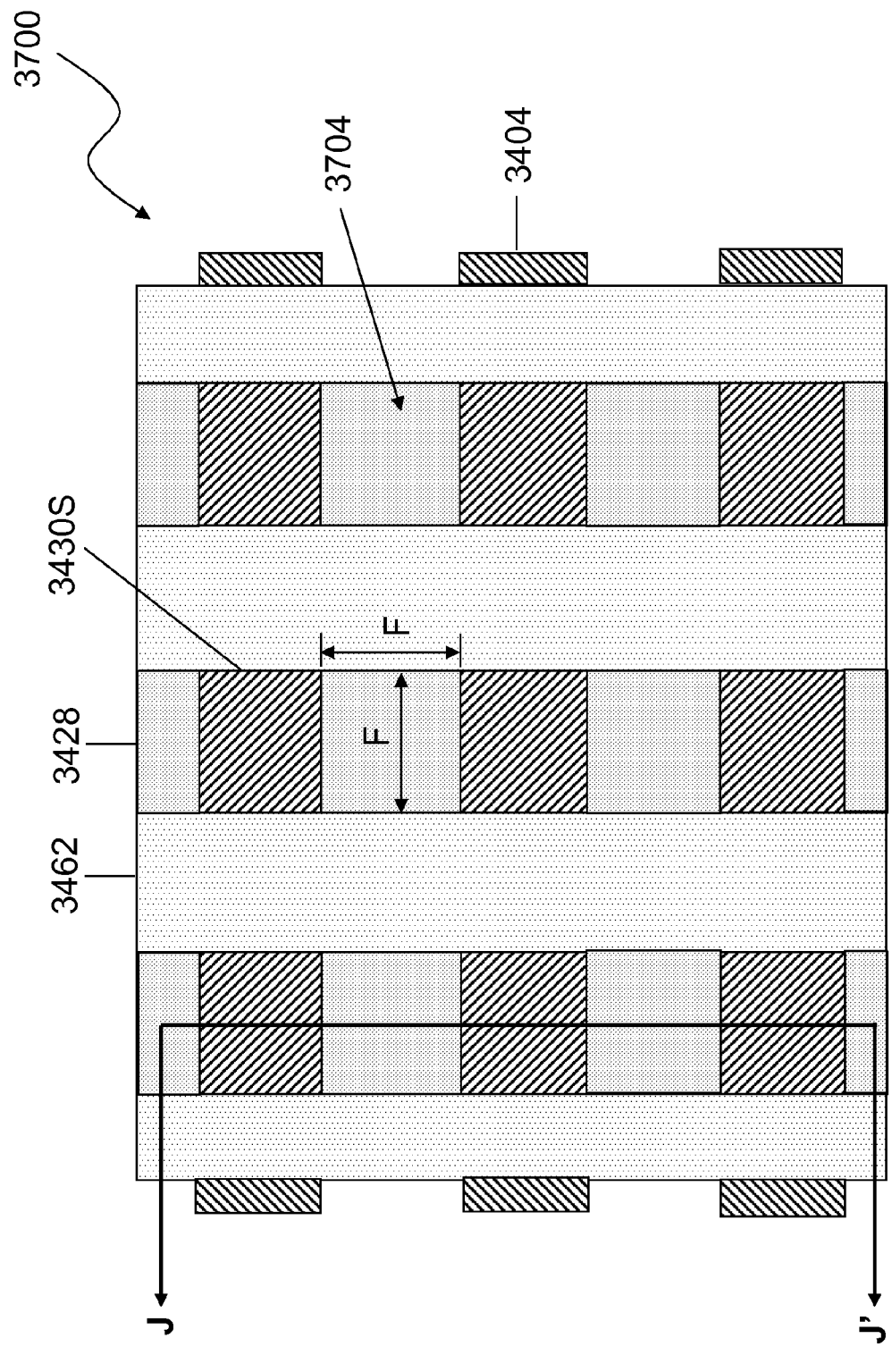
FIG. 37A: illustrates a plan view of FIG. 35B after sacrificial array masking wires have been removed.
Figure 37B:
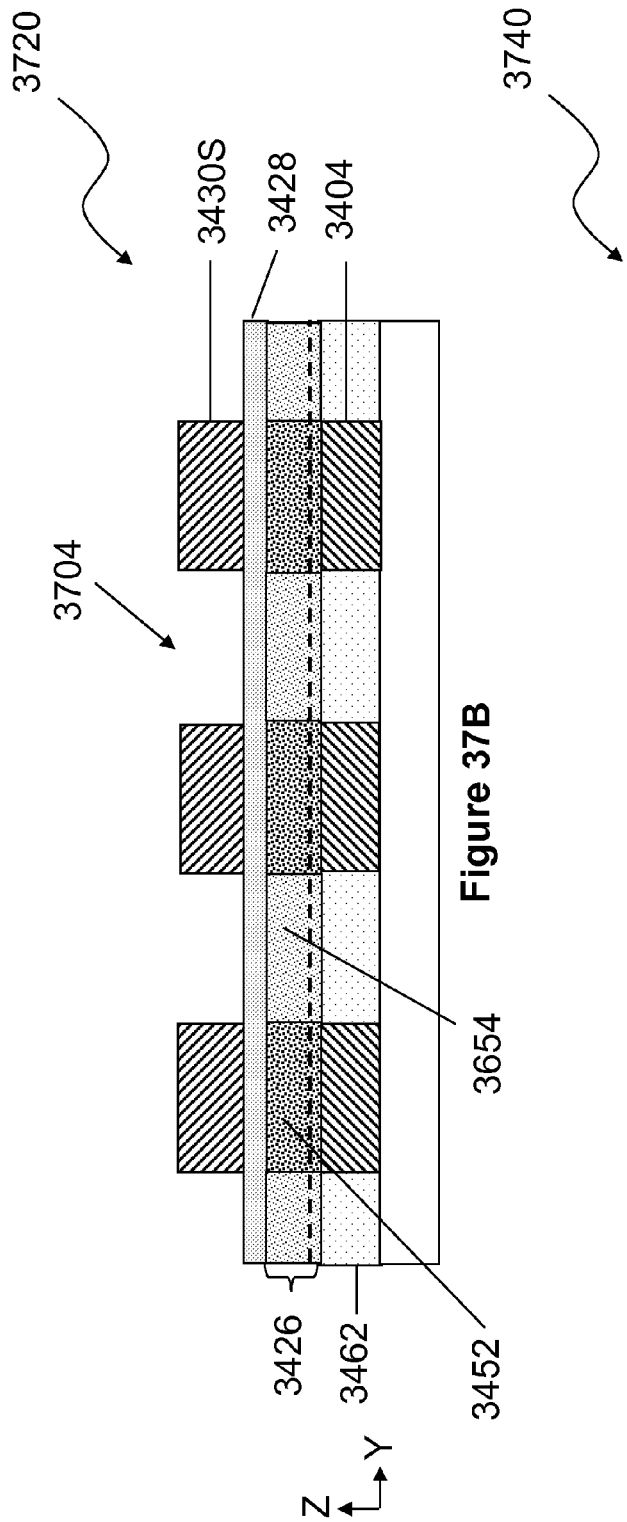
FIG. 37B illustrates a cross section of plan view 37B through segmented top array wires.

Methods 3380 remove (etch) sacrificial array masking wires 3502, selective to contact layer 3428, first sacrificial layer 3462, and top array wire segments 3430S shown in FIGS. 35B, 35C, 35E, and 35F using known industry methods, which results in the structures illustrated by plan view 3700 shown in FIG. 37A and cross section 3720 in the Y-direction as shown in FIG. 37B, corresponding to cross section JJ' shown in FIG. 37A. Openings 3704 expose sections of the top surface of contact layer 3428 as shown in FIGS. 37A and 37B. The dimensions of openings 3704 are defined in the X-direction by edges of first sacrificial layer 3462 openings separated by a distance F, and in the Y-direction by edges of top array wire segments 3430S separated by a distance F.

Figure 37C:
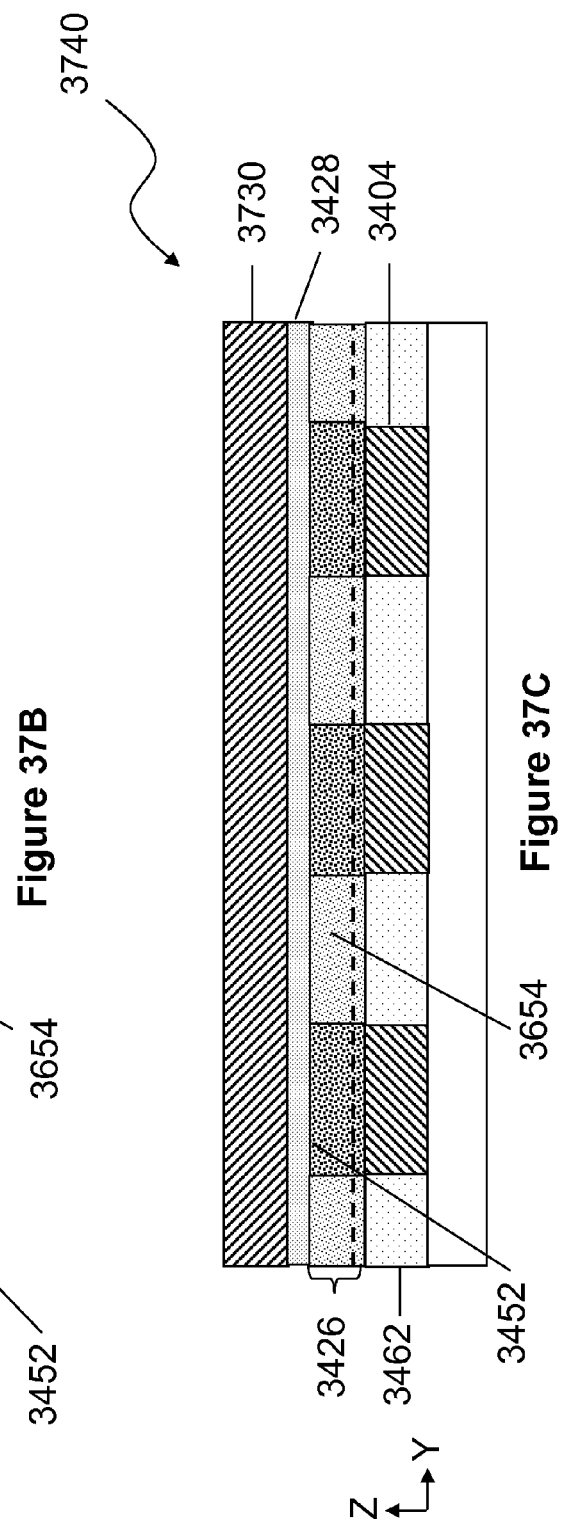
FIG. 37C illustrates cross section 37B after damascene conductor deposition and planarization re-connects top array wires segments to re-form top array lines.
Figure 37D:
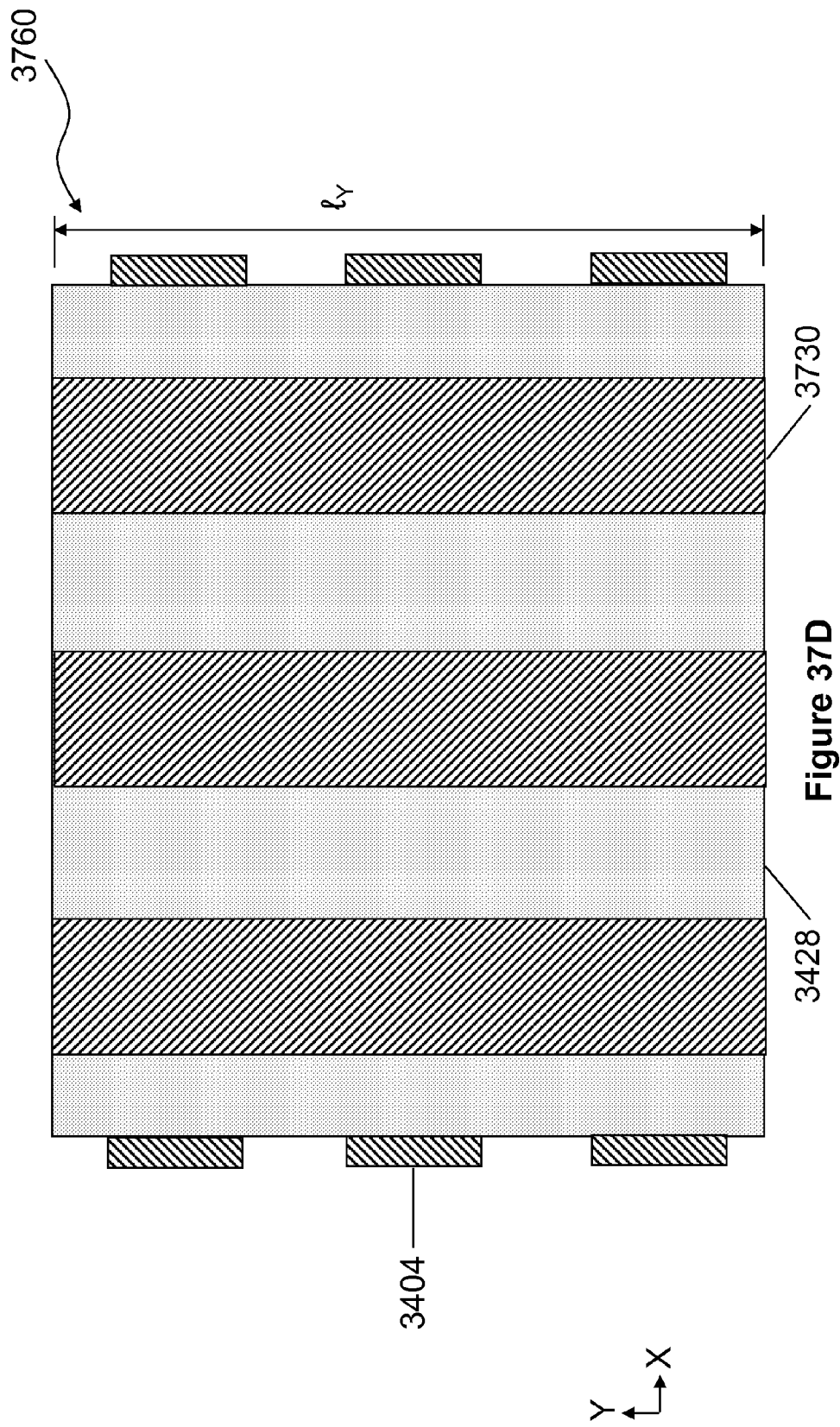
FIG. 37D illustrates a plan view corresponding to cross section 37B showing reformed top array wires.
Figure 37E:
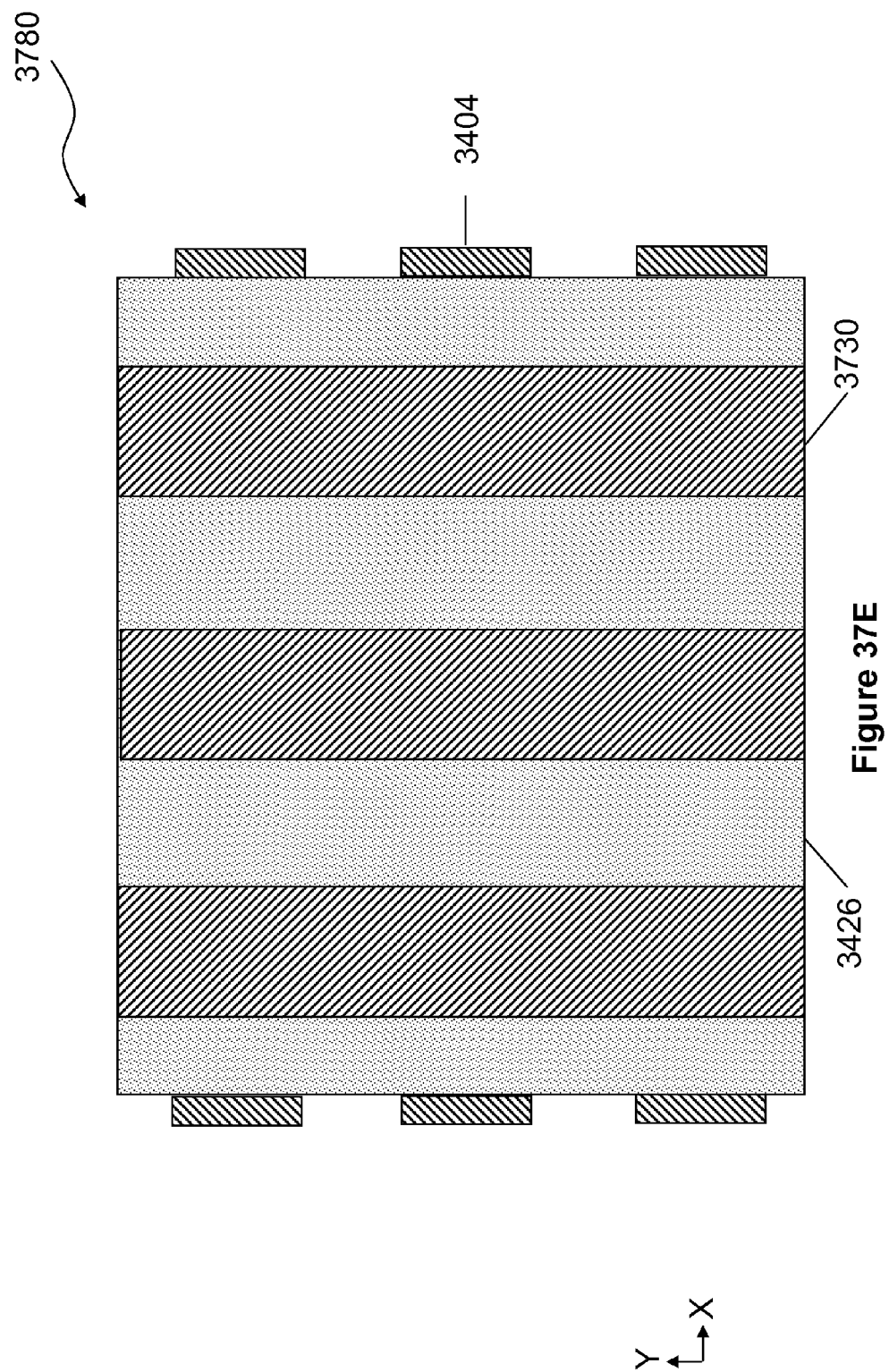
FIG. 37E illustrates a plan view corresponding to plan view 37D after the exposed contact layer between top array wires has been removed (etched)

Next, methods 3390 deposit a conductor layer which penetrates the opening 3704 and contacts exposed regions of contact layer 3428, also covering and contacting top array wire segments 3430S. Next, the conductor layer is planarized to the top surfaces of first sacrificial insulator 3462 and top array wire segments 3430S using known industry damascene process methods, forming continuous top array wire 3730 shown in cross section 3740 in the Y-direction as illustrated in FIG. 37C. Plan view 3760 illustrated in FIG. 37D also show top array wires 3730 and exposed regions of contact layer 3428 between top array wires 3730. CNT switching region 3452, formed by ion implant 3442 in CNT fabric layer 3726, is positioned at the intersection of top array wire 3730 and bottom array wires 3404. High-R CNT fabric isolation region 3654, formed by ion implant 3602, isolates adjacent CNT switching regions 3452 as illustrated in FIG. 37C Next, methods 3390 etch (remove) exposed regions of contact layer 3428 using top array wires 3730 as a masking layer exposing the top surface of CNT fabric layer 3426 as shown in plan view 3780 illustrated in FIG. 37E. Methods of etching metals and insulators without damaging CNTs in CNT fabric layers are described in the referenced patents and patent publications further above with respect to methods 3320. The top surface of CNT fabric layer 3426 is exposed between top array wires 3730.

Figure 38A:
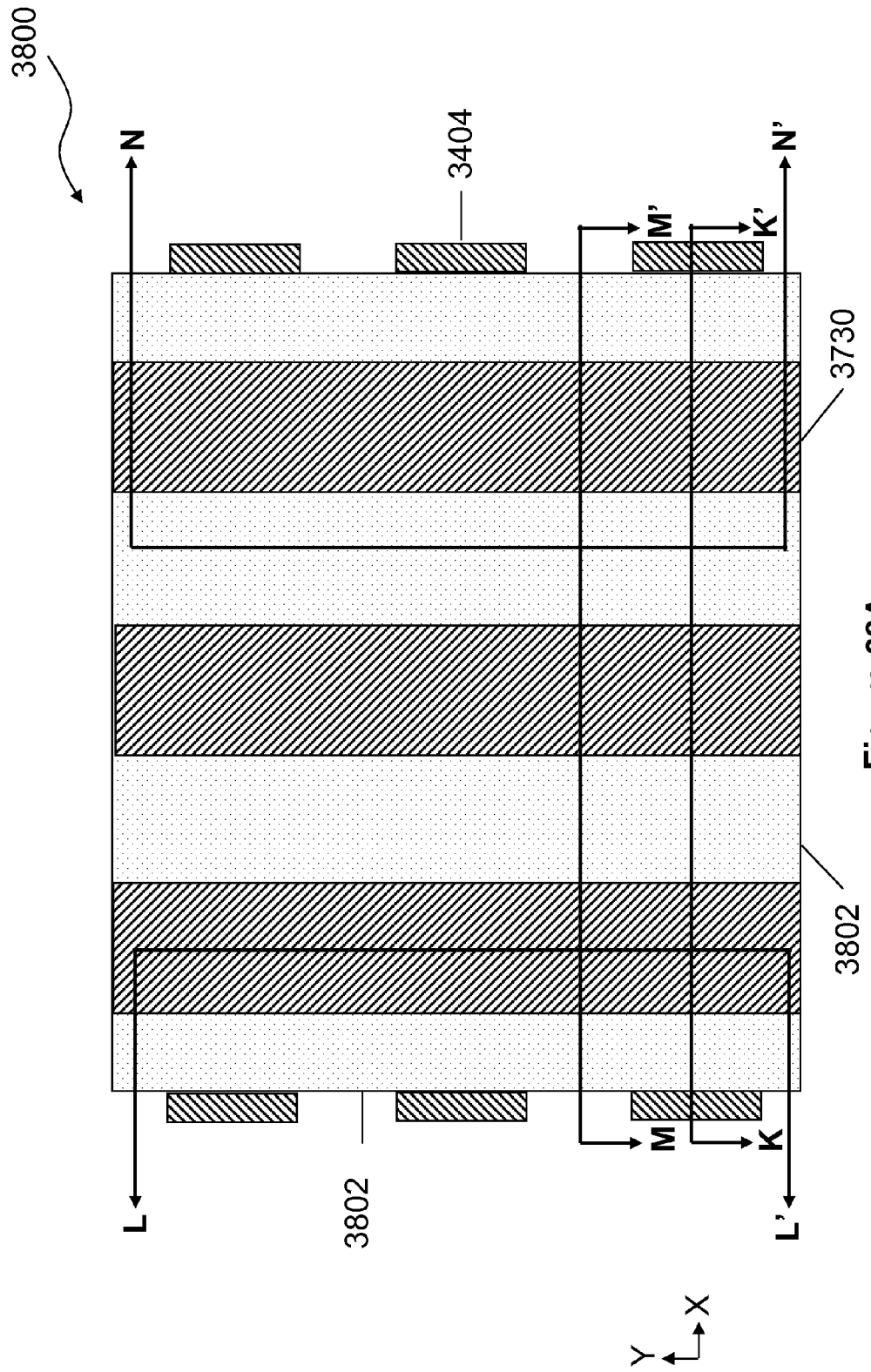
FIG. 38A illustrates plan a plan view corresponding to plan view 37E after deposition and planarization of a protective insulator.

Next, methods 3390 deposit and planarize an insulating layer forming insulator 3802 using industry methods to complete the cross point memory array 3800 illustrated in plan view in FIG. 38A. A passivation layer may be deposited on the top surface of plan view 38A. Alternatively, the methods 3390 planarization step may not planarize the insulating layer to the top surface of array wires 3730, thereby forming both a insulating layer between array lines 3730 and a passivation layer above array wires 3730. Cross point memory array 3800 and other structures shown in various cross sections described further below correspond to cross point sub-array 2120 shown schematically in FIG. 21. Multiple cross point memory arrays 3800 may be fabricated on a chip to form cross point memory array 2100 illustrated schematically in FIG. 21. In this example, CNT fabric layer 3426 was used and the resulting NV CNT resistive block switches include an integrated diode switch corresponding to cross point memory array 2300, which includes a select diode in 1-RS cell 2350, both shown schematically in FIGS. 23A and 23B, respectively. Select diode 1-RS cell 2380 illustrated in FIG. 23C may be used instead of 1-RS cell 2350.

Cross section 3810 along the X-direction illustrated in FIG. 38B, corresponds to cross section KK' shown in FIG. 38A, and shows patterned contacts 3804 between top array wires 3730 and underlying CNT fabric layer 3426. CNT switching regions 3452 are at the intersection of top array wire 3730 and bottom array wire 3404 on substrate 3402. High-R CNT fabric isolation regions 3454, formed by ion implant 3442, prevent current flow between adjacent cell CNT switching regions 3452 of NV CNT resistive switches 3812 through CNT fabric layer 3426. NV CNT resistive block switch 3812 is illustrated in cross section 3810 with a minimum dimension F in the X-direction. NV CNT resistive block switch 3812 corresponds to resistive change memory element 450 illustrated and described further above with respect to FIG. 4B.

Cross section 3820 along the Y-direction illustrated in FIG. 38C, corresponds to cross section LL' shown in FIG. 38C, and shows patterned contact 3804 between top array wire 3730 and underlying CNT fabric layer 3426. CNT switching regions 3452 are at the intersection of top array wire 3730 with underlying contact layer 3804 and bottom array wire 3404 on substrate 3402. High-R CNT fabric isolation regions 3654, formed by ion implant 3602, prevent current flow between adjacent cell CNT switching regions 3452 of NV CNT resistive switches 3812 through CNT fabric layer 3426. NV CNT resistive block switch 3812 is illustrated in cross section 3820 with a minimum dimension F in the Y-direction. NV CNT resistive block switch 3812 corresponds to resistive change memory element 450 illustrated and described further above with respect to FIG. 4B.

Cross section 3830 along the X-direction illustrated in FIG. 38D, corresponds to cross section MM' shown in FIG. 38D, and shows patterned contacts 3804 between top array wires 3730 and underlying CNT fabric layer 3426. High-R CNT fabric isolation regions 3654 and 3454 alternate along the length of CNT fabric 3426 and prevent leakage between cell CNT switching regions 3452 of NV CNT resistive switches 3812.

Cross section 3840 along the Y-direction illustrated in FIG. 38E, corresponds to cross section NN' shown in FIG. 38E, and shows a cross section of insulator 3802 on the top surface of CNT fabric layer 3426. CNT fabric layer 3426 is a high-R CNT fabric isolation region 3454 formed by implant 3442 along the entire length. High-R CNT fabric isolation region 3454 prevents leakage between cell CNT switching regions 3452 of NV CNT resistive switches 3812.

Methods 3300 and corresponding cross point memory array 3800 illustrated in plan view FIG. 38A and cross sections illustrated in FIGS. 38B-38E describe methods of fabrication and corresponding structures that may be used to implement cross point sub-arrays 2120 and cross point memory array 2300 illustrated schematically in FIGS. 21 and 23, respectively. Cross point memory array 3800 enables vertical current flow between intersecting top array wires 3730 and bottom array wires 3404, while preventing lateral current flow in any direction. Multiple cross point memory arrays 3800 may be fabricated in a chip to form cross point memory array 2100 illustrated schematically in FIG. 21 and cross point memory array 2300 illustrated in FIG. 23A. For minimum dimensions F=15 nm, cell periodicity=2F=30 nm. For 10,000 bits per array line, for example, then array lines are approximately 300 µm in length. The X-direction and Y-direction array lines may have different bits per bit lines. In this example, assuming the same number of bits per array line, then bottom array wires 3404 illustrated in FIG. 34A are F=15 nm wide and $l_X$=300 µm in length. Bottom array wire 3404 corresponds to X-direction array wire 2125 illustrated in FIG. 21. Also in this example, assuming the same number of bits per array line, then top array wires 3430 illustrated in FIG. 34C are F=15 nm wide and $l_Y$=300 µm in length. Top array wire 3430 corresponds to Y-direction array wire 2130 illustrated in FIG. 21. Using methods (of fabrication) 3300, integrated NV CNT resistive block switches 3812 illustrated in FIGS. 38B and 38C, have an X-direction dimension of F=15 nm and Y-direction dimension F=15 nm. The NV CNT resistive block switch dimensions of 15×15 nm were formed by the intersection of overlapping array wires having dimensions of 15 nm by 300 µm, without requiring the formation of 15×15 nm shapes as described further above. Methods 3300 are compatible with scalable cross point memory arrays to smaller dimensions.

For example, cross point memory array 3800 illustrated in plan view FIG. 38A and cross sections illustrated in FIGS. 38B-38E may be scaled to F=10 nm. For minimum dimensions F=10 nm, cell periodicity=2F=20 nm. For 10,000 bits per array line, for example, then array lines are approximately 200 µm in length. The X-direction and Y-direction array lines may have different bits per bit lines. In this example, assuming the same number of bits per array line, then bottom array wires 3404 illustrated in FIG. 34A are F=10 nm wide and $l_X$=200 µm in length. Also in this example, assuming the same number of bits per array line, then top array wires 3430 illustrated in FIG. 34C are F=10 nm wide and $l_Y$=200 µm in length. Using methods (of fabrication) 3300, integrated NV CNT resistive block switches 3812 illustrated in FIGS. 38B and 38C, have an X-direction dimension of F=10 nm and Y-direction dimension F=10 nm. The NV CNT resistive block switch dimensions of 10×10 nm were formed by the intersection of overlapping array wires having dimensions of 10 nm by 200 µm, without requiring the formation of 10×10 nm shapes as described further above. Methods 3300 are compatible with scalable cross point memory arrays to minimum dimensions less than 10 nm.

While methods 3300 have been used to form cross point memory array 3800 using CNT fabric layers, conductors, and insulators to form NV CNT resistive block switch 3812 memory cells, methods 3300 may also be applied to integrate graphic layers and buckyball layers to form cross point resistive change memory cells illustrated further above with respect to FIGS. 1D, 1E, 5, and 6 described further above. For example, NV graphitic resistive block switch 540 illustrated in FIG. 5D, which includes switch graphitic layer 544 and diode graphitic layer 514, may be formed instead of NV CNT resistive block switch 3812 illustrated in FIGS. 38B and 38C. Also, for example, NV buckyball resistive block switch 640 illustrated in FIG. 6D, which includes switch buckyball layer 644 and diode buckyball layer 614, may be formed instead of NV CNT resistive block switch 3812 illustrated in FIGS. 38B and 38C.

Combinations of CNT fabric layers, graphitic layers, and buckyball layers illustrated in FIGS. 5 and 6 may also be used to form cross point memory cells. For example, NV CNT resistive block switch 520 illustrated in FIG. 5B, which includes switch nanotube fabric layer 524 and diode graphitic layer 514, may be formed instead of NV CNT resistive block switch 3812 illustrated in FIGS. 38B and 38C. Also, for example, NV CNT resistive block switch 620 illustrated in FIG. 6B, which includes switch nanotube fabric layer 624 and diode buckyball layer 614, may be formed instead of NV CNT resistive block switch 3812 illustrated in FIGS. 38B and 38C, Other combinations, not shown, of CNT fabric layers, graphitic layers, and buckyball layers may also be used.

Methods 3300 may also be used to form cross point phase change memory cells using phase change material, cross point metal-oxide memory cells, and other cross point memory cells using still other materials.

Figure 39:
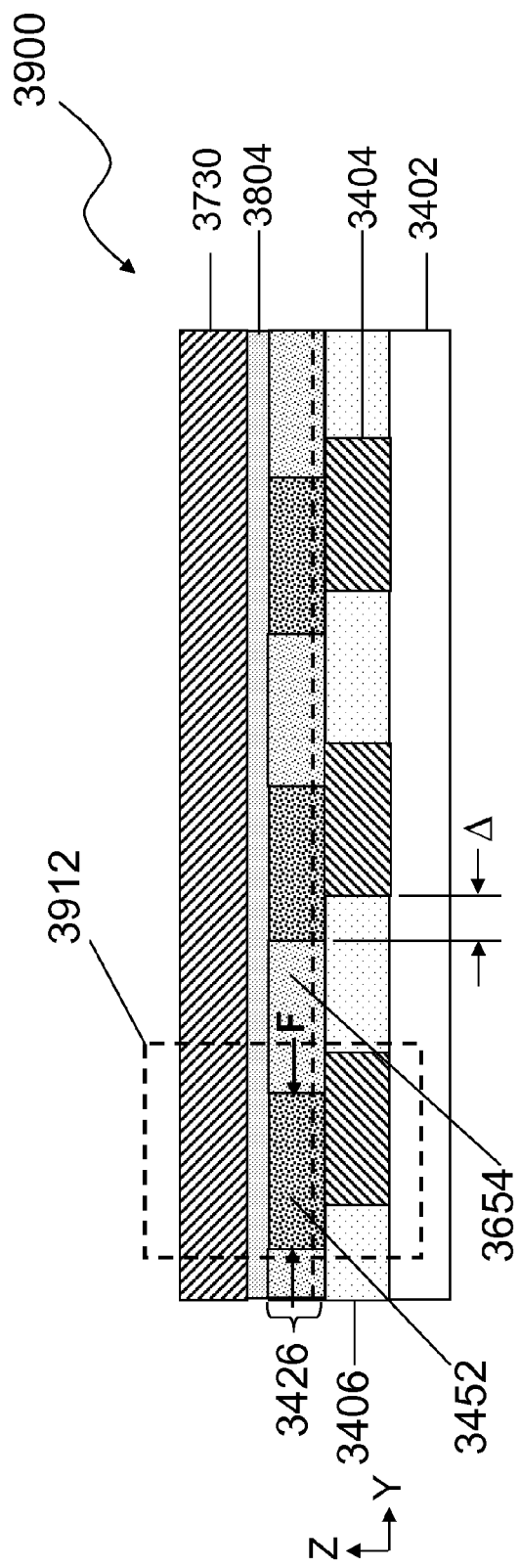
FIG. 39 illustrates a cross section in which sacrificial top marking wires are misaligned with respect to bottom array wires to show integrated nonvolatile CNT resistive block switch insensitivity to the alignment; CNT switching regions of minimum dimension F are also defined by the intersection of array wires.

Methods 3300 result in NV CNT resistive block switches 3812 in which CNT switching regions 3452 are self-aligned in the X-direction to top array wires 3730. However, NV CNT resistive block switches 3812 CNT switching regions 3452 are not self-aligned to bottom array wires 3404 in the Y direction because methods 3300 use sacrificial array masking wires 3502 illustrated in FIG. 35B, aligned to, and positioned above, bottom array wires 3404. NV CNT resistive block switches 3812 illustrated in the Y-direction in FIG. 38C are shown with aligned sacrificial array masking wires 3502 and bottom array wires 3404. Cross section 3900 illustrated in FIG. 39 shows NV CNT resistive block switches 3912 in which CNT switching regions 3452 and corresponding high-R CNT fabric isolation regions 3654 are misaligned by an amount Δ relative to bottom array wires 3404. For example, Δ may represent a misalignment of +−0.3F. For F=15 nm, then Δ=4.5 nm. For F=10 nm, then Δ=3.0 nm. Misalignment Δ does not change cross point memory array 3800 density (dimensions). Misalignment Δ of 0.3F reduces the bottom surface area contact of CNT switching region 3452 with bottom array wires 3404 from 100% to 70%. The top surface of CNT switching region 3452 coverage remains 100% because of self-alignment with respect to top array wires 3730. NV CNT resistive block switch 3912 electrical characteristics remain essentially the same as those of NV CNT resistive block switch 3812. US Pub. 2008/0160734 shows NV CNT resistive block switches with full and partial coverage of surfaces having essentially the same electrical characteristics.

Forming Logic Functions with Cross Point Arrays, Programmable Array Logic (PAL), Diode-Resistor Logic (DRL), and Field Programmable Gate Arrays (FPGAs), and ESD Protect Devices At this point in the specification, the focus is changed from nonvolatile memory to configurable logic, i.e. resistive change logic elements using the same underlying technology used in memory: carbon nanotubes, graphitic carbon, and buckyballs and corresponding fabrication methods. Cross point arrays for signal routing, voltage distribution, and power distribution is described with respect to FIGS. 40 and 41; a programmable logic function (PAL) is described with respect to FIG. 42. In this example, a cross point array in a memory mode is used to configure cross point array bits used to generate logic functions, and the logic function is generated in logic mode. Optionally, the cross point array in a memory mode may be used as a NV embedded memory; combinatorial diode-resistor logic (DRL) functions are shown as DRL AND gates and DRL OR gates with respect to FIGS. 43A and 43B; Field programmable gate arrays (FGPAs) are formed using combinations of configurable nonvolatile select circuits, configurable logic blocks (CLBs) using DRL logic gates and cross point array look-up-tables (LUTs), and programmable switch matrices (PSM) to route signals between CLBs to form full-function FPGA logic are described with respect to FIGS. 44-47; and ESD protect devices are described with respect to FIG. 48.

Cross Point Arrays Used for Signal Routing and/or Voltage or Power Distribution

Figure 40:
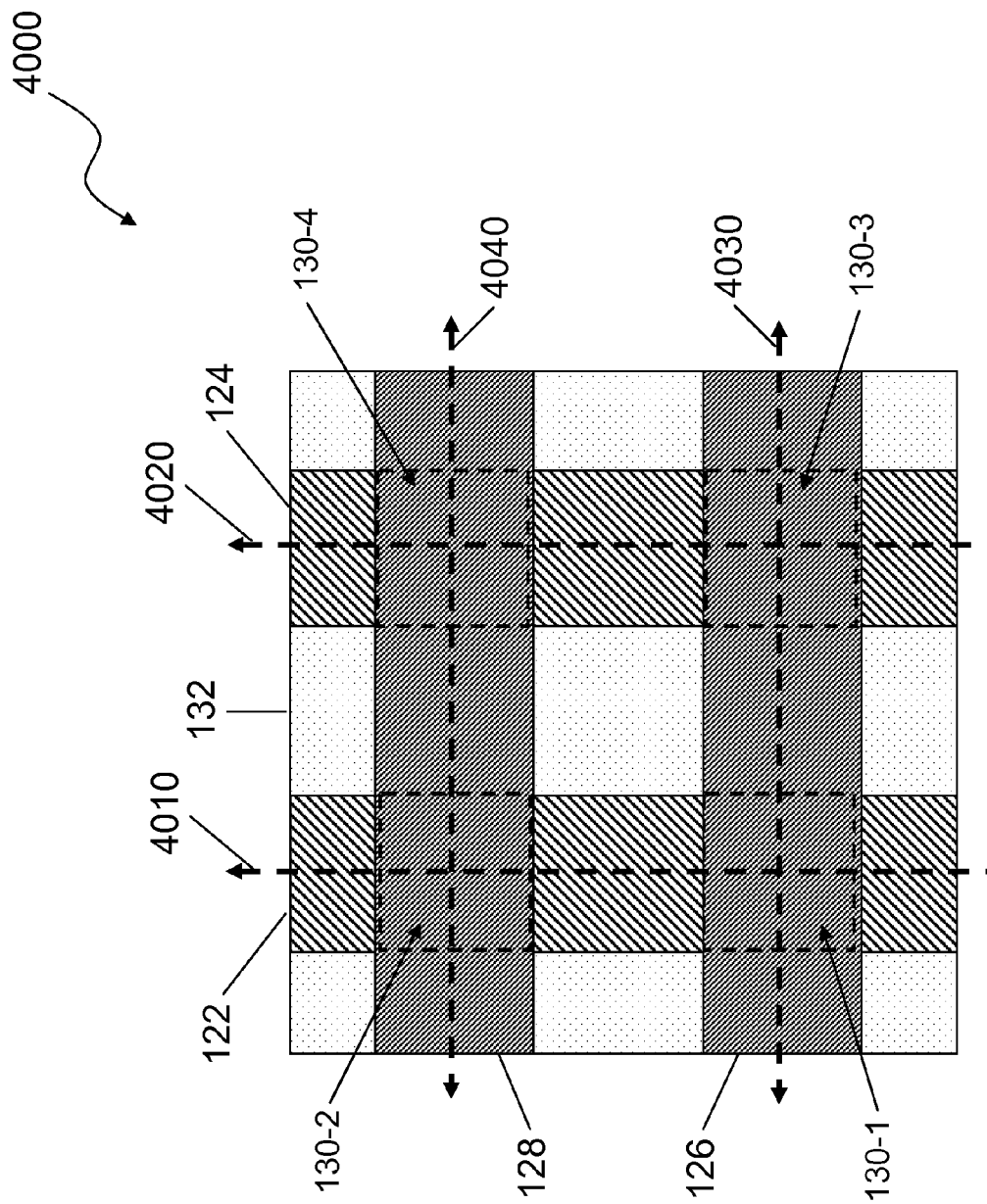
FIG. 40 illustrates a cross point array used to interconnect top and bottom wires for purposes of signal routing, voltage distribution, and/or power distribution. All NV CNT resistive block switches are in a high resistance RESET state.

FIG. 40 illustrates a plan view of cross point array 4000 that may be used to route signals, distribute power supply voltages, and distribute power along and between buses, referred to as wires. Cross point array 4000 corresponds structurally to cross point array 120 illustrated in FIG. 1B-1, with corresponding cross sections 1B-2, and 1B-3. Two-terminal NV CNT resistive block switches 130-1, 130-2, 130-3, and 130-4 may used to selectively connect bottom wires 122 and 124 with top wires 126 and 128. Referring to FIGS. 1B-1, 1B-2, and 1B-3, the emphasis is on maximizing cross point array density with cross point switches of F×F minimum dimensions. However, referring to FIG. 40, the emphasis is on signal and/or voltage and/or power distribution with low voltage drop, and hence low ON-state $R_{ON}$ resistance values for NV CNT resistive block switches. Therefore, dimensions may be much larger than minimum dimensions F because low resistance values require many more parallel conductive paths in the resistive change cross point array switching elements. $R_{ON}$ resistance values may vary depending on the application. By way of examples: $R_{ON}$ in the range of 1-100Ω for some applications, 100-1,000Ω, and 1,000-10,000Ω for other applications. Hence, instead of F=10 nm dimensions, for example, NV CNT resistive block switch dimensions may be 100×100 nm, 1×1 μm, 10×10 μm, 100×100 μm, or have still other dimensions, as needed to meet desired $R_{ON}$ resistance values. Nonvolatile cross point switches may be formed with NV CNT resistive block switches 130-1, 130-2, 130-3, and 130-4 as illustrated in FIGS. 1B and 1C. However, these NV cross point switches may also be formed with NV graphitic resistive block switch 162 illustrated in FIG. 1D, or NV buckyball resistive block switch 182 illustrated in FIG. 1E.

Referring to FIG. 40, cross point array 4000 may perform a routing function. In the example illustrated in FIG. 40, NV CNT resistive block switches 130-1, 130-2, 130-3, and 130-4 are all in a high resistance $R_{OFF}$ RESET state and cross point array 4000 has not been configured for signal routing. For example, $R_{OFF}$ may be in the Giga-Ohm range as illustrated in FIG. 15. Hence, signal propagation, voltage distribution, or power distribution remains within individual wires, with no propagation or distribution between wires. By way of example, propagation/distribution 4010 remains within bottom wire 122, propagation/distribution 4020 remains within bottom wire 124, propagation/distribution 4030 remains within top wire 126, and propagation/distribution 4040 remains within top wire 128.

Referring to FIG. 41A, configured cross point array 4100 illustrated in FIG. 41A has been configured such that NV CNT resistive block switch 130-2 is in a low resistance $R_{ON}$ SET state interconnecting bottom wire 122 and top wire 128 through a resistance in the range of 1-10,000 Ohms, selected for the required application, such as signal propagation and/or voltage and/or power distribution as described further above. All other NV CNT resistive block switches remain in a high resistance state. When configuring specific NV CNT resistive cross point switches for routing purposes, there are no undesired interactions with adjacent switches that can result in parasitic losses (sneak current paths) such as illustrated in FIG. 2A, for example. This is because the state of adjacent switches is not modified during the configured switch operation. Accordingly, NV CNT resistive block switches may be near-Ohmic, for example, enabling bidirectional signal, voltage, and power flow. If desired, highly non-linear switches may be formed, and may include a series diode for unidirectional signal, voltage, and power flow. However, in these examples, near-Ohmic NV CNT resistive block switches are assumed. Applied voltages and currents used to write NV CNT resistive block switches, switching them between low resistance SET and high resistance RESET states, is as described further above with respect to FIG. 19.

Referring to FIG. 41A, configured cross point array 4100 with interconnected bottom wire 122 and top wire 128 connected by NV CNT resistive block switch 130-2 results in propagation/distribution 4105. Propagation/distribution 4105 flows in both bottom array wire 122 and top array wire 128. Propagation/distributions 4020 and 4030 flow in bottom wire 124 and top wire 126, respectively, as also illustrated in FIG. 40, and remain unchanged.

Referring to FIG. 41B, configured cross point array 4120 has been configured such that NV CNT resistive block switch 130-4 is in a low resistance $R_{ON}$ SET state and interconnects bottom wire 124 and top wire 128 through a resistance in the range of 1-10,000 Ohms, selected for the required application, such as signal propagation and/or voltage and/or power distribution. NV CNT resistive block switch 130-4 enables propagation/distribution 4125 of signal, voltage, or power through NV CNT resistive block switch 130-4 and remains within individual bottom wire 124 and top wire 128. All other NV CNT resistive block switches remain in a high resistance state. Propagation/distributions 4010 and 4030 flow in bottom wire 122 and top wire 126, respectively, as also illustrated in FIG. 40, and remain unchanged.

Referring to FIG. 41C, configured cross point array 4140 has been configured such that NV CNT resistive block switches 130-2 and 130-3 are in a low resistance $R_{ON}$ SET state and interconnect bottom wire 122 and top wire 128, and bottom wire 124 and top wire 126, respectively, through a resistance in the range of 1-10,000 Ohms, selected for the required application, such as signal propagation and/or voltage and/or power distribution. NV CNT resistive block switches 130-2 and 130-3 enable propagation/distributions 4145 and 4150, respectively, of signal, voltage, or power. Propagation/distribution 4145 flows through NV CNT resistive block switch 130-2 and remains within individual bottom wire 122 and top wire 128. Propagation/distribution 4150 flows through NV CNT resistive block switch 130-3 and remains within individual bottom wire 124 and top wire 126. All other NV CNT resistive block switches, in this example NV CNT resistive block switches 130-1 and 130-4, remain in a high resistance state.

Referring to FIG. 41D, configured cross point array 4160 has been configured such that NV CNT resistive block switches 130-2 and 130-4 are in a low resistance $R_{ON}$ SET state and interconnect top wire 128 with bottom wires 122 and 124, respectively, through a resistance in the range of 1-10,000 Ohms, selected for the required application, such as signal propagation and/or voltage and/or power distribution. NV CNT resistive block switches 130-2 and 130-4 enable propagation/distribution 4165 of signal, voltage, or power. Propagation/distribution 4165 flows through NV CNT resistive block switches 130-2 and 130-4 and remains within individual top wire 128 and bottom wires 122 and 124. All other NV CNT resistive block switches, in this example NV CNT resistive block switches 130-1 and 130-3, remain in a high resistance state. Propagation/distribution 4030 flows in top wire 126, as also illustrated in FIG. 40, and remain unchanged.

Other configured cross point arrays may also be formed using the principles illustrated with respect to FIGS. 41A, 41B, 41C, and 41D.

Figure 41:
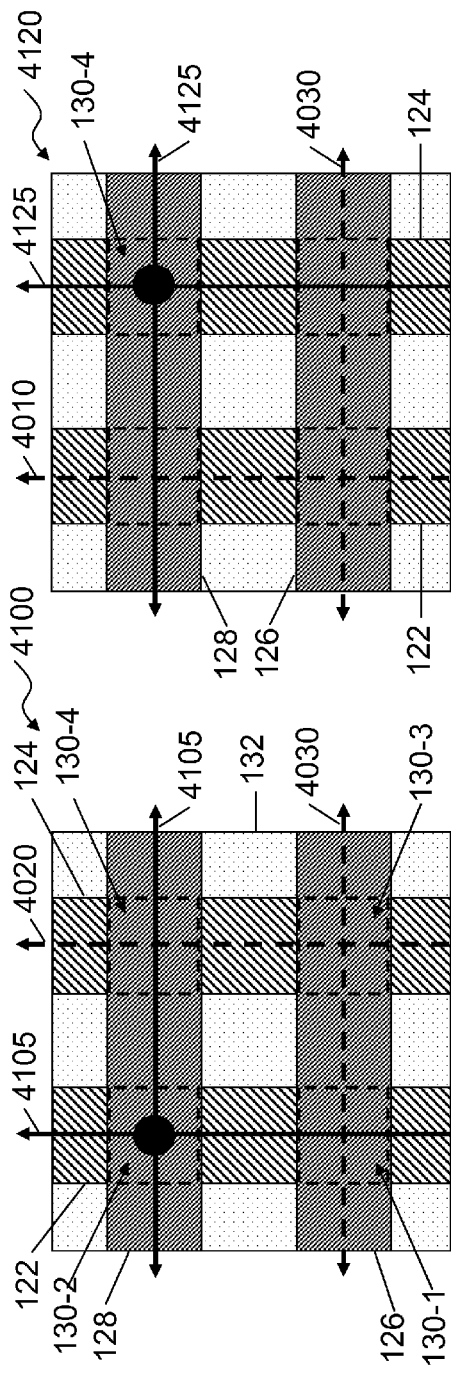
FIGS. 41A, 41B, 41C, and 41D illustrate the cross point array of FIG. 40 in which selected NV CNT resistive block switches are in a low resistance SET state.

Examples of configured cross point arrays that enable various propagation/distribution combinations of signal propagation and/or voltage and/or power distribution have been described further above with respect to FIGS. 40 and 41. However, configured cross point arrays may also be used in various circuit configurations. For example, configured cross point array 4160 may be used as a voltage divider. NV CNT resistive block switches may be switched to various $R_{ON}$ SET-state resistance values over a wide range of resistance as illustrated in U.S. Pat. No. 8,102,018. For example, a voltage divider network may be formed that includes NV CNT resistive block switch 130-2 to an $R_{ON}$ value of R1 between bottom wire 122 and top wire 128, and NV CNT resistive block switch 130-4 set to an $R_{ON}$ value of R2 between top wire 128 and bottom wire 124. An input voltage $V_{IN}$ is applied to bottom wire 122 with respect to a common ground reference, and bottom wire 124 is connected to ground. Voltage divider network output $V_{OUT}$ on top wire 128 results from the ratio of $R_{ON}$ resistance values R1 and R2 such that $V_{OUT}=[R2/(R1+R2)]V_{IN}$. Values of R1 and R2 may be set independently over a large range of resistance values. By way of example, if R1=150 kΩ and R2=50 kΩ, then voltage divider output voltage $V_{OUT}=0.25\ V_{IN}$; if R1=150Ω and R2=150 kΩ, then $V_{OUT}=0.50\ V_{IN}$; and if R1=50 kΩ and R2=150 kΩ, then $V_{OUT}=0.750\ V_{IN}$. The voltage divider output voltage $V_{OUT}$ may be set to any other multiple of $V_{IN}$, generating various analog voltage values.

In some cases, it is desirable to have multiple voltage divider output voltage $V_{OUT}$ values simultaneously available. A way of achieving this is to have three configured cross point arrays with different combinations of R1 and R2. For example, a first configured cross point array 4160 with R1=150 kΩ and R2=50 kΩ with $V_{OUT}=0.25\ V_{IN}$; and a second configured cross point array 4160 with R1=150 kΩ and R2=150 kΩ with $V_{OUT}=0.50 V_{IN}$; and a third configured cross point switch 4160 with R1=50 kΩ and R2=150 kΩ with $V_{OUT}=0.75\ V_{IN}$. Alternatively, three different voltage divider output voltage $V_{OUT}$ values may be available simultaneously from the same configured cross point array if there are more total cross point switches and top and bottom wires available.

Cross Point Array-Based Programmable Array Logic (XP-PAL)

Cross point array-based programmable array logic (XP-PAL) 4200 illustrated in FIG. 42 may be configured as a memory to program individual bits to form logic functions as described further below. Then, XP-PAL 4200 is operated in a logic mode to generate the logic function corresponding to the programmed memory bits. Optionally, XP-PAL 4200 may be used as embedded memory function.

XP-PAL 4200 uses a configuration controller 4202 with input INP1 and mode select 4230 output to activate an XP-PAL 4200 logic mode of operation after programmable/re-programmable AND array 4205 bits have been programmed. Alternatively, mode select 4230 may activate a memory mode. When in memory mode, XP-PAL 4200 logic functions are disabled, and XP-PAL 4200 may be used instead as an embedded NRAM memory with a memory control function, word decoders and drivers, bit decoders and drivers, and latch and I/O functions. Memory operation is similar to descriptions with respect to FIG. 19. When in memory mode, cells may be programmed or reprogrammed to implement new XP-PAL 4200 logic functions. Horizontal array lines each form a single product term such as PT1 when XP-PAL 4200 operates in a logic mode or a bit line such as BL1 when operating in a memory mode. Vertical array lines may form a single logic input in a logic mode such as input logic IL1 or form a word line such as word line WL1 when operating in a memory mode. Logic or memory modes of operation are controlled by configuration controller 4202 based on input(s) INP1 by providing a low voltage (near ground) mode select signal 4230 for XP-PAL operation or by providing a high voltage (at or near $V_{DD}$) for memory write SET or RESET operations. SET results in a NV resistive switch low resistance state and RESET results in a NV resistive switch high resistance state as described with respect to FIG. 19.

In a logic operating mode, XP-PAL 4200 logic input circuits 4210 drive vertical array lines corresponding to logic variables A, $A_C$, B, and $B_C$, while feedback lines 3570 and 3575 provide logic output O1 that provides logic variable C and logic output O2 that provides logic variable D, respectively, as inputs. True and complement logic variables may be represented as A and $A_C$; B and $B_C$; C and $C_C$; and D and $D_C$, respectively. The combination of logic input circuits 4210 drive cathodes of integrated diode 4207B illustrated in cell 4207 as shown in FIG. 42, and logic states are stored as a nonvolatile resistance values in NV resistive switches 4207A connected to product term (PT) array lines. 1-RS cell 4207 corresponds to 1-RS cell 2380 illustrated in FIG. 23C. 1-RS cell 2380, formed between terminals 1 and 2, includes NV resistive switch 2385, corresponding to NV resistive switch 4207A and integrated diode 2390, corresponding to integrated diode 4207B. The anode of integrated diode 4207B is connected to a first terminal of NV resistive switch 4207A. Terminal 1 corresponds to the cathode of integrated diode 4207B and terminal 2 corresponds to a second terminal of NV resistive switch 4207A. Cell 4207 is formed between terminals 1 and 2. Terminals 2 connect a second terminal of NV resistive switches 4207A to horizontal array lines corresponding to product terms such as PT1, PT2, PT3, and PT4. Terminals 1 connect the cathodes of integrated diodes 4207B to logic input lines IL1, IL2 . . . , IL8. In a nanotube programmable array logic (NPAL) operating mode, XP-PAL 4200 operating voltage swings are kept below switching voltage level, less than or equal to 2 volts for example, with switching voltages for write modes SET and RESET typically 3 volts or higher. In a NPAL operating mode, each of the product terms is connected to a pull up PFET device connected to a power supply voltage V. Product term lines such as PT1 is in a high voltage state prior to the activation of input logic signals. In this example, PT1 remains in a high voltage state for any combination of inputs A, $A_C$, B, $B_C$, C, $C_C$, D, and $D_C$ if all NV resistive switches 4207A are in an OFF or high resistance state so no current can flow in cell 4207. Dotted circles in FIG. 42 indicate NV resistive switches 4207A that are in a low resistance SET state in this example. Nonvolatile cross point switches may be formed with NV CNT resistive block switches 130-1, 130-2, 130-3, and 130-4 as illustrated in FIGS. 1B and 1C. However, these NV cross point switches may also be formed with NV graphitic resistive block switch 162 illustrated in FIG. 1D, or NV buckyball resistive block switch 182 illustrated in FIG. 1E. Nonvolatile cross point switches may also be formed with resistive change memory elements illustrated in FIGS. 4, 5, 6, and 7.

In operation, in the case of product term PT4, the PT4 voltage level is V prior to input logic activation. However, if terminal 1 of integrated diode 4207B receives a low voltage such as zero volts, for example, from logic input $B_C$, then current flows through the corresponding cell and the corresponding pull up PFET, and PT4 voltage drops to a low voltage because the NV resistive switch in the cell between PT4 and logic input $B_C$ is in a low resistance state. However, if logic input $B_C$ is at a high voltage, such as 2 volts, the corresponding integrated diode is back biased and no current flows, and product term PT4 remains at voltage V. Product term PT3 high or low voltage value depends on the state of the NV resistive switch in the cell at the intersection of PT3, and logic input C, and corresponds to the behavior of PT4 as described further above.

In operation, product term PT2 may be activated depending on the state of two NV resistive switches and corresponding logic input levels. Product term PT2 is also at voltage V prior to logic input circuit 4210 activation. In the case of product term PT2, NV NT block switches at two cell locations, a first cell at the intersection of PT2 and $B_C$ and a second cell at the intersection of PT2 and $D_C$. If either the first cell is selected or the second cell is selected, PT2 transitions from voltage V to a low voltage such as a reference voltage at or near ground; and if both the first and second cells are selected, PT2 is also at a low voltage near ground.

In operation, each of the product terms PT1, PT2, PT3, and PT4 in programmable AND array 4205 correspond to the combination of all input signals on input lines (IL1-IL8) connected to the terminals 1 of the integrated diodes 4207B and the ON (low resistance) or OFF (high resistance) states of the corresponding NV resistive block switches 4207A in series as described in the examples described further above. Signal voltages on product terms PT1 and PT2 pass through mode select FETs and form inputs to two-terminal OR circuit 4250 whose output drives D-flip flop 4260. The output of D-flip flop 4260 is logic output O1. Product terms PT3 and PT4 pass through mode select FETs and form inputs to two-terminal OR circuit 4255 whose output drives D-flip flop 4265. The output of D-flip flop 4265 is logic output O2. Logic outputs O1 and O2 are fed back as logic inputs to programmable/reprogrammable AND array 4205 as described further above. D-flip flops 4260 and 4265 compensate for any voltage drops through integrated diodes in the array. OR gates may be formed using MOSFETs, or may also be formed using diode-resistor logic as described further below with respect to FIGS. 43A and 43B.

When configuring or reconfiguring the cells in programmable/reprogrammable AND array 4205, configuration controller 4202 mode select 4230 output transitions to a high voltage ($V_{DD}$ for example) and turns OFF corresponding FETs that enable/disable product terms PT1 and PT2 to the inputs of two terminal OR gate 4250 and product terms PT3 and PT4 to the inputs of two terminal OR gate 4265. FET transfer devices that enable/disable connections between memory mode word decoders and WL drivers 4215 with inputs INP2 and dual function input lines/word lines such as IL1/WL1, IL2/WL2, IL3/WL3, IL4/WL4, IL5/WL5, IL6/WL6, IL7/WL7, and IL8/WL8 are turned ON. Also, PFET pull up devices connected to dual function product term line/bit lines such as PT1/BL1, PT2/BL2, PT3/BL3, and PT4/BL4 are turned OFF and FET transfer devices that enable/disable connections between memory mode bit decode and BL drivers, and latch & I/O circuits 4220 with input INP3 and dual function product terms/bit lines such as PT1/BL1, PT2/BL2, PT3/BL3, and PT4/BL4 are turned ON. While FET transfer devices illustrated in FIG. 42 have shown NFET transfer devices, PFET transfer devices may be used instead, as well as CMOS transfer devices using both NFET and PFET.

Programming/reprogramming of programmable/reprogrammable AND array 4205 cells has been described in terms of an NRAM® operating modes. This approach uses some additional circuits such as memory mode word decoders and WL drivers 4215 and memory mode bit decoders and BL drivers, and latch & I/O circuits 4220 for example to simplify cell programming/reprogramming, and also to provide an embedded NRAM function option. However, it is possible to program/reprogram cells using only the XP-PAL 4200 logic input, output, and timing control circuits. Such an alternative approach requires more complex programs/programming methods.

Diode-Resistor Logic (DRL) Circuits

Diode-resistor logic (DRL) is an old technology as described for example in the reference: Frank Sterrett Davidson, "Design for a Diode-resistor Logic Circuit Family", George Washington University, 1967. A summary of diode-resistor logic operation is described with respect to FIG. 43A and FIG. 43B. Until recently, diodes have been formed with semiconductor materials such as Si, Ge, and many combinations of semiconductor materials such GaAs, and have typically been PN diodes, although Schottky diodes have been used as well. Resistors may be formed of conductors, semiconductors, doped oxides, and other materials. However, the advent of nanotechnology using materials such as carbon-based diode materials has revived interest in diode-resistor logic.

Figure 43:
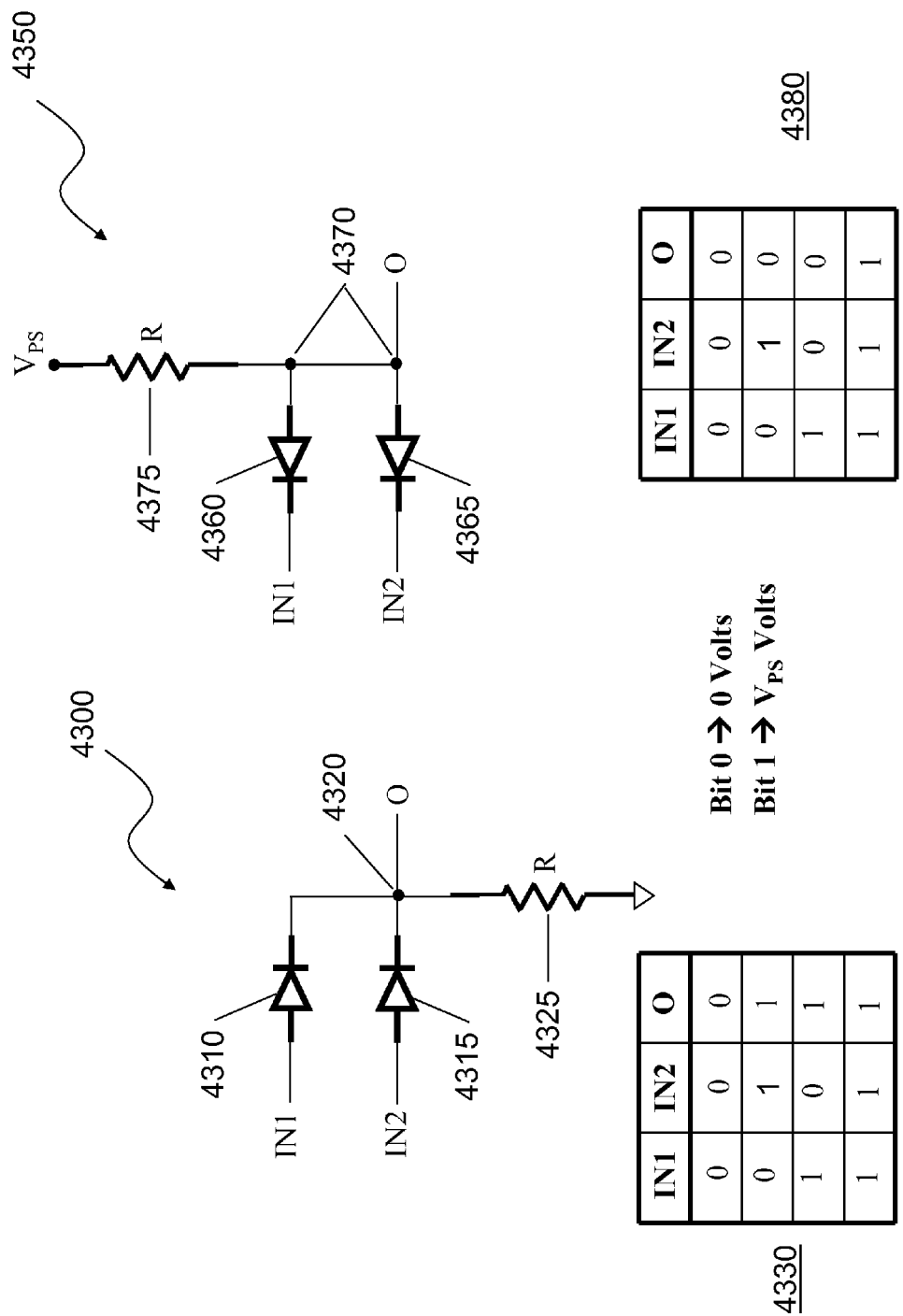
FIGS. 43A and 43B illustrate diode-resistor logic circuits.

Referring to FIG. 43A, diode-resistor logic (DRL) OR gate 4300 is illustrated with two voltage inputs IN1 and IN2 and a logic output O. Many more diode inputs may be used (not shown). IN1 is connected to the anode of diode 4310, IN2 is connected to the anode of diode 4315, and the cathodes of both diodes are connected to output node 4320. Resistor 4325 is connected to node 4320 and is also connected to a common low reference voltage; typically ground (zero volts).

In operation, IN1 and IN2 can swing between ground and power supply $V_{PS}$, although a voltage drop through a diode in a preceding stage may lower the total swing by the amount of a diode forward voltage drop $V_D$, typically in the range of 0.3-0.6 volts for example. If both IN1 and IN2 are at ground for example, then no current flows and resistor 4325 holds the output voltage O at ground, approximately zero volts in this example. However, if either IN1 or IN2 is at $V_{PS}$, then current flows through resistor 4325 and the output voltage O=$V_{PS}$−$V_D$. By way of example, if $V_{PS}$=3.5 V. and diode forward voltage drop is $V_D$=0.5 V., then $V_{OUT}$=3.0 V.

Still referring to FIG. 43A, assigning logic bit "0" to zero volts and logic bit "1" to $V_{PS}$, or $V_{PS}$−$V_D$, then logic table 4330 illustrates all combinations of IN1 and IN2 expressed as a corresponding logic bit "0" or corresponding logic bit "1", and $V_{OUT}$ is also expressed as a corresponding logic bit. Logic table 4330 corresponds to an OR logic function, illustrating that the corresponding circuit generates an OR logic function for DRL OR gate 4300.

Referring to FIG. 43B, diode-resistor logic (DRL) AND gate 4350 illustrated with two voltage inputs IN1 and IN2 and a logic output O. Many more diode inputs may be used (not shown). IN1 is connected to the cathode of diode 4360, IN2 is connected to the cathode of diode 4365, and the anodes of both diodes are connected to output node 4370. Resistor 4375 is connected to node 4370 and is also connected to power supply voltage $V_{PS}$.

In operation, IN1 and IN2 can swing between ground and power supply $V_{PS}$, although a voltage drop through a diode in a preceding stage may lower the total swing by the amount of a diode forward voltage drop $V_D$, typically in the range of 0.3-0.6 volts for example. If either, or both, N1 and IN2 are at ground for example, then current flows through resistor 4375 and the output voltage O at approximately zero volts; actually, output voltage O is at $V_D$, the forward diode voltage drop, so if $V_D$=0.5 volts for example, then output O=0.5 V. However, if both IN1 and IN2 are at $V_{PS}$, no current flows through resistor 4375 and the output voltage $V_{OUT}$=$V_{PS}$. By way of example, if $V_{PS}$=3.5 V. then $V_{OUT}$=3.5 V.

Still referring to FIG. 43B, assigning logic bit "0" to zero volts or $V_D$ and logic bit "1" to $V_{PS}$, then logic table 4380 illustrates all combinations of IN1 and IN2 expressed as a corresponding logic bit "0" or corresponding logic bit "1", and output O is also expressed as a corresponding logic bit. Logic table 4380 corresponds to an AND logic function, illustrating that the corresponding circuit generates an AND logic function for DRL AND gate 4350.

Carbon-diode diode-resistor logic (CD-DRL) gates may be formed by using carbon-based diode materials. Examples of carbon-based diode materials are diode CNT fabric layers, diode graphitic layers, and/or diode buckyball layers described in detail further above with respect to FIGS. 4F-4H, 5E-5G, and 6E-6G, respectively. Structures, fabrication, and operation are described for various carbon-based diode examples. CD-DRL gates may be formed by using carbon-based diodes illustrated in FIGS. 4F-4H, 5E-5G, and 6E-6G as diodes 4310, 4315, 4360, and 4365 illustrated in FIGS. 43A and 43B. Resistors 4325 and 4375, also illustrated in FIGS. 43A and 43B, respectively, may continue to be formed of conductors, semiconductors, doped oxides, and other materials. However, carbon-based resistors, for example carbon nanotube resistors fabricated from patterned carbon nanotube fabrics may be formed and used as illustrated in U.S. Pat. No. 7,365,632 hereby incorporated by reference in its entirety. Patterned graphitic layers, or patterned buckyball layers, may also be used to form resistors. The combination of carbon-based diodes and carbon-based resistors to form CD-DRL OR and AND logic gates may be used as logic families. Such CD-DRL gates integrate well with array wires, including multiple stacked levels of array wires, because these gates do not have to be in an underlying semiconductor substrate for example.

Referring to carbon-based diodes 470 and 480 illustrated in FIGS. 4F and 4G, respectively, carbon-based diodes 470 and 480 are formed as Schottky-type diodes using patterned diode CNT fabric layers described further above with respect to structure, fabrication, and operation. Carbon-based diode 490 illustrated in FIG. 4H is formed as a PN diode using patterned diode CNT fabric layers also described further above with respect to structure, fabrication, and operation.

Referring to carbon-based diodes 570 and 580 illustrated in FIGS. 5E and 5F, respectively, carbon-based diodes 570 and 580 are formed as Schottky-type diodes using patterned diode graphitic layers described further above with respect to structure, fabrication, and operation. Carbon-based diode 590 illustrated in FIG. 5G is formed as a PN diode using patterned diode graphitic layers also described further above with respect to structure, fabrication, and operation.

Referring to carbon-based diodes 670 and 680 illustrated in FIGS. 6E and 6F, respectively, carbon-based diodes 670 and 680 are formed as Schottky-type diodes using patterned diode buckyball layers described further above with respect to structure, fabrication, and operation. Carbon-based diode 690 illustrated in FIG. 6G is formed as a PN diode using patterned diode buckyball layers also described further above with respect to structure, fabrication, and operation.

Field Programmable Gate Arrays (FPGAs)

Figure 42:
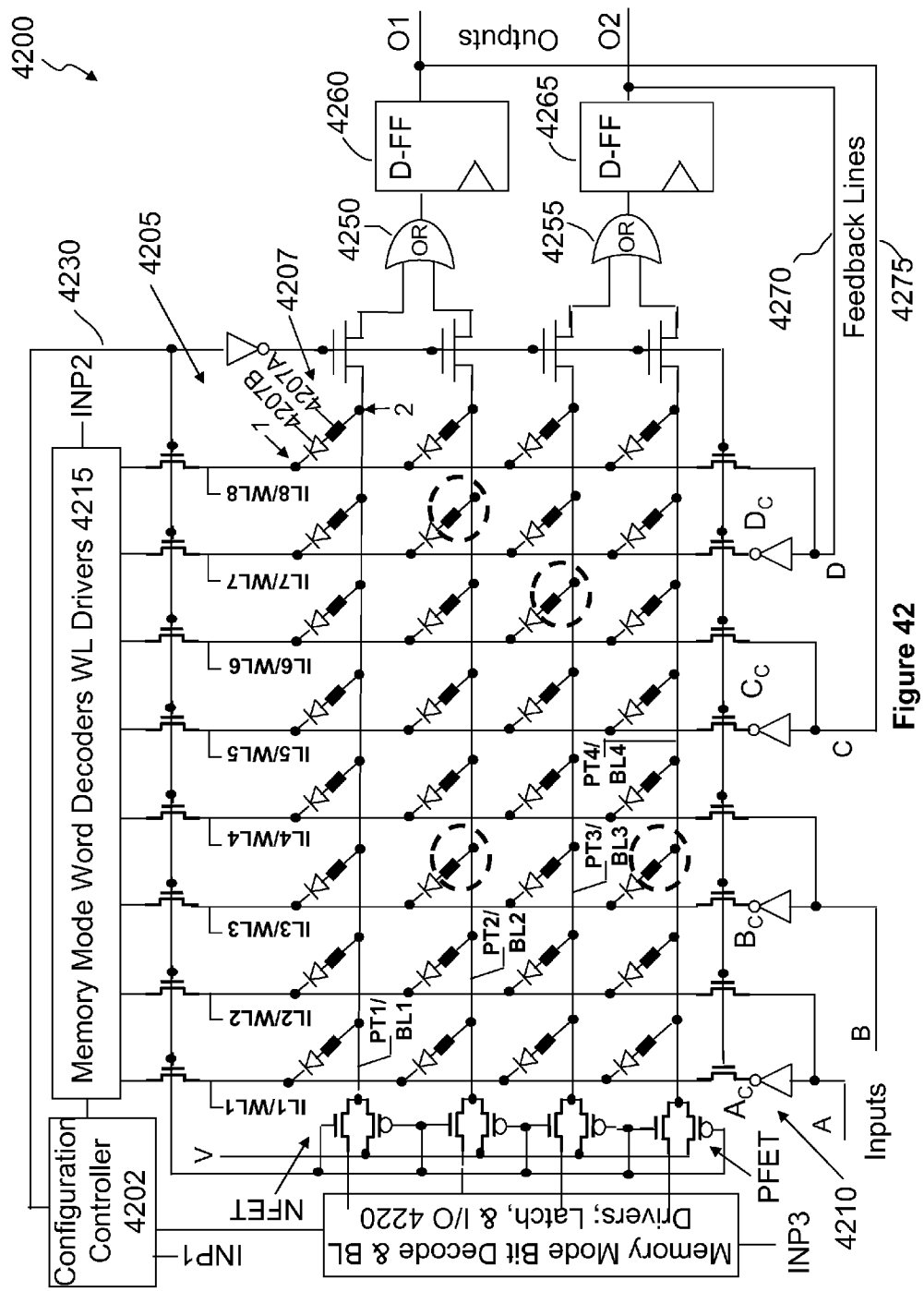
FIG. 42 illustrates a cross point array-based programmable array logic function.
Figure 44:
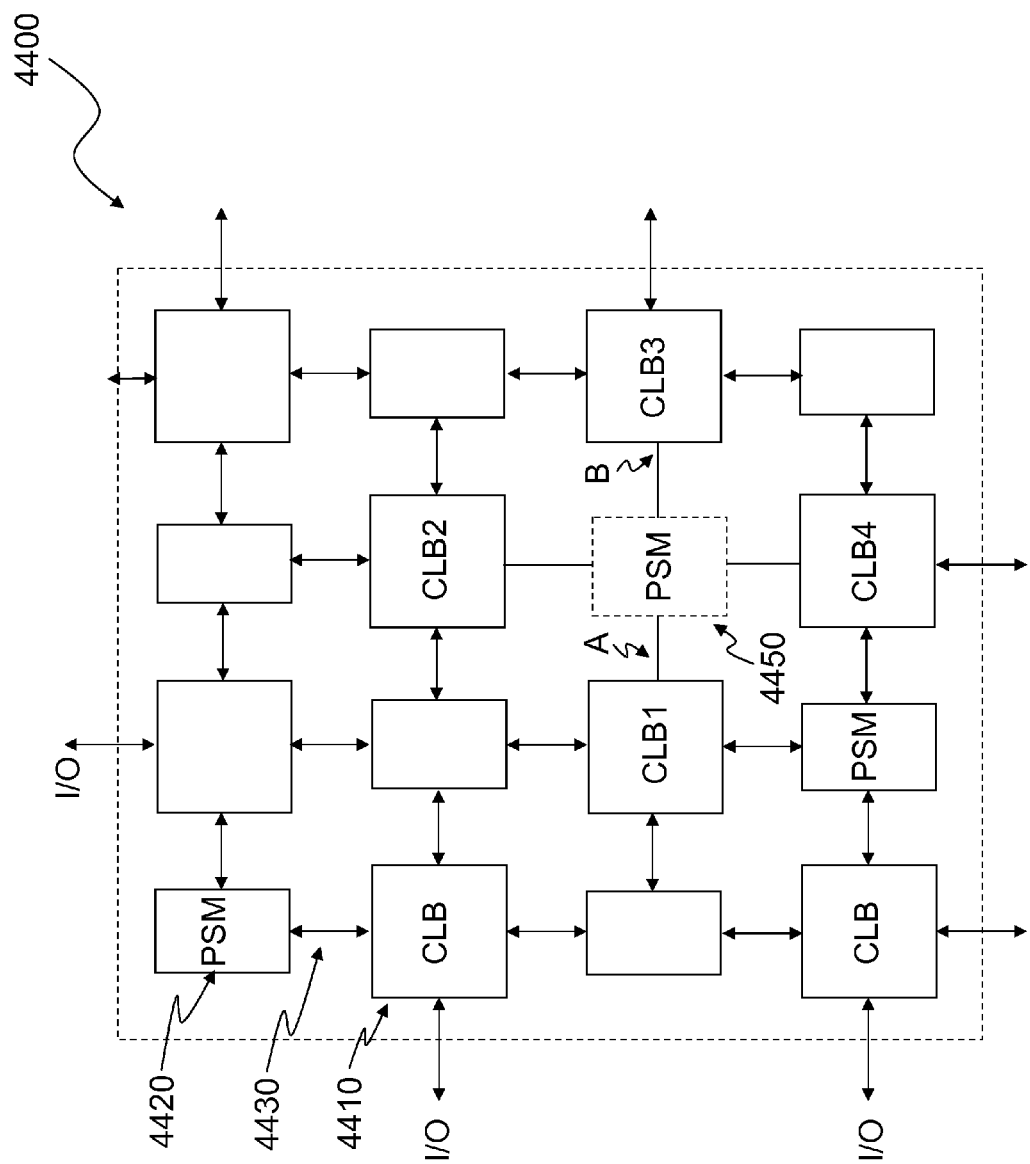
FIG. 44 illustrates a field programmable gate array.

FPGAs were invented by Ross Freeman, cofounder of the Xilinx Corporation, in 1984 to overcome the limitations of array logic, such as XP-PAL 4200 illustrated in FIG. 42. FPGA architectures are dominated by interconnects. FPGAs are therefore much more flexible in terms of the range of designs that can be implemented and logic functions in the millions and tens of millions and eventually in the hundreds of millions of equivalent logic gates may be realized. In addition, the added flexibility enables inclusion of higher-level embedded functions such adders, multipliers, CPUs, and embedded memory. FPGA architecture and circuit implementations are described in U.S. Pat. No. Re. 34,363 to Freeman filed on Jun. 24, 1991, and SRAM memory controlled routing switch circuit implementations are described in U.S. Pat. No. 4,670,749 to Freeman filed on Apr. 13, 1984, the contents of which are incorporated herein by reference in their entirety. FPGA 4400 (as shown in FIG. 44) schematically illustrates basic concepts taught by Freeman in the above referenced patents by Freeman. In this application, SRAM control is replaced by control using nonvolatile CNT-based, graphitic-based, and/or buckyball-based electrical functions as described further below.

Referring now to FIG. 44, FPGA 4400 includes an array of configurable (programmable) logic blocks (CLBs) such as CLB 4410 and programmable switch matrices (PSMs) such as PSM 4420. Interconnections between CLBs and PSMs may be relatively short to provide local wiring (such as interconnect 4430) or relatively long to provide global wiring (not shown). Input/output (I/O) signal buses, typically with multiple lines per bus, are also shown in FIG. 44.

A programmable switch matrix PSM 4450 interconnecting four CLB blocks CLB1, CLB2, CLB3, and CLB4 is illustrated in FIG. 44. In this example, PSM 4450 may be formed using cross point array 4000 illustrated in FIG. 40 and used to interconnect CLB1, CLB2, CLB3, and CLB4 in various combinations as illustrated with respect to FIGS. 45A-45D. Nonvolatile cross point switches may be formed with NV CNT resistive block switches 130-1, 130-2, 130-3, and 130-4 as illustrated in FIGS. 1B and 1C. However, these NV cross point switches may also be formed with NV graphitic resistive block switch 162 illustrated in FIG. 1D, or NV buckyball resistive block switch 182 illustrated in FIG. 1E.

In the PSM 4450 configuration examples that follow, referring to FIG. 40, CLB1 is connected to top wire 128, CLB2 is connected to bottom wire 122, CLB3 is connected to top wire 126, and CLB4 is connected to bottom wire 124. There are no interconnections between CLB1, CLB2, CLB3, and CLB4 when all cross point arrays are a high resistance OFF state as illustrated in FIG. 40.

Referring to FIGS. 41A-41D, NV cross point switches in a low resistance ON state is shown by a dark circle at the intersection of a top wire and a bottom wire. With respect to configured cross point array 4100, CLB1 and CLB2 are electrically connected; with respect to configured cross point array 4120, CLB1 and CLB4 are electrically connected; with respect to configured cross point array 4140, CLB1 and CLB2 are electrically connected and CLB3 and CLB4 are also electrically connected; and with respect to configured cross point array 4160, CLB1 and both CLB2 and CLB4 are electrically connected. Other electrically interconnected CLB combinations may be formed as well.

CLBs may be formed by combining look up tables (LUTs), formed with NRAM in this example, with flip flops and multiplexers as illustrated schematically by CLB 4700 in FIG. 47 and described further below. Alternatively, CLBs may be formed by combining combinatorial logic with flip flops and multiplexers as illustrated by CLB 4600 in FIG. 46, as described further below.

Figure 45B:
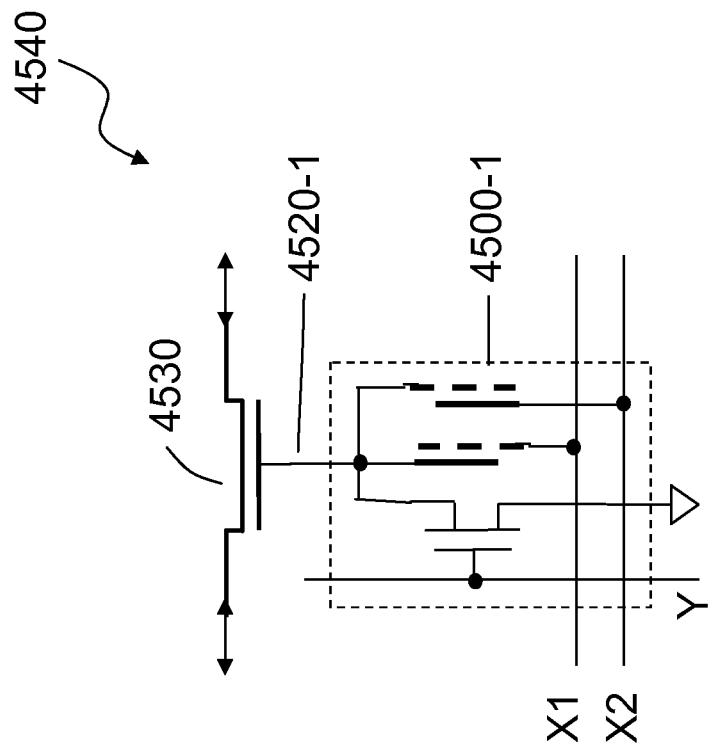
Figure 45A:
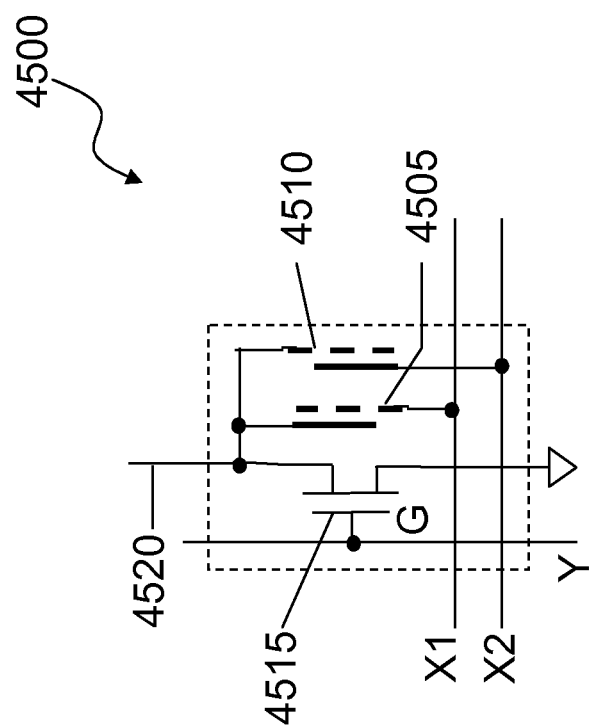

Referring to FIG. 45A, an embodiment of configurable NV select circuit 4500 is shown, which is formed using NV CNT switch 4505 and NV CNT switch 4510 with a first terminal sharing a common node referred to as select node 4520. Terminals T1 and T2 are connected to a second terminal of NV CNT switches 4505 and 4510, respectively. FET 4515 has a diffusion connected to select node 4520 and the other diffusion connected to a reference such as ground as described in U.S. Pat. No. 7,852,114. Configurable NV select circuits 4500 is a general purpose configuration circuit and may be used to configure a programmable switch matrix (PSM) and also to configure a configurable logic block (CLB).

Configurable NV select circuit 4500 is described with respect to NV CNT switches 4505 and 4510 that correspond to NV CNT resistive block switch 142 illustrated in FIG. 1C. However, NV CNT switches 4505 and 4510 may be formed instead with NV graphitic resistive block switch 162 illustrated in FIG. 1E, or may be formed instead with NV buckyball resistive block switch 182 illustrated in FIG. 1D.

In operation, when a logic function is programmed, FET 4515 is activated (ON) during write SET (low resistance) or write RESET (high resistance) operations by applying a high voltage to gate G of FET 4515 with program line Y, select node 4520 is connected to a reference voltage such as ground and provides a current path between program line X1 and ground and program line X2 and ground through NV CNT switches 4505 and 4510, respectively. Combinations of SET and RESET operations are used to set resistance states (values) of NV CNT switches 4505 and 4510. SET and RESET conditions are described further above with respect to FIG. 19. These resistance states (values) remain nonvolatile even after power is removed or lost. After SET or RESET operations, FET 4515 is in an (OFF) state by applying a low voltage such as ground to gate G of FET 4515 with program line Y and select node 4520 is disconnected from ground. Configurable NV select circuit 4500 is now ready to provide a configured logic block function operating in a range of voltages that vary as a function of the technology node; in the <1V to 5V volts for example. In the examples that follow, $V_{DD}$=2.5 V. is used. Note that while NV CNT circuits are designed to be in-circuit programmed, this does not preclude programming in sockets, for example, as is done in some older technologies.

Referring to FIG. 45A, during logic operation, after the configurable NV select circuit 4500 has been written (that is programmed) and is stored in a nonvolatile state by NV CNT switches 4505 and 4510, operating voltages are kept sufficiently low, less than 3 volts for example, so that the resistance states (values) of NV CNT switches 4505 and 4510 are not changed (disturbed) under NFPGA operation. Leakage currents are kept low during logic operation by selecting a high resistance value for one of the NV CNT switches. By way of example, if NV CNT switch 4505 is in high resistance state, 1-10 G Ohms for example, and NV CNT switch 4510 is in low resistance state, 100 k Ohms for example, and if X1 is at an on-chip voltage of $V_{DD}$=2.5 volts and X2 is at a reference voltage such as ground (zero volts), then select node 4520 voltage will be at approximately 0 volts and a current in the range of 250 pA to 2.5 nA flows, but only during logic operation, and only in selected regions of switch to keep DC power dissipation low. However, if switch NV CNT switch 4505 is in a low resistance state, 100 k Ohm for example, and NV CNT switch 4510 is in a high resistance state, 1-10 G Ohms for example, then select node 4520 voltage will be at 2.5 volts and a current in the range of 250 pA to 2.5 nA flows, but only during logic operation, and only in selected regions of switch to keep DC power dissipation low. FET 4515 is OFF during logic operations.

As described further above, FPGA architectures are dominated by programmable interconnects, such as programmable switch matrix PSM 4450 illustrated in FIG. 44. Referring to FIG. 45B, instead of using configurable cross point arrays in PSM 4450 as described further above with respect to FIGS. 40, 41, and 44, CLBs may instead be interconnected by combining configurable NV select circuit 4500 and FET transfer device 4530 to form configurable NV routing circuit 4540 illustrated in FIG. 45B.

FIG. 45B illustrates NV routing circuit 4540 in which configurable NV select circuit 4500-1 with select node 4520-1 corresponds to configurable NV select circuit 4500, and controls the gate voltage of FET 4530 transfer device. In operation, FET transfer device 4530 connects, or disconnects, pairs of CLBs by forming and un-forming an electrical path between them, and logic current flows through FET transfer device 4530. The logic function of programmable NV routing circuit 4540 is determined as described further above with respect to configurable NV select circuits 4500 and retains the programmed logic function even if power is removed or lost.

In operation, select node 4520-1 turns FET 4530 ON if it is at a high voltage such as 2.5 volts and turns FET 4530 OFF if is at a low voltage such as ground. When FET 4530 is ON, signal flow, voltage distribution, current distribution, and power distribution are enabled; and when FET 4530 is in an OFF state, then transmission of these functions is disabled. Multiple configurable NV routing circuits 4540 may be used to form PSM 4450 illustrated in FIG. 44 that forms and un-forms electrical connections between CLBs.

FIG. 45C illustrates configurable diode-resistor logic AND circuit 4550 in which configurable NV select circuit 4500-2 with select node 4520-2 may configure or reconfigure the logic function of configurable diode-resistor logic (DRL) AND circuit 4550. Configurable DRL AND circuit 4550 is a configurable combinatorial logic circuit and may be used in configurable logic block (CLB) 4600 illustrated in FIG. 46 for example. DRL AND circuits are described further above with respect to FIG. 43B. Configurable NV select circuit 4500-2 with select node 4520-2 corresponds to configurable NV select circuit 4500 and select node 4520, respectively, described further above with respect to FIG. 45A. Select node 4520-2 controls an input voltage IN3 to the cathode of diode 4555 of DRL NAND gate 4560. The logic function of configurable DRL AND circuit 4550 is determined by input IN3 as described in logic function table 4570. Configurable DRL AND circuit 4550 retains the programmed logic function shown in logic function table 4570 even if power is removed or lost.

In operation, if IN3 is at a low voltage L, near zero volts for example, output O at node 4565 remains near zero volts L regardless of the voltage values (low voltage L or high voltage H) of input voltages N1 and IN2. However, if IN3 is at a high voltage H, such as 2.5 V. for example, then output O at node 4565 depends on the values of IN1 and IN2. Both IN1 and IN2 need to be at a high voltage H in order for output O at node 4565 to be at a high voltage H as shown by Boolean logic equation $O = IN1 \cdot IN2$ in logic function table 4570. If either IN1 or IN2, or both IN1 and IN2 are at a low voltage L, then output O is at low voltage L.

FIG. 45D illustrates configurable diode-resistor logic OR circuit 4575 in which configurable NV select circuit 4500-3 with select node 4520-3 may configure or reconfigure the logic function of configurable diode-resistor logic (DRL) OR circuit 4575. Configurable DRL OR circuit 4575 is a configurable combinatorial logic circuit and may be used in configurable logic blocks (CLBs). DRL OR circuits are described further above with respect to FIG. 43A. Configurable NV select circuit 4500-3 with select node 4520-3 corresponds to configurable NV select circuit 4500 and select node 4520, respectively, described further above with respect to FIG. 45A. Select node 4520-3 controls an input voltage IN3 to the anode of diode 4580 of DRL OR gate 4585. The logic function of configurable DRL OR circuit 4575 is determined by input IN3 as described in logic function table 4595. Configurable DRL OR circuit 4575 retains the programmed logic function shown in logic function table 4595 even if power is removed or lost.

In operation, if IN3 is at a high voltage H, approximately 2.5 V for example, output O at node 4590 remains at a high voltage H regardless of the voltage values (low voltage L or high voltage H) of input voltages IN1 and IN2. However, if IN3 is at a low voltage L, such as approximately zero volts, for example, then output O at node 4590 depends on the values of IN1 and IN2. If either IN1 or IN2, or both IN1 and IN2, are at high voltage H, then O at node 4590 is at a high voltage H as shown by Boolean logic equation $O = IN1 + IN2$ in logic function table 4595. If both IN1 and IN2 are at a low voltage L, then output O is at low voltage L.

Referring to FIG. 45A, the embodiment of configurable NV select circuit 4500 may be modified to include just one NV CNT switch and one reference resistor to simplify writing (programming) of the nonvolatile logic state of the configurable NV select circuit. Modified configurable NV select circuit 4500 may be formed by replacing NV CNT switch 4510 or NV CNT switch 4505 with a resistor of fixed value. In this example, NV CNT switch 4510 may be replaced with a resistor of fixed value and NV CNT switch 4505 may be left unchanged. The resistor may be formed using a metal, metal alloy, conductive oxide, semiconductor, carbon nanotube fabric, or other material. U.S. Pat. No. 7,365,632 describes resistive elements formed using patterned carbon nanotube fabrics that are compatible with integration in CMOS processes. Write operations for NV CNT switch 4510 are unchanged.

Referring to the modified configurable NV select circuit described above, during logic operation, after the write operation, the nonvolatile NV select circuit state is stored in NV CNT switches 4505. By way of example, if NV CNT switch 4505 is in high resistance state, 1 G Ohm for example, and the reference resistor is chosen as 100 k Ohms for example, and if X1 is at an on-chip voltage of $V_{DD} = 2.5$ volts and X2 is at a reference voltage such as ground (zero volts), then the select node voltage will be at approximately 0 volts and a current in the range of and 2.5 nA flows, but only during logic operation, and only in selected regions of switch to keep DC power dissipation low. However, if switch NV CNT switch 4505 is in a low resistance state, 10 k Ohms for example, then the select node voltage will be at 2.5 volts and a current of 25 nA flows, determined by the 100 kOhm reference resistor, but only during logic operation, and only in selected regions of switch to keep DC power dissipation low. FET 4515 is OFF during logic operations.

Configurable NV select circuit operation may optionally be enhanced by adding a capacitor between node 4520 (FIG. 45A) and a reference voltage such as ground. And this capacitor may also be added to nodes 4520-1, 4520-2, and 4520-3 illustrated in FIGS. 45B, 45C, and 45D, respectively, as well as to the modified configurable NV select circuit defined further above. Combined with high resistance NV CNT switch resistance values, a capacitance of 10's of pF results in a time constant in the 10's of microseconds to enhance logic stability of configurable NV select circuits. For example, as 2.5 Volt signals flow between source and drain of the controlled MOSFET, such as MOSFET 4530 illustrated in FIG. 45B, signals coupled to the controlled gate connected to select node 4520-1 could not disturb the NV logic state set by the configurable NV select circuit 4500. When writing configurable NV select circuit 4500, the mode select MOSFET 4515 is ON and the capacitance is shorted to ground, so no write delays are introduced.

While a $V_{DD}$ of 2.5 volts has been used in these examples, configurable NV select circuits are compatible with $V_{DD}$=1V and $V_{DD}$ values of less than 1 Volt.

Figure 46:
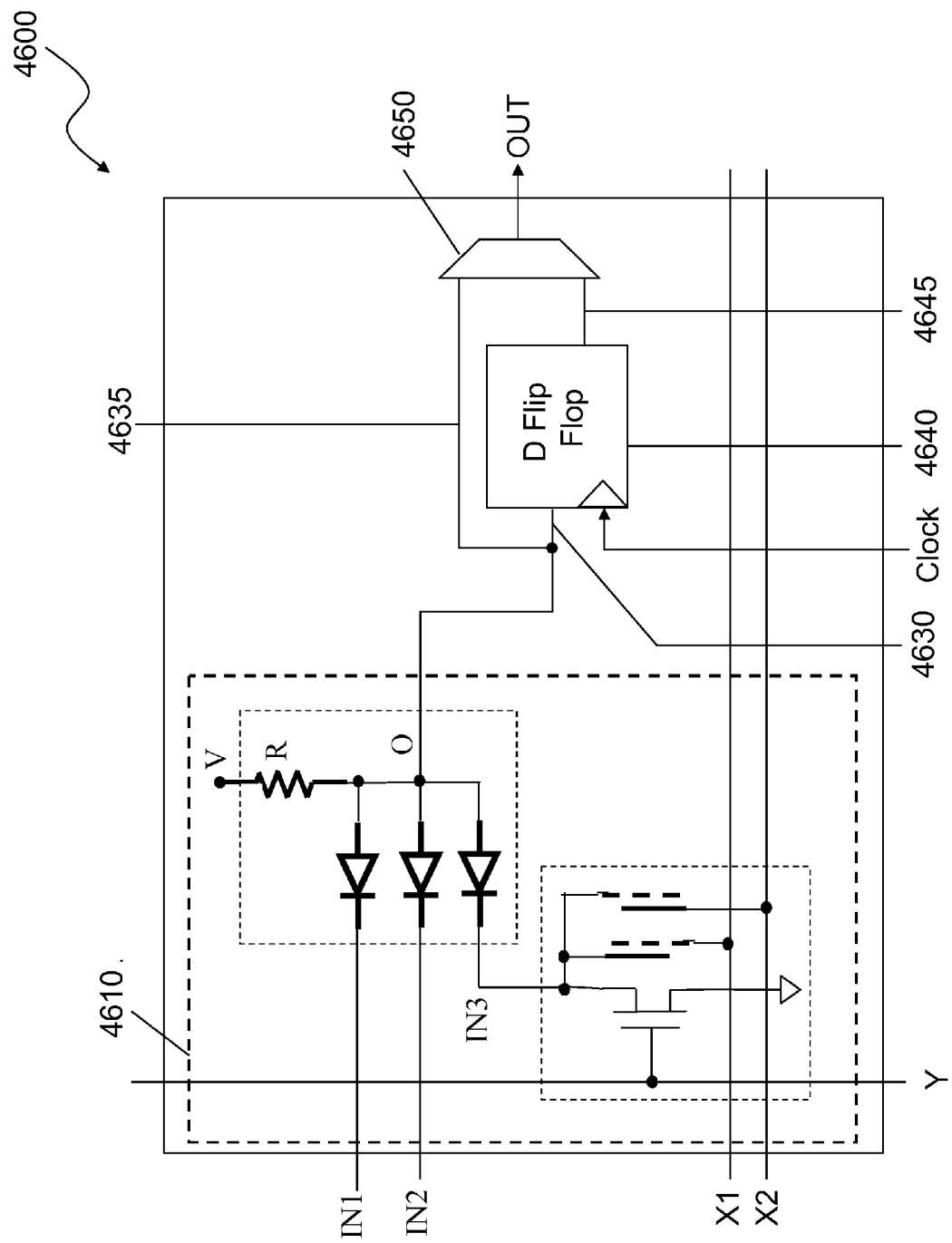
FIG. 46 illustrates a configurable logic block formed with configurable combinatorial logic circuits.

Referring to FIG. 46, configurable logic block (CLB) 4600 may be formed with configurable combinatorial logic 4610, clocked D flip-flop 4640, and multiplexer (MUX) 4650. In this example, configurable combinatorial logic 4610 is formed using configurable diode-resistor logic (DRL) AND circuit 4550 described further above with respect to FIG. 45C, whose output O is connected to input 4630 of clocked D flip-flop 4640 and input 4635 of MUX 4650. Output 4645 of D flip-flop 4640 is connected to a second input of MUX 4650.

In operation, configurable combinatorial logic 4610, formed with configurable DRL AND circuit 4550, may be configured (programmed) with program lines X1, X2, and Y as described further above with respect FIGS. 45C and 45A. When configured, output O corresponds to inputs IN1 and IN2 and the programmed state of IN3, as described further above with respect to logic function table 4570 shown in FIG. 45C. Clocked D flip-flop latches output O, and MUX 4650 generates output OUT of CLB 4600 based on inputs IN1 and IN2 and the configured state of IN3.

While CLB 4600 is illustrated as a having two inputs IN1 and IN2, multiple inputs in excess of two may be used. Also, other circuits may be used for configurable combinatorial logic 4610, such as using DRL OR gate 4585 illustrated in FIG. 45D. CLB 4600 may be used for one or several of the CLBs in FPGA 4400 illustrated in FIG. 44.

Figure 47:
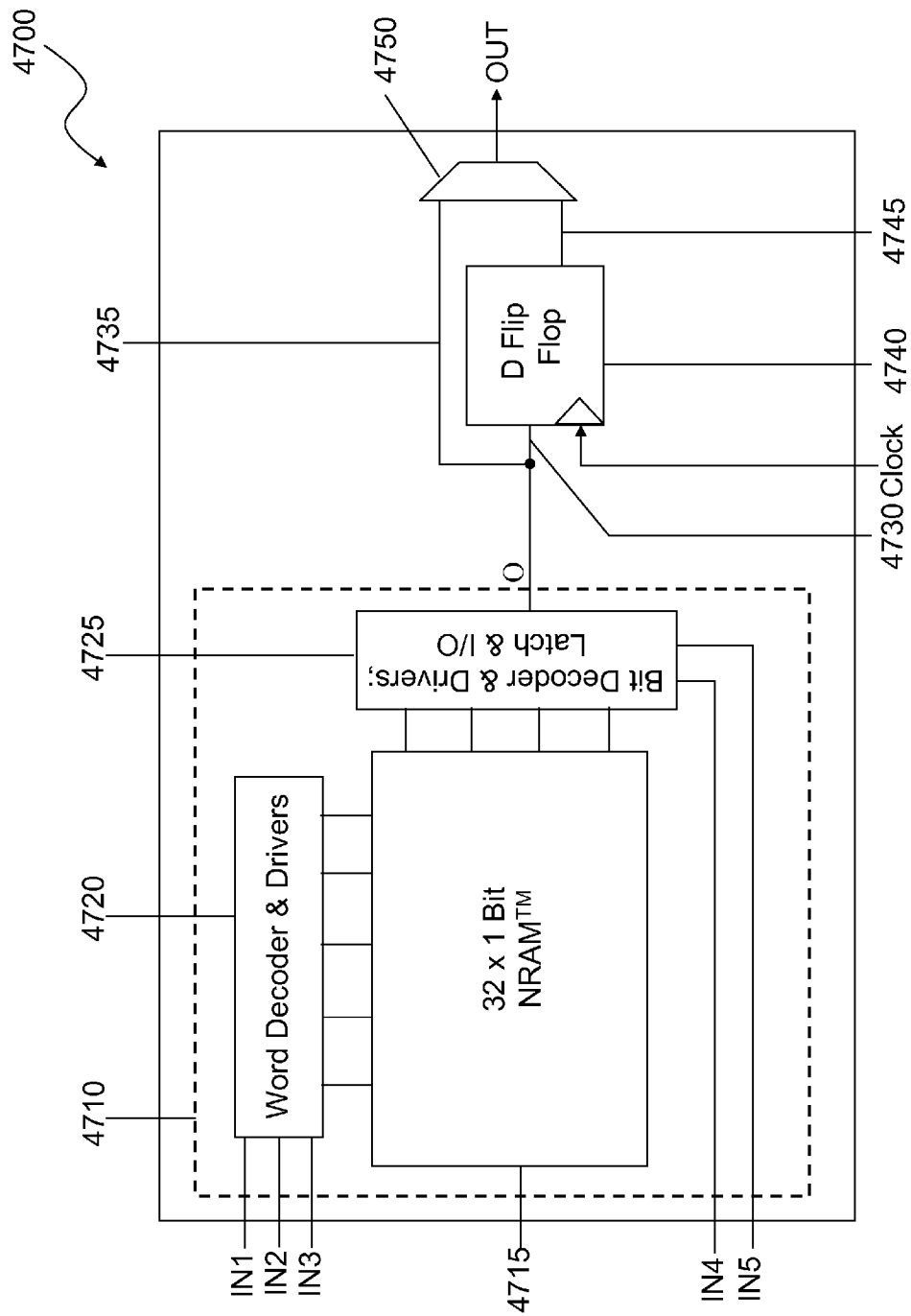
FIG. 47 illustrates a configurable logic block formed with a look-up-table (LUT) using a cross point array.

Configurable logic block (CLB) 4700 may be formed with configurable look-up-table (LUT) 4710, clocked D flip-flop 4740, and multiplexer (MUX) 4750 as illustrated in FIG. 47. In this example, configurable LUT 4710 is formed using cross point array 4715, corresponding to cross point array 2300, with 1-RS cell 2350 or 1-RS cell 2380, described further above with respect to FIGS. 23A, 23B, and 23C, respectively. Word decoder drivers 4720 with inputs IN1, IN2, and IN3, and bit decoder and driver, latch and I/O functions 4725 with inputs IN4 and IN5 may be used to configure (program) cross point array 4715 which contains the configurable look-up-table. Output O of bit decoder and driver, latch and I/O functions 4725 is connected to input 4730 of clocked D flip-flop 4740 and input 4735 of MUX 4750. Output 4745 of D flip-flop 4640 is connected to a second input of MUX 4650.

In operation, configurable LUT 4710 may be configured (programmed) with program inputs IN1, IN2, IN3, IN4, and IN5 as described further above with respect FIGS. 23A, B, and C. And also, as described with programmable/reprogrammable AND array 4205, which is used as a cross point memory array and corresponding memory mode word decoders WL drivers 4215 and memory mode bit decode & BL drivers, latch, and I/O 4220, when configuration controller 4202 is in memory mode, as illustrated in FIG. 42. When configured, output O corresponds to nonvolatile programmed states in cross point array 4715. Clocked D flip-flop latch 4740 stores output O and MUX 4750 generates output OUT of CLB 4700 based on stored configurable (LUT) 4710 values.

While CLB 4700 is illustrated as a having five inputs used to configure cross point array 4715, multiple inputs less than or in excess of five may be used. CLB 4700 may be used for one or several of the CLBs in FPGA 4400 illustrated in FIG. 44.

While configurable LUT 4710 was described in terms above with respect to the AND array subset programmable/reprogrammable AND array 4205 illustrated in FIG. 42, CLB 4700 may also be generated using the entire XP-PAL 4200 programmable logic function described further above with respect to FIG. 42. In this approach, XP-PAL 4200 replaces configurable LUT 4710; logic inputs A, $A_C$, B, and $B_C$; replace program inputs IN1, IN2, IN3, IN4, and IN5; D flip flops 4260 and 4265 replace D flip flop 4740 and MUX 4750 and corresponding interconnections, and D flip flops 4260 and 4265 provide outputs O1 and O2, respectively.

At this point in the specification, the description of FPGA 4400 illustrated in FIG. 44 is complete. However, electrostatic discharge (ESD) protection of interface such as inputs, outputs, and input/outputs connected to external pads and pins needs to be provided as described in the referenced book H. B. Bakoglu, "Circuits, Interconnections, and Packaging for VLSI," Addison-Wesley Publishing Company, 1990, pages 46-51. ESD protection of chips using carbon nanotube-based devices is also described in U.S. Pat. No. 7,839,615, the contents of which are incorporated herein in their entirety by reference.

ESD Protect Circuits

Figure 48:
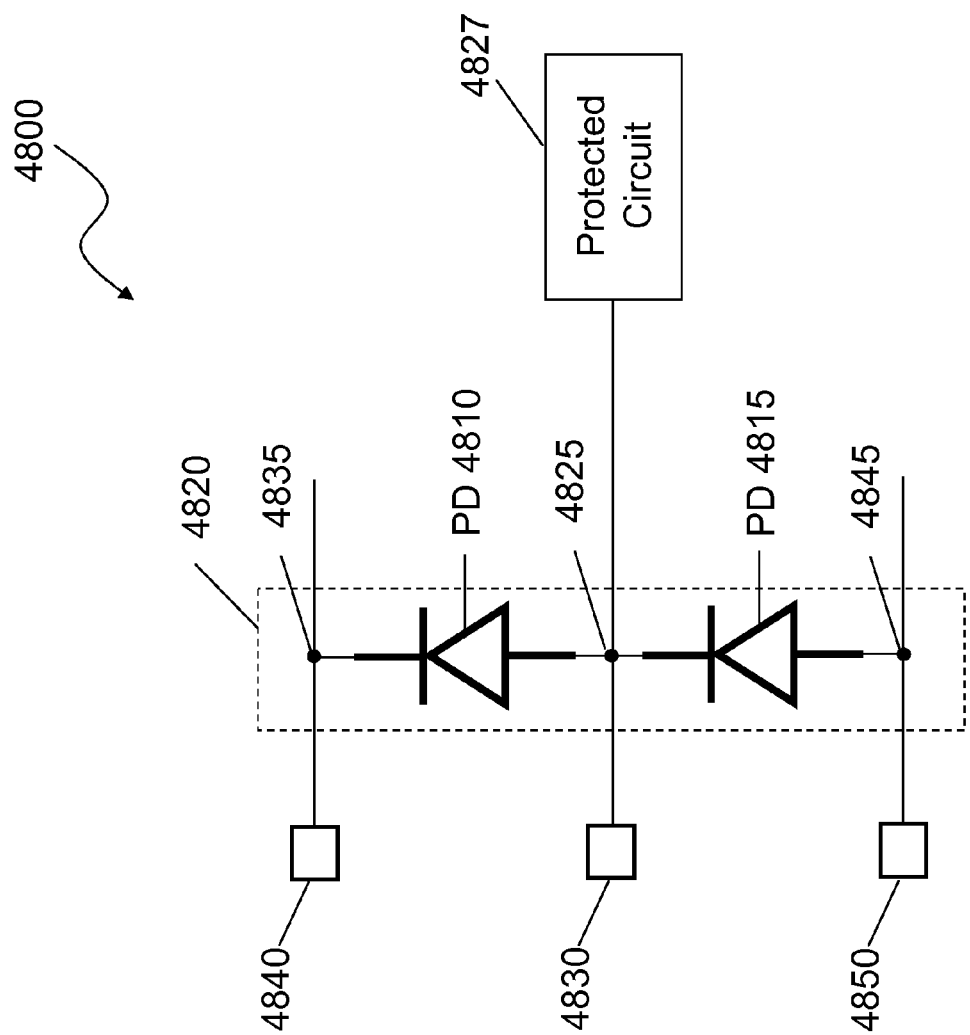
FIG. 48 illustrates a protective device circuit.

Referring to FIG. 48, ESD protect circuit 4800 may be used to provide electrostatic discharge protection for FPGA 4400 illustrated in FIG. 44. ESD protect circuit 4800 includes protect diodes PD 4800 and PD 4815 in series, with the anode of PD 4810 connected to the cathode of PD 4815 at node 4825. Node 4825 is connected to input/output (I/O) terminal 4830 that carries input, output, or input/output signals to and from FPGA 4400 illustrated in FIG. 44. Protected circuits 4827 are connected to node 4825, and to power supply bus 4842 and ground bus 4852 (power and ground connections not shown in the drawing). The cathode of PD 4810 is connected to node 4835 which is connected to terminal 4840 that is used to supply voltage to power supply bus 4842 as part of FPGA 4400 (not shown in FIG. 44) and the anode of PD 4815 is connected to node 4845 which is connected to terminal 4850 that is to used to provide a reference voltage such as ground to ground bus 4852 as part of FPGA 4400 (not shown in FIG. 44). The series combination of PD 4810 and PD 4815 form protective diode pair 4820.

Protective diode pair 4820 may be integrated in chips at any process level in the chip fabrication process. Chip level includes analog and digital chips, and highly integrated chip functions such as system-on-chip (SoC). In addition to chip level, however, protective diode pairs 4820 may be formed at various other levels of assembly. For example, protective diode pairs 4820 may be formed on a module substrate. Protective diode pairs 4820 may be formed at the card level or board level as well. Protective diode pairs may be included in multiple assembly levels such as chip level, module level, card level, and board level to maximize the amount of ESD protection.

Power supply bus 4842 and ground bus 4852 typically have large decoupling capacitance values. ESD surges are in the nanosecond range and the high decoupling capacitance holds power supply bus 4842 and 4852 at nearly the same voltage during the ESD surge duration. Focusing on ESD protection with respect to circuits 4827 connected to I/O terminal 4830, protective diode pair 4820 provides protection in both the positive and negative voltage surge direction. That is, a positive ESD surge with respect to terminal 4830, and any other terminal, results in the corresponding surge current to flow in PD 4810. However, a negative ESD surge with respect to terminal 4830, and any other terminal, results in a corresponding surge current to flow in PD 4815.

PD 4810 and PD 4815 have typically been formed of semiconductor materials such as silicon and gallium arsenide for example. However, carbon-based diodes have high current carrying capacity which may be used for ESD protection. Also, these diodes may be formed at any point in the fabrication cycle because they do not require a semiconductor substrate. In this example, carbon-based diode materials are used to form PD 4810 and PD 4815. These carbon-based protective devices are formed with diode CNT fabric layers, diode graphitic layers, and/or diode buckyball layers described in detail further above with respect to FIGS. 4F-4H, 5E-5G, and 6E-6G, respectively. Structures, fabrication, and operation are described for various carbon-based diode examples illustrated in FIGS. 4F-4H, 5E-5G, and 6E-6G.

Referring to carbon-based diodes 470 and 480 illustrated in FIGS. 4F and 4G, respectively, carbon-based diodes 470 and 480 are formed as Schottky-type diodes using patterned diode CNT fabric layers described further above with respect to structure, fabrication, and operation. Carbon-based diode 490 illustrated in FIG. 4H is formed as a pn diode using patterned diode CNT fabric layers also described further above with respect to structure, fabrication, and operation.

Referring to carbon-based diodes 570 and 580 illustrated in FIGS. 5E and 5F, respectively, carbon-based diodes 570 and 580 are formed as Schottky-type diodes using patterned diode graphitic layers described further above with respect to structure, fabrication, and operation. Carbon-based diode 590 illustrated in FIG. 5G is formed as a pn diode using patterned diode graphitic layers also described further above with respect to structure, fabrication, and operation.

Referring to carbon-based diodes 670 and 680 illustrated in FIGS. 6E and 6F, respectively, carbon-based diodes 670 and 680 are formed as Schottky-type diodes using patterned diode buckyball layers described further above with respect to structure, fabrication, and operation. Carbon-based diode 690 illustrated in FIG. 6G is formed as a pn diode using patterned diode buckyball layers also described further above with respect to structure, fabrication, and operation.

The geometry of the carbon-based diodes described further above are relatively large to be able to support maximum ESD surge currents in the range of 100 mA to 1 A for example, without exceeding a maximum allowed voltage across devices in the chip. In this example, if the maximum tolerable voltage for devices in FPGA 4400 is 4 volts, then the dimensions of patterned diode CNT fabric layers 470, 480, and 490 are chosen to prevent a voltage surge of greater than 4 volts for a maximum current surge value between 100 mA and 1 A as required; if the maximum tolerable voltage for devices in FPGA 4400 is 4 volts, then the dimensions of patterned diode graphitic layers 570, 580, and 590 are chosen to prevent a voltage surge of greater than 4 volts for a maximum current surge value between 100 mA and 1 A as required; and if the maximum tolerable voltage for devices in FPGA 4400 is 4 volts, then the dimensions of patterned diode buckyball layers 670, 680, and 690 are chosen to prevent a voltage surge of greater than 4 volts for a maximum current surge value between 100 mA and 1 A as required.

In operation, FPGA 4400 illustrated in FIG. 44 may have power supply bus 4842 at 2.5 volts and ground bus 4852 at ground voltage. Input, output, and input/output (I/O) voltage swings are between ground and 2.5 volts. However, signal overshoots and undershoots may occur during operation. Assuming PD 4810 and PD 4815 have forward voltage drops $V_D=0.5$ volts, then no current flows in PD 4810 and PD 4015 for overshoots and undershoots, respectively, of 0.5 V. Therefore, the voltage on terminal 4830 may swing between −0.5 V. and +3.0 V without inducing forward current flow in PD 4810 and 4820.

Voltage Scaling of Dense Memory Arrays

Memory cells and corresponding arrays described further above illustrate methods and corresponding structures for achieving dimensional scaling of cells and corresponding memory arrays to sub-15 nm technology nodes using integrated diode-resistive change memory arrays. Such memory arrays can approach densities of $4F^2$. However, there are applications where memory arrays formed with cells using MOSFET select devices and NV CNT resistive block switches may be integrated with cell densities approaching $6F^2$ that are also compatible with nanosecond READ and WRITE operating speeds. $6F^2$ cell densities can be achieved by optimizing architectures and modes of operation that enable MOSFET select devices to be scaled to small dimensions with corresponding operating voltages of 1 volt, and yet compatible with NV CNT resistive block switches with SET voltages of 2 volts and RESET voltage of 3 volts as described further below. MOSFET device voltage scaling is required in order to achieve scaled cells at sub-15 nm technology nodes.

Voltage Scaling of NRAM Memories with Diode Select Devices

Referring to FIGS. 4A and 4B, FIGS. 5A-5D, and FIGS. 6A-6D, the formation of various scalable integrated diode-resistive change memory elements is described further above. Scaling CNT fabric density is illustrated with respect to FIGS. 12A and 12B. Forming doped and undoped diode nanotube fabric layers, adjusting electrical characteristics by selecting compatible work functions, and other methods, have also been described further above. High density cross point cell areas approaching $4F^2$ may be achieved using these methods. In some applications, memory architectures can be optimized to achieved memory arrays with cell areas approaching $6F^2$ with cells using MOSFET select devices as described further below.

Voltage Scaling of NRAM Memories with MOSFET Select Devices

Referring to FIG. 1A, NV resistive memory cell 100 shows a MOSFET select device 102 in series electrical connection with a NV CNT resistive block switch 104. Resistive memory cell 100 is a hybrid technology cell formed by adding NV CNT resistive block switches 104 to an underlying CMOS technology, which is used for select device 102 in NV resistive memory cells 100 as well as CMOS on-pitch array drivers and other circuits used to form a memory function. A first conductive terminal 106 of NV CNT resistive block switch 104 is electrically connected to the source S of MOSFET select device 102 and a second conductive terminal 110 is connected to array select line SL. Switch nanotube block 108 provides the nonvolatile storage function in the form of multiple nonvolatile resistance states. Array bit line BL is connected to MOSFET select device 102 drain D. Array word line WL, a portion of which forms the gate of MOSFET select device 102, is used to turn MOSFET select device 1020N to form an electrical conducting channel between drain D and source S, or to turn MOSFET select device 102 OFF to unform the electrical channel. Bit lines BL and word lines WL are always approximately orthogonal. Select lines SL may be approximately parallel to bit lines BL in a first architecture or SL may be approximately parallel to word lines WL in a second architecture.

NV CNT resistive block switches 104 have been fabricated over a wide range of dimensions, from 200×200 nm to 45 nm, for example. And, referring to FIGS. 3D and 3E, NV CNT resistive block switches 104 have been scaled to even smaller dimensions as illustrated by electrically operational NV CNT resistive block switch 370, which includes switch nanotube block 372 having dimensions of 15×15 nm. These switches can be scaled to even smaller sub-10 nm dimensions.

CMOS technologies in fabricators around the world operate at 150-200 nm technology nodes with MOSFET device voltages of 5.0 Volts for older technologies for example; other technologies operate in the range of 35-45 nm with MOSFET device voltages in the range of 2.5-3.3 Volts for example; and the most advanced fabricators operate at 15-20 nm technology nodes with MOSFET voltages in the range of 1-2 Volts for example. As CMOS technology is scaled to small dimensions, operating voltages are scaled to prevent electrical breakdown between source and drain, prevent breakdown between drain and substrate, and to prevent gate oxide failure in the corresponding scaled thin gate oxides. These CMOS technology nodes include multiple NMOS and PMOS devices optimized to several voltages. It is desirable to use the lowest MOSFET device in NV memory cells to achieve the smallest cell area, with higher voltage devices in on-pitch driver circuits and other memory circuits as needed.

NV CNT resistive block switch 104, fabricated/positioned above MOSFET select device 102 as shown schematically in FIG. 1A, enables efficient cell layout configurations for both first and second array architectures. NV CNT resistive block switches 104 may operate in various modes, bidirectional or unidirectional modes for example, as illustrated in FIG. 20. Furthermore, various memory array and sub-array operating modes may be selected. For example, one or more random bits along a word line row may be selected. Alternatively, a sub-block of bits along multiple word lines may be selected.

As indicated in FIG. 18, nanosecond READ and WRITE speeds are desirable. Referring to FIG. 19, 20 ns READ and WRITE operations were achieved as measured on a 4 Mbit NRAM memory configured as a first architecture, with select lines SL parallel to bit lines BL. READ operations are performed at 1 volt and are therefore compatible with 1 Volt MOSFET devices. However, in the example illustrated in FIG. 19, the SET (WRITE) operation was performed at 2.5 Volts and the RESET (WRITE) operation was performed at 3.5 Volts. Measurements on millions of NV CNT resistive block switches 104 show SET voltages in a range of 2-4 volts and RESET voltages in a range of 3-5 volts.

Referring to FIG. 1A, it is desirable to scale NV CNT resistive block switches 104 over a wide range of dimensions, compatible with various embedded and stand alone NV resistive memory sizes, integrated with the various available CMOS technologies from 150 nm to sub-15 nm technology nodes, and compatible with the corresponding MOSFET select device 102 operating voltage constraints.

What is needed for the densest NV resistive memories is a combination of: NV resistive memory architectures and operating modes that enable NV resistive memories, formed with arrays of scaled NV resistive memory cells 100 illustrated in FIG. 1A, operating at 20 ns READ and WRITE speeds; and NV CNT resistive block switches 104 scaled to small sub-20 nm dimensions and operating with SET and RESET voltage of 2V and 3V, respectively, with MOSFET select devices 102 of sub-20 nm dimensions operating at 1 volt.

Figure 49:
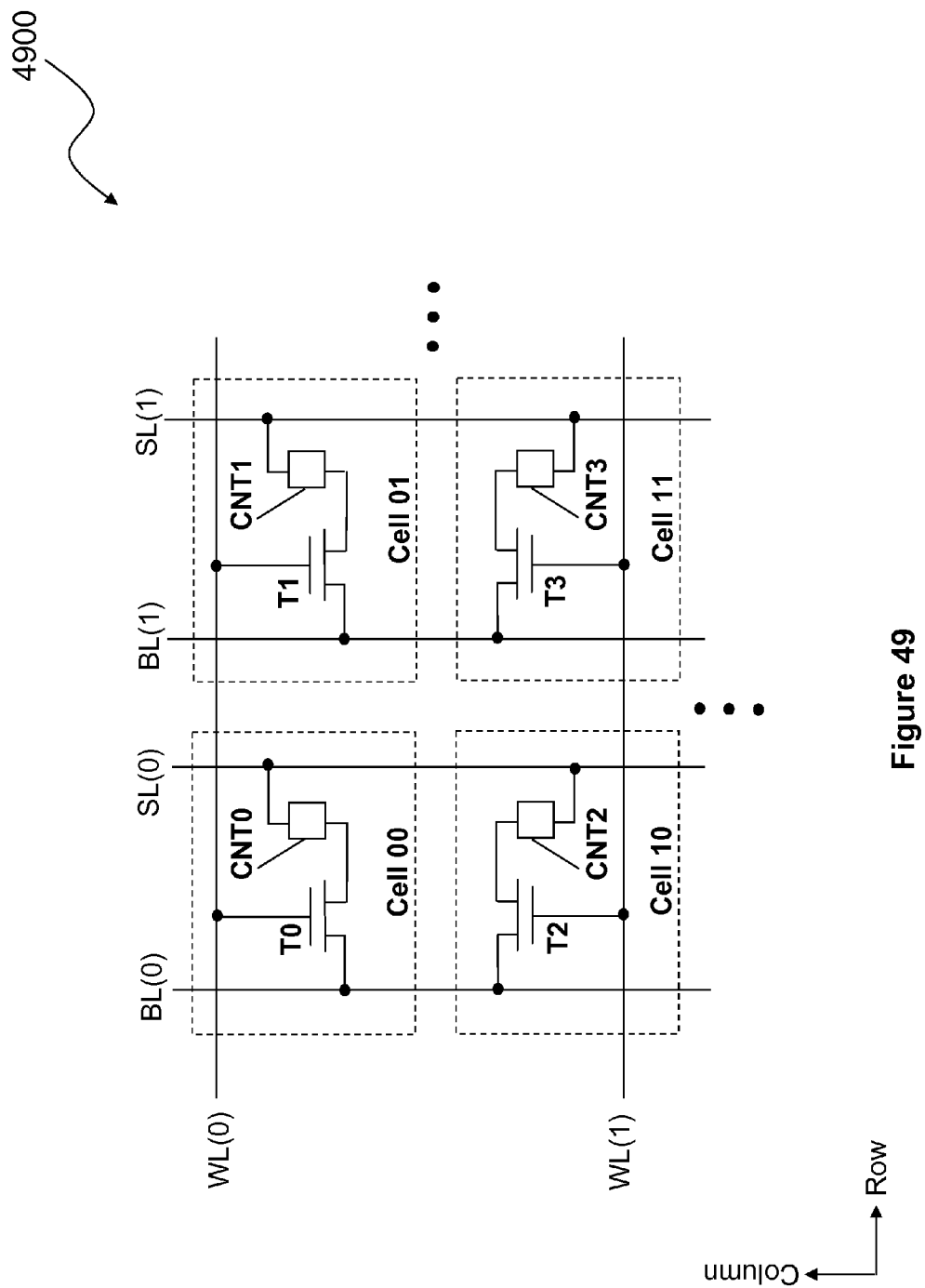
FIG. 49 illustrates a nonvolatile resistive memory sub-array schematic using a first architecture.
Figure 50A:
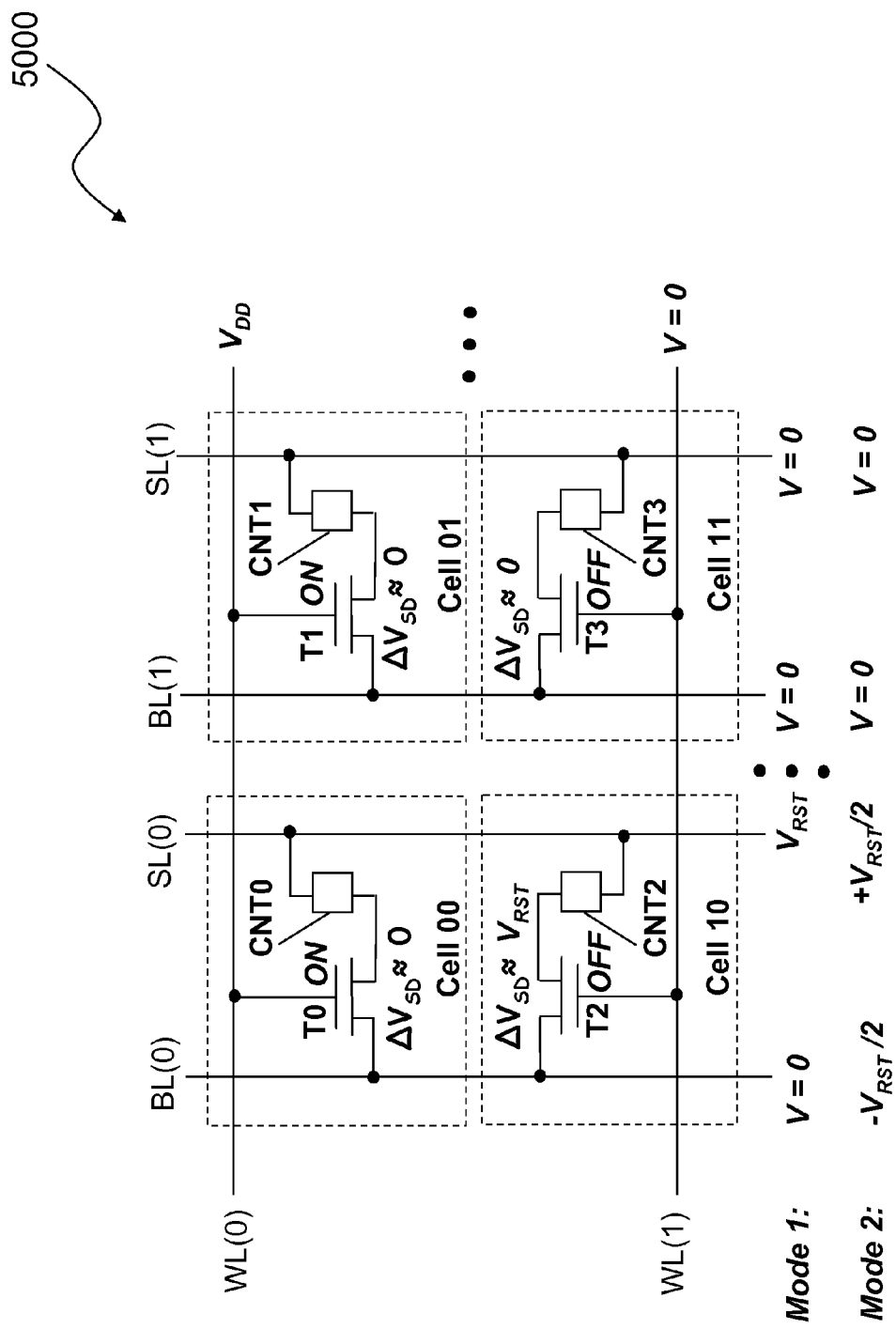
FIGS. 50A, 50B, 50C, and 50D illustrate first architecture modes of operation for the sub-array of FIG. 59.
Figure 50B:
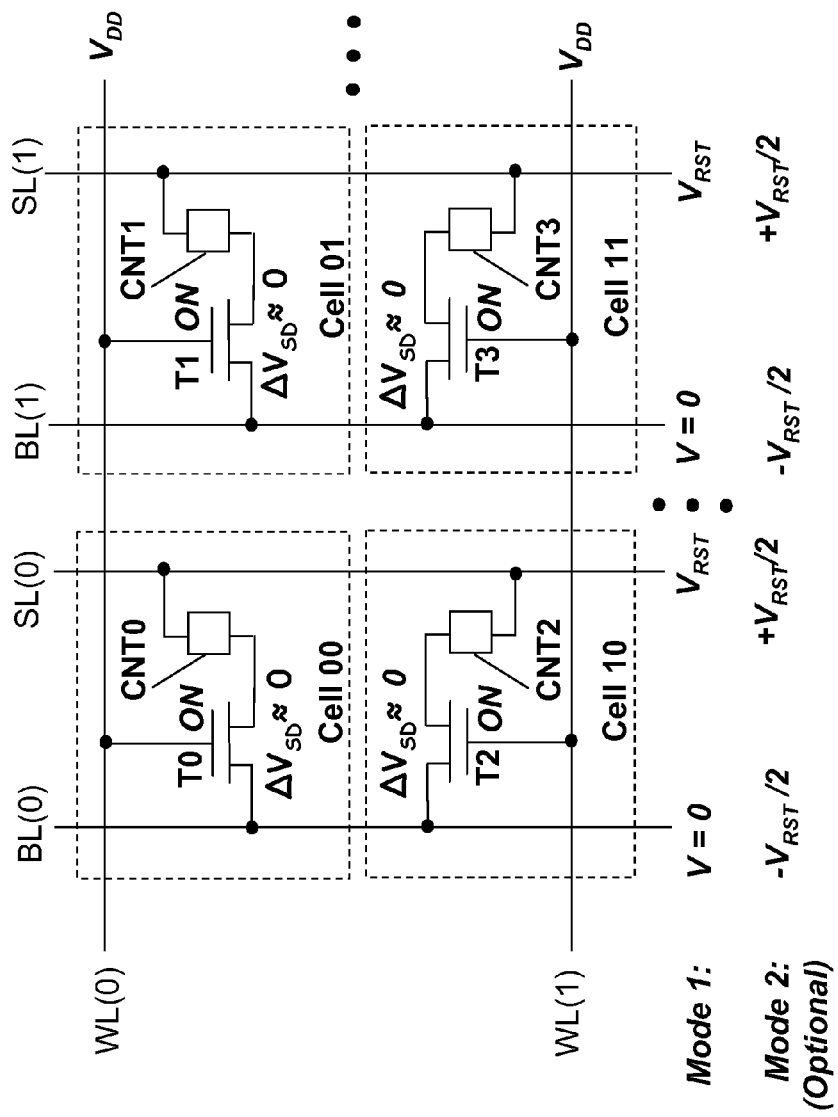
Figure 50C:
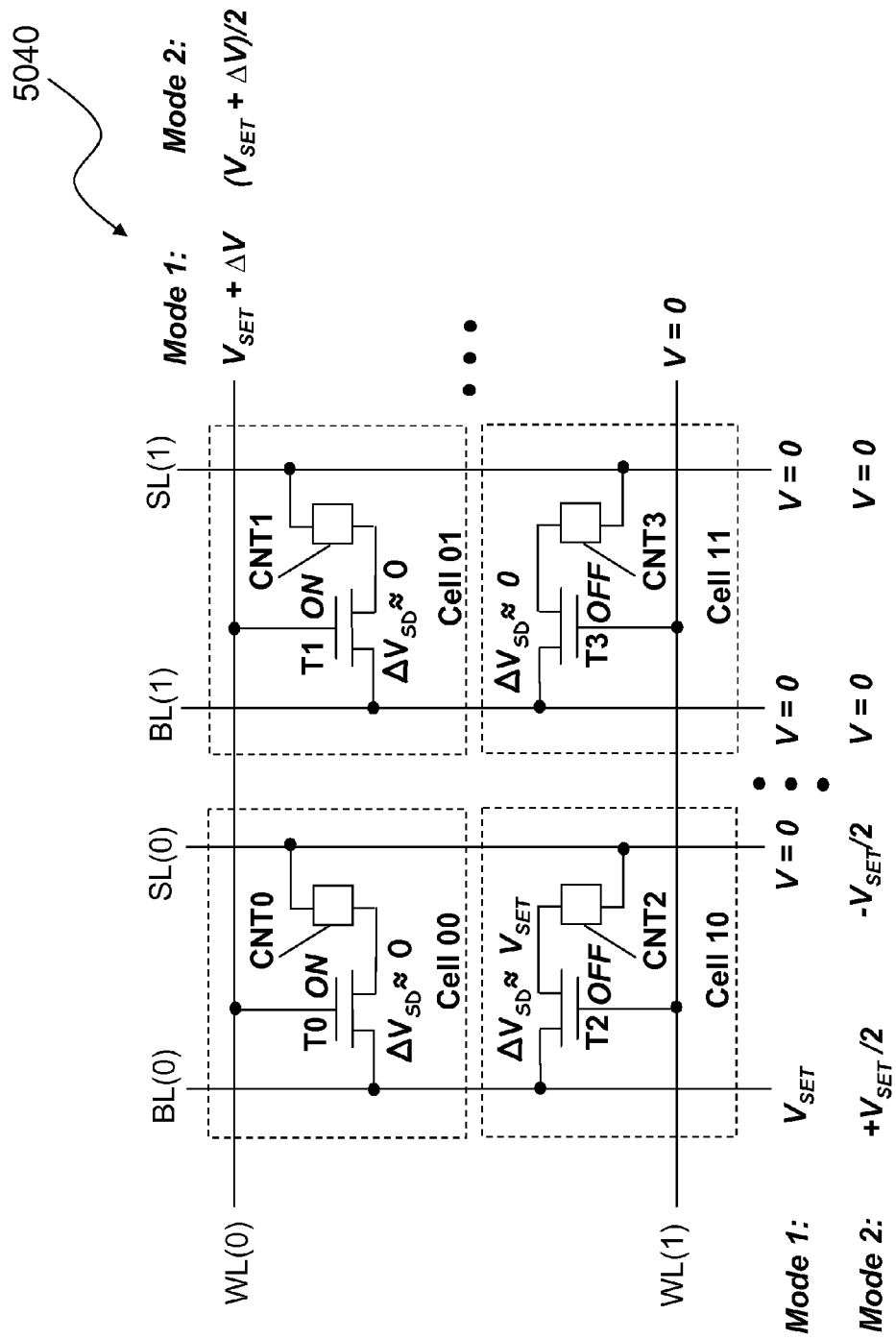
Figure 50D:
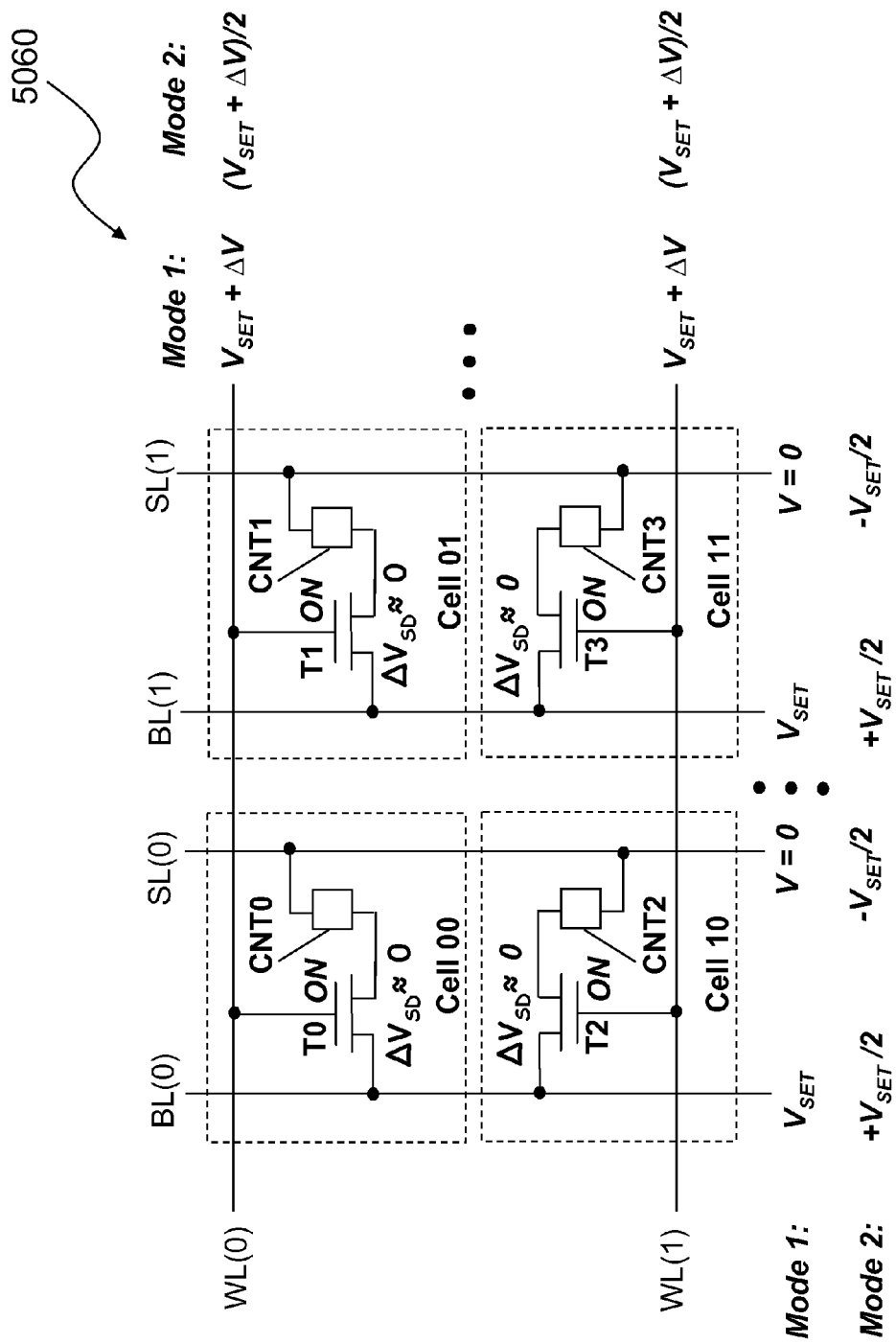
Figure 51:
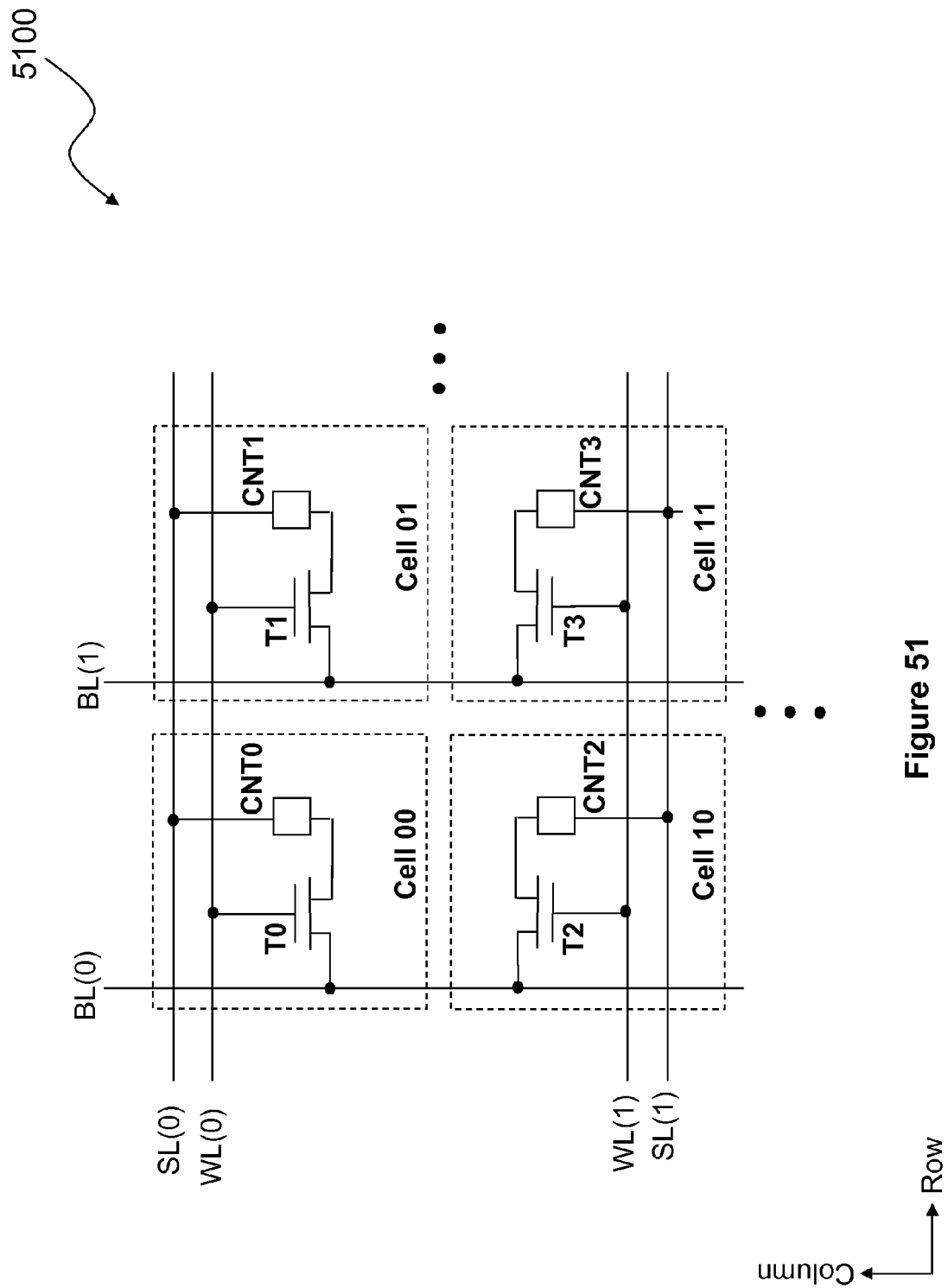
FIG. 51 illustrates a nonvolatile resistive memory sub-array schematic using a second architecture.

FIGS. 49-57 described further below, illustrate various combinations of architectures and operating modes for NV resistive memories that meet the voltage scaling conditions described further above that are needed to enable cell dimensional scaling without MOSFET operating voltage limitations (constraints). FIGS. 49 and 51 illustrate memory sub-array schematics 4900 and 5100, respectively, corresponding to a first architecture (SLs parallel to BLs) and a second architecture (SLs parallel to WLs), respectively. FIGS. 50A, 50B, 50C, and 50D illustrate the first architecture memory sub-array schematics 5000, 5020, 5040, and 5060, respectively, in various modes of operation. FIGS. 52A, 52B, 52C, and 52D illustrated the second architecture memory sub-array schematics 5200, 5220, 5240, and 5260, respectively, in various modes of operation. Tables 5300, 5400, and 5450 illustrated in FIGS. 53, 54A, and 54B, respectively, show voltages across gate oxides, between source and drain, and between drain and substrate for MOSFET select devices for both first and second architectures as a function of mode 1 SET and RESET operation. Tables 5500, 5600, and 5650 illustrated in FIGS. 55, 56A, and 56B, respectively, show voltages across gate oxides, between source and drain, and between drain and substrate for MOSFET select devices for both first and second architectures as a function of mode 2 SET and RESET operation. Examples of first and second architectures are shown in Patent Pub. No. US 2010/0001267. Examples of second architecture is also shown in U.S. Pat. No. 7,835,170.

Table 5700 illustrated in FIG. 57 summarizes overall results and shows cell select MOFET voltage requirements as a function of first and second architectures and modes 1 and 2 for various SET and RESET operations. Table 5700 shows that a combination of the first architecture and mode 2 requires the cell select MOSFET to operate at 2 V. However, a combination of the second architecture and mode 2 enables the cell select MOSFET to operate at 1 V. For both first and second architectures, SET and RESET voltages of 2V and 3V, respectively, may be applied across the NV CNT resistive block switch. A 2 volts MOSFET is physically substantially larger than a 1 V. MOSFET, requiring up to at least 4× the physical area. Hence, the second architecture is scalable to substantially smaller cell dimensions, and therefore smaller resistive memory array dimensions, than the first architecture for reasons described further below.

Referring to FIGS. 49 and 1A, memory first architecture sub-array schematic 4900 illustrates an interconnected subset of identical cells 00, 01, 10, 11, each cell corresponding to NV resistive memory cell 100 illustrated in FIG. 1A. Cell 00 illustrates the MOSFET select device T0 source connected to one terminal of two terminal NV CNT resistive block switch CNT0. MOSFET select device T0 corresponds to MOSFET select device 102, and NV CNT resistive block switch CNT0 corresponds to NV CNT resistive block switch 104, with one terminal connected to source S of MOSFET select device 102. Memory first architecture sub-array schematic 4900 is formed by interconnecting word line WL(0) to the gates of MOSFET select devices T0 and T1, and to other MOSFET gates not shown. Word line WL(1) is connected to the gates of MOSFET select devices T2 and T3, and to other MOSFET gates not shown. Bit line BL(0) is connected to the drains of MOSFET select devices T0 and T2, and other drains not shown. Bit line BL(1) is connected to the drains of MOSFET devices T1 and T3 and other drains not shown. Select line SL(0), parallel to bit lines BL(0) and BL(1), is connected to the second terminal of NV CNT resistive block switches CNT0 and CNT2, and other NV CNT resistive block switches not shown. Select line SL(1), parallel to bit lines BL(0) and BL(1), is connected to the second terminal of NV CNT resistive block switches CNT1 and CNT3 and other NV CNT resistive block switches not shown. The operation of memory first architecture sub-array schematic 4900 is described further below with respect to FIGS. 50A-50D.

FIG. 50A corresponds to memory first architecture sub-array schematic 4900 and illustrates memory first architecture operating mode 5000. Operating mode 5000 corresponds to a random RESET operation in which one, several, or all bits along a word line row may be RESET. In operation, the random RESET may use a first operating mode, mode 1, or a second operating mode, mode 2. Mode 1 and mode 2 both apply a RESET voltage $V_{RST}$ across selected NV CNT resistive block switches. In this example, cell 00 is selected and $V_{RST}$ is applied across CNT0. In mode 1, all voltages are >=0 and bit line and select line voltage may transition between 0V. and $V_{RST}$ as needed. However, in mode 2, only word line voltages are >=0. Bit line and select line voltages may transition between $-V_{RST}/2$ and $+V_{RST}/2$ voltages as needed. For the first architecture, mode 2 reduces the voltage across the MOSFET gate oxide and between drain and substrate from $V_{SRT}$ to $V_{RST}/2$. However, the drain-to-source voltage remains $V_{RST}$ for both mode 1 and mode 2. The highest voltage stress conditions occur in cell 10, with T2 OFF.

Use of + and 1 voltages is well known in the industry, especially with respect to flash technology and analog circuit technology. Typically additional wells are integrated in the process to prevent forward biasing of junctions as needed.

FIG. 50B corresponds to memory first architecture sub-array schematic 4900 and illustrates memory first architecture operating mode 5020. Operating mode 5020 corresponds to a sub-block RESET operation in which all bits along word line rows in the sub-block may be RESET. In operation, the sub-block RESET may use a first operating mode, mode 1, or a second operating mode, mode 2. Mode 1 and mode 2 both apply a RESET voltage $V_{RST}$ across selected NV CNT resistive block switches. In this example, all cells 00, 01, 10, 11 are selected and $V_{RST}$ is applied across CNT0, CNT1, CNT2, and CNT3, respectively. In mode 1, all voltages are >=0 and bit line and select line voltage may transition between 0V. and $V_{RST}$ as needed. However, in mode 2, only word line voltages are >=0. Bit line and select line voltages may transition between $-V_{RST}/2$ and $+V_{RST}/2$ voltages as needed. Voltage stress conditions are low across all MOSFET transistors T0, T1, T2, and T3 because they are all ON as illustrated FIG. 50B.

FIG. 50C corresponds to memory first architecture sub-array schematic 4900 and illustrates memory first architecture operating mode 5040. Operating mode 5040 corresponds to a random SET operation in which one, several, or all bits along a word line row may be SET. In operation, the random SET may use a first operating mode, mode 1, or a second operating mode, mode 2. Mode 1 and mode 2 both apply a SET voltage $V_{SET}$ across selected NV CNT resistive block switches. In this example, cell 00 is selected and $V_{SET}$ is applied across CNT0. In mode 1, all voltages are >=0 and bit line and select line voltage may transition between 0V. and $V_{SET}$ as needed. However, in mode 2, only word line voltages are >=0. Bit line and select line voltages may transition between $-V_{SET}/2$ and $+V_{SET}/2$ voltages as needed. For the first architecture, mode 2 reduces the voltage across the MOSFET gate oxide and between drain and substrate from approximately $V_{SET}$ to $V_{SET}/2$. However, the drain-to-source voltage remains $V_{SET}$ for both mode 1 and mode 2. The highest voltage stress conditions occur in cell 10, with T2 OFF. However, high voltage can also occur across the gate oxide in Cell 01 in mode 1.

FIG. 50D corresponds to memory first architecture sub-array schematic 4900 and illustrates memory first architecture operating mode 5060. Operating mode 5060 corresponds to a sub-block SET operation in which all bits along word line rows in the sub-block may be SET. In operation, the sub-block SET may use a first operating mode, mode 1, or a second operating mode, mode 2. Mode 1 and mode 2 both apply a SET voltage $V_{SET}$ across selected NV CNT resistive block switches. In this example, all cells 00, 01, 10, 11 are selected and $V_{SET}$ may be applied across CNT0, CNT1, CNT2, and CNT3, respectively, as needed. In mode 1, all voltages are >=0 and bit line and select line voltage may transition between 0V. and $V_{SET}$ as needed. However, in mode 2, only word line voltages are >=0. Bit line and select line voltages may transition between $-V_{SET}/2$ and $+V_{SET}/2$ volt-ages as needed. Voltage stress conditions are relatively high only between drain and substrate, but low across gate oxide and between source and drain, for all MOSFET transistors T0, T1, T2, and T3 because they are all ON as illustrated FIG. 50D.

Referring to FIGS. 51 and 1A, memory second architecture sub-array schematic 5100 illustrates an interconnected subset of identical cells 00, 01, 10, 11, each cell corresponding to NV resistive memory cell 100 illustrated in FIG. 1A. Cell 00 illustrates the MOSFET select device T0 source connected to one terminal of two terminal NV CNT resistive block switch CNT0. MOSFET select device T0 corresponds to MOSFET select device 102, and NV CNT resistive block switch CNT0 corresponds to NV CNT resistive block switch 104, with one terminal connected to source S of MOSFET select device 102. Memory first architecture sub-array schematic 5100 is formed by interconnecting word line WL(0) to the gates of MOSFET select devices T0 and T1, and to other MOSFET gates not shown. Word line WL(1) is connected to the gates of MOSFET select devices T2 and T3, and to other MOSFET gates not shown. Bit line BL(0) is connected to the drains of MOSFET select devices T0 and T2, and other drains not shown. Bit line BL(1) is connected to the drains of MOSFET devices T1 and T3, and other drains not shown. Select line SL(0), parallel to word lines WL(0) and WL(1), is connected to the second terminal of NV CNT resistive block switches CNT0 and CNT1, and other NV CNT resistive block switches not shown. Select line SL(1), parallel to word lines WL(0) and WL(1), is connected to the second terminal of NV CNT resistive block switches CNT2 and CNT3, and other NV CNT resistive block switches not shown. The operation of memory first architecture sub-array schematic 5100 is described further below with respect to FIGS. 52A-52D.

Figure 52A:
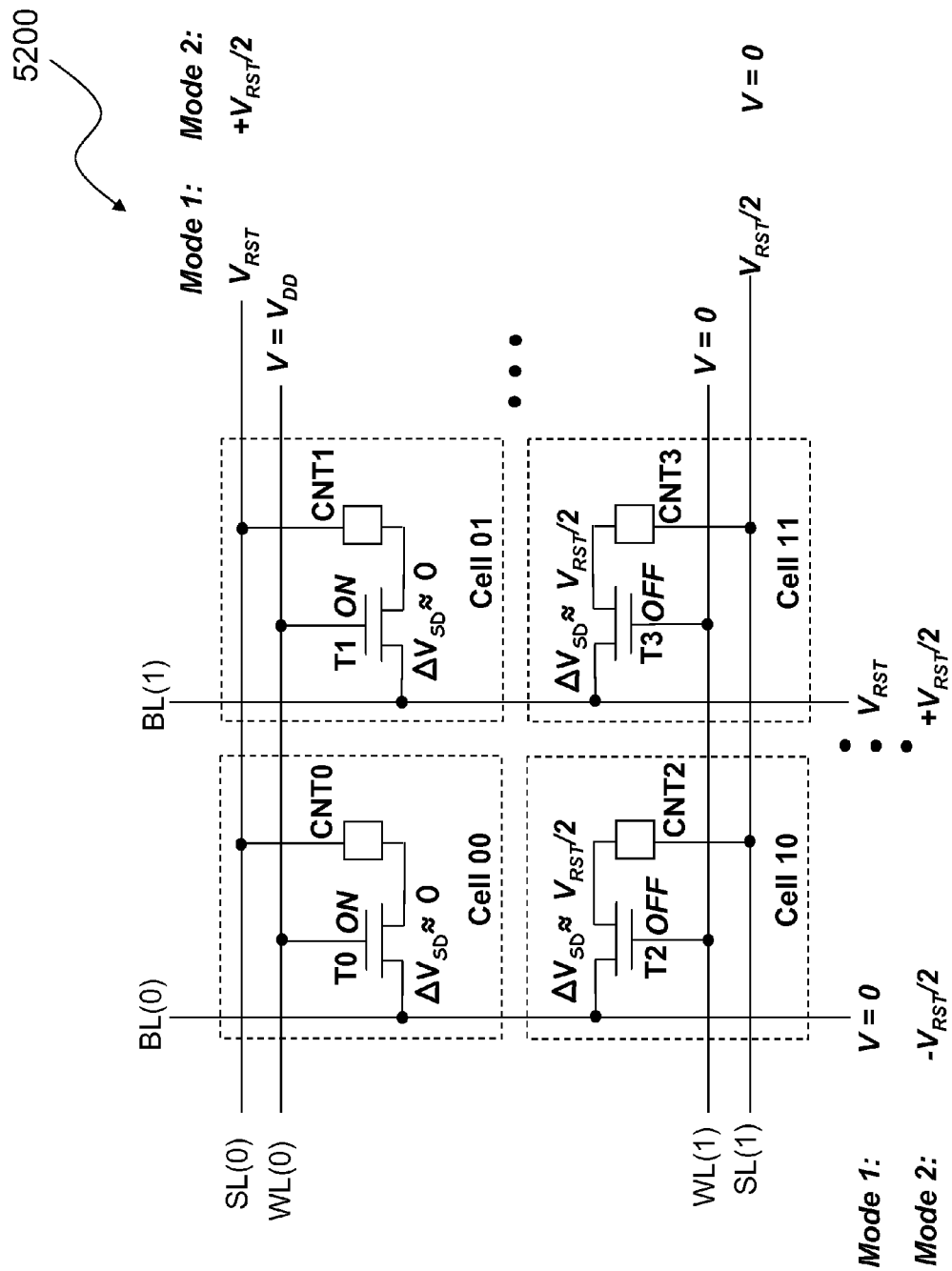
FIGS. 52A, 52B, 52C, and 52D illustrate second architecture modes of operation for the sub-array of FIG. 51.

FIG. 52A corresponds to memory first architecture sub-array schematic 5100 and illustrates memory second architecture operating mode 5200. Operating mode 5200 corresponds to a random RESET operation in which one, several, or all bits along a word line row may be RESET. In operation, the random RESET may use a first operating mode, mode 1, or a second operating mode, mode 2. Mode 1 and mode 2 both apply a RESET voltage $V_{RST}$ across selected NV CNT resistive block switches. In this example, cell 00 is selected and $V_{RST}$ is applied across CNT0. In mode 1, all voltages are >=0 and bit line and select line voltage may transition between 0V. and $V_{RST}$ as needed. However, in mode 2, only word line voltages are >=0. Bit line and select line voltages may transition between $-V_{RST}/2$ and $+V_{RST}/2$ voltages as needed. The highest voltage stress conditions occur in cell 10, with T2 OFF, for $V_{RST}$ voltage across the gate oxide and between drain and substrate in mode 1 and $V_{RST}/2$ in mode 2. However, the voltage between drain-and-source is $V_{RST}/2$ for both mode 1 and mode 2 because the second architecture is used. By way of contrast, as described further above with respect to FIG. 50A, the first architecture results in the entire RESET voltage $V_{RST}$ between drain-and-source terminals for both mode 1 and mode 2.

Figure 52B:
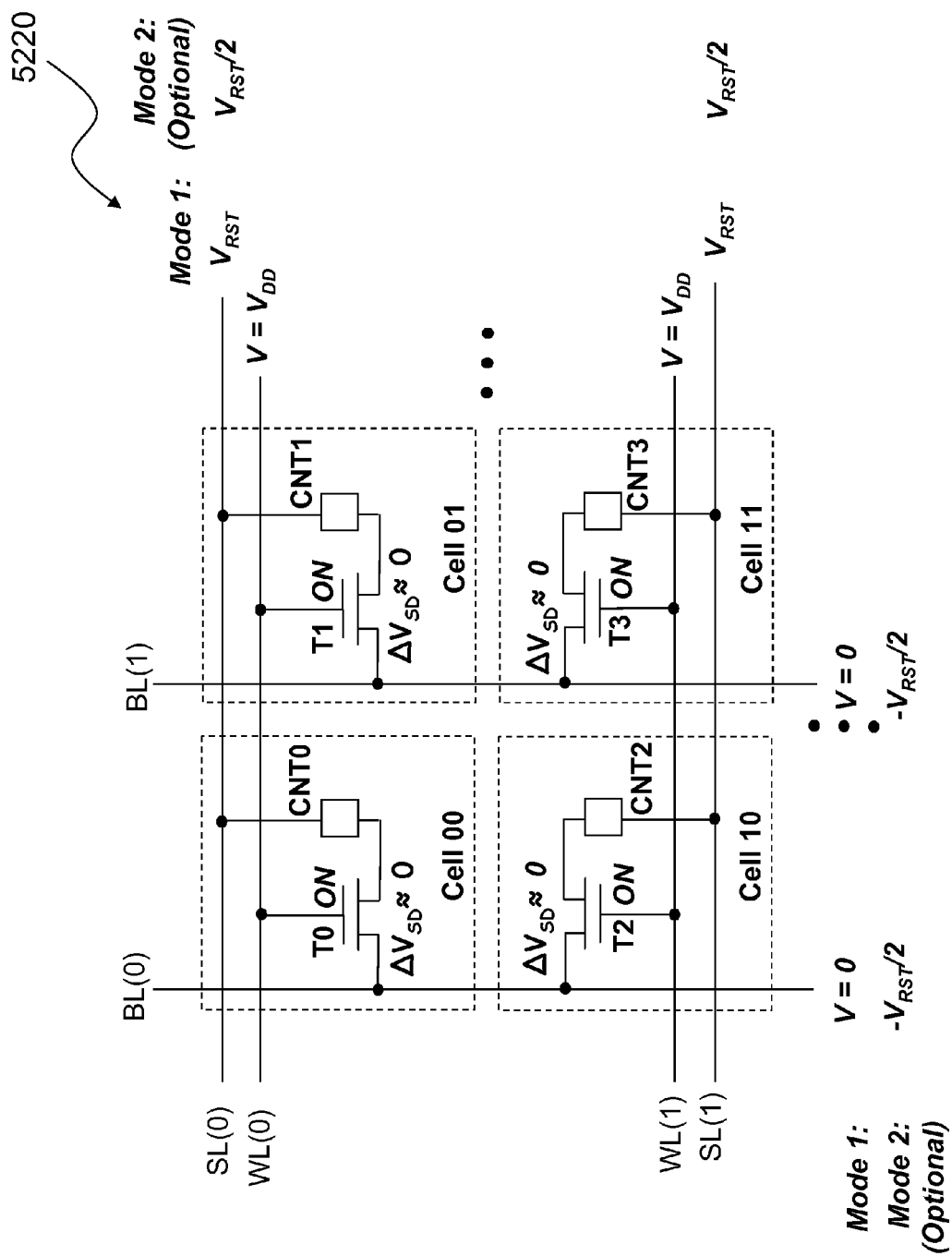

FIG. 52B corresponds to memory second architecture sub-array schematic 5100 and illustrates memory second architecture operating mode 5220. Operating mode 5220 corresponds to a sub-block RESET operation in which all bits along word line rows in the sub-block may be RESET. In operation, the sub-block RESET may use a first operating mode, mode 1, or a second operating mode, mode 2. Mode 1 and mode 2 both apply a RESET voltage $V_{RST}$ across selected NV CNT resistive block switches. In this example, all cells 00, 01, 10, 11 are selected and $V_{RST}$ is applied across CNT0, CNT1, CNT2, and CNT3, respectively. In mode 1, all voltages are >=0 and bit line and select line voltage may transition between 0V. and $V_{RST}$ as needed. However, in mode 2, only word line voltages are >=0. Bit line and select line voltages may transition between $-V_{RST}/2$ and $+V_{RST}/2$ voltages as needed. Voltage stress conditions are low across all MOSFET transistors T0, T1, T2, and T3 because they are all ON as illustrated FIG. 50B.

Figure 52C:
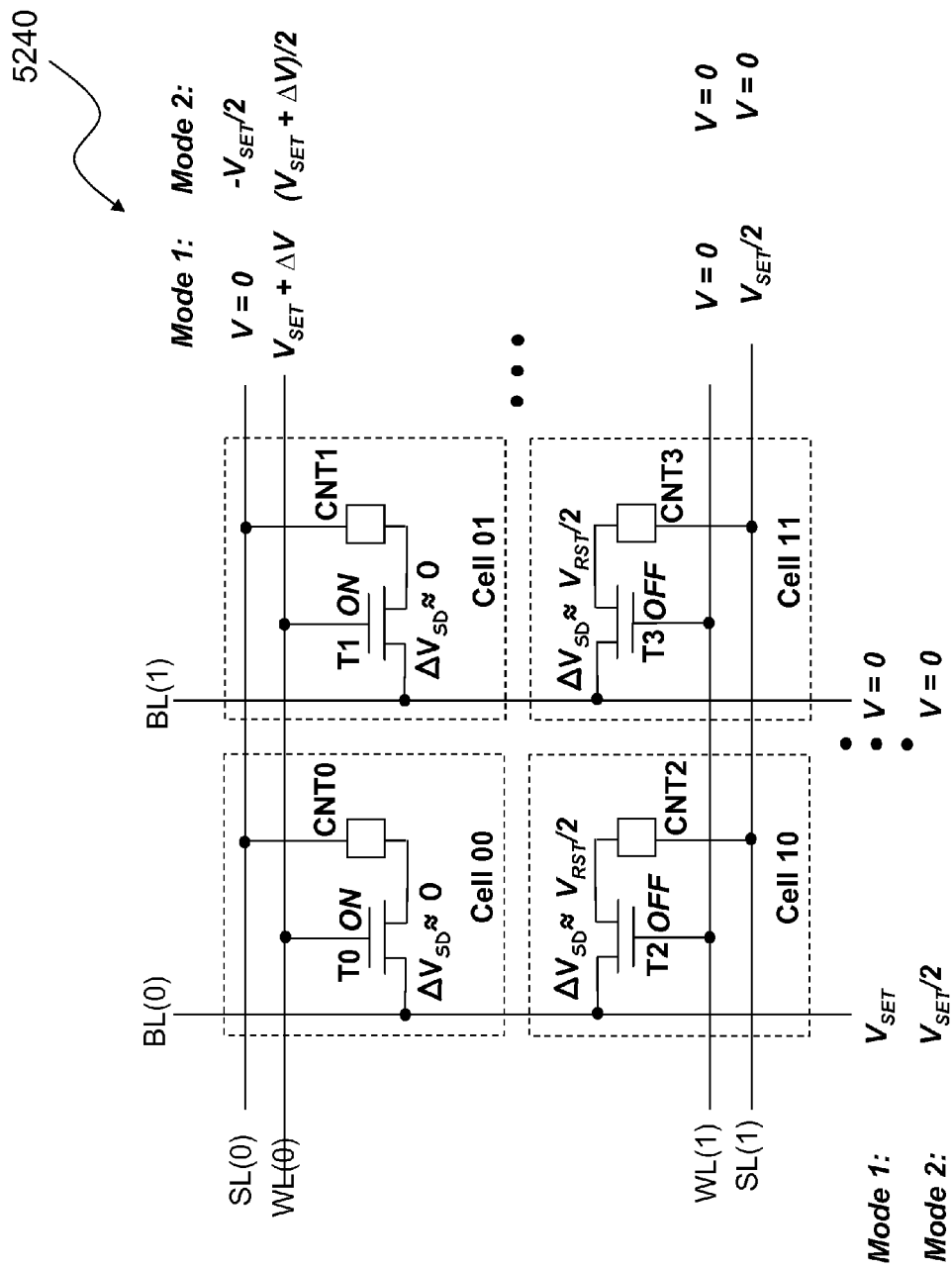

FIG. 52C corresponds to memory second architecture subarray schematic 5100 and illustrates memory second architecture operating mode 5240. Operating mode 5240 corresponds to a random SET operation in which one, several, or all bits along a word line row may be SET. In operation, the random SET may use a first operating mode, mode 1, or a second operating mode, mode 2. Mode 1 and mode 2 both apply a SET voltage $V_{SET}$ across selected NV CNT resistive block switches. In this example, cell 00 is selected and $V_{SET}$ is applied across CNT0. In mode 1, all voltages are >=0 and bit line and select line voltage may transition between 0V. and $V_{SET}$ as needed. However, in mode 2, only word line voltages are >=0. Bit line and select line voltages may transition between $-V_{SETT}/2$ and $+V_{SET}/2$ voltages as needed. For the second architecture, mode 2 reduces the voltage across the MOSFET gate oxide and between drain and substrate from approximately $V_{SET}$ to $V_{SET}/2$. However, the voltage between drain and source is $V_{SET}/2$ for both mode 1 and mode 2 because the second architecture is used. The highest voltage stress conditions occur in cell 10, with T2 OFF. However, high voltage can also occur across the gate oxide in Cell 01 in mode 1.

Figure 52D:
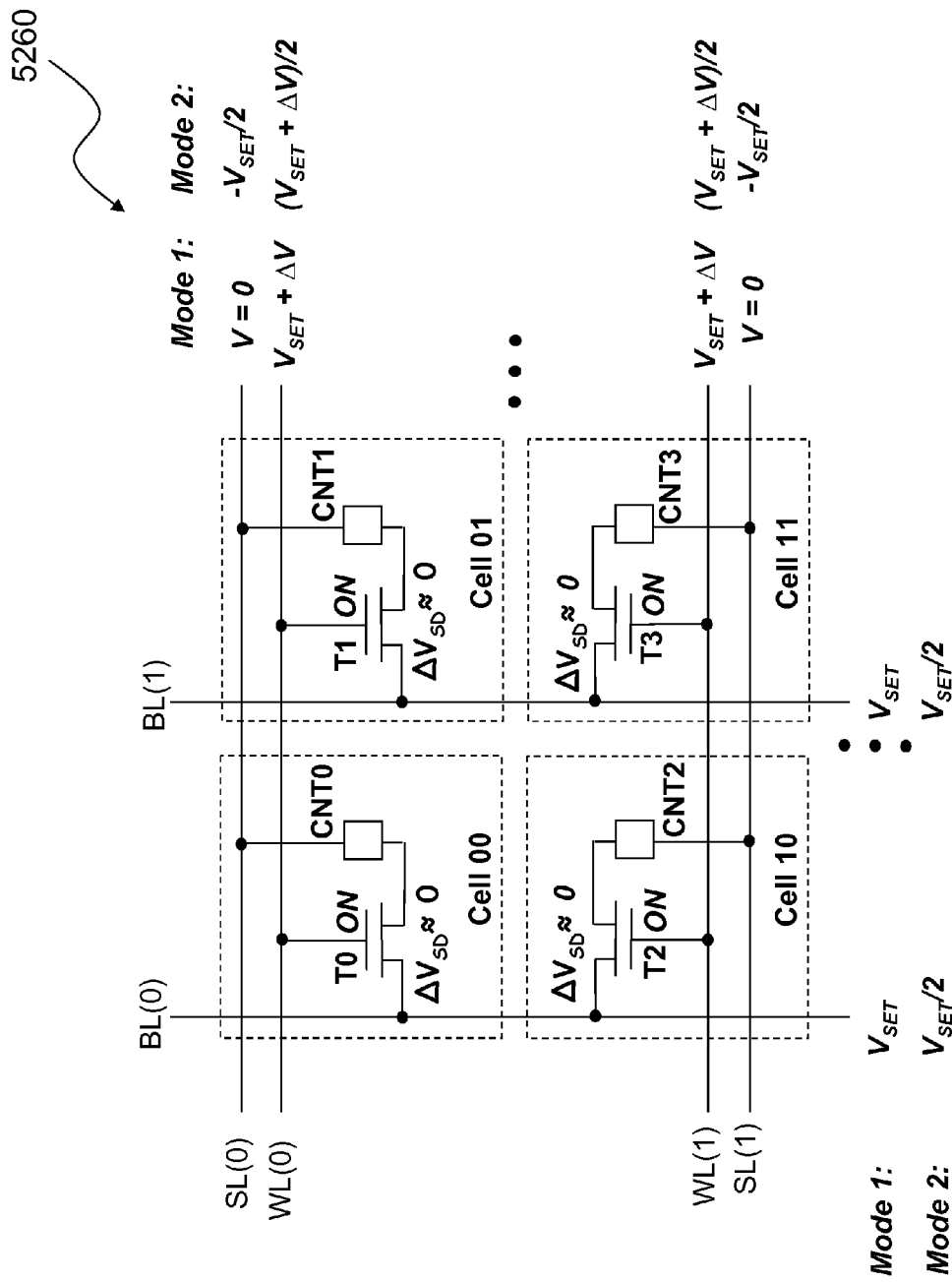

FIG. 52D corresponds to memory second architecture subarray schematic 5100 and illustrates memory second architecture operating mode 5260. Operating mode 5260 corresponds to a sub-block SET operation in which all bits along word line rows in the sub-block may be SET. In operation, the sub-block SET may use a first operating mode, mode 1, or a second operating mode, mode 2. Mode 1 and mode 2 both apply a SET voltage $V_{SET}$ across selected NV CNT resistive block switches. In this example, all cells 00, 01, 10, 11 are selected and $V_{SET}$ may be applied across CNT0, CNT1, CNT2, and CNT3, respectively, as needed. In mode 1, all voltages are >=0 and bit line and select line voltage may transition between 0V. and $V_{SET}$ as needed. However, in mode 2, only word line voltages are >=0. Bit line and select line voltages may transition between $-V_{SET}/2$ and $+V_{SET}/2$ voltages as needed. Voltage stress conditions are relatively high only between drain and substrate, but low across gate oxide and between source and drain, for all MOSFET transistors T0, T1, T2, and T3 because they are all ON as illustrated FIG. 50D Referring to FIG. 53, table 5300 summarizes first architecture and second architecture operating conditions for mode 1 for random RESET and random SET operations, and for sub-block RESET and sub-block SET operations. MOSFET select device gate-to-source voltages $|V_{GS}|$, drain-to-source voltages $|V_{SD}|$, and drain to substrate voltages $|V_{D-SUB}|$ are shown for both first and second architectures. Absolute values are used because both positive and negative polarities may occur. For the random RESET and SET modes, $|V_{DS}|$ values are highlighted by dotted oval 5350 for the second architecture because $|V_{DS}|$ for the second architecture are $V_{RST}/2$ and $V_{SET}/2$ for random SET and RESET operations, respectively for mode 1. By way of contrast, for the first architecture, corresponding $|V_{DS}|$ values are $V_{RST}$ and $V_{SET}$, respectively, for mode 1.

Referring to FIG. 54A, table 5400 shows the same table as 5300 but with voltage values of $V_{RST}$=3V. and $V_{SET}$=2 V. In this example, mode 1A refers to an operating mode in which random SET and RESET operations are performed. Highlighted gate, source-drain, and drain-substrate voltages are compared and show that all voltages are the same, except for source-drain voltage which is lower by a factor of 2 for the second architecture. Both first and second architectures require 3 volt MOSFET select devices.

Referring to FIG. 54B, table 5450 shows the same table as 5300 but with voltage values of $V_{RST}$=3V. and $V_{SET}$=2 V. Mode 1B refers to an operating mode in which random SET and sub-block RESET operations are performed to lower the required voltages. Highlighted gate, source-drain, and drain-substrate voltages show that all voltage are the same, except for source-drain voltage which is lower by a factor of 2 for the second architecture. Both first and second architectures require 2 volt MOSFET select devices. In the mode 2B operation, it may be possible to use the second architecture with a 1.5 volt MOSFET select device for applications with lower reliability requirements.

As discussed further above, the first architecture results in $V_{SET}$ and $V_{RST}$ applied between MOSFET select device source and drain for random SET and RESET operations, respectively, for both mode 1 and mode 2, while the second architecture results in $V_{SET}/2$ and $V_{RST}/2$ applied between MOSFET select device source and drain for random SET and RESET operations, respectively, for both mode 1 and mode 2. This 2× difference in MOSFET select device source-drain operating voltages is a consequence of select lines SL parallel to word lines WLs for the second architecture as illustrated by comparing FIGS. 52A and 50A and FIGS. 52C and 52C. Because of the SL orientation difference between the first and second architecture, the effect of the mode 2 is substantially greater for the second architecture as illustrated further below with respect to FIGS. 55, 56A, and 56B.

Referring to FIG. 55, table 5500 summarizes first architecture and second architecture operating conditions for mode 2 for random RESET and random SET operations, and for sub-block RESET and sub-block SET operations. MOSFET select device gate-to-source voltages $|V_{GS}|$, drain-to-source voltages $|V_{SD}|$, and drain to substrate voltages $|V_{D\_SUB}|$ are shown for both first and second architectures. $|V_{GS}|$ and $|V_{D\_SUB}|$ are reduced by a factor of 2 for mode 2 compared to mode 1 for both first and second architectures. And $|V_{DS}|$ values remain the same for both mode 1 and mode 2. For the random RESET and SET modes, $|V_{DS}|$ values are highlighted by dotted oval 5550 for the second architecture because $|V_{DS}|$ for the second architecture are $V_{RST}/2$ and $V_{SET}/2$ for random SET and RESET operations, respectively for mode 2. By way of contrast, for the first architecture, corresponding $|V_{DS}|$ values are $V_{RST}$ and $V_{SET}$, respectively, for mode 2.

Referring to FIG. 56A, table 5600 shows the same table as 5500 but with voltage values of $V_{RST}$=3V and $V_{SET}$=2 V. In this example, mode 2A refers to an operating mode in which random SET and RESET operations are performed. Highlighted gate, source-drain, and drain-substrate voltages are compared and show $|V_{GS}|$ and $|V_{D-SUB}|$ are reduced from 3V to 1.5 volts, but that $|V_{SD}|$ remains 3V. for the first architecture. By contrast, $|V_{GS}|$ and $|V_{D-SUB}|$ are reduced from 3V to 1.5 volts, and that $|V_{SD}|$ remains 1.5V. for the second architecture. In a random SET and RESET mode, the first architecture requires a 3 Volt MOSFET device, while the second architecture requires a 1.5 Volt MOSFET device.

Referring to FIG. 56B, table 5650 shows the same table as 5500 but with voltage values of $V_{RST}$=3V and $V_{SET}$=2 V. Mode 2B refers to an operating mode in which random SET and sub-block RESET operations are performed to lower the required voltages. Highlighted gate, source-drain, and drain-substrate voltages are compared and show $|V_{GS}|$ and $|V_{D-SUB}|$ are reduced to approximately 1 volt, but that |$V_{SD}$| is equal to $V_{SET}$ which is 2V for the first architecture. By contrast, |$V_{GS}$| and |$V_{D-SUB}$| are reduced from approximately 1 volts, and that |$V_{SD}$| is equal to $V_{SET}/2$ which is 1V. for the second architecture. In a random SET and RESET mode, the first architecture requires a 2 Volt MOSFET device, while the second architecture requires a 1 Volt MOSFET device. Highlighted gate, source-drain, and drain-substrate voltages show that all voltage are the same, except for source-drain voltage which is lower by a factor of 2 for the second architecture. The first and second architectures require 2 volt and 1 volt MOSFET select devices, respectively.

Table 57 illustrated in FIG. 57 summarizes the voltage requirements of MOSFET cell select devices. For the first architecture, a 2 volt MOSFET device is required for mixed random and sub-block write select operation. While for the second architecture, a 1 volt MOSFET device is required. In these examples, the SET voltage is $V_{SET}$=2V and the RESET voltage is $V_{RST}$=3 V.

The second architecture has a layout advantage with respect to the first architecture because there are fewer column lines required. FIG. 49 shows the first architecture with both SL(0) and BL(1) (two) column array wires. FIG. 51 shows the second architecture with BL(1) (one) column array wire. Reducing column array wires enables smaller NV resistive memory cells. The addition of select lines SL parallel to word lines WL increases the number of rows. However, this increase has almost no effect on NV resistive memory cell area. As describe further above, from both a layout and voltage scaling standpoint, the second architecture may approach NV resistive memory cell densities of $6F^2$.

While first and second architectures and operating modes have been described in terms of NV CNT resistive block switches, the same results apply to cells with NV graphitic block switches or NV buckyball resistive block switches. First and second architectures and operating modes may also be applied to other resistive memories such as those formed with metallic oxide storage elements.

Although the present invention has been described in relation to particular embodiments thereof, many other variations and modifications and other uses will become apparent to those skilled in the art. It is preferred, therefore, that the present invention not be limited by the specific disclosure herein, but rather be defined by the appended claims; and that these claims will encompass modifications of and improvements to what has been described.

What is claimed:

1. A diode, comprising:
   a first multi-layer carbon block, said first multi-layer carbon block comprising at least two carbon layers, each carbon layer comprising multiple, interconnected carbon structures; and
   a second multi-layer carbon block, said second multi-layer carbon block comprising at least two carbon layers, each carbon layer comprising multiple, interconnected carbon structures;
   wherein said second multi-layer carbon block is in electrical communication with said first multi-layer carbon block;
   wherein said first multi-layer carbon block and said second multi-layer carbon block comprise a diode carbon layer; and
   wherein said diode carbon layer includes a pn junction between said first multi-layer carbon block and said second multi-layer carbon block.

2. The diode of claim 1, wherein at least one of said first multi-layer carbon block and said second multi-layer carbon block is a nanotube fabric.

3. The diode of claim 2, wherein said nanotube fabric comprises carbon nanotubes.

4. The diode of claim 2, wherein said first multi-layer carbon block is a p-type nanotube fabric and said second multi-layer carbon block is an n-type nanotube fabric.

5. The diode of claim 1, wherein at least one of said first multi-layer carbon block and said second multi-layer carbon block is a graphitic block.

6. The diode of claim 5, wherein said first multi-layer carbon block is a p-type graphitic block and said second multi-layer carbon block is an n-type graphitic block.

7. The diode of claim 1, wherein at least one of said first multi-layer carbon block and said second multi-layer carbon block is a buckyball block.

8. The diode of claim 7, wherein said buckyball block comprises Buckminsterfullerenes $C_{60}$.

9. The diode of claim 7, wherein said first multi-layer carbon block is a p-type buckyball block and said second multi-layer carbon block is an n-type buckyball block.

10. The diode of claim 1, wherein said first multi-layer carbon block is an anode of said diode and said second multi-layer carbon block is a cathode of said diode.

11. The diode of claim 1, wherein said conductive path is directional.

12. A diode, comprising:
    a conductive layer; and
    a multi-layer carbon block, said multi-layer carbon block comprising at least two carbon layers, each carbon layer comprising multiple, interconnected carbon structures;
    wherein said multi-layer carbon block is in electrical contact with said conductive layer;
    wherein said conductive layer and said multi-layer carbon block comprise a diode carbon layer; and
    wherein said diode carbon layer includes a Schottky junction between said conductive layer and said multi-layer carbon block.

13. The diode of claim 12, wherein said multi-layer carbon block is a nanotube fabric.

14. The diode of claim 13, wherein said nanotube fabric comprises carbon nanotubes.

15. The diode of claim 13, wherein said multi-layer carbon block is at least one of a p-type nanotube fabric and an n-type nanotube fabric.

16. The diode of claim 12, wherein said multi-layer carbon block is a graphitic block.

17. The diode of claim 16, wherein said multi-layer carbon block is at least one of a p-type graphitic block and an n-type graphitic block.

18. The diode of claim 12, wherein said multi-layer carbon layer is a buckyball block.

19. The diode of claim 18, wherein said buckyball block comprises Buckminsterfullerenes $C_{60}$.

20. The diode of claim 18, wherein said multi-layer carbon block is at least one of a p-type buckyball block and an n-type buckyball block.

21. The diode of claim 12, wherein said multi-layer carbon block is at least one of an anode of said diode and a cathode of said diode.

22. The diode of claim 12, wherein said conductive path is directional.

* * * * *